US012679858B2

(12) United States Patent
Yan et al.

(10) Patent No.: US 12,679,858 B2
(45) Date of Patent: Jul. 14, 2026

(54) METAL IRIDIUM COMPLEX AND USE THEREOF

(71) Applicant: GUANGDONG AGLAIA OPTOELECTRONIC MATERIALS CO., LTD, Foshan (CN)

(72) Inventors: Liangliang Yan, Foshan (CN); Lei Dai, Foshan (CN); Lifei Cai, Foshan (CN)

(73) Assignee: GUANGDONG AGLAIA OPTOELECTRONIC MATERIALS CO., LTD, Foshan (CN)

( * ) Notice: Subject to any disclaimer, the term of this patent is extended or adjusted under 35 U.S.C. 154(b) by 669 days.

(21) Appl. No.: 17/928,908

(22) PCT Filed: May 9, 2021

(86) PCT No.: PCT/CN2021/092527
§ 371 (c)(1),
(2) Date: Nov. 30, 2022

(87) PCT Pub. No.: WO2021/258875
PCT Pub. Date: Dec. 30, 2021

(65) Prior Publication Data
US 2023/0227485 A1 Jul. 20, 2023

(30) Foreign Application Priority Data
Jun. 23, 2020 (CN) ........................ 202010579527.X

(51) Int. Cl.
*C07F 15/00* (2006.01)
*H10K 50/11* (2023.01)
*H10K 50/17* (2023.01)
*H10K 85/00* (2023.01)
*H10K 85/30* (2023.01)

(52) U.S. Cl.
CPC .......... *C07F 15/0033* (2013.01); *H10K 50/11* (2023.02); *H10K 85/00* (2023.02); *H10K 85/342* (2023.02); *H10K 50/17* (2023.02)

(58) Field of Classification Search
None
See application file for complete search history.

(56) References Cited

U.S. PATENT DOCUMENTS 9,793,499 B2 10/2017 Masahiro et al.
2015/0315222 A1 11/2015 Boudreault et al.
2022/0115603 A1 4/2022 Yan et al.
2023/0033081 A1 * 2/2023 Yan ........................ C09K 11/06

FOREIGN PATENT DOCUMENTS

CN 106459114 A 2/2017
CN 107973823 A 5/2018
CN 111377969 A 7/2020
CN 111620910 A 9/2020
CN 112830943 A 5/2021

* cited by examiner

*Primary Examiner* — Noble E Jarrell
(74) *Attorney, Agent, or Firm* — Maschoff Brennan

(57) ABSTRACT

The present invention relates to a metal iridium complex and application thereof. The metal iridium complex has a structure as shown in the following formula (I). The compound provided in the present invention has the advantages of low sublimation temperature, great optical and electrical stability, high luminescence efficiency, long service life, and high color saturation, and can be used in organic light-emitting devices. In particular, the complex has the potential for application in the AMOLED industry as a red light-emitting phosphorescent material.

(I)

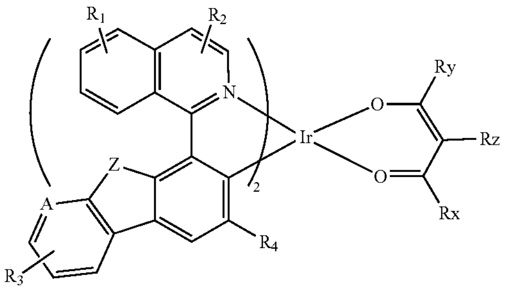

15 Claims, 4 Drawing Sheets

METAL IRIDIUM COMPLEX AND USE THEREOF

TECHNICAL FIELD

The present invention relates to the technical field of organic electroluminescence, in particular to an organic light-emitting material applicable to organic electroluminescent devices, and specially in particular to a metal iridium complex and application thereof in an organic electroluminescent device.

BACKGROUND

At present, as a new-generation display technology, an organic electroluminescent device (OLED) has attracted more and more attention in display and lighting technologies, thus having a wide application prospect. However, compared with market application requirements, properties, such as luminescence efficiency, driving voltage, and service life of OLED devices still need to be strengthened and improved.

In generally, the OLED devices include various organic functional material films with different functions between metal electrodes as basic structures, which are similar to sandwich structures. Under the driving of a current, holes and electrons are injected from a cathode and an anode, respectively. After moving a certain distance, the holes and the electrons are compounded in a light-emitting layer, and then released in the form of light or heat to achieve luminescence of the OLED.

However, organic functional materials are core components of the OLED devices, and the thermal stability, photochemical stability, electrochemical stability, quantum yield, film forming stability, crystallinity, and color saturation of the materials are main factors affecting properties of the devices.

In general, the organic functional materials include fluorescent materials and phosphorescent materials. The fluorescent materials are usually organic small-molecule materials, which can only use 25% of singlet luminescence, thus having low luminescence efficiency. Meanwhile, due to a spin-orbit coupling effect caused by a heavy atom effect, the phosphorescent materials can use 25% of a singlet state, and can also use 75% of energy of a triplet exciton, so that the luminescence efficiency can be improved. However, compared with the fluorescent materials, the phosphorescent materials are started later, and the thermal stability, service life, and color saturation of the materials need to be improved. Thus, the phosphorescent materials are a challenging topic. Various compounds have been developed to serve as the phosphorescent materials. For example, according to an invention patent document CN107973823, a quinoline iridium compound is disclosed. However, the color saturation and device properties, especially luminescence efficiency and device service life, of the compound need to be improved. According to an invention patent document CN106459114, an iridium compound coordinated with a β-dione coordination group is disclosed. However, the compound has high sublimation temperature and low color saturation. In particular, the device properties, especially luminescence efficiency and device service life are unsatisfactory, which needs to be further improved.

SUMMARY

In order to solve the above problems, objectives of the present invention are to provide an organic electroluminescent device with high properties and to provide a novel material capable of realizing the organic electroluminescent device.

In order to achieve the above objectives, the inventor has conducted in-depth studies repeatedly and found that an organic electroluminescent device with high properties can be obtained by using a metal iridium complex as shown in the following formula (I).

The present invention relates to a metal iridium complex and application thereof. The metal iridium complex has a structure as shown in the following formula (I). The complex provided in the present invention has the advantages of low sublimation temperature, great optical and electrical stability, high luminescence efficiency, long service life, and high color saturation, and can be used in organic light-emitting devices. In particular, the complex has the potential for application in the AMOLED industry as a red light-emitting phosphorescent material.

One of the objectives of the present invention is to provide a metal iridium complex. The complex has the advantages of low sublimation temperature, high optical and electrochemical stability, high color saturation, high luminescence efficiency, and long device service life, and can be used in organic electroluminescent devices. In particular, the complex can be used in the OLED industry as a red light-emitting dopant.

A metal iridium complex has a structure formula as shown in the following formula (I):

(I)

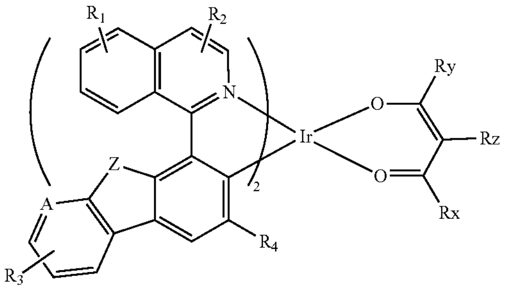

where

A is $CR_0$ or N;

the number of $R_1$, $R_2$, and $R_3$ ranges from a single substitution number to a maximum possible substitution number;

$R_1$ and $R_4$ are independently selected from substituted or unsubstituted $C_1$-$C_{10}$ alkyl, substituted or unsubstituted $C_3$-$C_{20}$ cycloalkyl, substituted or unsubstituted $C_2$-$C_{10}$ alkenyl, substituted or unsubstituted $C_1$-$C_{10}$ heteroalkyl, substituted or unsubstituted $C_6$-$C_{30}$ aralkyl, substituted or unsubstituted $C_6$-$C_{30}$ aryl, or substituted or unsubstituted $C_1$-$C_8$ heteroaryl;

$R_0$, $R_2$, and $R_3$ are independently selected from hydrogen, deuterium, halogen, substituted or unsubstituted $C_1$-$C_{10}$ alkyl, substituted or unsubstituted $C_3$-$C_{20}$ cycloalkyl, substituted or unsubstituted $C_2$-$C_{10}$ alkenyl, substituted or unsubstituted $C_1$-$C_{10}$ heteroalkyl, substituted or unsubstituted $C_6$-$C_{30}$ aralkyl, substituted or unsubstituted $C_6$-$C_{30}$ aryl, or substituted or unsubstituted $C_1$-$C_8$ heteroaryl;

or any two adjacent groups of the $R_0$, the $R_1$, the $R_2$, and the $R_3$ are capable of being connected to each other to form a ring structure or a fused ring structure;

when the $R_3$ exists and is located adjacent to the A, the $R_3$ is not F; Rx-Rz are independently selected from hydrogen, deuterium, substituted or unsubstituted $C_1$-$C_{10}$ alkyl, substituted or unsubstituted $C_3$-$C_{20}$ cycloalkyl, substituted or unsubstituted $C_2$-$C_{10}$ alkenyl, or substituted or unsubstituted $C_1$-$C_{10}$ heteroalkyl;

the Z is independently selected from O, S, $C(R)_2$, or NR; the R is independently selected from substituted or unsubstituted $C_1$-$C_{10}$ alkyl or alkoxy, substituted or unsubstituted $C_2$-$C_{30}$ cycloalkyl, substituted or unsubstituted $C_6$-$C_{30}$ aryl, or substituted or unsubstituted $C_1$-$C_{18}$ heteroaryl;

the "substituted" refers to substitution with deuterium, F, Cl, Br, $C_1$-$C_5$ alkyl, or $C_3$-$C_6$ cycloalkyl;

and a heteroatom in the heteroalkyl or heteroaryl includes one or more of N, S, and O.

Preferably, the number of the $R_1$, the $R_2$, and the $R_3$ is a single substitution number; the $R_1$ and the $R_4$ are substituted or unsubstituted $C_1$-$C_6$ alkyl or substituted or unsubstituted $C_3$-$C_6$ cycloalkyl; and the $R_0$, the $R_2$, and the $R_3$ are independently selected from hydrogen, deuterium, halogen, substituted or unsubstituted $C_1$-$C_6$ alkyl, or substituted or unsubstituted $C_3$-$C_6$ cycloalkyl.

More preferably, the metal iridium complex has a structure formula as shown in the following formula (II):

Formula (II)

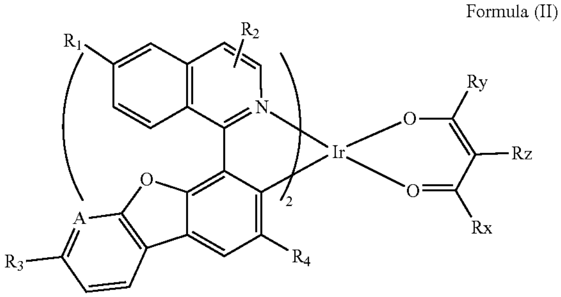

where $R_1$ and $R_4$ are substituted or unsubstituted $C_3$-$C_6$ branched alkyl, substituted $C_3$-$C_6$ linear alkyl, or substituted or unsubstituted $C_3$-$C_6$ cycloalkyl; $R_0$, $R_2$, and $R_3$ are independently selected from hydrogen, deuterium, substituted or unsubstituted $C_1$-$C_6$ alkyl, or substituted or unsubstituted $C_3$-$C_6$ cycloalkyl; and the "substituted" refers to substitution with deuterium, F, $C_1$-$C_5$ alkyl, or $C_3$-$C_6$ cycloalkyl.

The "substituted" refers to substitution with D, F, $C_1$-$C_5$ alkyl partially or completely substituted with D or F, or $C_3$-$C_6$ cycloalkyl partially or completely substituted with D or F.

A is CH or N.

The A is N, and the $R_3$ is not H.

As a preferred metal iridium complex, a structure of

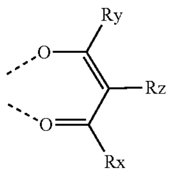

in the right side of the formula I is preferably one of the following structures, or corresponding parts or complete deuterides thereof, or corresponding parts or complete fluorides thereof, where a dotted line refers to a metal connection position.

A1

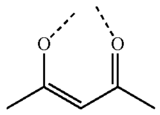

A2

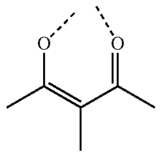

A3

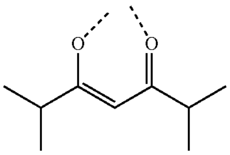

A4

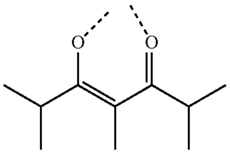

A5

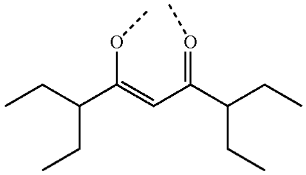

A6

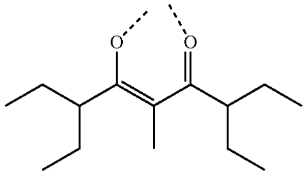

A7

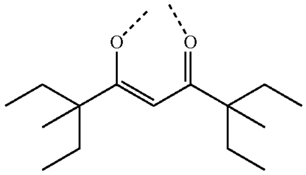

A8

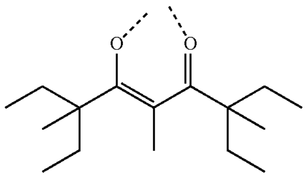

A9

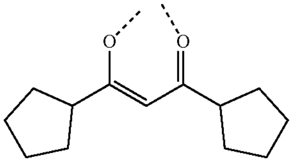

-continued
A10
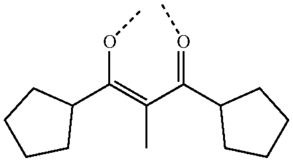
A11
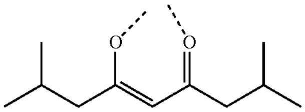
A12
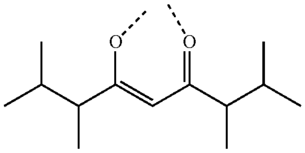
A13
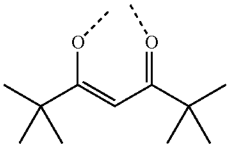
A14
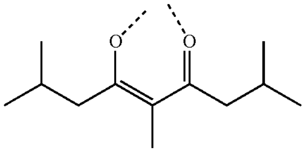
A15
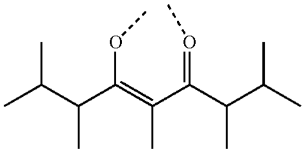
A16
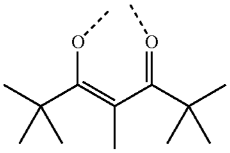
A17
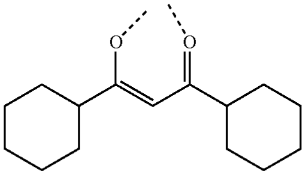
A18
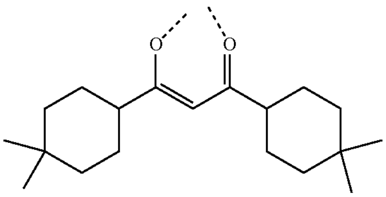
-continued
A19
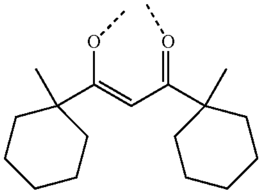
A20
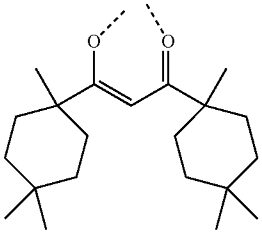
A21
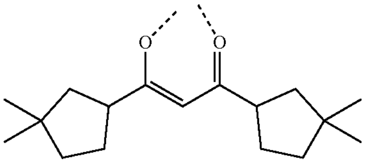
A22
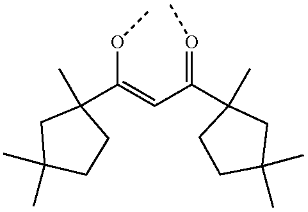
A23
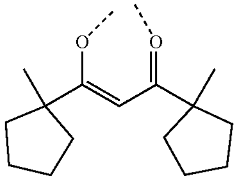
A24
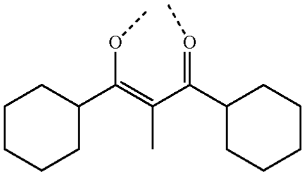
A25
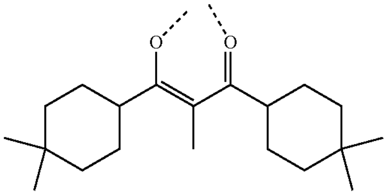
A26
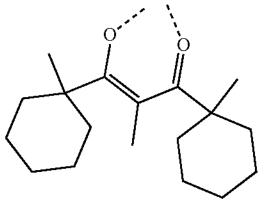

-continued
A27
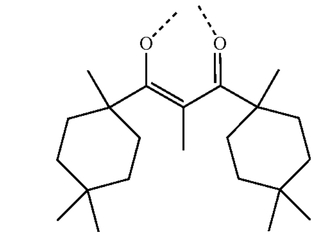
A28
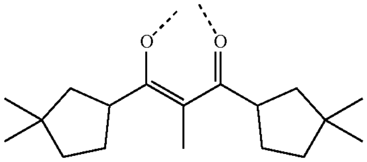
A29
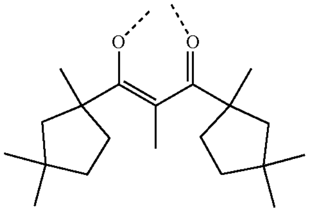
A30
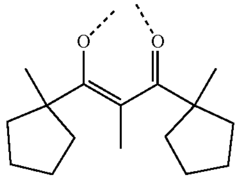
A31
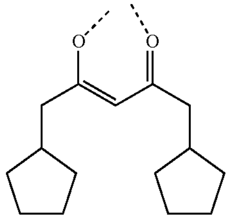
A32
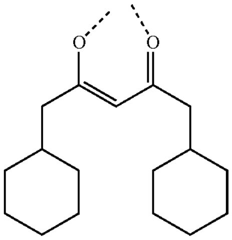
A33
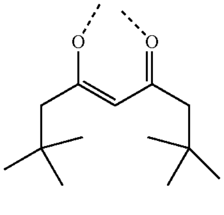
-continued
A34
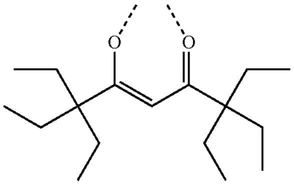
A35
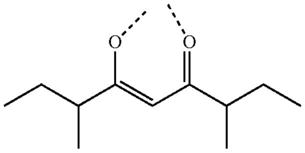
A36
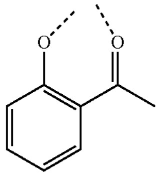
A37
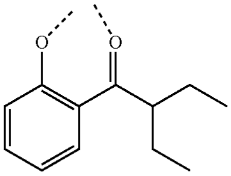
A38
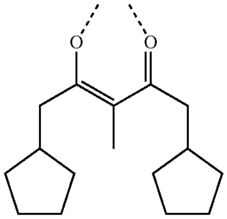
A39
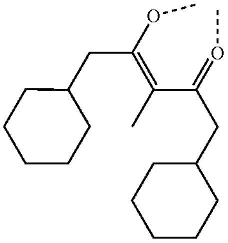
A40
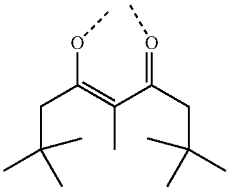
A41
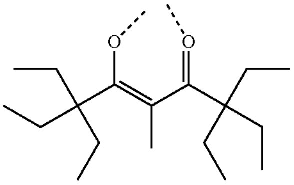

-continued
A42
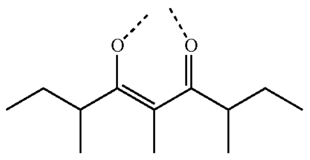
A43
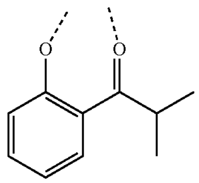
A44
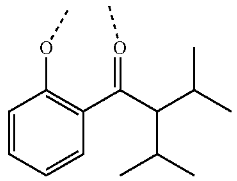
As a preferred metal iridium complex, the complex has one of the following structural formulas, or corresponding parts or complete deuterides thereof, or corresponding parts or complete fluorides thereof.
CPD 1
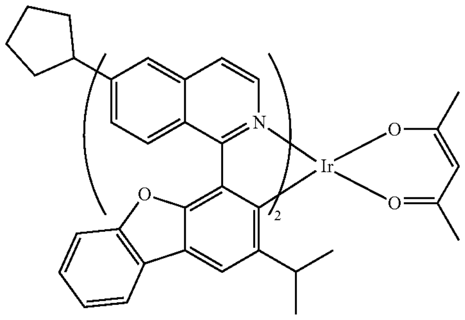
CPD 2
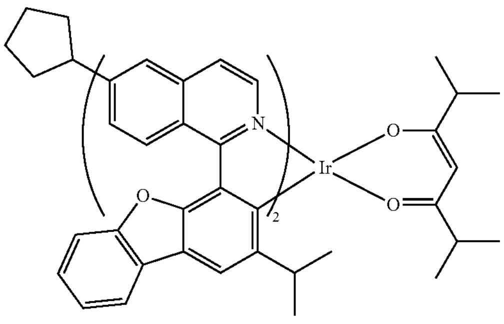
-continued
CPD 3
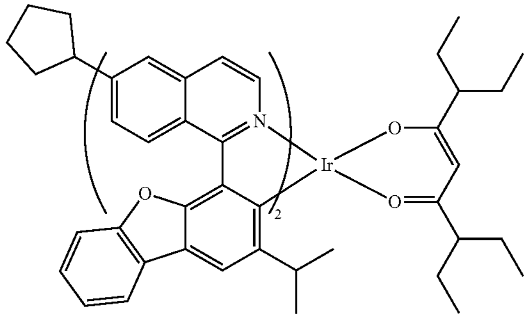
CPD 4
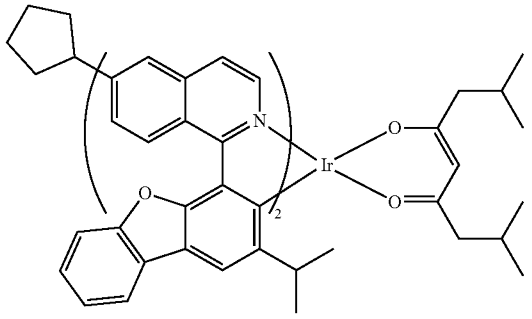
CPD 5
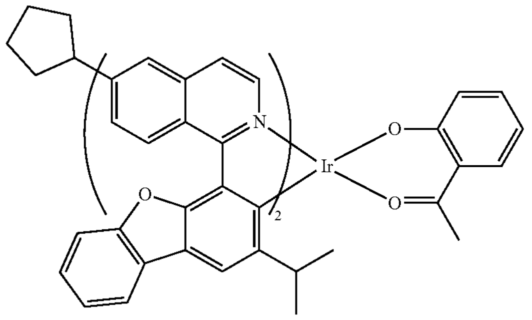
CPD 6
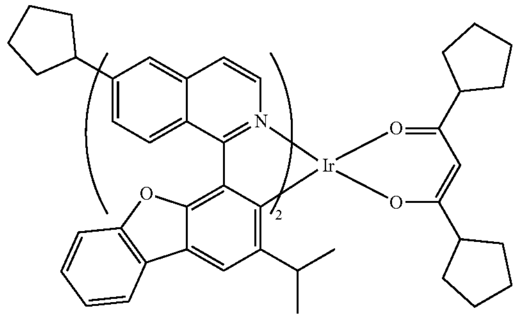

-continued
CPD 7
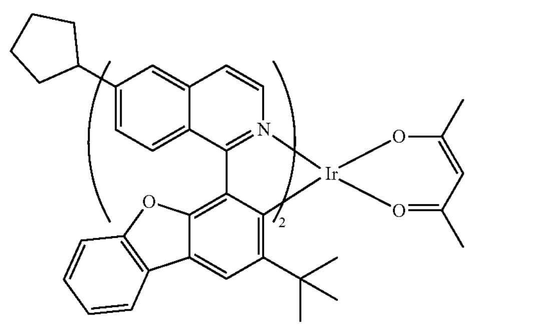
CPD 8
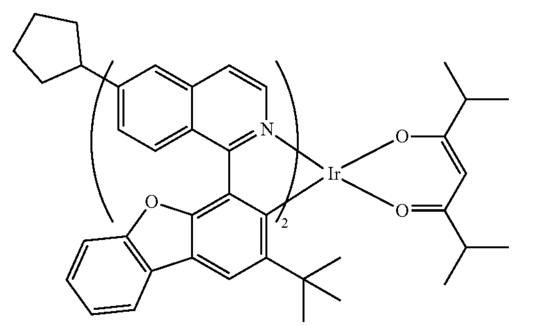
CPD 9
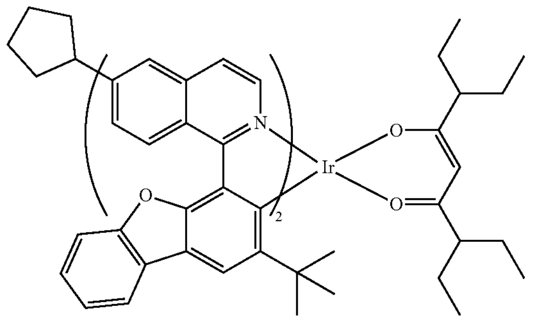
CPD 10
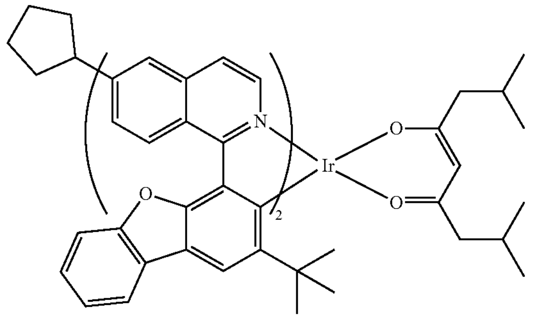
-continued
CPD 11
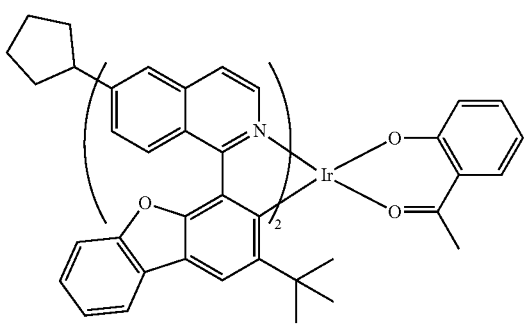
CPD 12
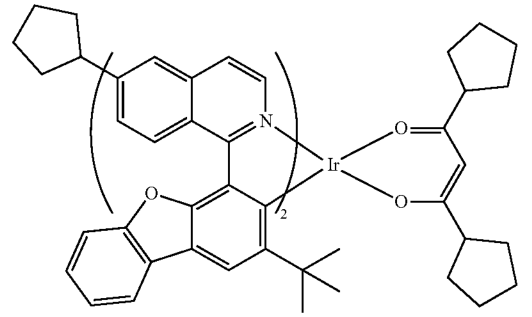
CPD 13
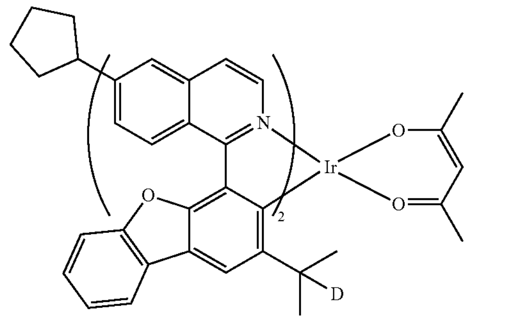
CPD 14
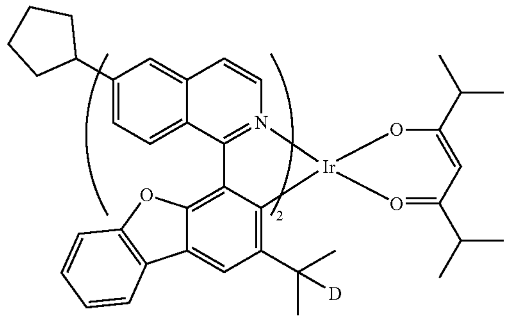

-continued
CPD 15
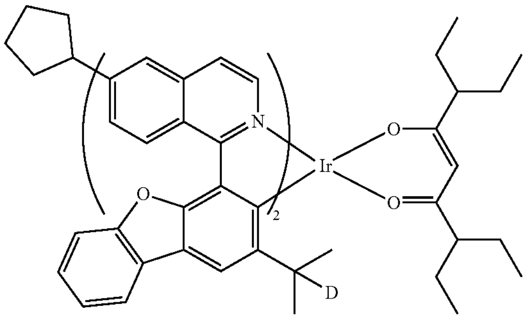
CPD 16
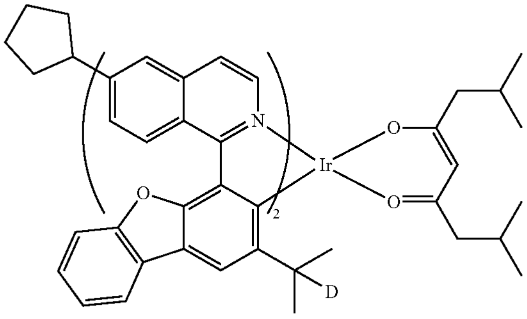
CPD 17
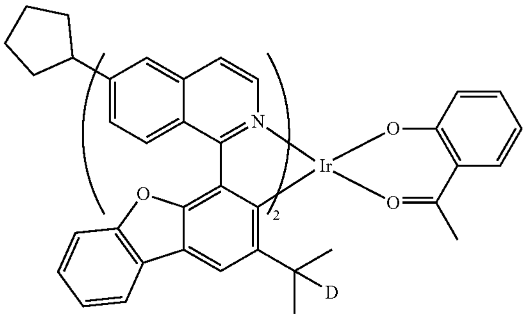
CPD 18
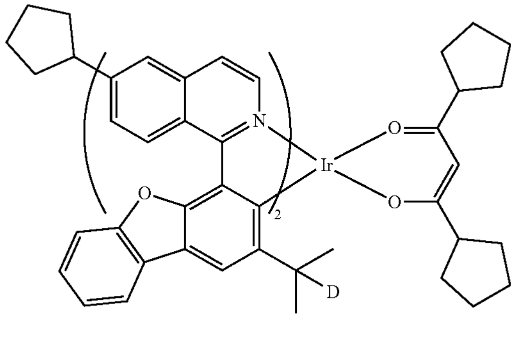
-continued
CPD 19
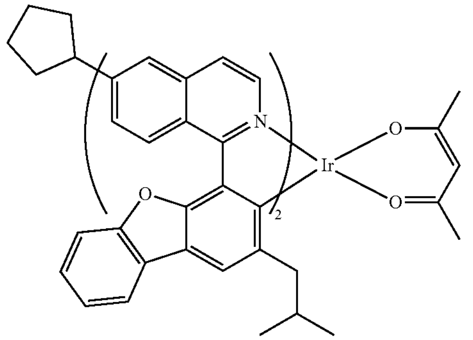
CPD 20
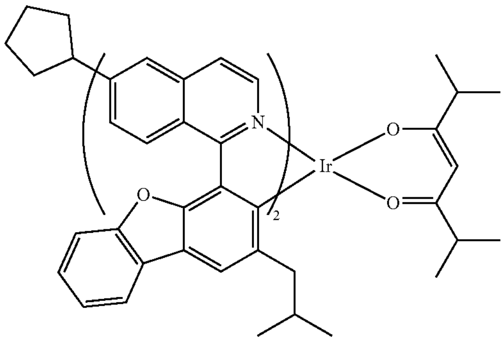
CPD 21
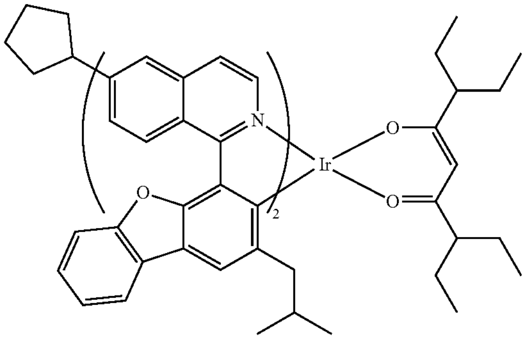
CPD 22
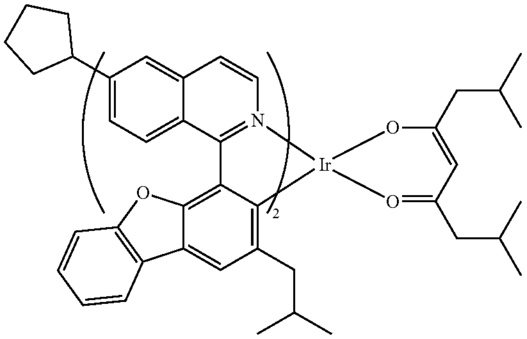

-continued
CPD 23
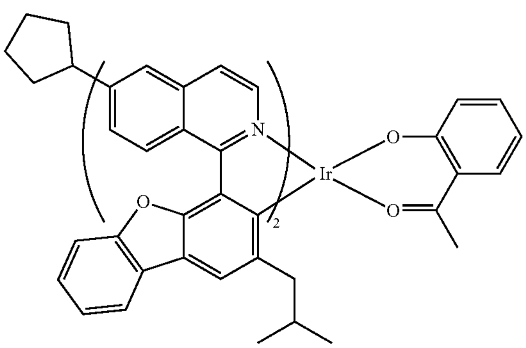
CPD 24
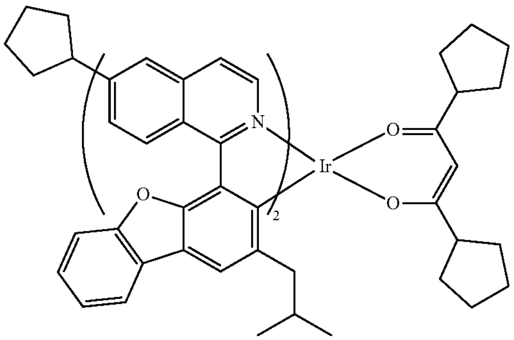
CPD 25
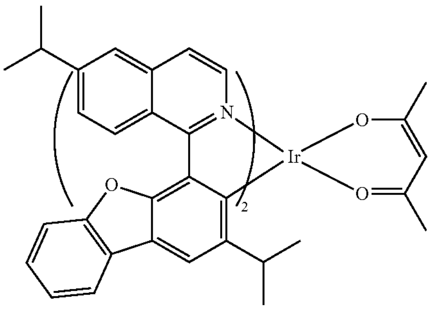
CPD 26
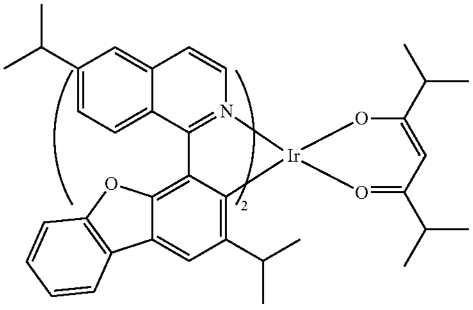
-continued
CPD 27
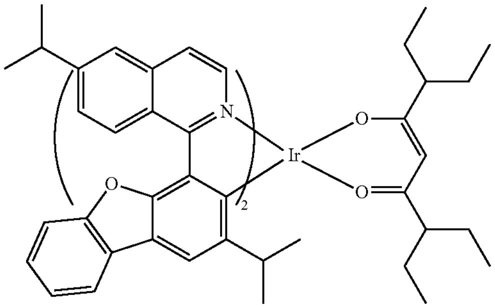
CPD 28
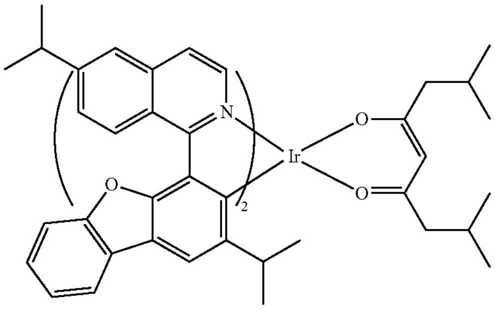
CPD 29
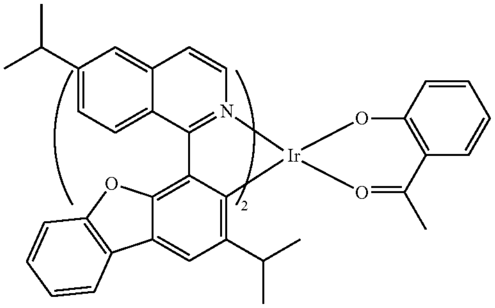
CPD 30
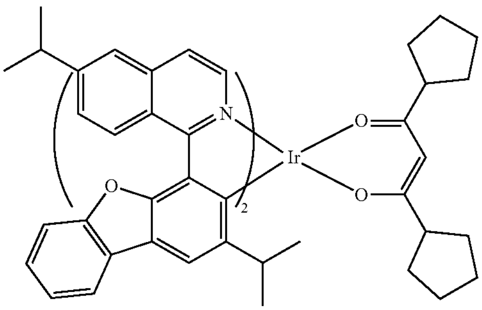

-continued
CPD 31
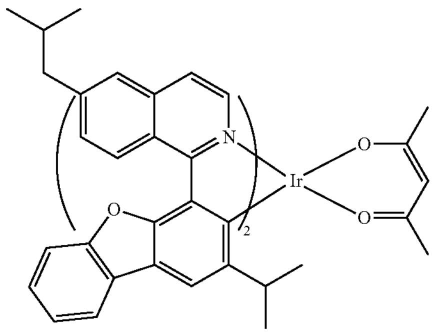
CPD 32
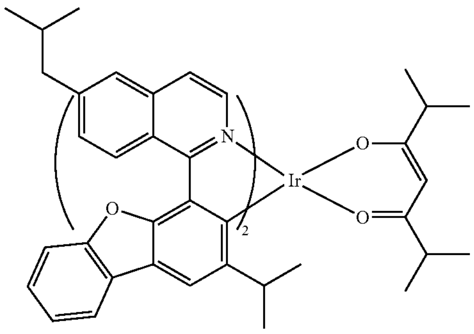
CPD 33
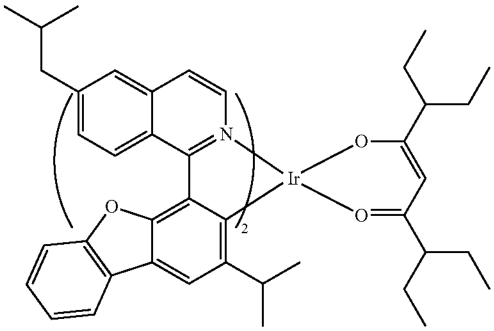
CPD 34
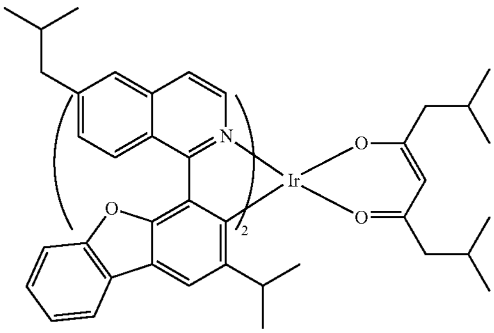
-continued
CPD 35
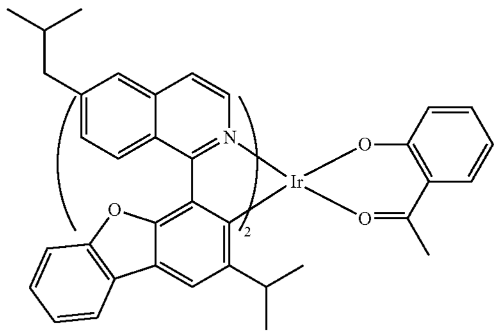
CPD 36
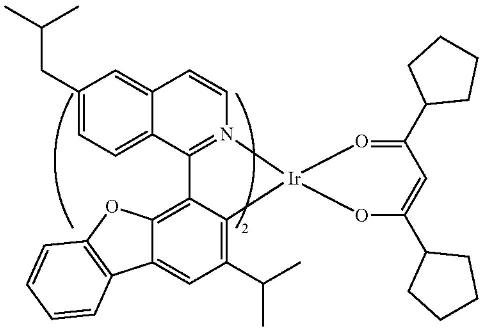
CPD 37
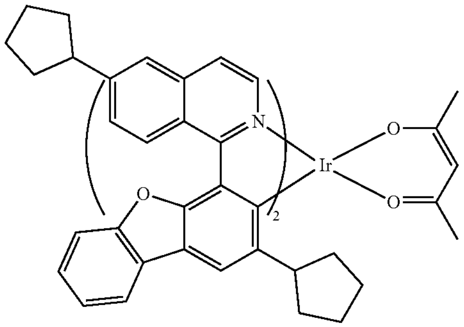
CPD 38
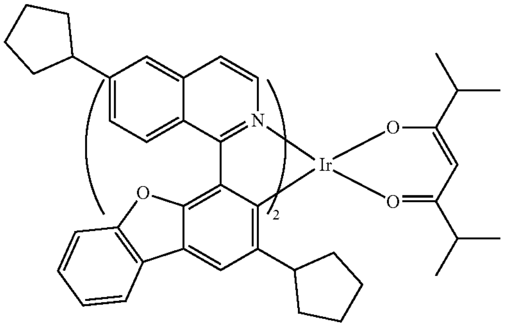

-continued
CPD 39
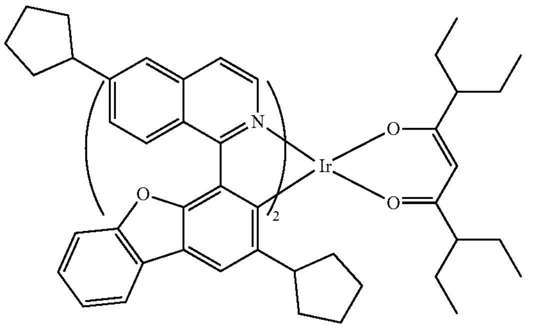
CPD 40
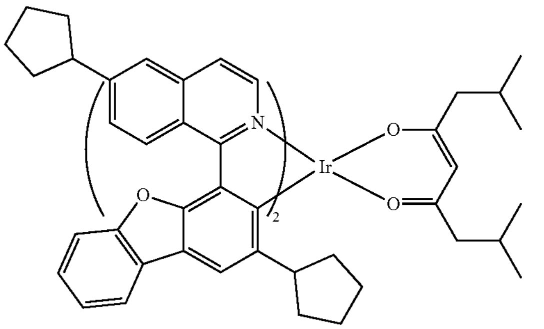
CPD 41
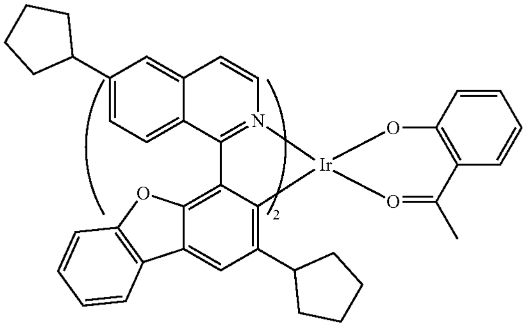
CPD 42
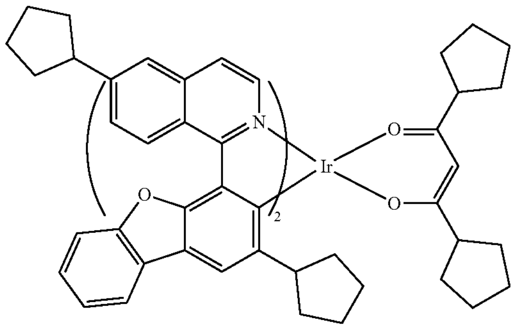
-continued
CPD 43
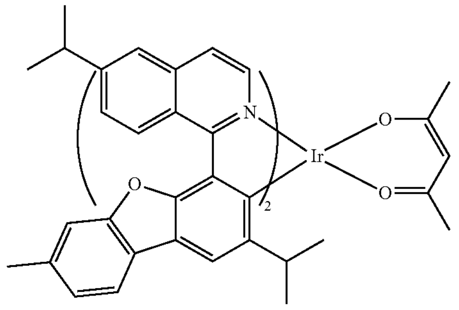
CPD 44
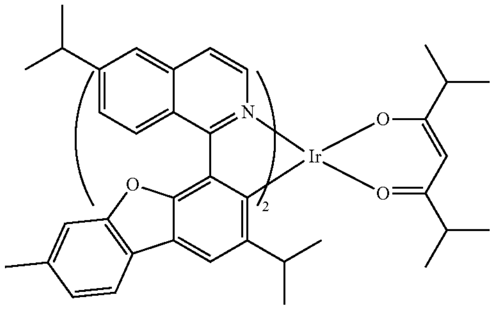
CPD 45
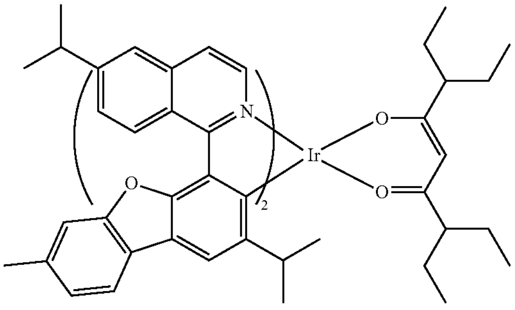
CPD 46
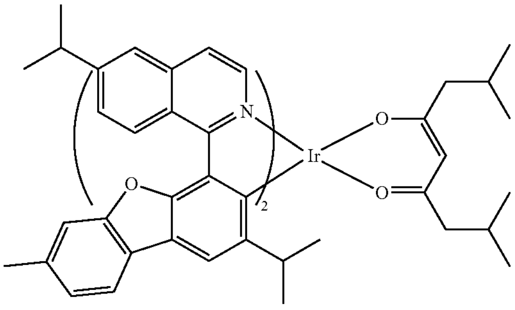

-continued
CPD 47
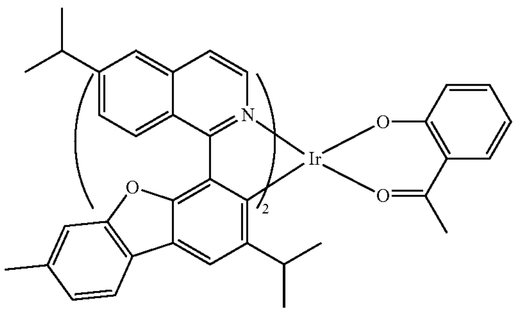
CPD 48
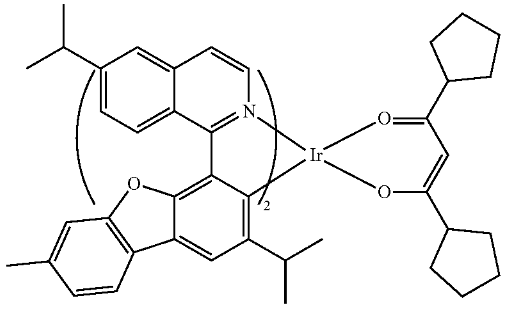
CPD 49
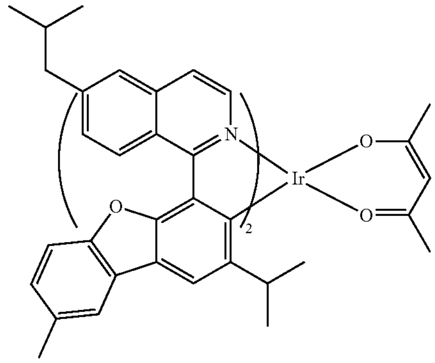
CPD 50
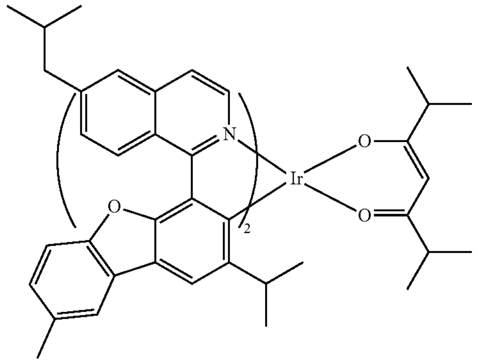
-continued
CPD 51
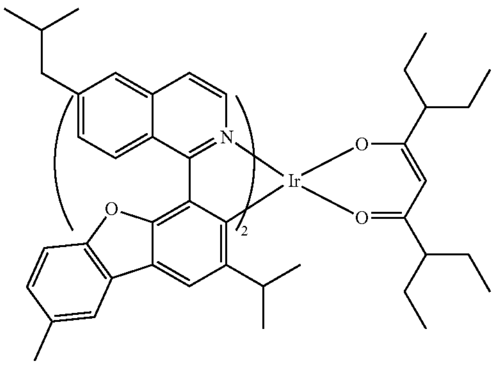
CPD 52
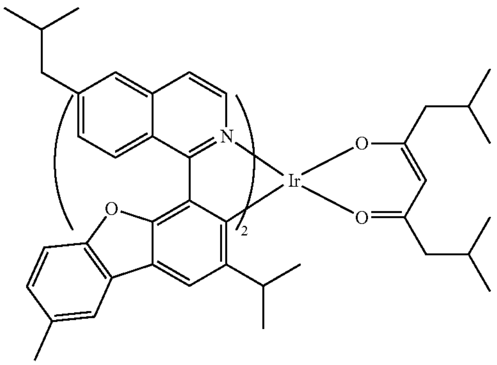
CPD 53
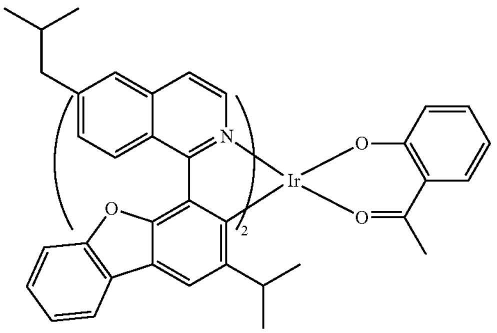
CPD 54
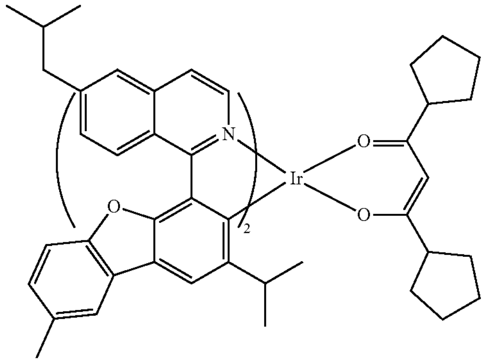

-continued
CPD 55
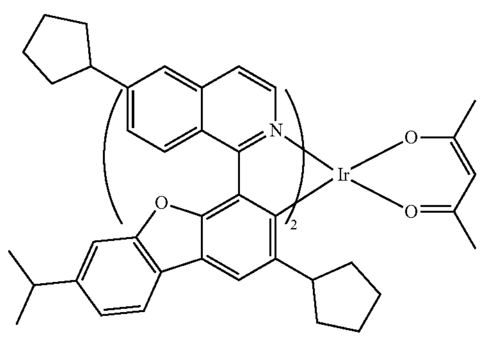
CPD 56
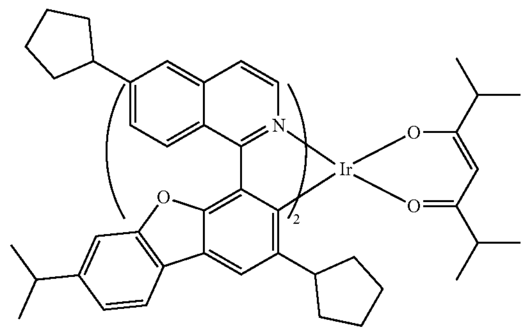
CPD 57
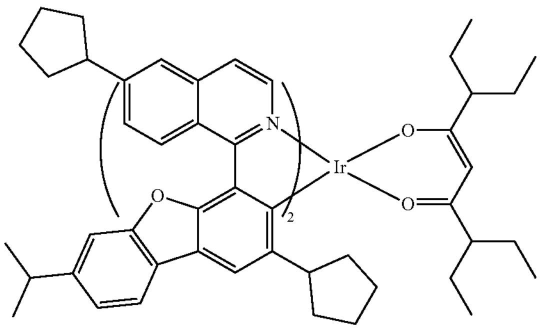
CPD 58
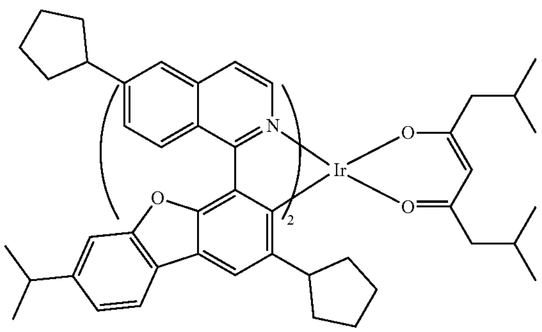
-continued
CPD 59
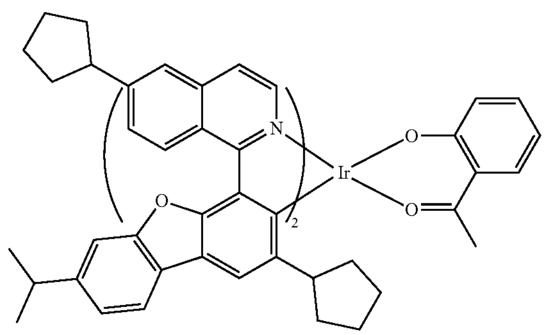
CPD 60
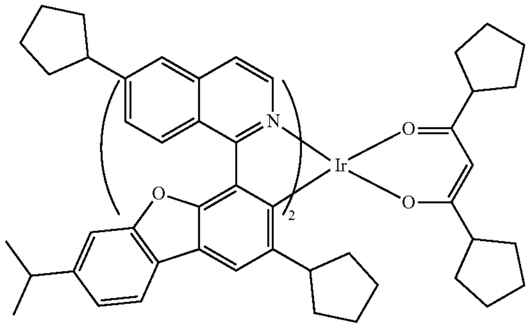
CPD 61
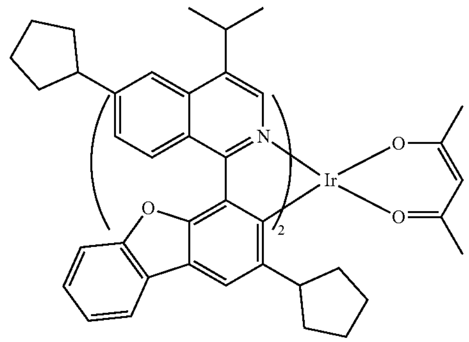
CPD 62
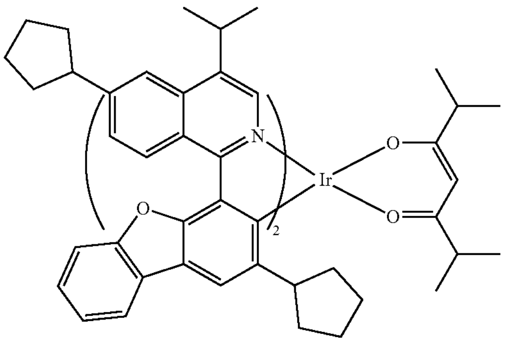

-continued
CPD 63
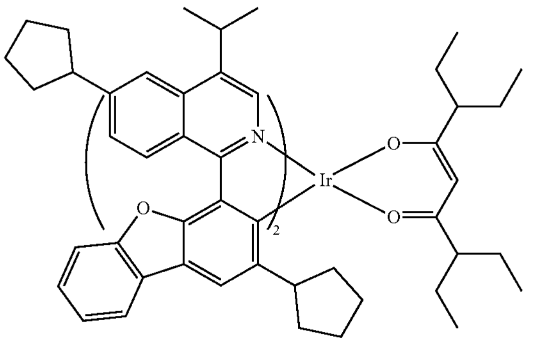
CPD 64
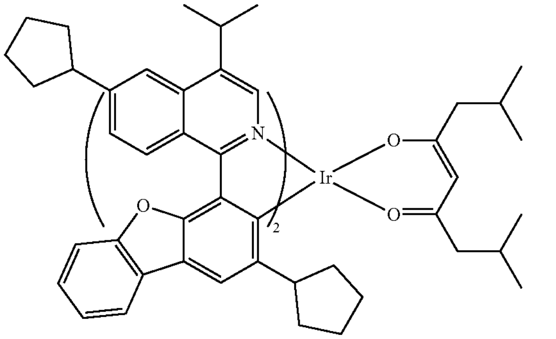
CPD 65
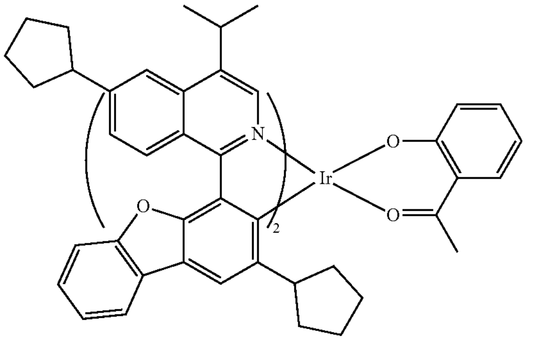
CPD 66
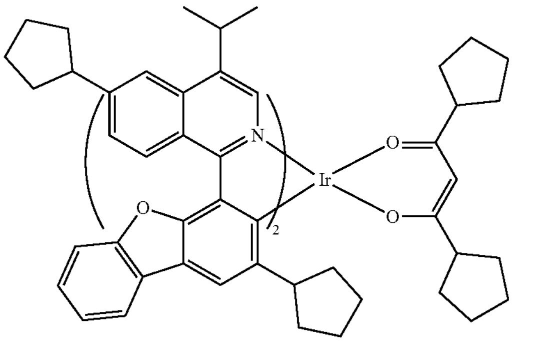
-continued
CPD 67
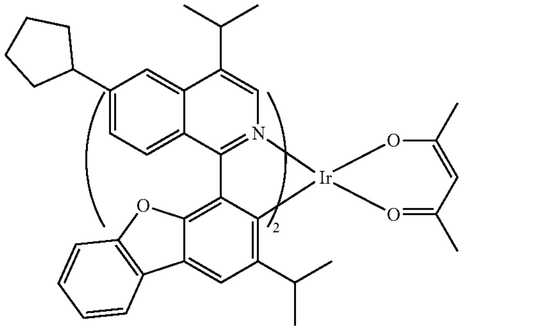
CPD 68
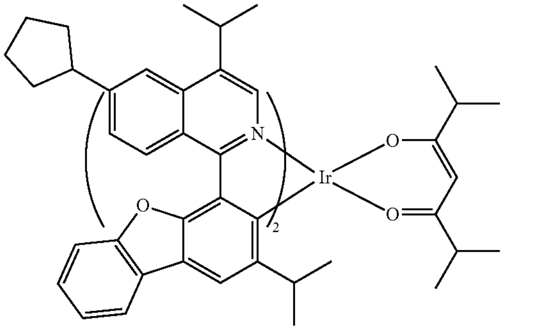
CPD 69
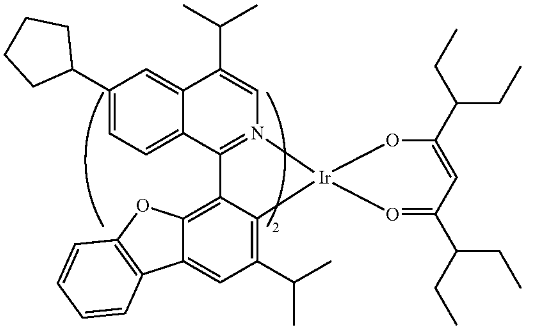
CPD 70
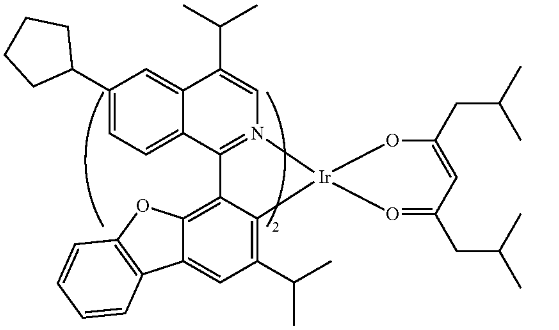

-continued
CPD 71
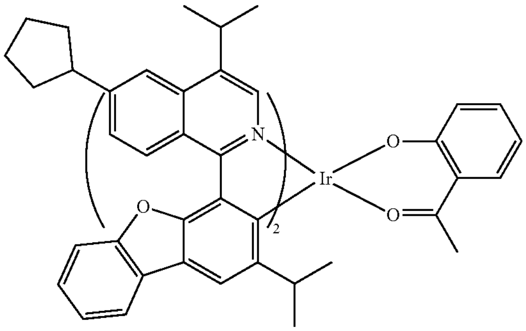
CPD 72
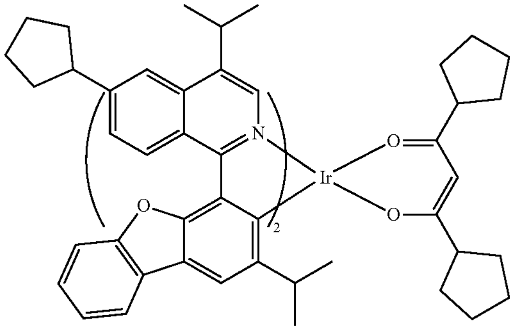
CPD 73
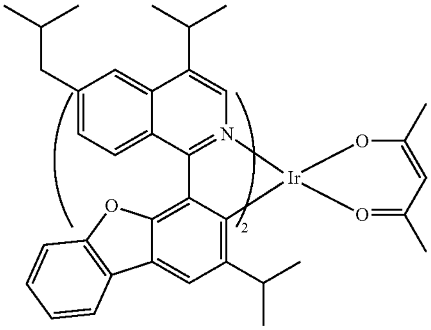
CPD 74
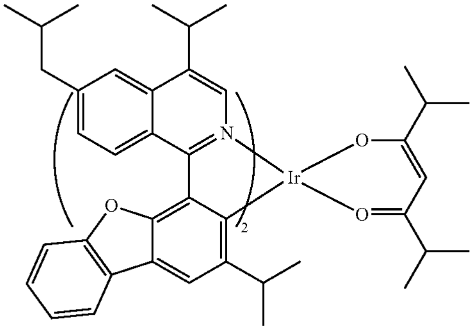
-continued
CPD 75
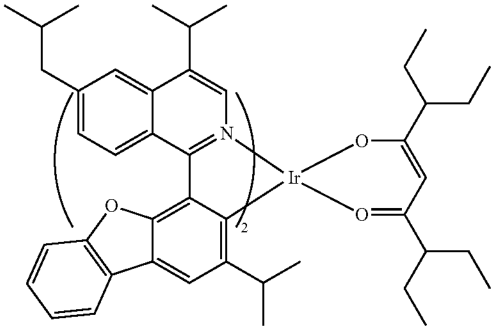
CPD 76
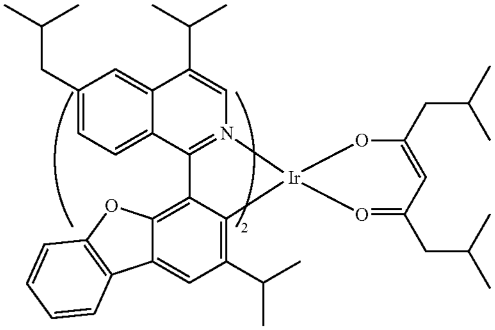
CPD 77
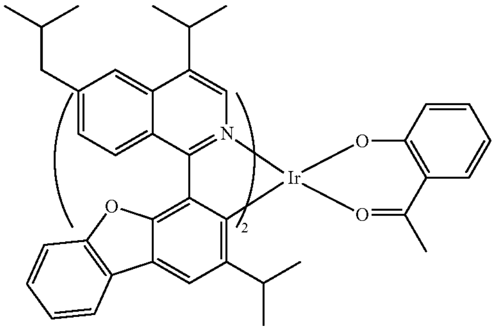
CPD 78
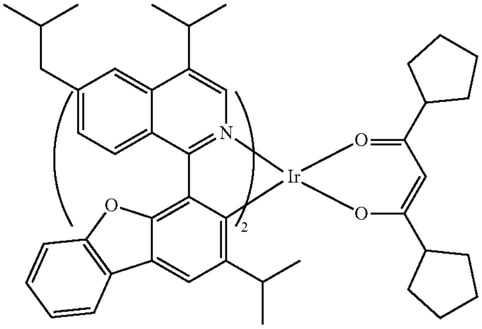

-continued
CPD 79
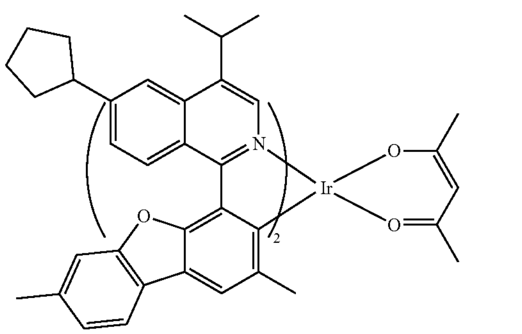
CPD 80
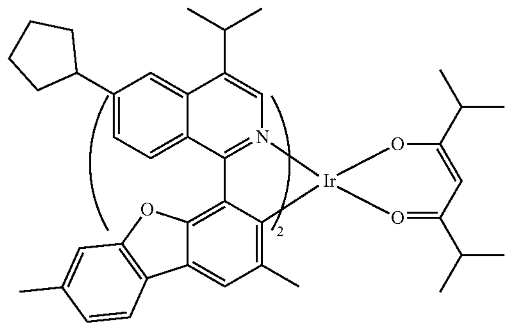
CPD 81
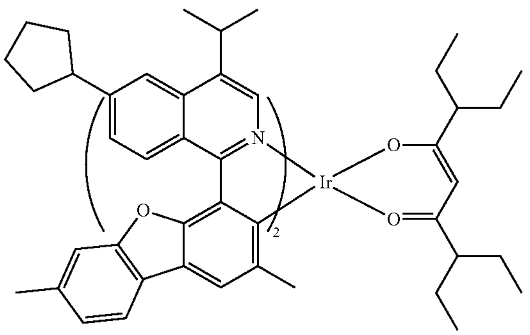
CPD 82
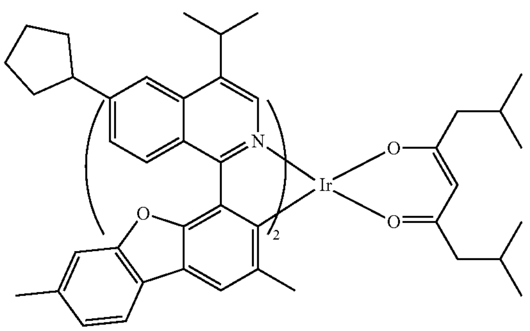
-continued
CPD 83
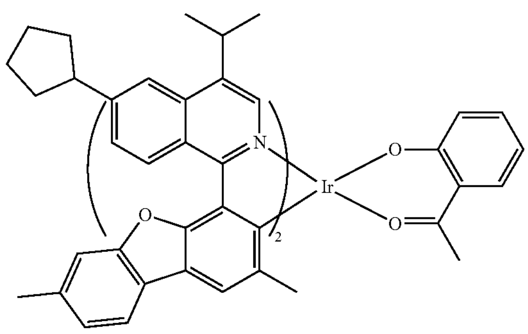
CPD 84
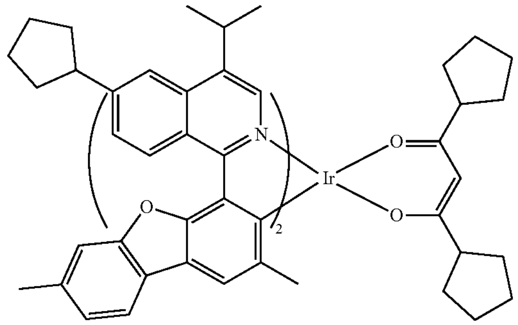
CPD 85
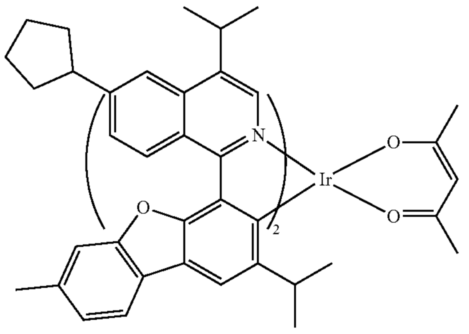
CPD 86
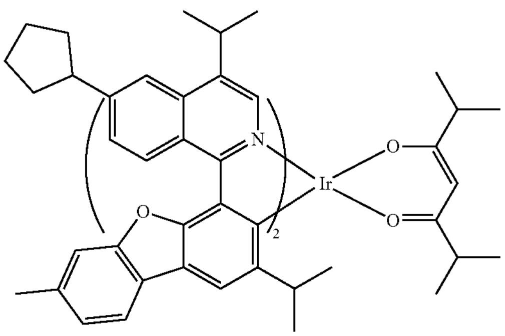

-continued
CPD 87
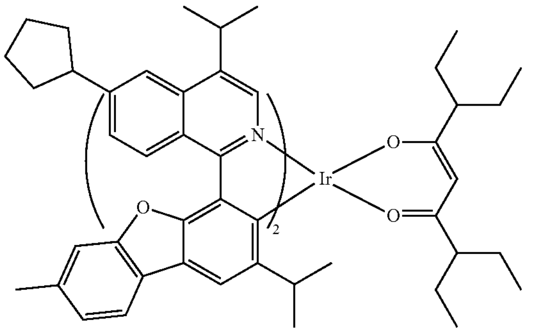
CPD 88
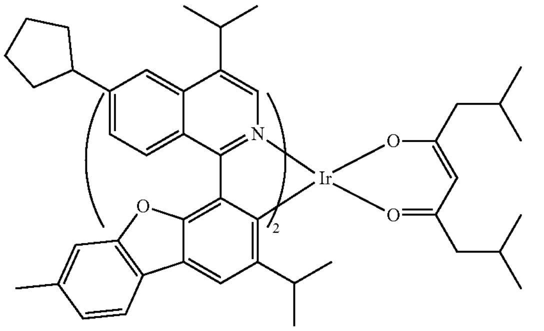
CPD 89
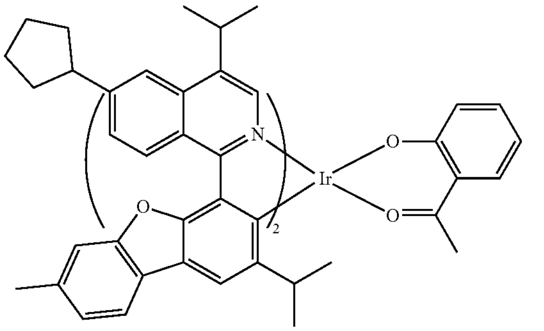
CPD 90
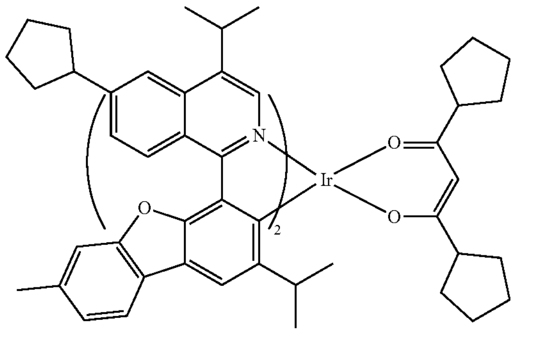
-continued
CPD 91
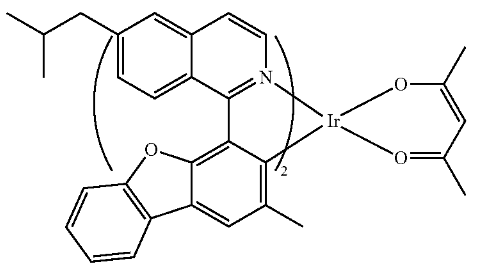
CPD 92
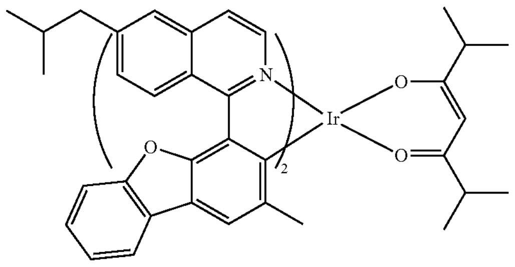
CPD 93
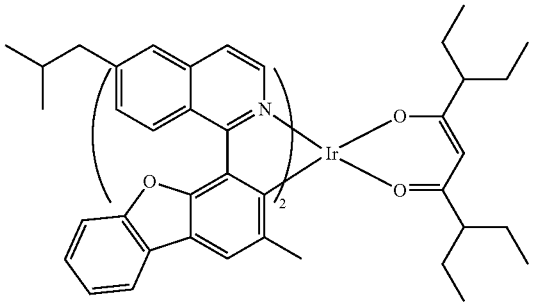
CPD 94
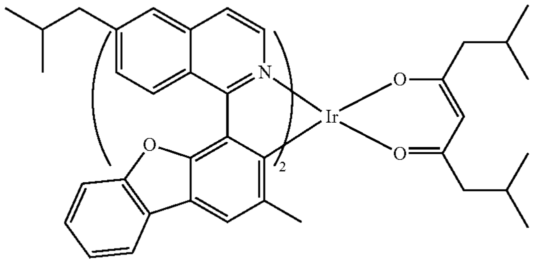
CPD 95
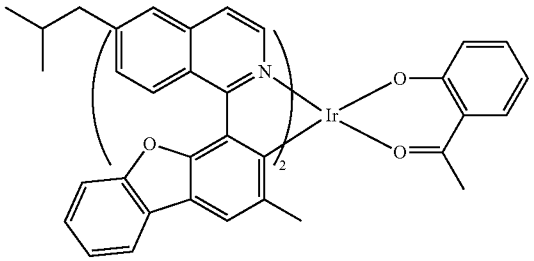

-continued
CPD 96
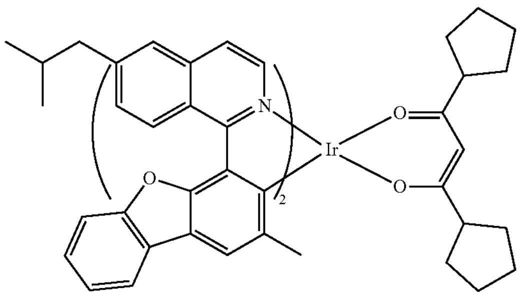
CPD 100
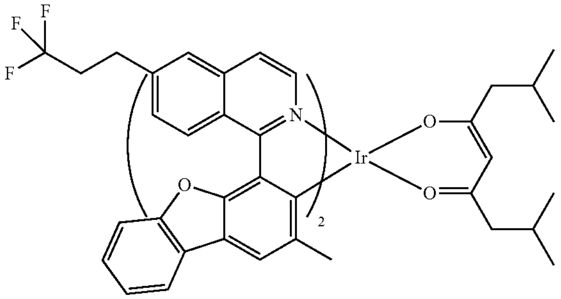
CPD 97
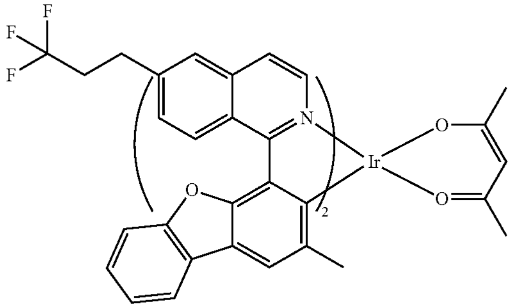
CPD 101
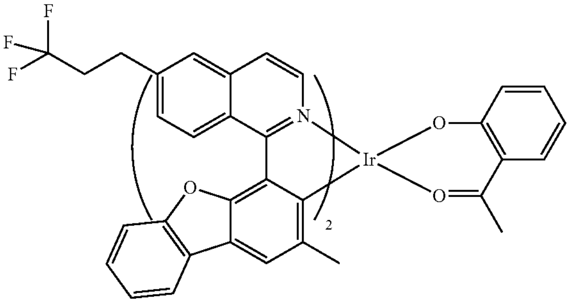
CPD 98
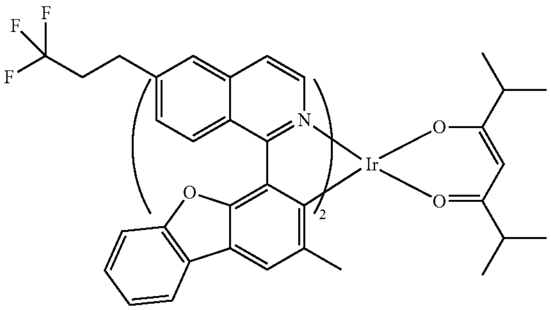
CPD 102
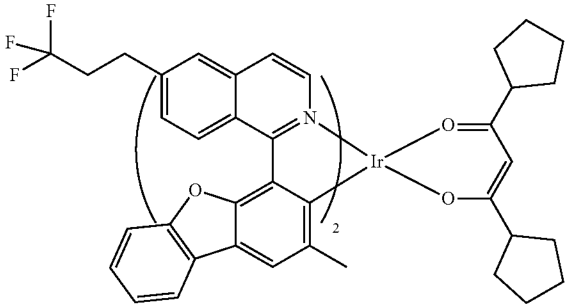
CPD 99
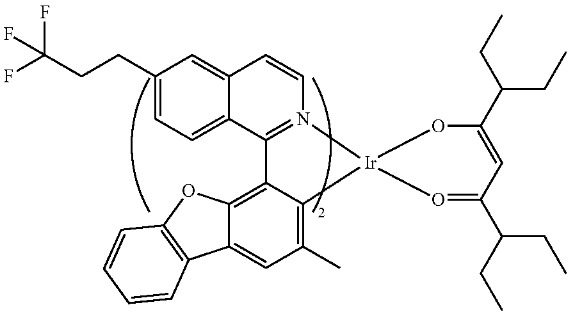
CPD 103
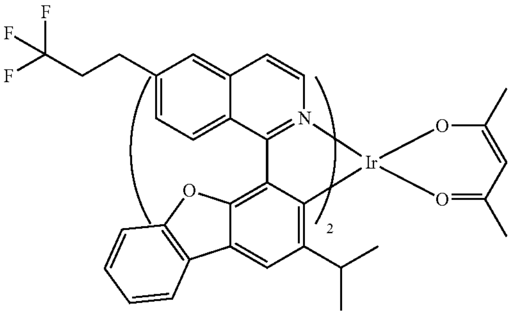

-continued
CPD 104
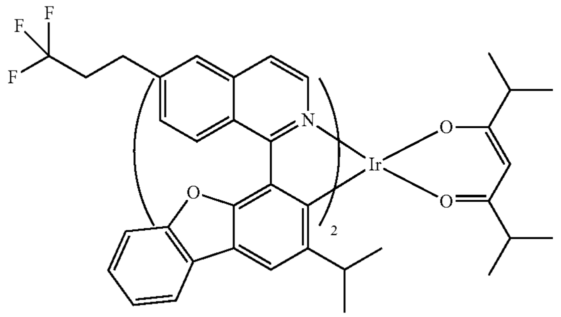
CPD 105
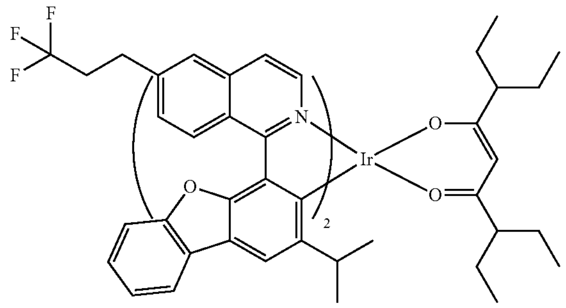
CPD 106
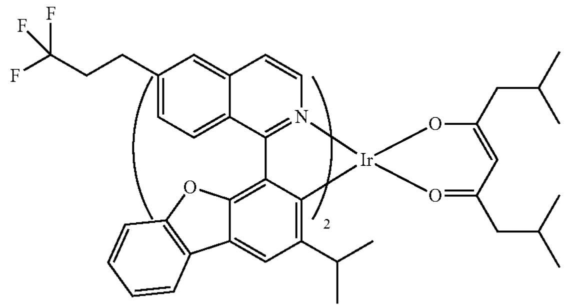
CPD 107
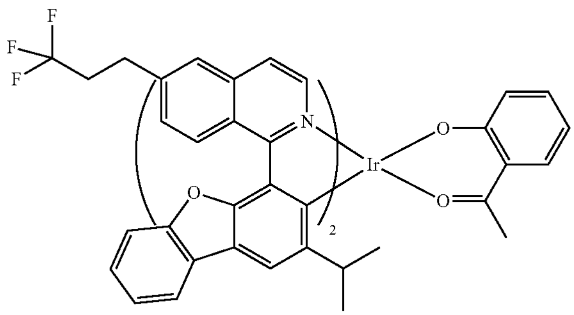
-continued
CPD 108
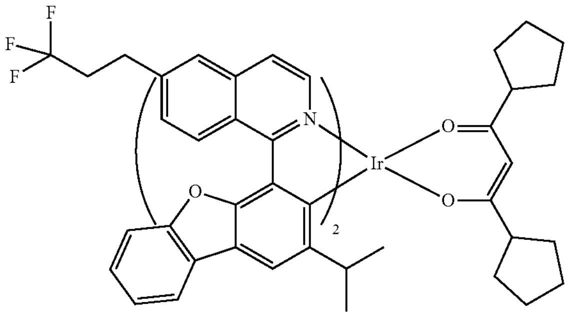
CPD 109
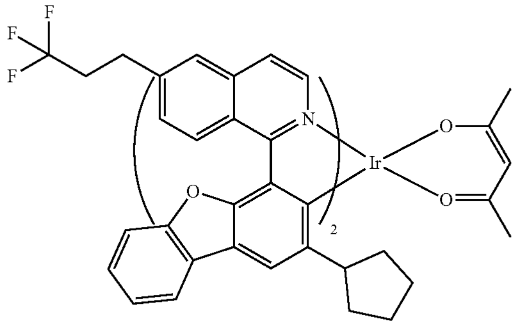
CPD 110
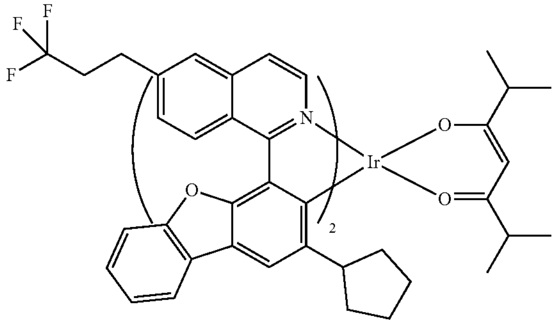
CPD 111
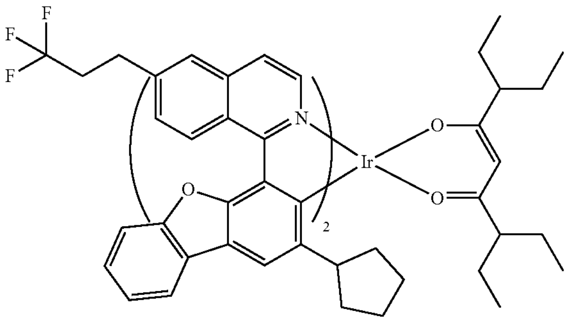

-continued
CPD 112
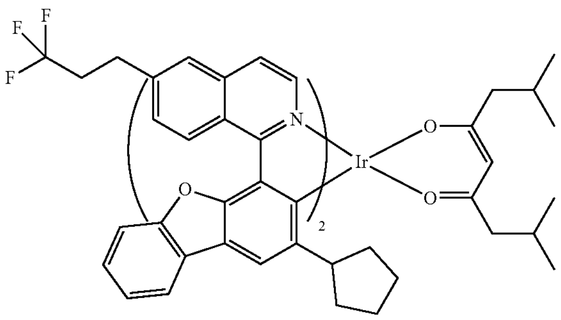
CPD 113
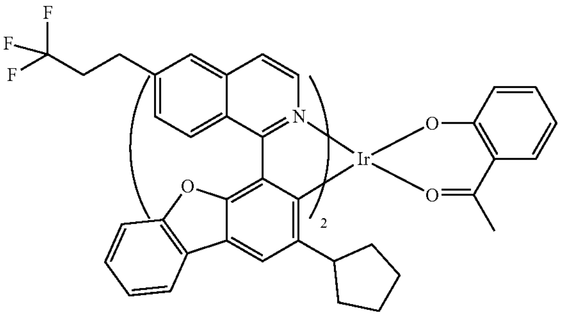
CPD 114
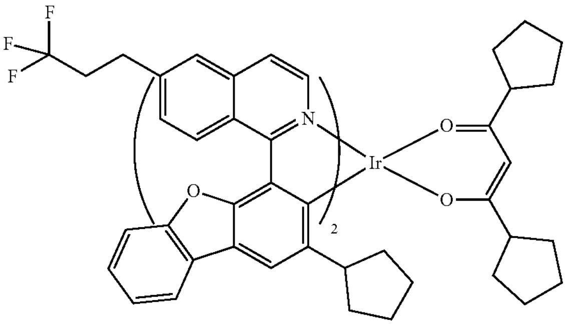
CPD 115
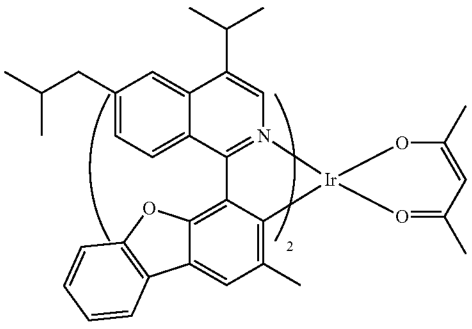
-continued
CPD 116
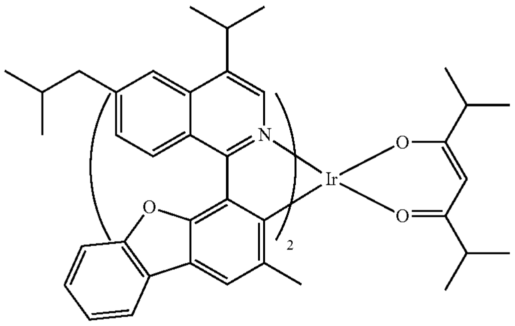
CPD 117
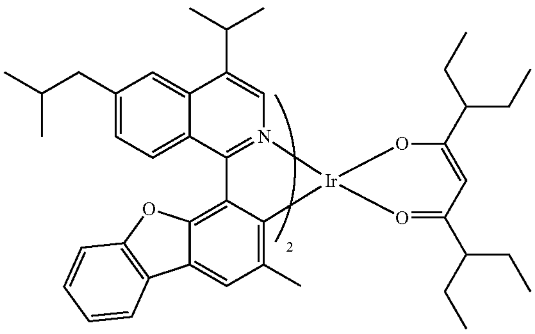
CPD 118
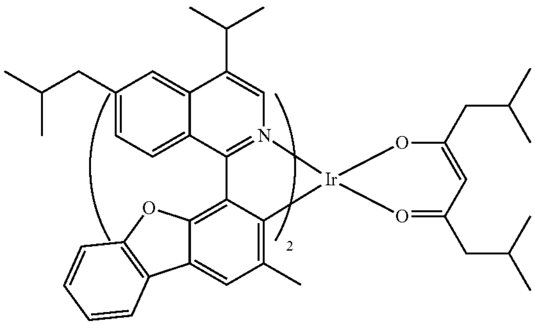
CPD 119
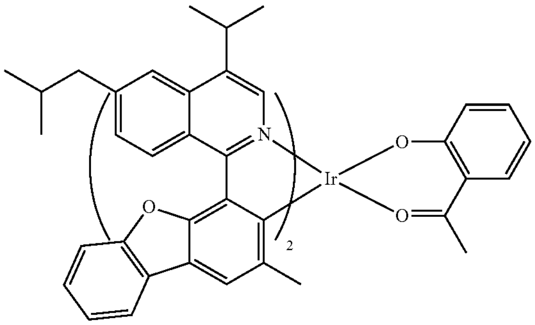

-continued
CPD 120
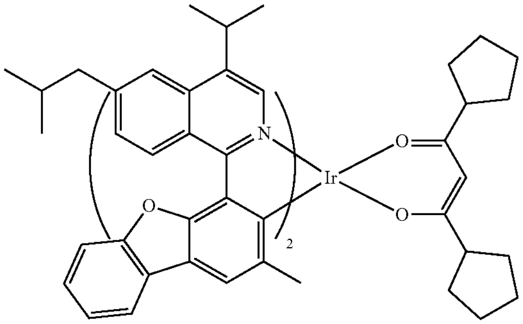
CPD 121
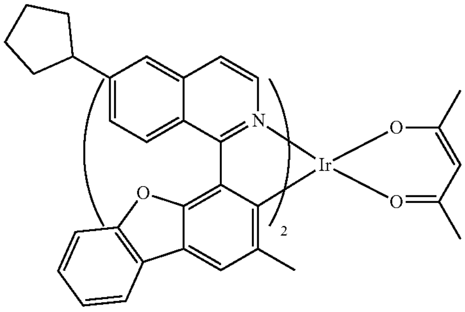
CPD 122
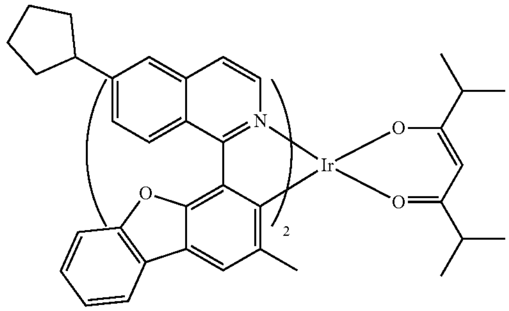
CPD 123
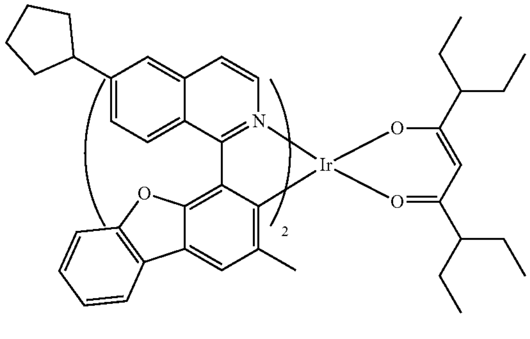
-continued
CPD 124
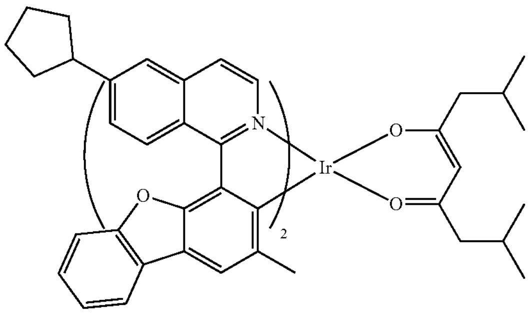
CPD 125
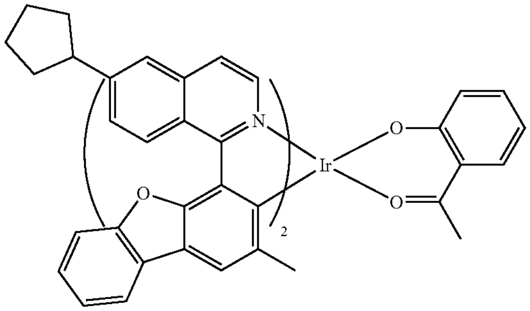
CPD 126
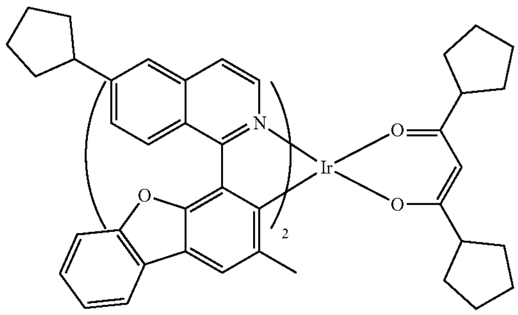
CPD 127
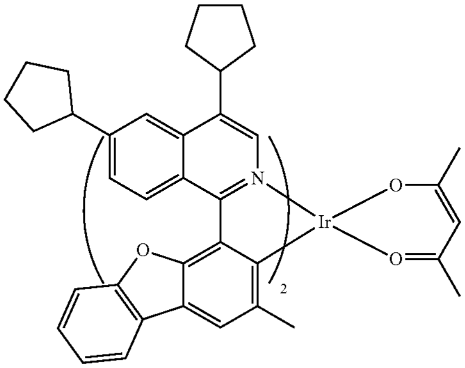

-continued
CPD 128
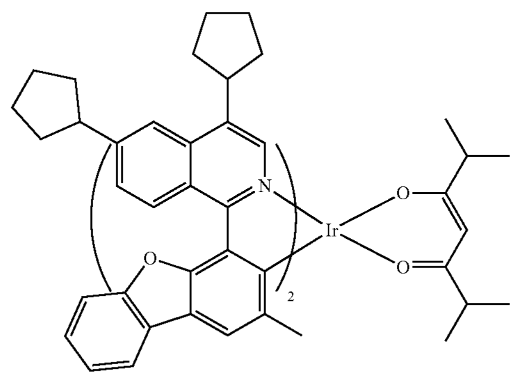
CPD 129
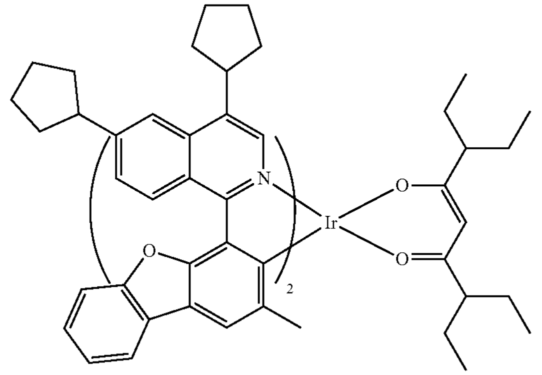
CPD 130
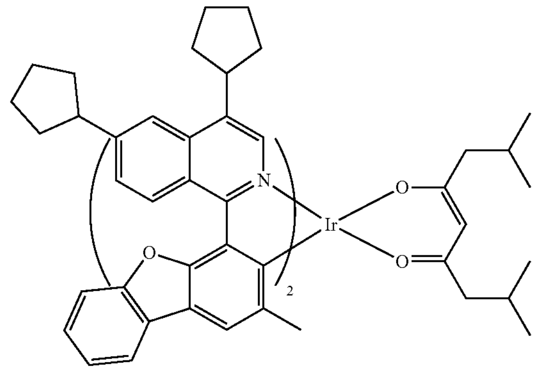
CPD 131
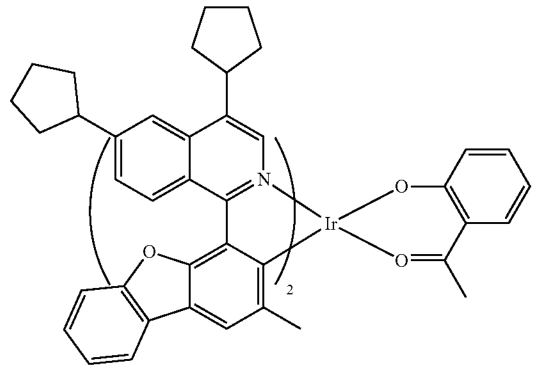
-continued
CPD 132
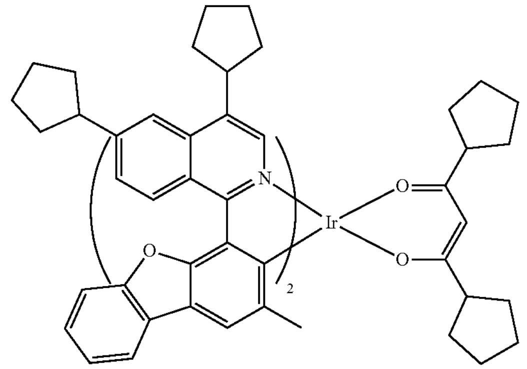
CPD 133
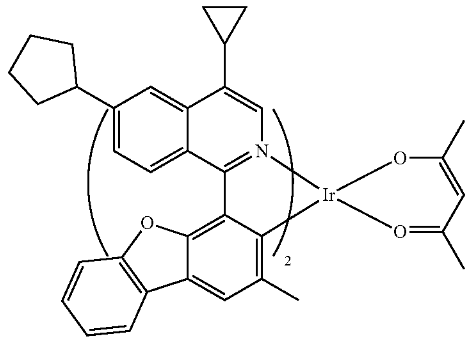
CPD 134
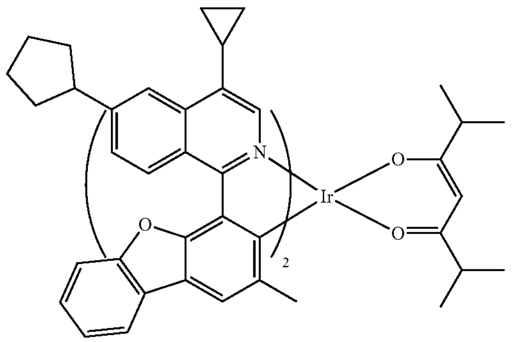
CPD 135
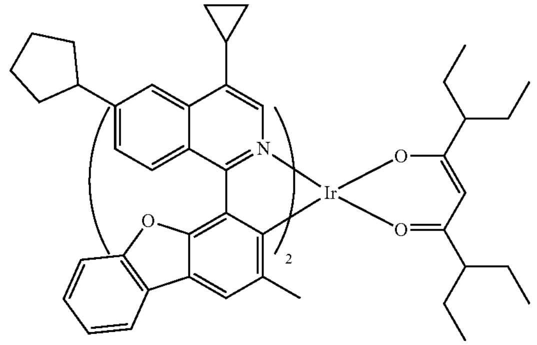

-continued
CPD 136
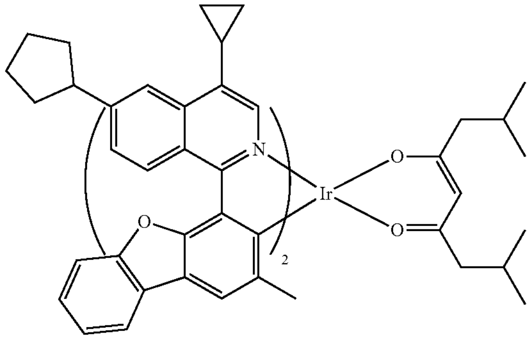
CPD 137
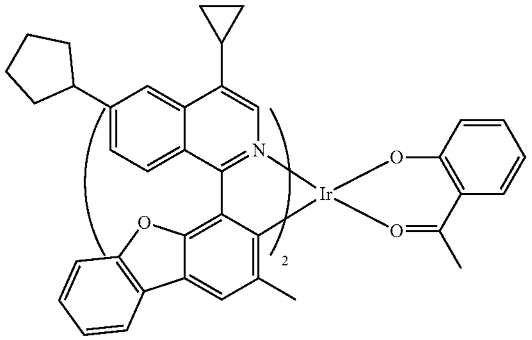
CPD 138
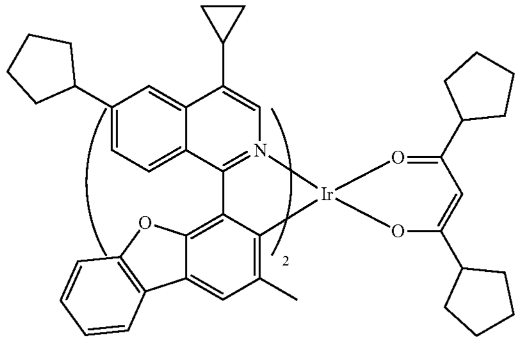
CPD 139
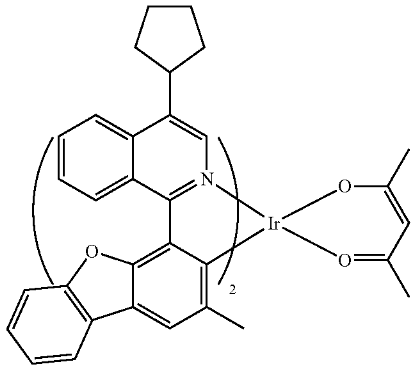
-continued
CPD 140
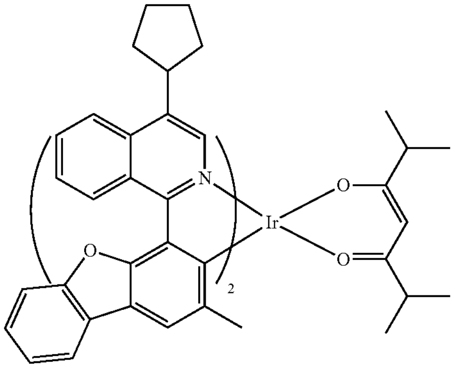
CPD 141
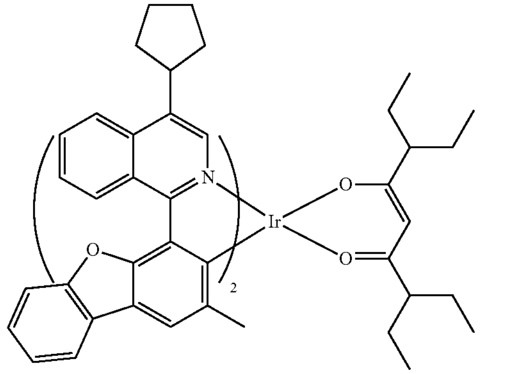
CPD 142
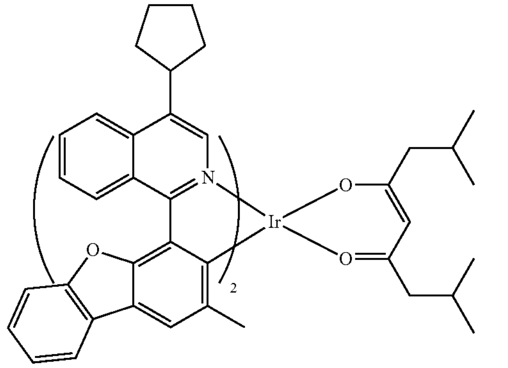
CPD 143
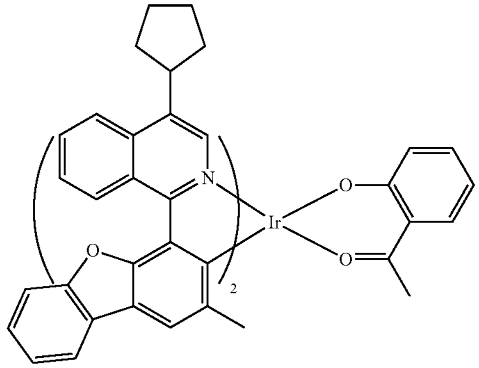

-continued
CPD 144
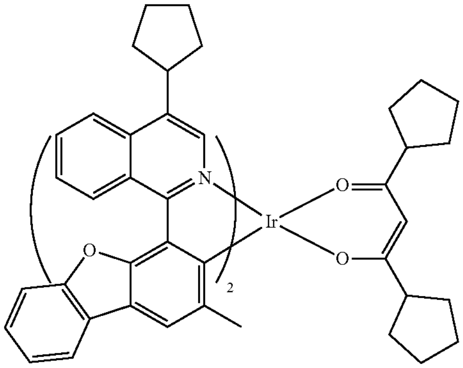
CPB 145
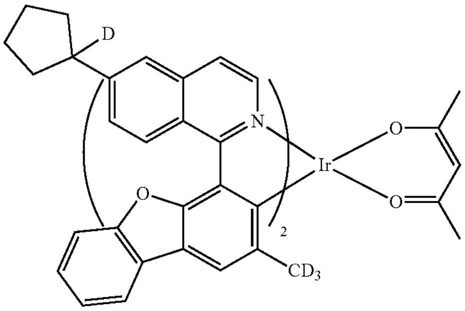
CPD 146
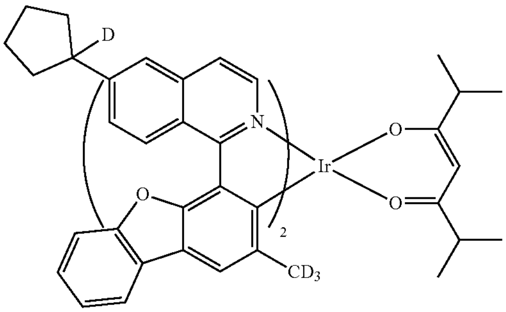
CPD 147
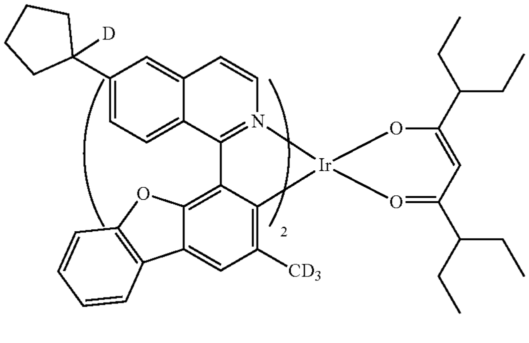
-continued
CPD 148
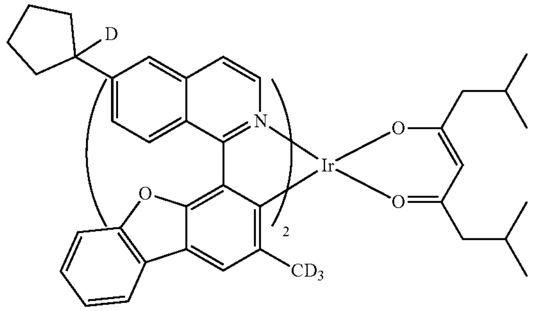
CPD 149
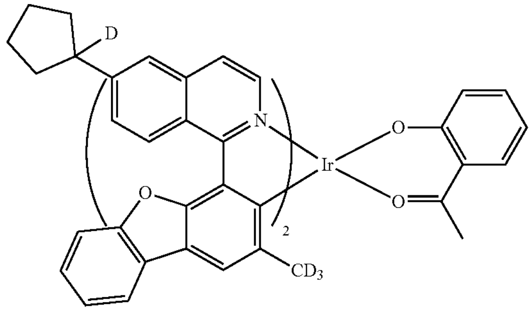
CPD 150
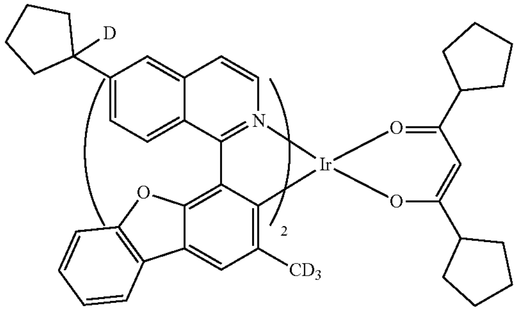
CPD 151
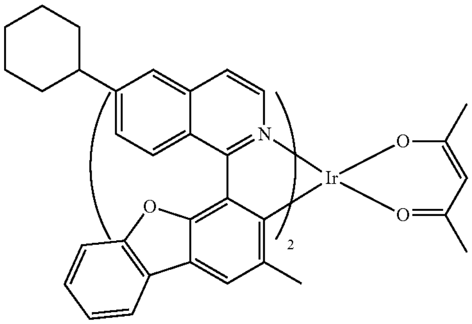

-continued
CPD 152
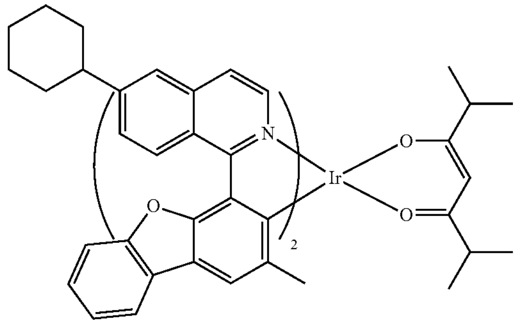
CPD 153
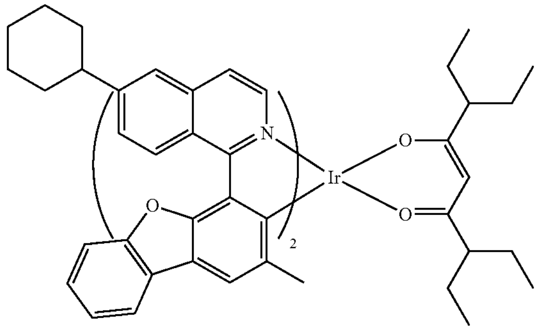
CPD 154
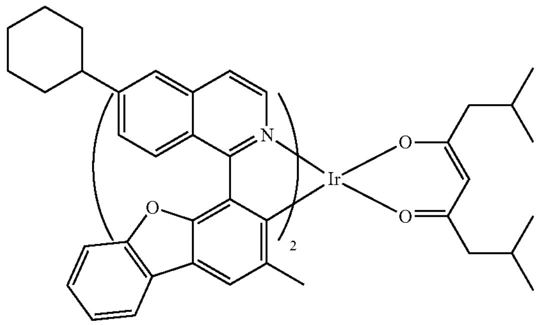
CPD 155
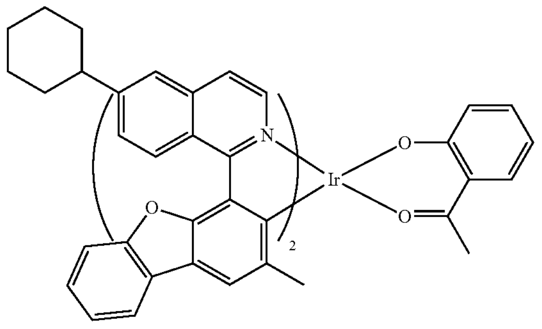
-continued
CPD 156
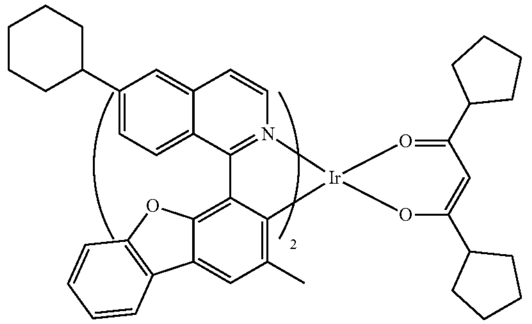
CPD 157
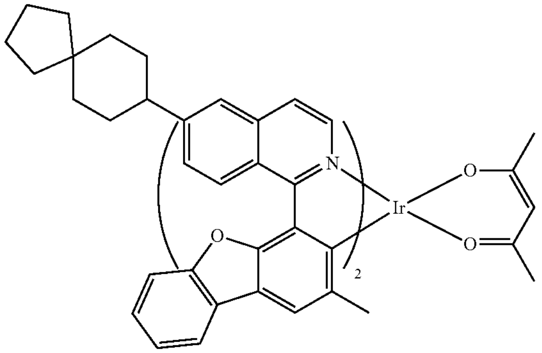
CPD 158
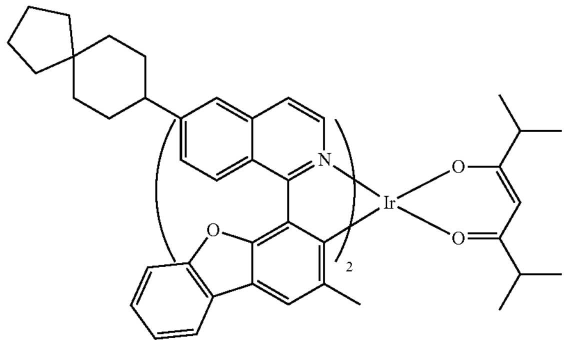
CPD 159
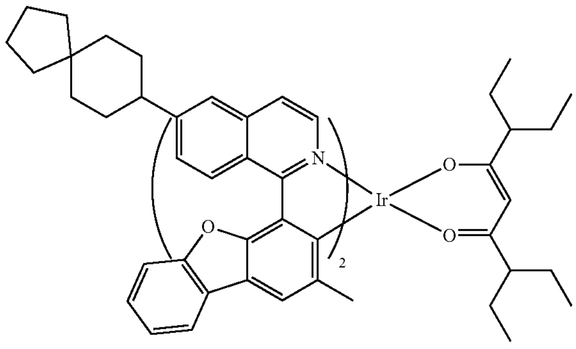

-continued
CPD 160
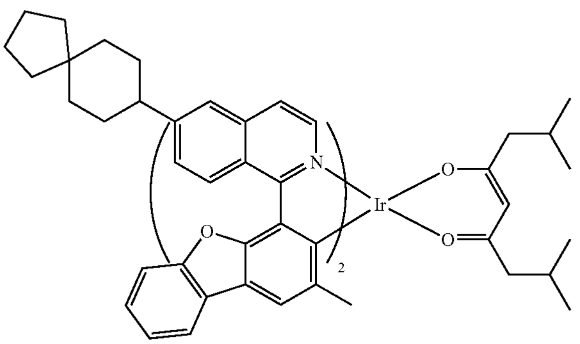
CPD 161
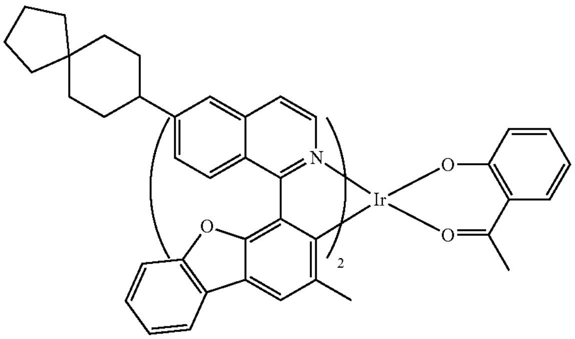
CPD 162
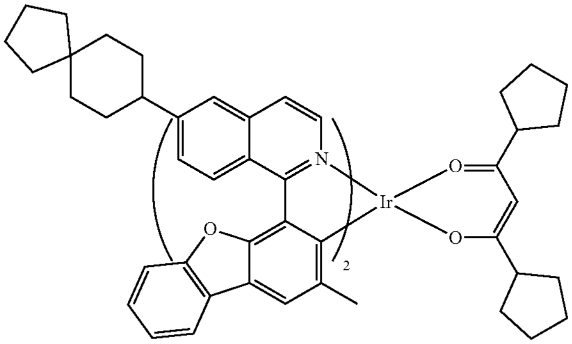
CPD 163
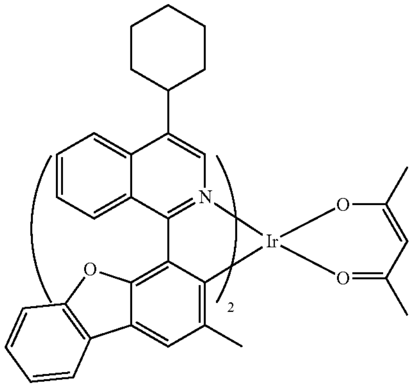
-continued
CPD 164
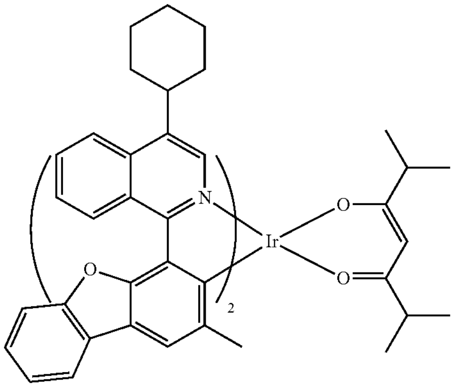
CPD 165
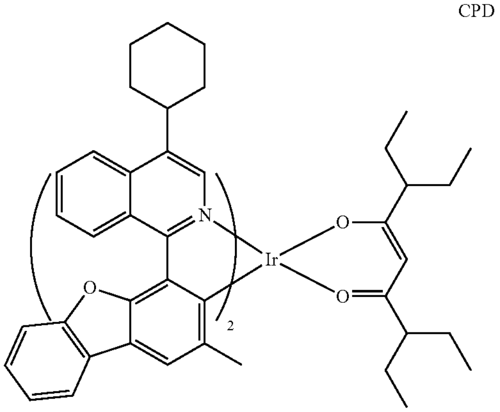
CPD 166
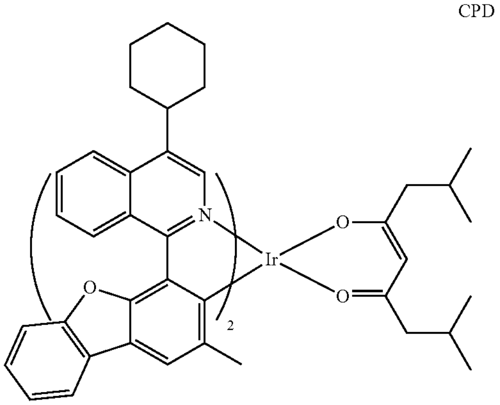
CPD 167
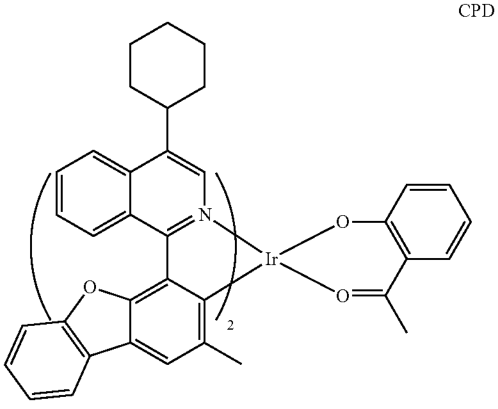

-continued
CPD 168
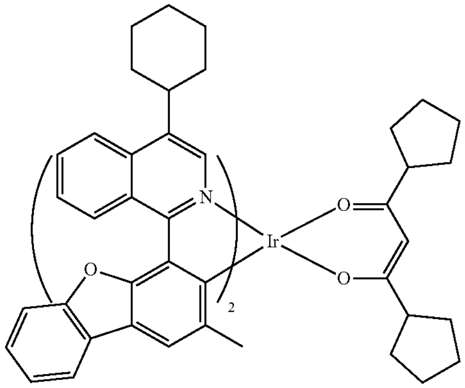
CPD 169
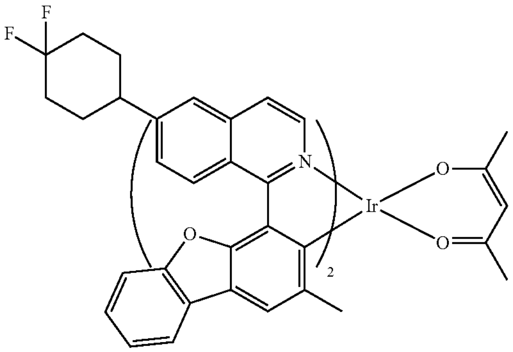
CPD 170
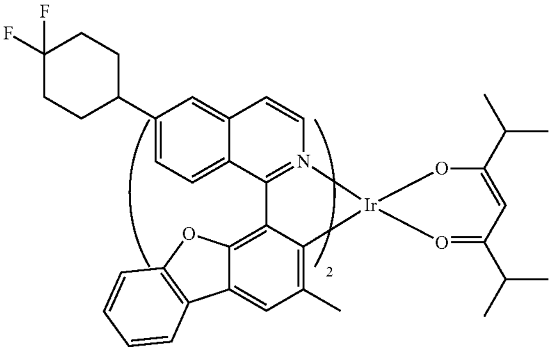
CPD 171
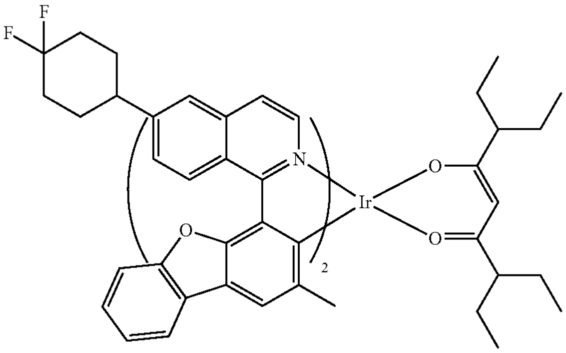
-continued
CPD 172
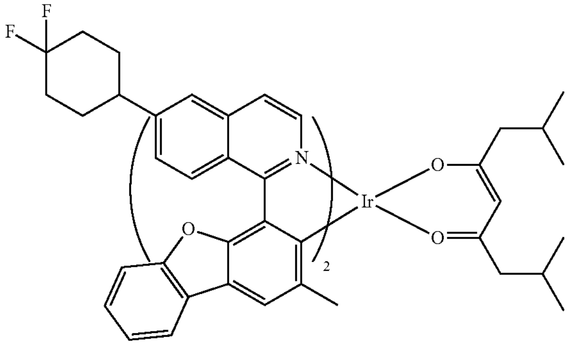
CPD 173
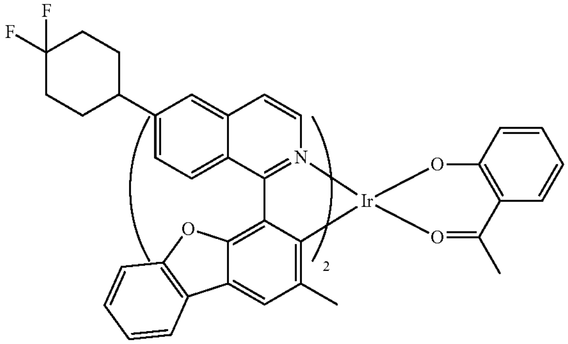
CPD 174
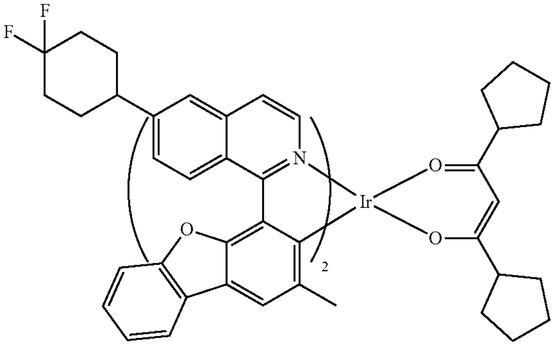
CPD 175
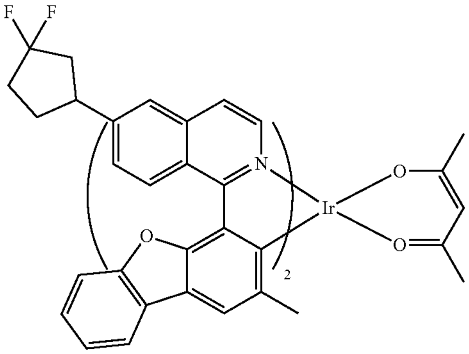

-continued
CPD 176
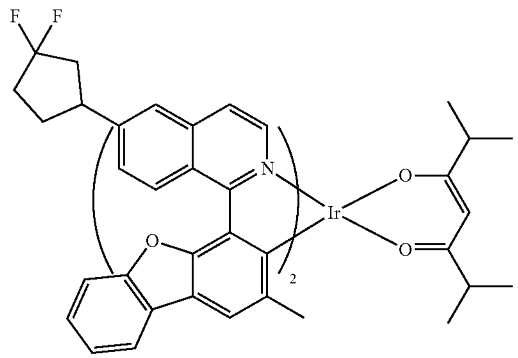
CPD 177
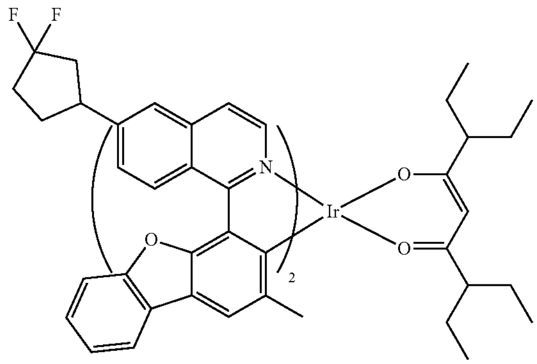
CPD 178
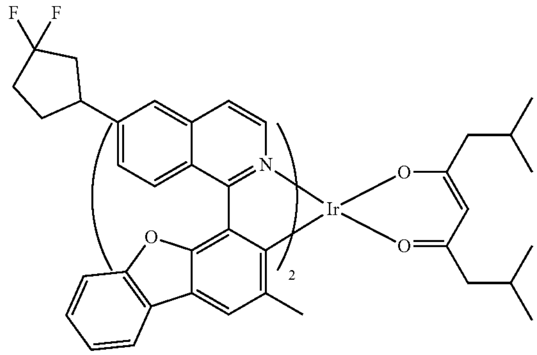
CPD 179
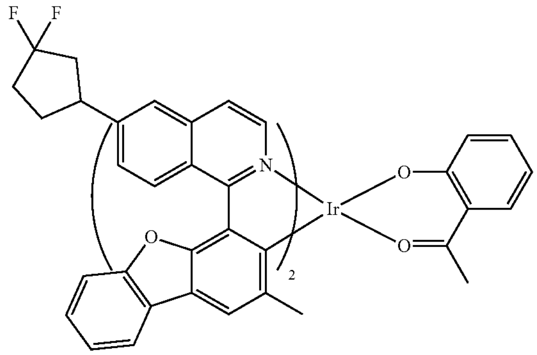
-continued
CPD 180
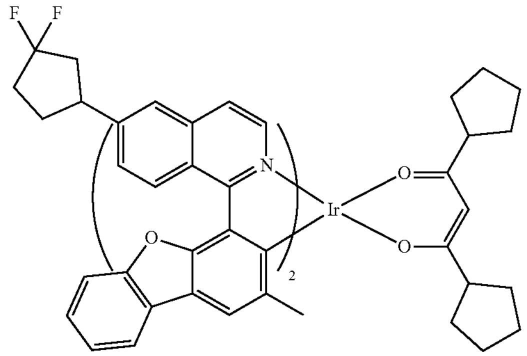
CPD 181
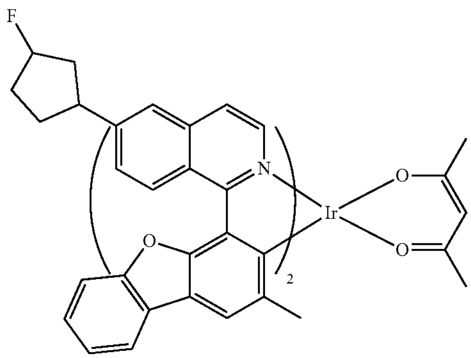
CPD 182
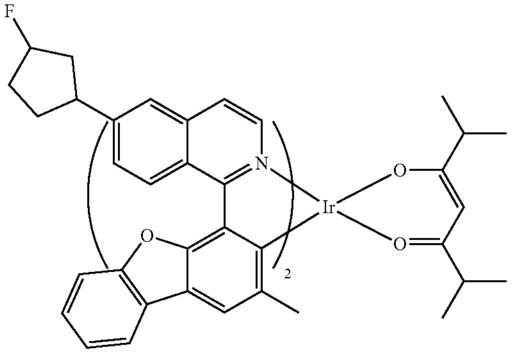
CPD 183
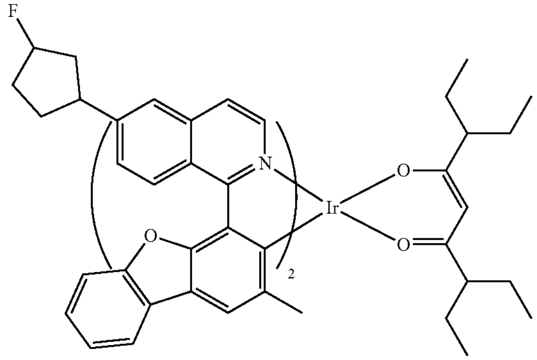

-continued
CPD 184
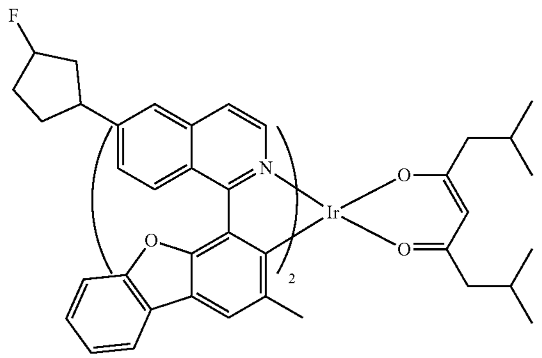
CPD 185
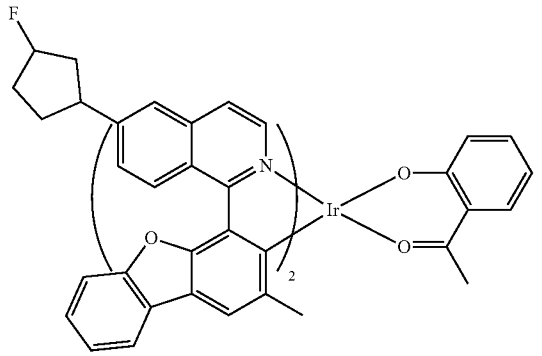
CPD 186
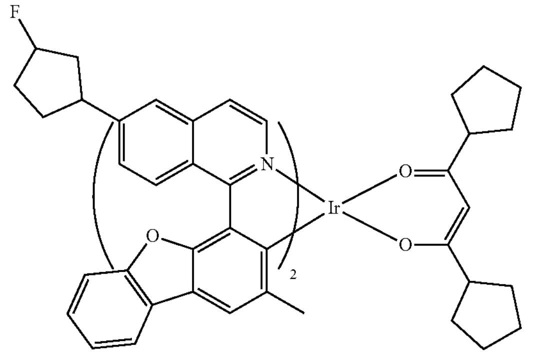
CPD 187
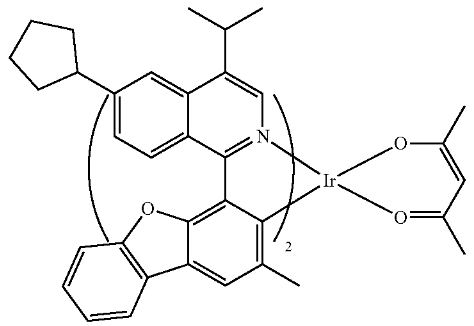
-continued
CPD 188
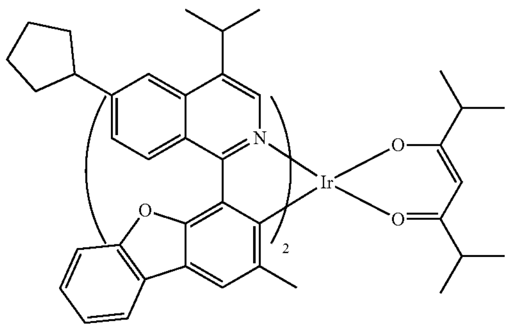
CPD 189
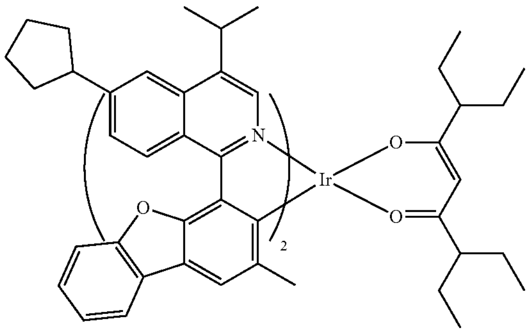
CPD 190
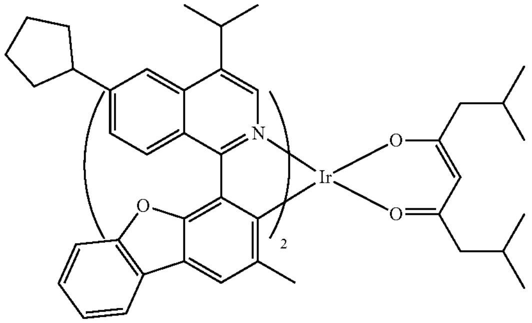
CPD 191
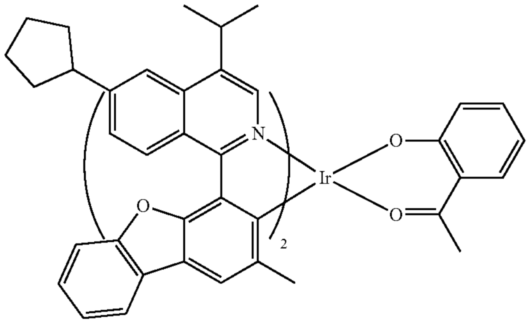

-continued
CPD 192
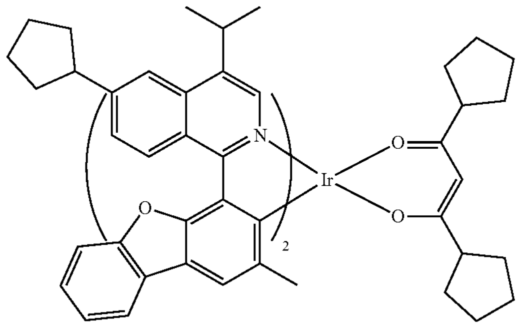
CPD 193
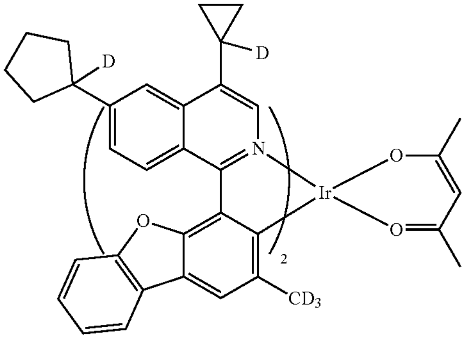
CPD 194
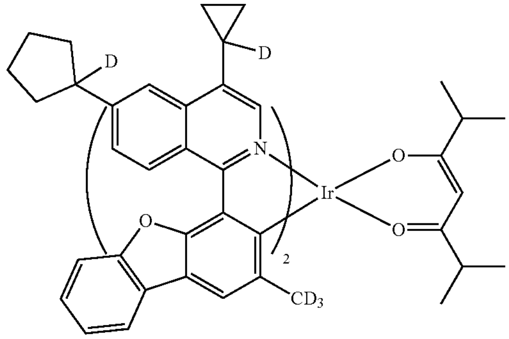
CPD 195
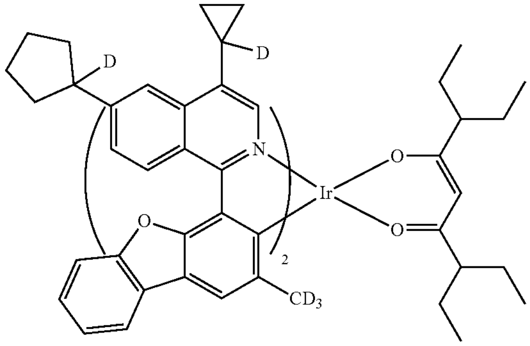
-continued
CPD 196
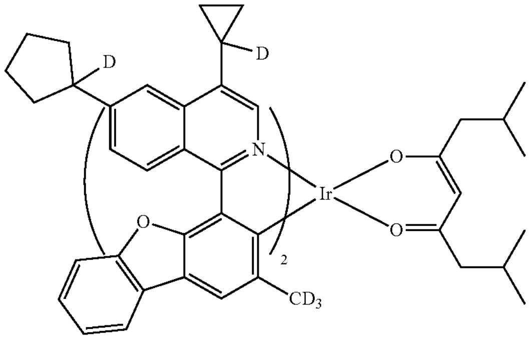
CPD 197
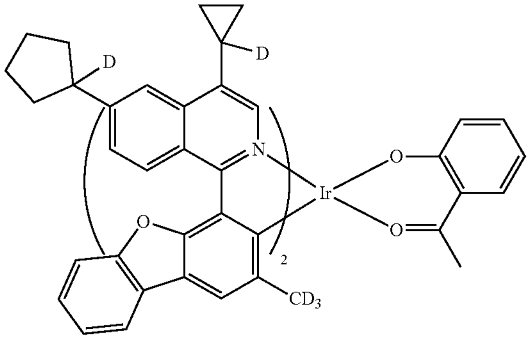
CPD 198
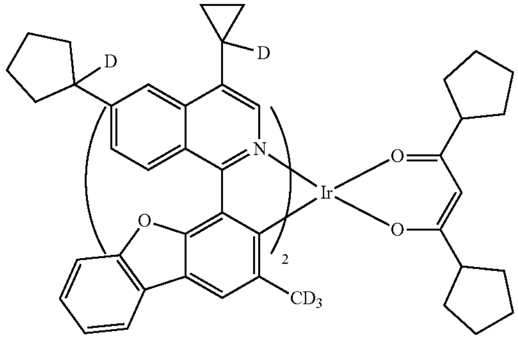
CPD 199
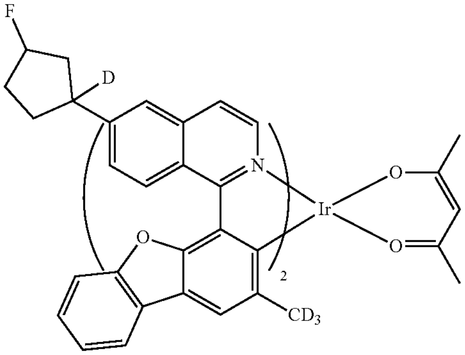

-continued
CPD 200
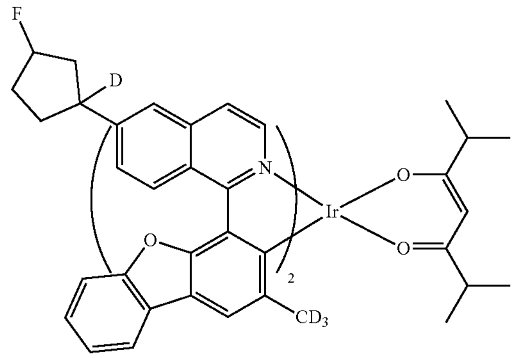
CPD 201
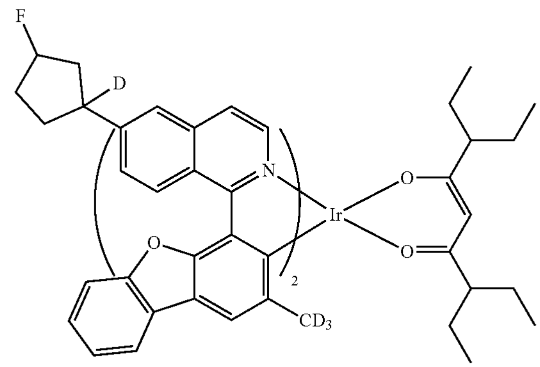
CPD 202
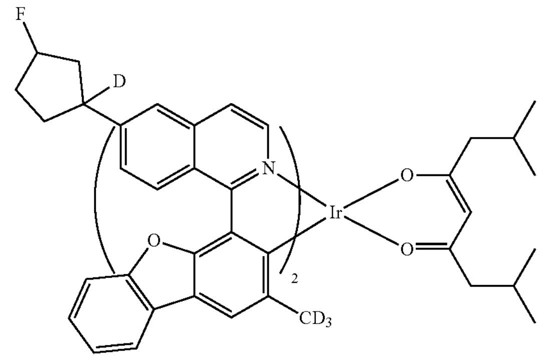
CPD 203
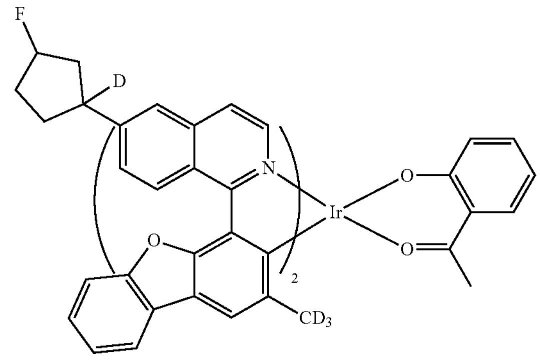
-continued
CPD 204
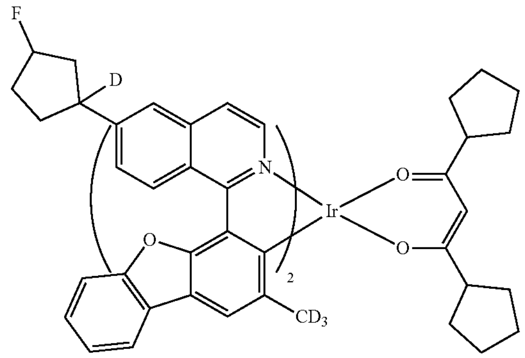
CPD 205
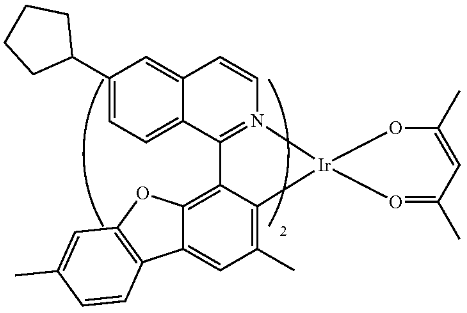
CPD 206
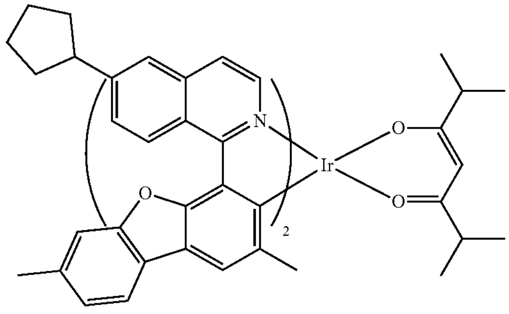
CPD 207
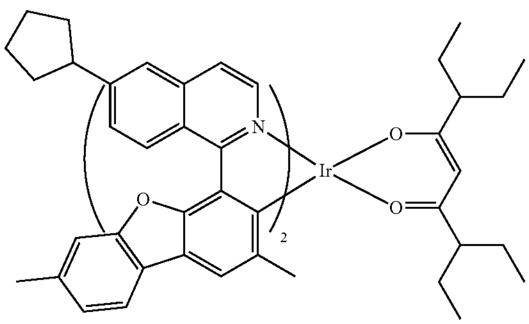

-continued
CPD 208
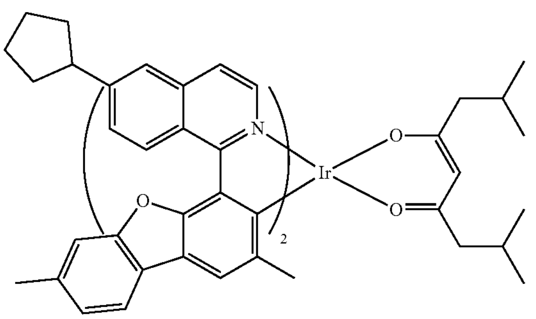
CPD 209
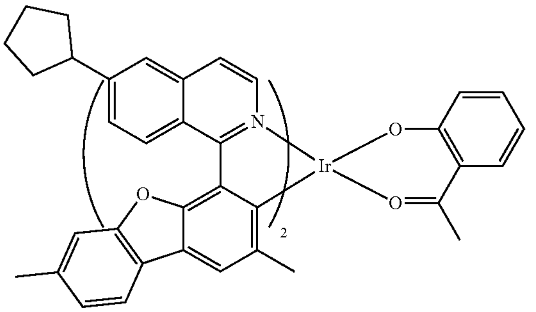
CPD 210
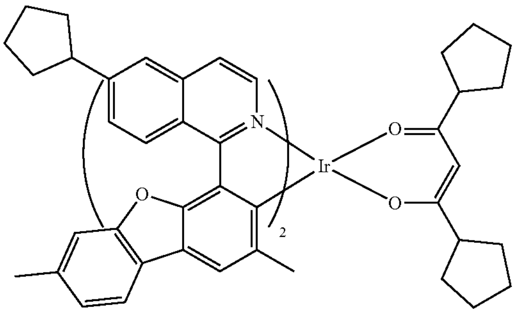
CPD 211
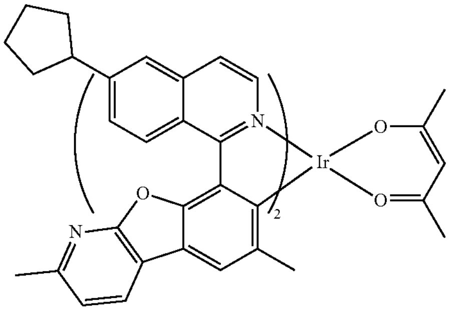
-continued
CPD 212
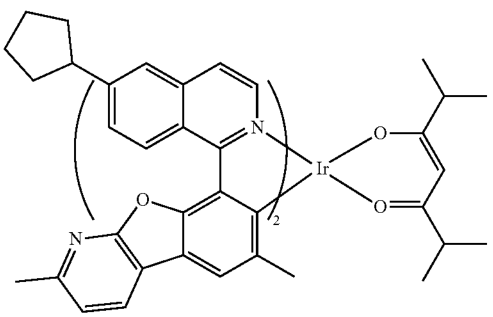
CPD213
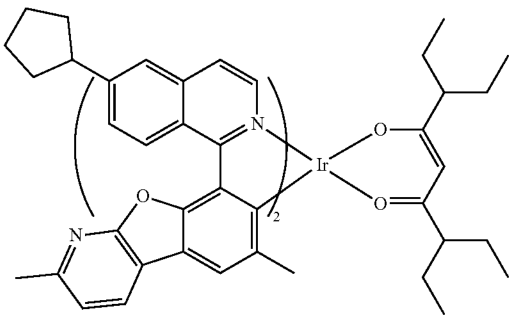
CPD 214
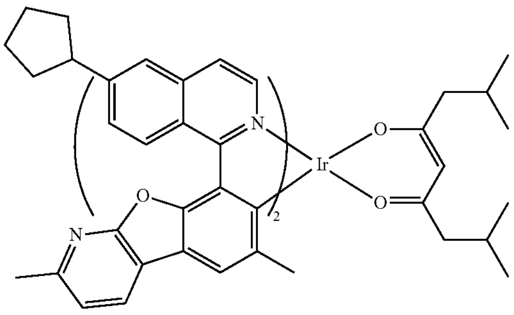
CPD 215
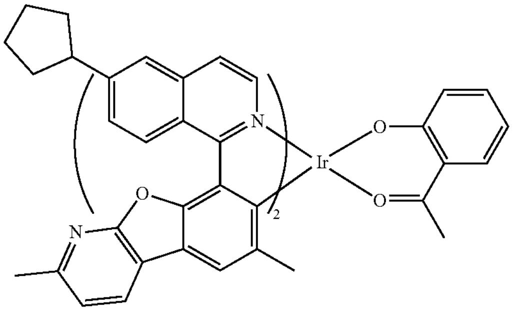

-continued
CPD 216
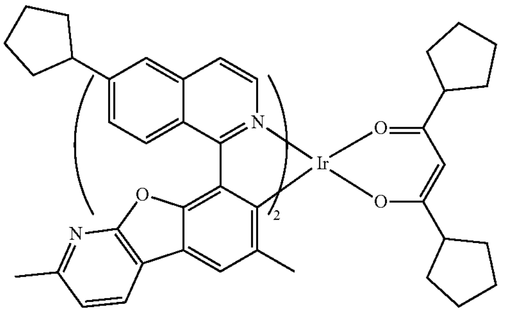
CPD 217
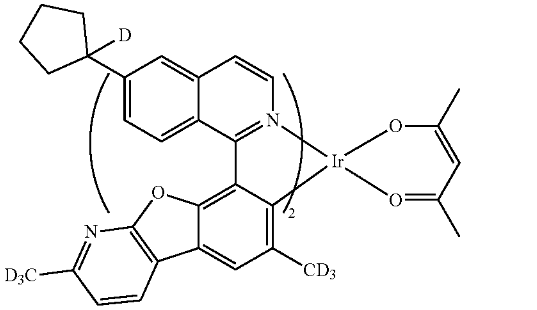
CPD 218
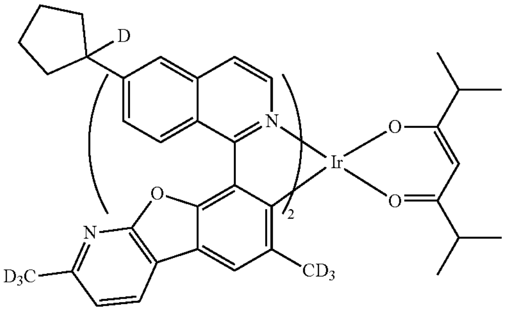
CPD 219
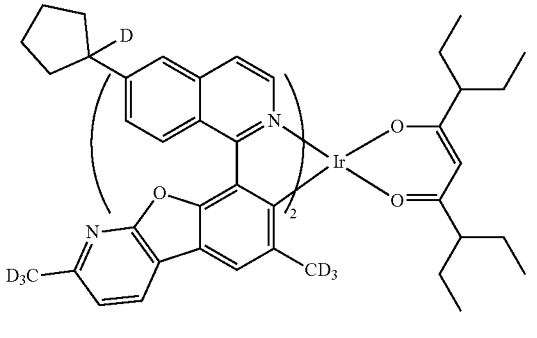
-continued
CPD 220
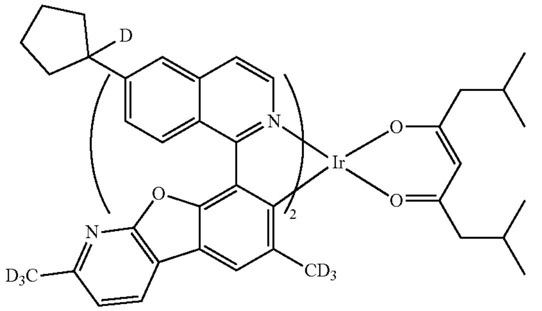
CPD 221
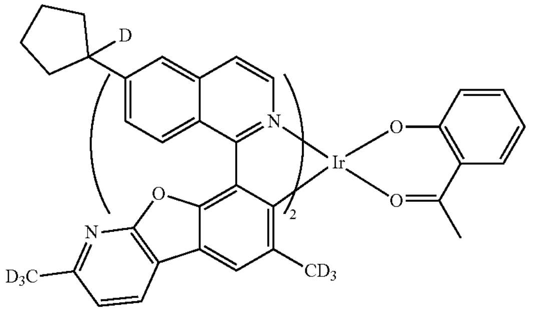
CPD 222
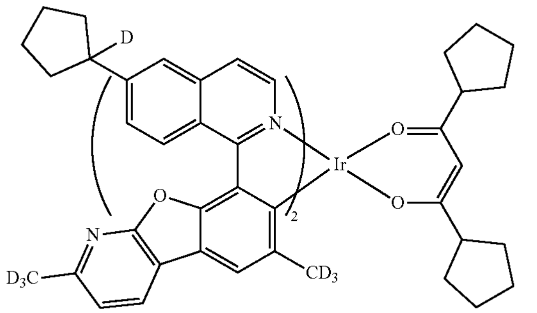
CPD 223
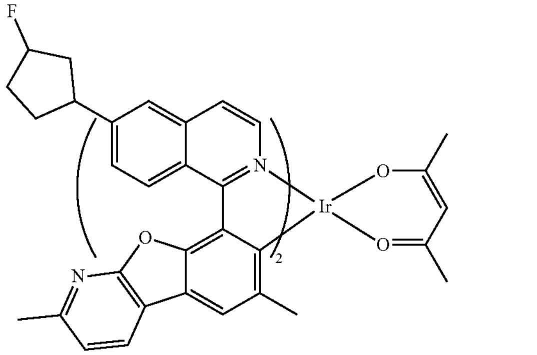

-continued
CPD 224
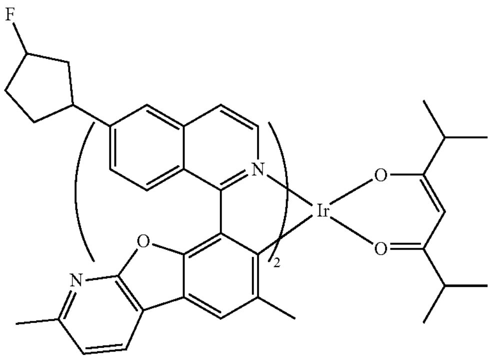
CPD 225
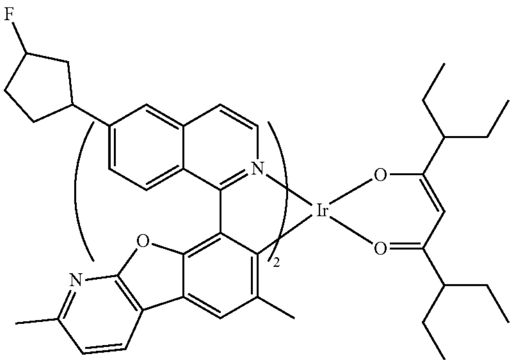
CPD 226
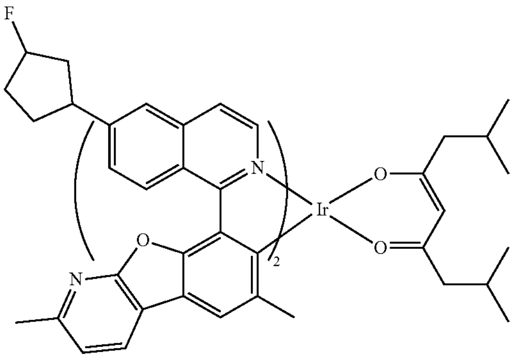
CPD 227
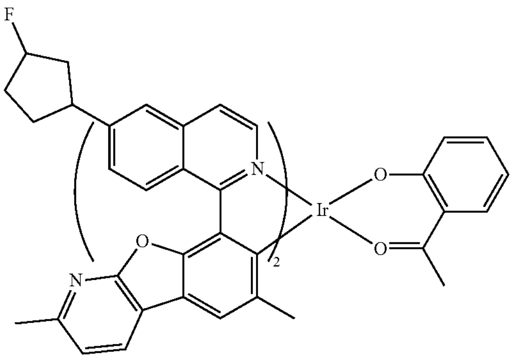
-continued
CPD 228
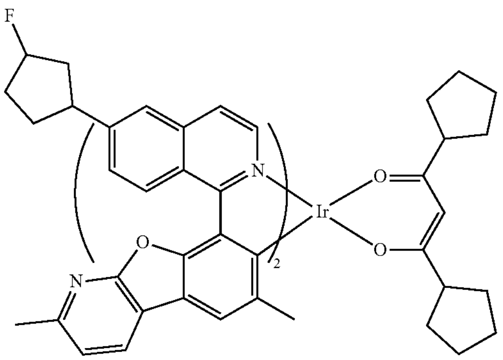
CPD 229
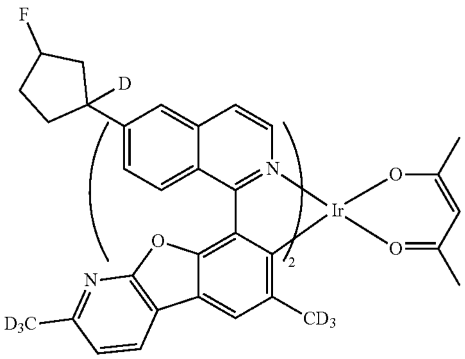
CPD 230
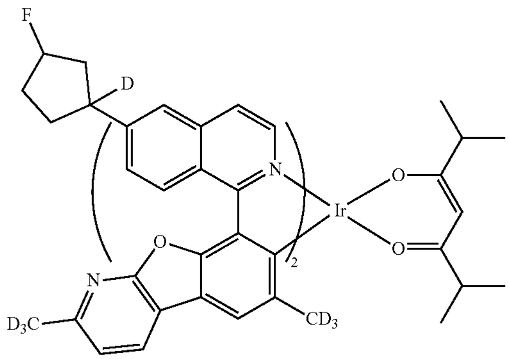
CPD 231
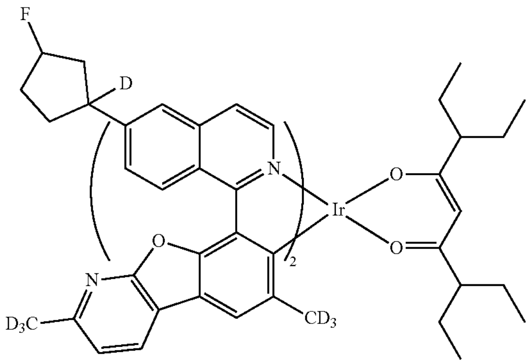

CPD 232
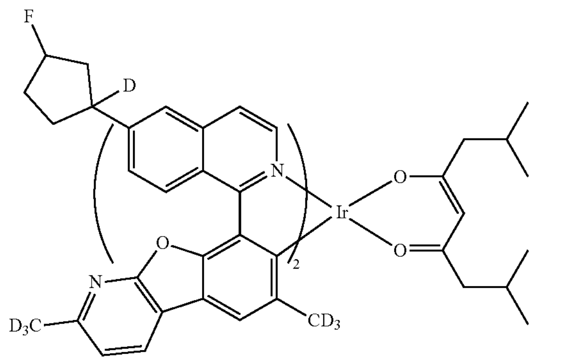
CPD 233
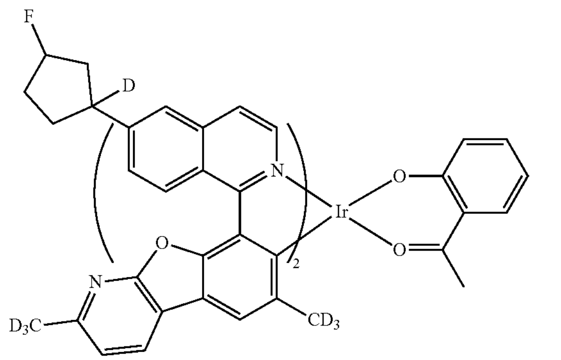
CPD 234
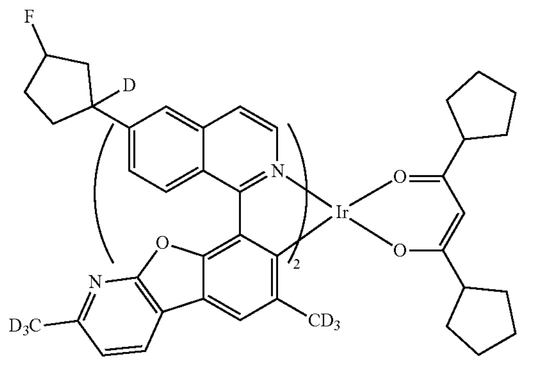
CPD 235
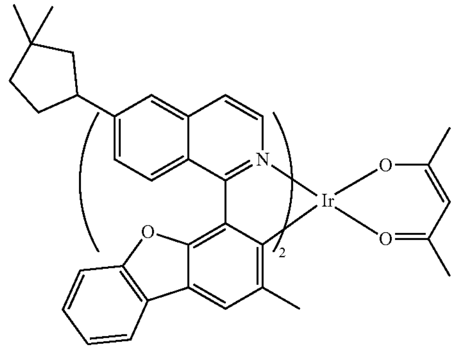
CPD 236
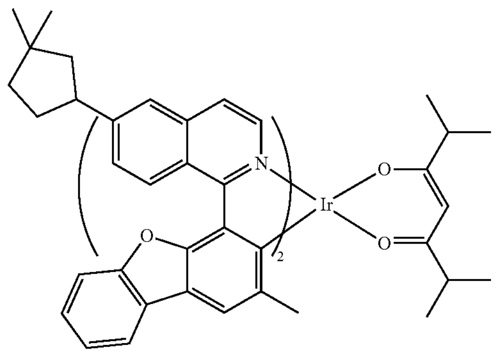
CPD 237
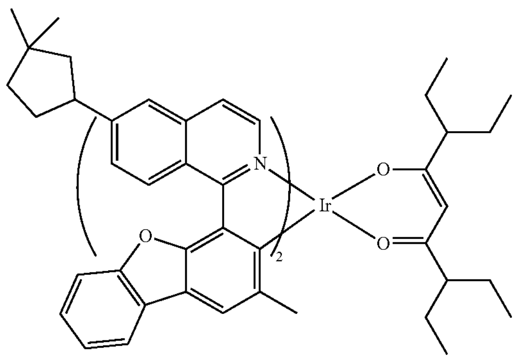
CPD 238
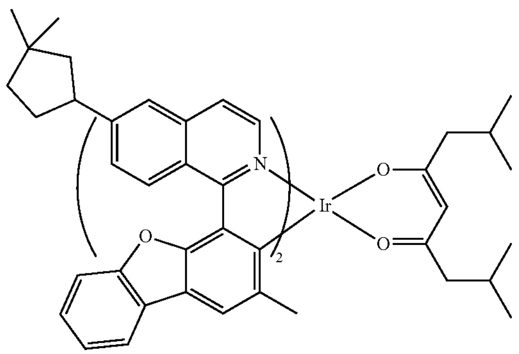
CPD 239
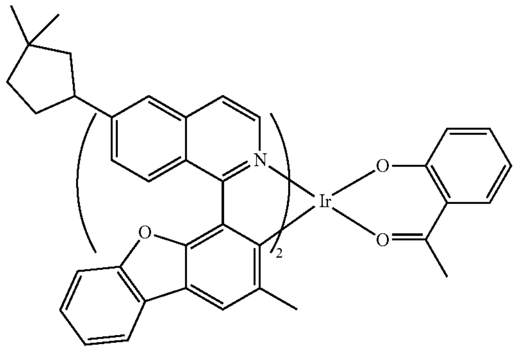

-continued
CPD 240
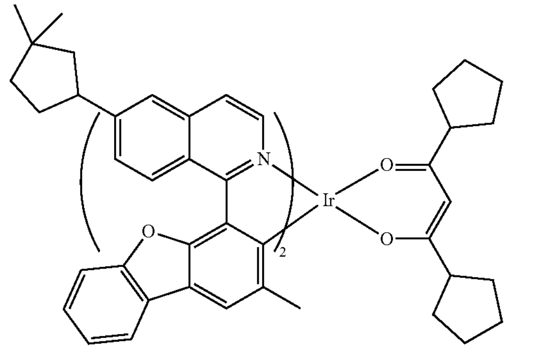
CPD 241
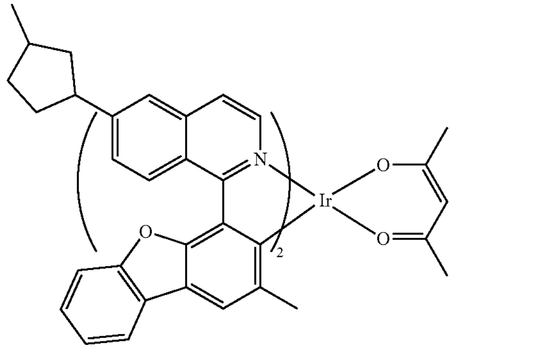
CPD 242
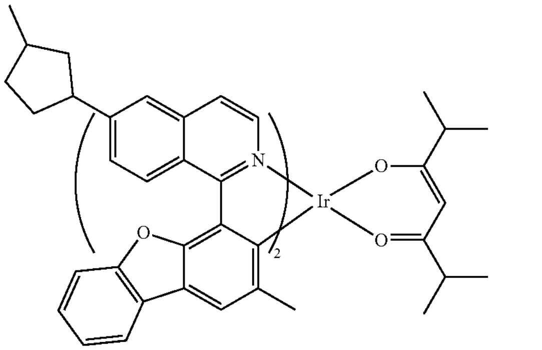
CPD 243
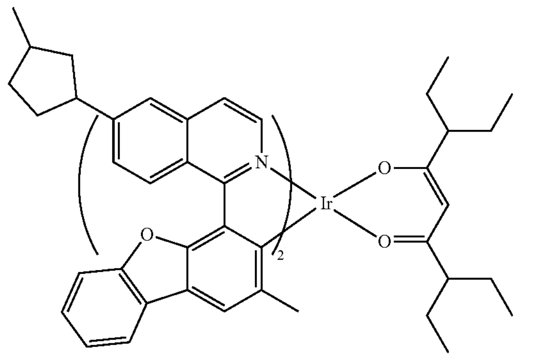
-continued
CPD 244
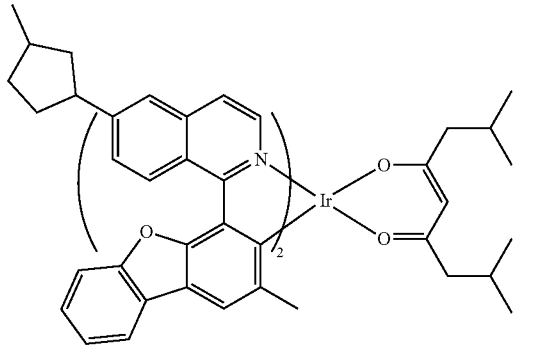
CPD 245
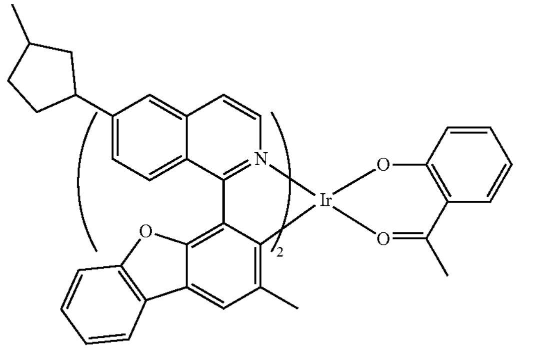
CPD 246
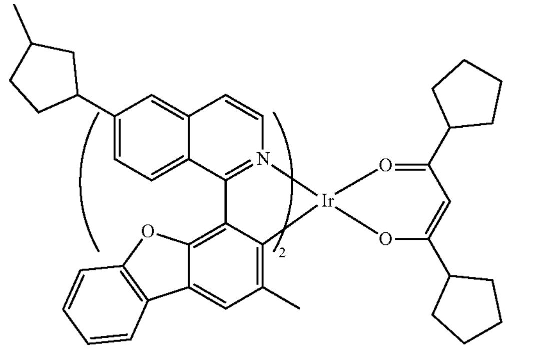
CPD 247
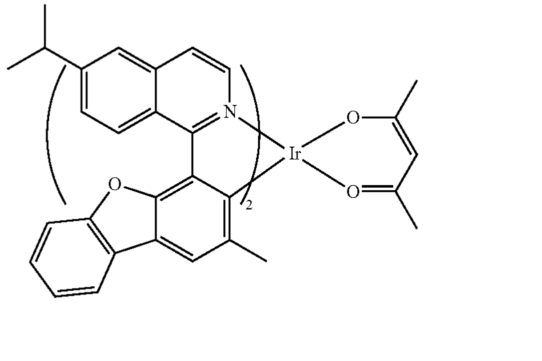

-continued
CPD 248
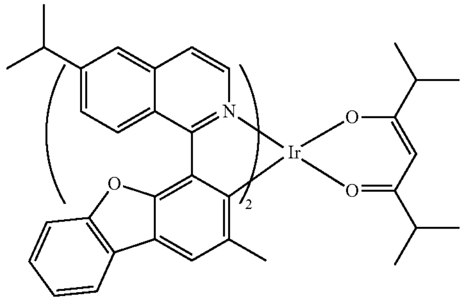
CPD 249
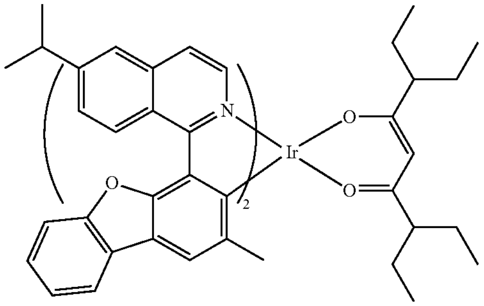
CPD 250
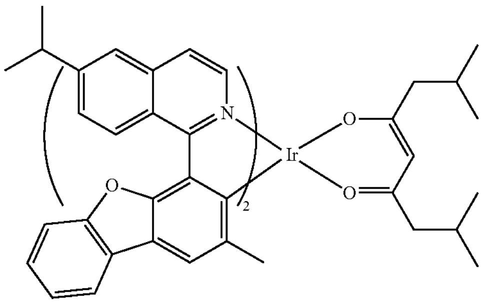
CPD 251
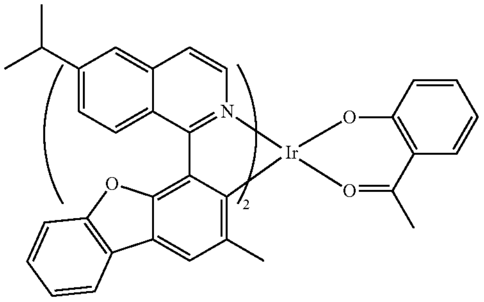
CPD 252
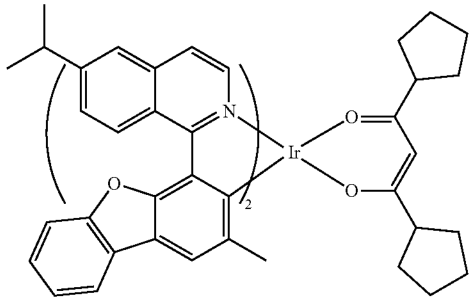
-continued
CPD 253
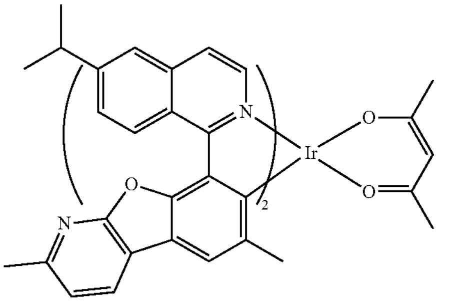
CPD 254
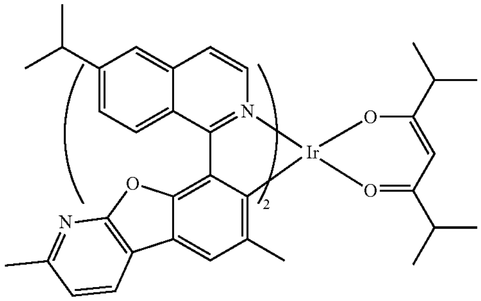
CPD 255
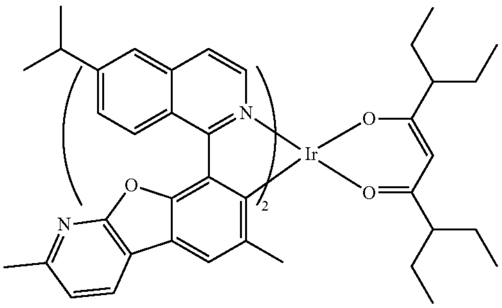
CPD 256
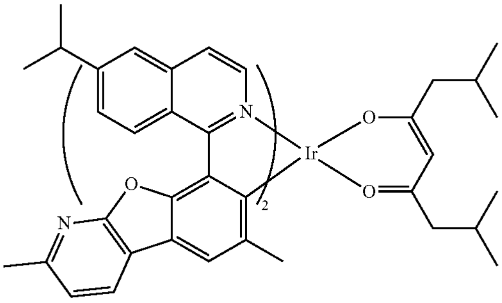
CPD 257
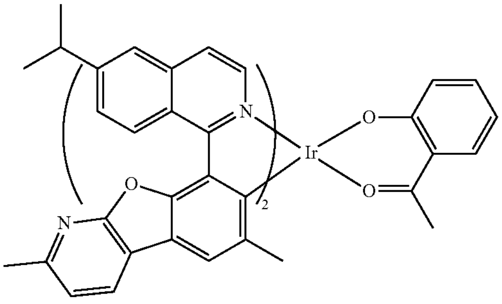

-continued
CPD 258
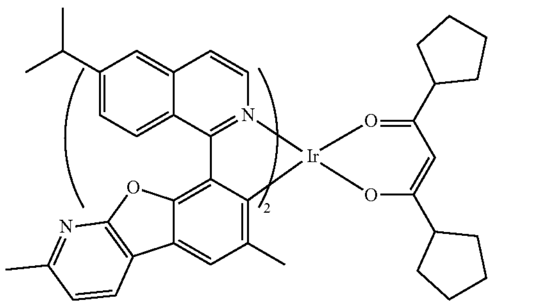
CPD 259
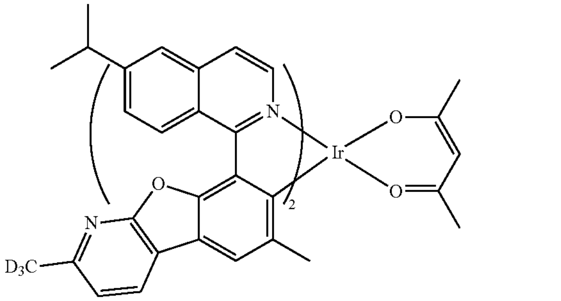
CPD 260
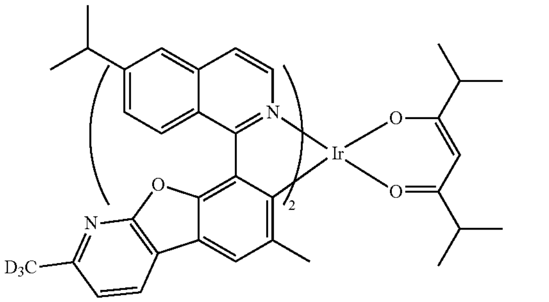
CPD 261
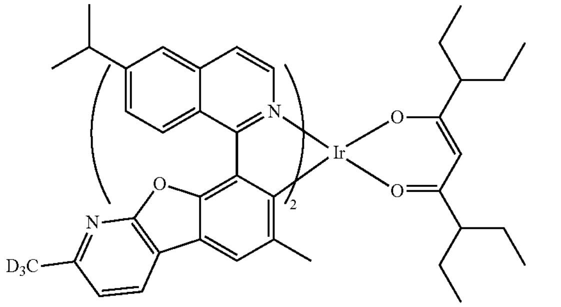
CPD 262
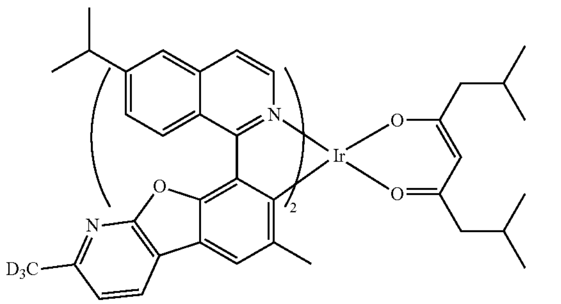
-continued
CPD 263
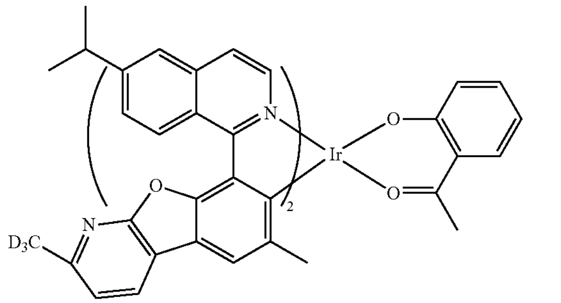
CPD 264
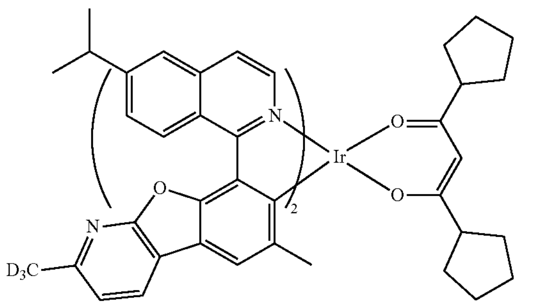
CPD 265
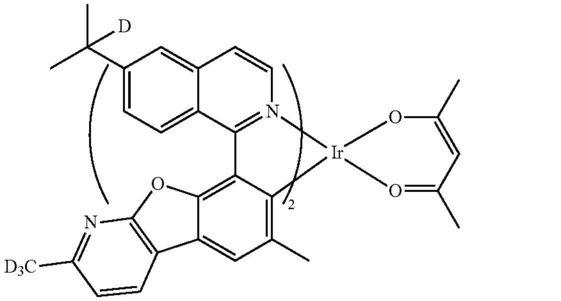
CPD 266
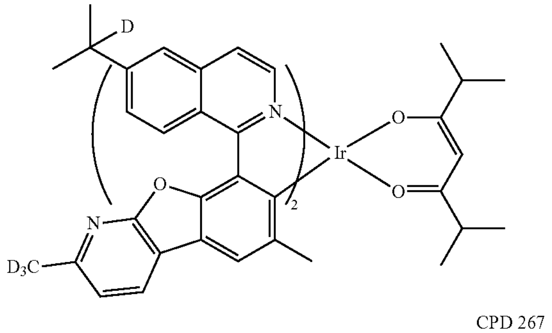
CPD 267
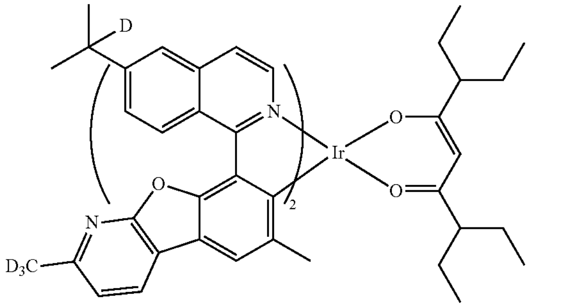

-continued
CPD 268
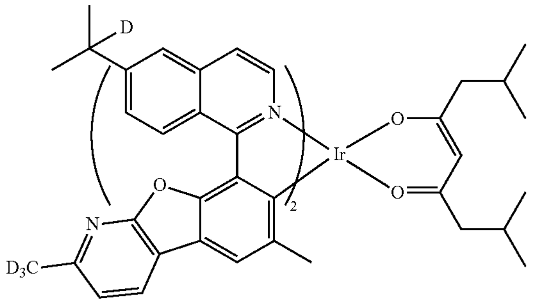
CPD 269
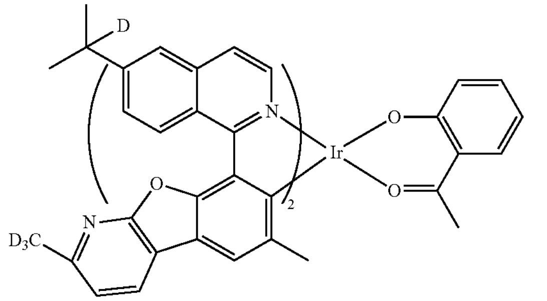
CPD 270
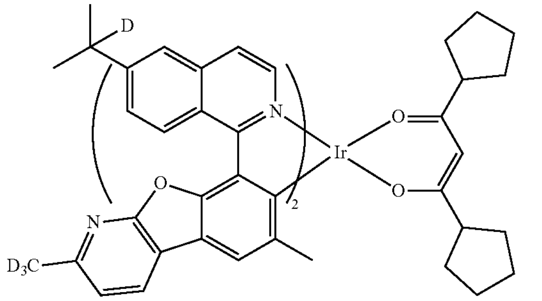
CPD 271
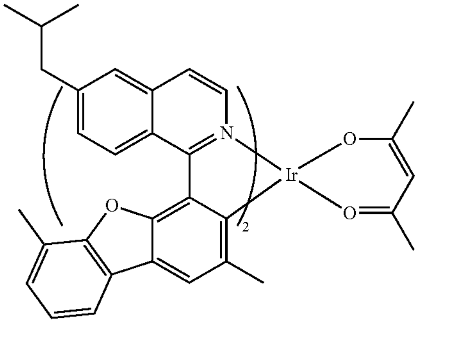
CPD 272
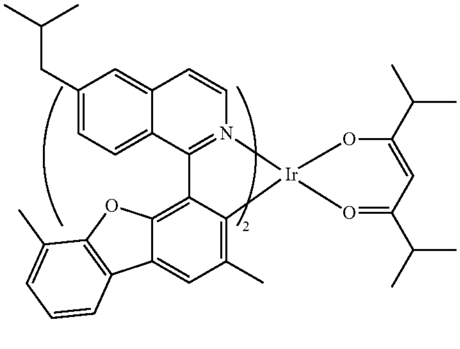
-continued
CPD 273
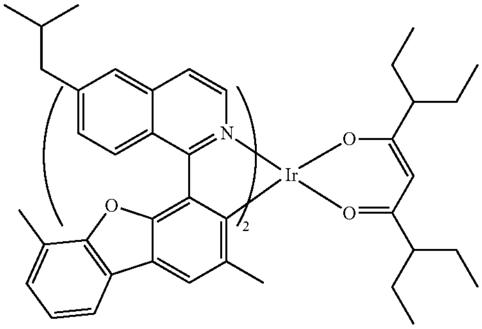
CPD 274
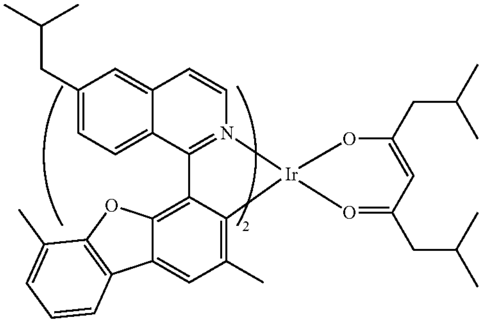
CPD 275
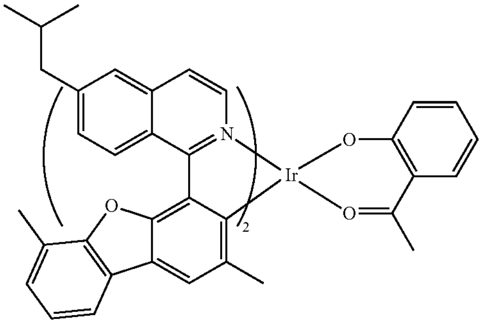
CPD 276
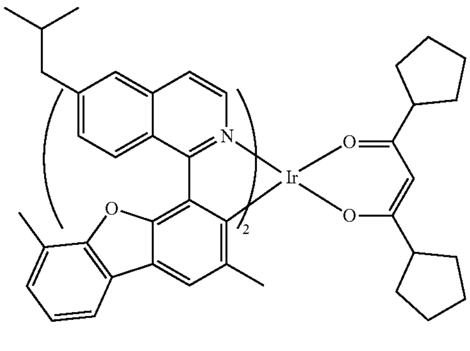

-continued
CPD 277
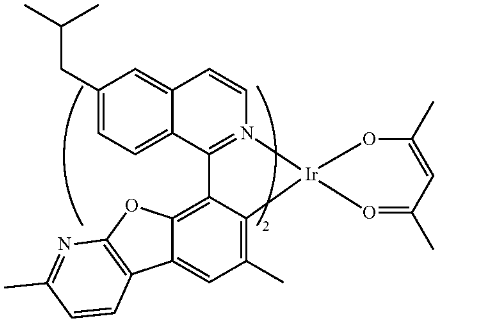
CPD 278
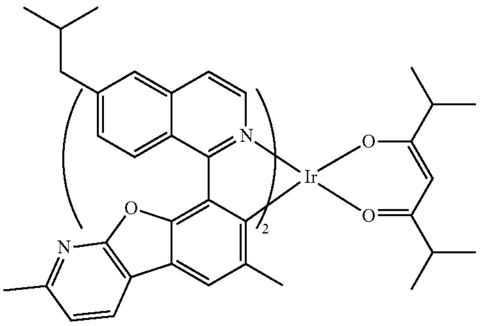
CPD 279
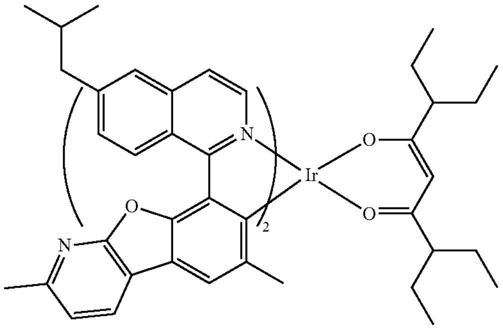
CPD 280
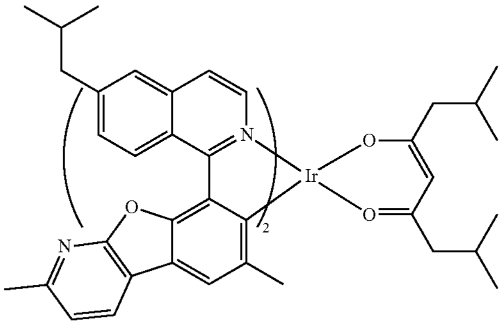
-continued
CPD 281
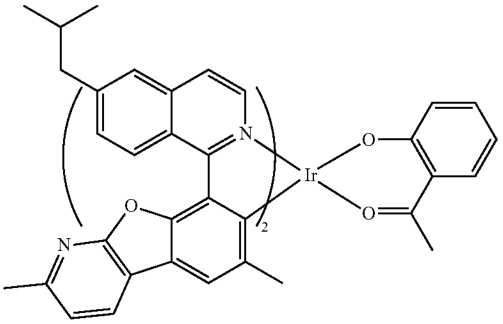
CPD 282
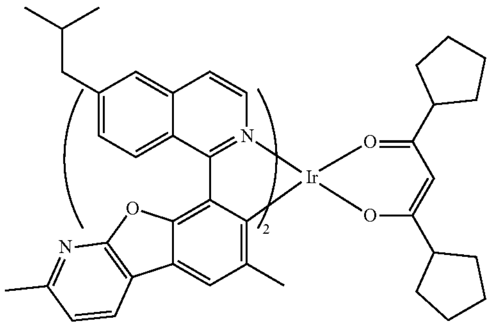
CPD 283
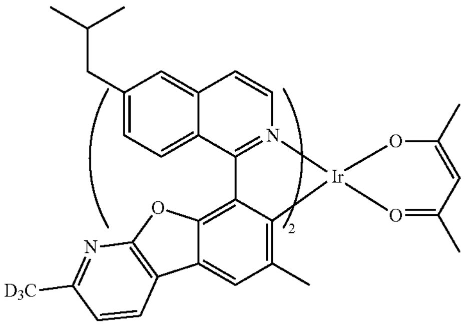
CPD 284
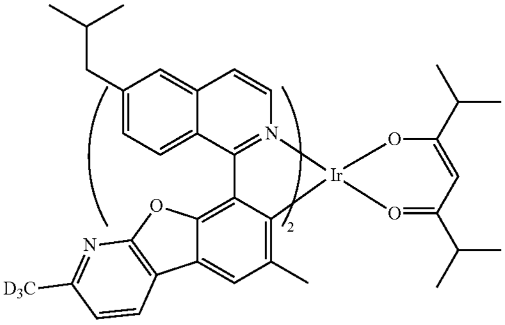

-continued
CPD 285
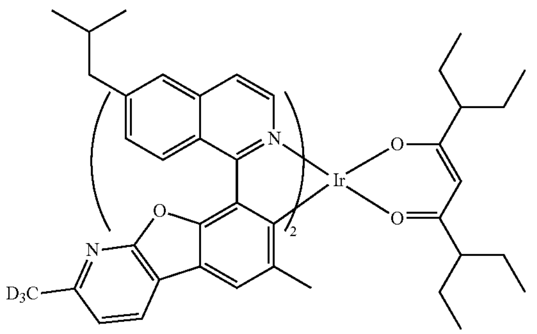
CPD 286
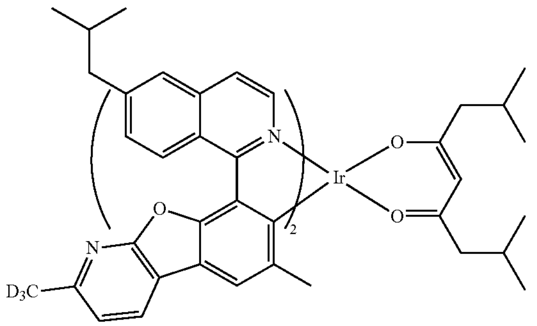
CPD 287
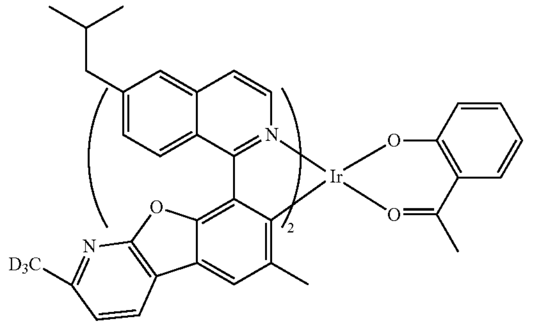
CPD 288
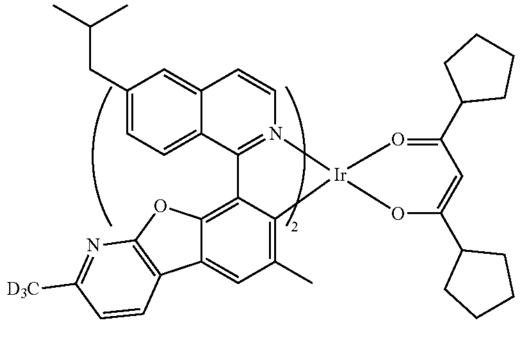
-continued
CPD 289
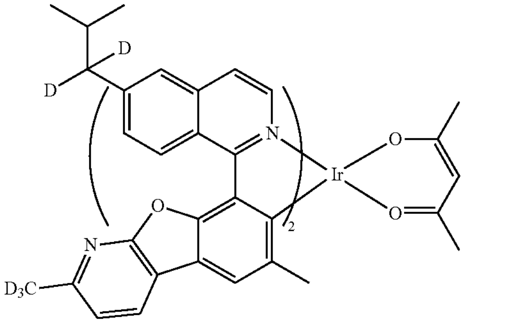
CPD 290
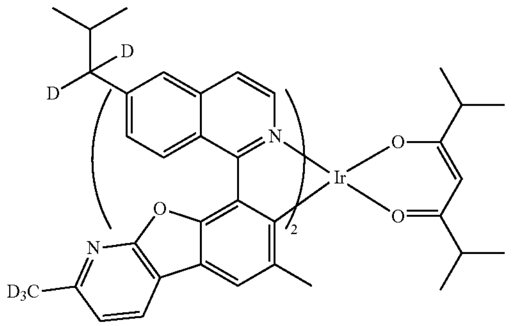
CPD 291
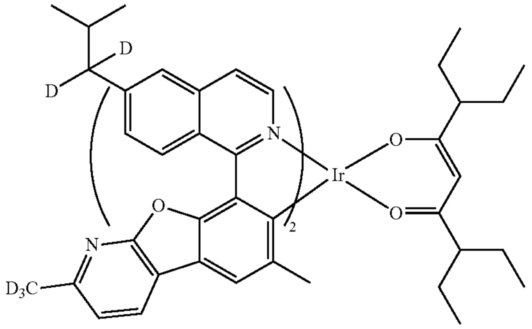
CPD 292
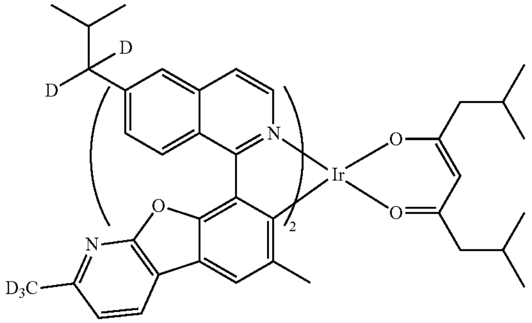

-continued
CPD 293
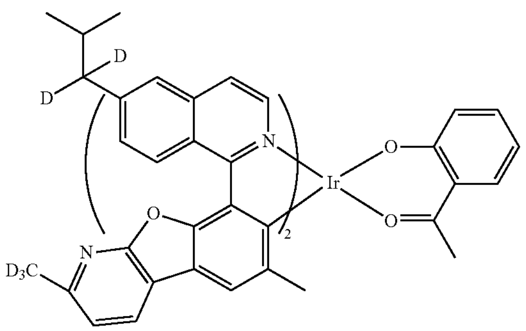
CPD 294
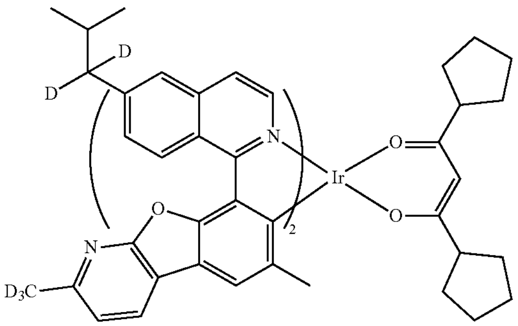
CPD 295
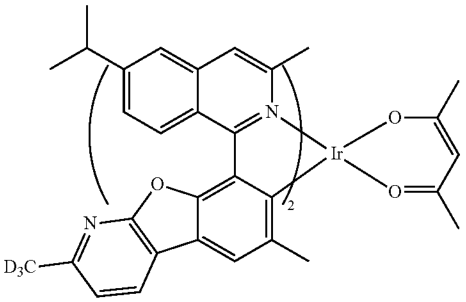
CPD 296
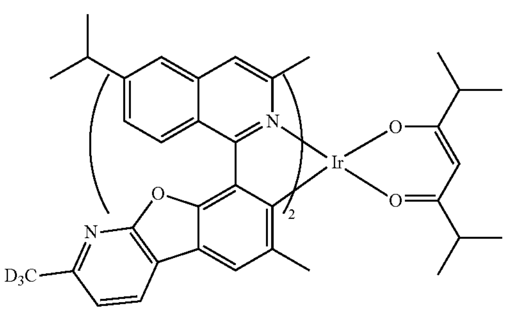
-continued
CPD 297
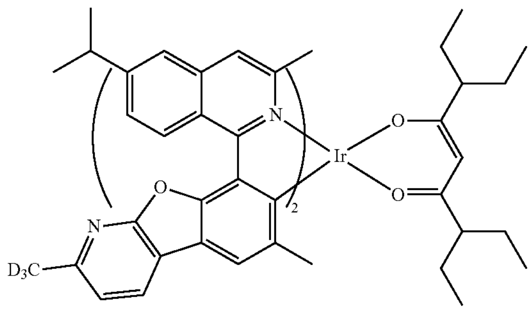
CPD 298
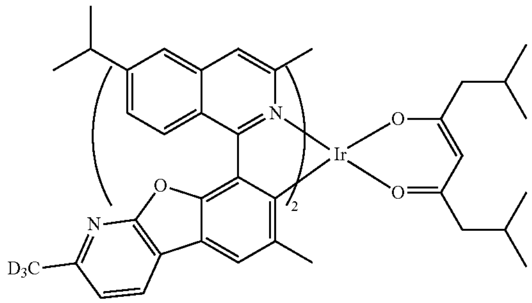
CPD 299
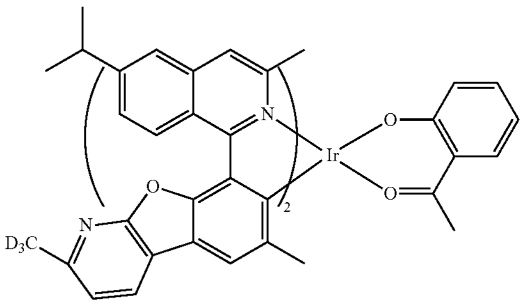
CPD 300
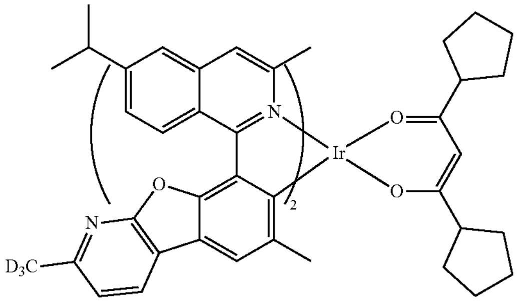
CPD 301
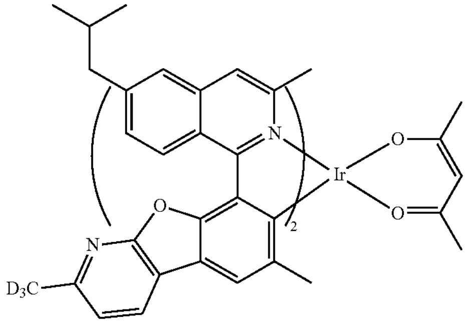

-continued
CPD 302
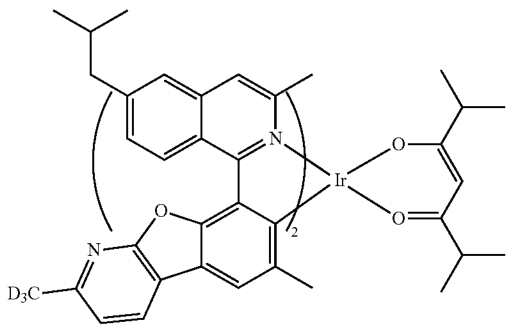
CPD 303
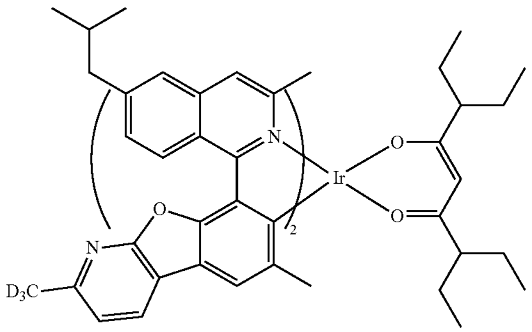
CPD 304
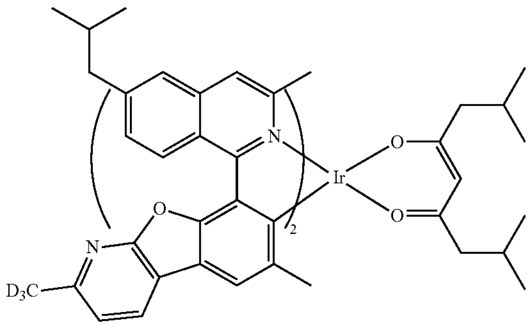
CPD 305
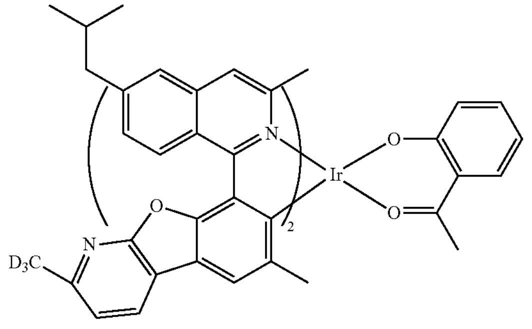
-continued
CPD 306
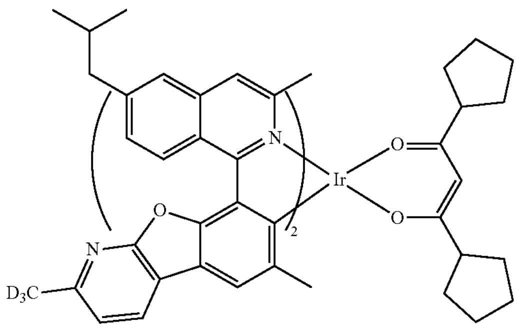
CPD 307
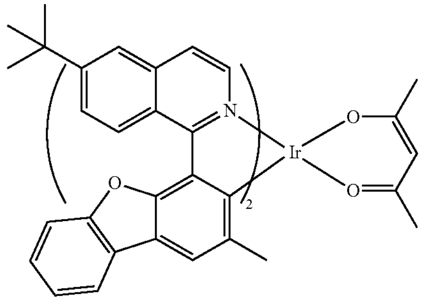
CPD 308
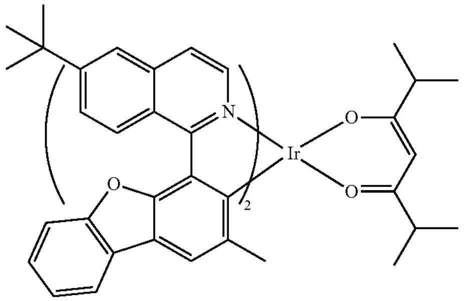
CPD 309
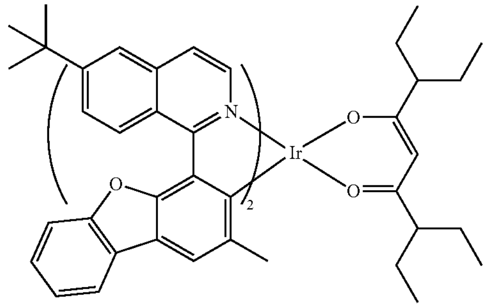
CPD 310
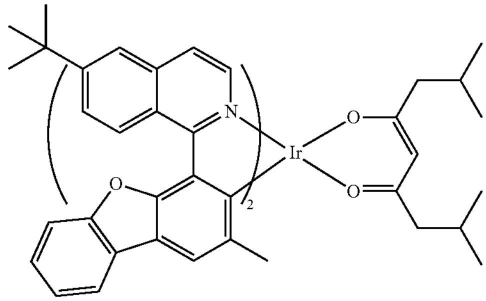

-continued
CPD 311
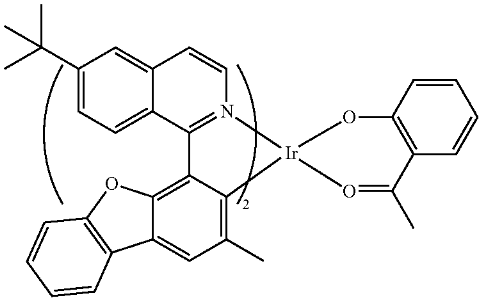
CPD 312
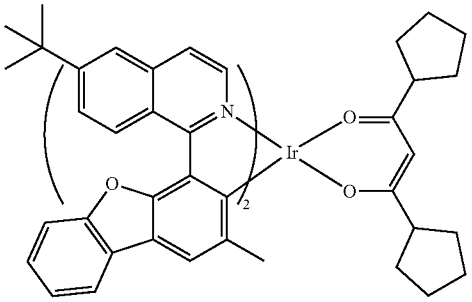
CPD 313
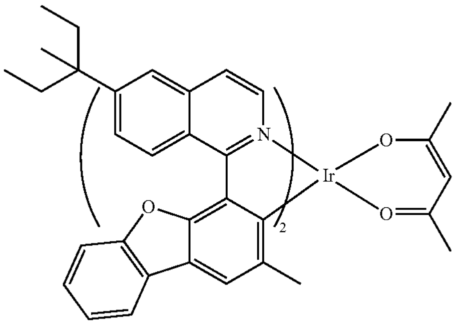
lp;1p
CPD 314
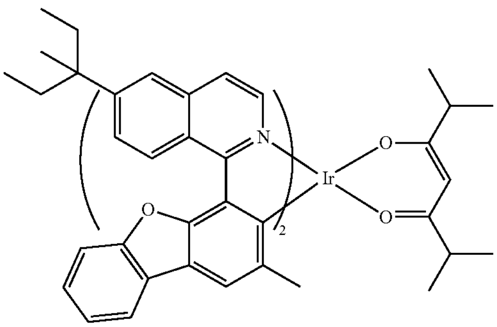
-continued
CPD 315
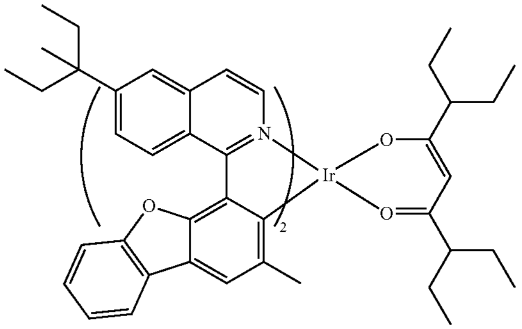
CPD 316
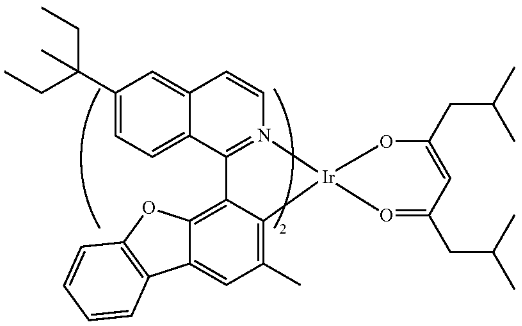
CPD 317
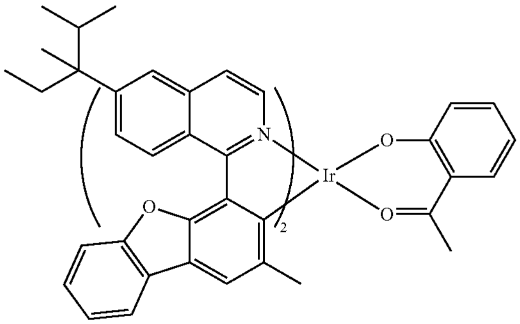
CPD 318
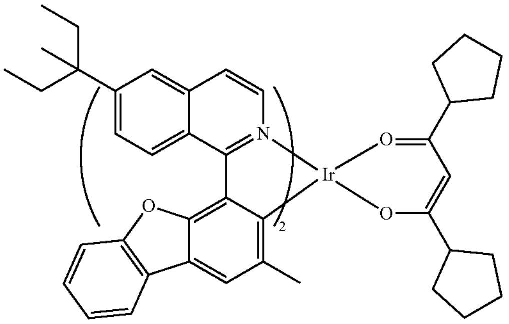

-continued

CPD 319

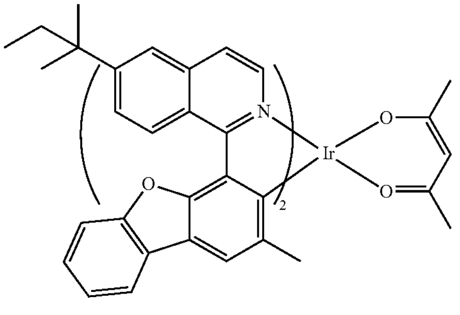

CPD 320

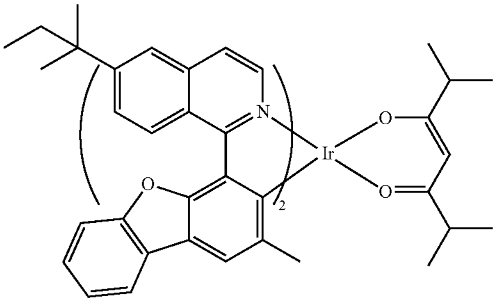

CPD 321

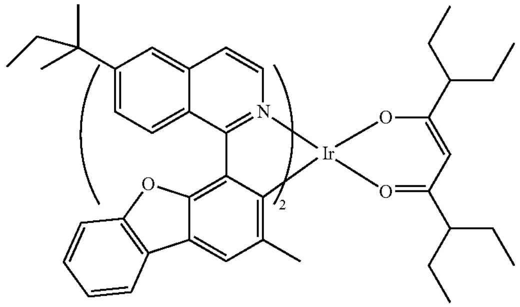

CPD 322

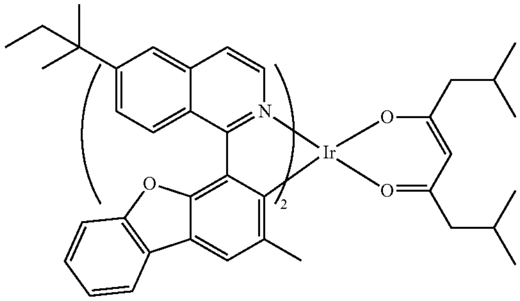

CPD 323

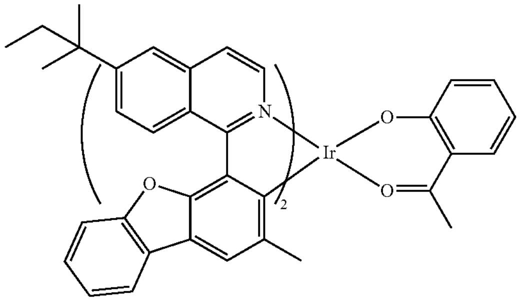

-continued

CPD 324

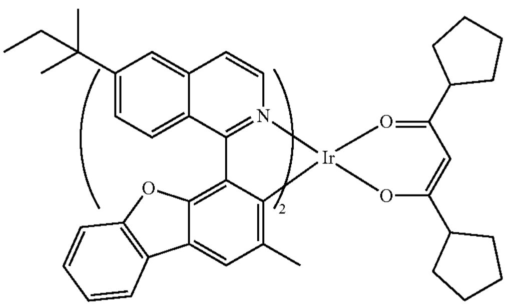

An electroluminescent device includes a cathode, an anode, and an organic layer arranged between the cathode and the anode.

The organic layer includes the metal iridium complex.

The organic layer includes a light-emitting layer, and the metal iridium complex is used as a red light-emitting doping material for the light-emitting layer; or the organic layer includes a hole injection layer, and the metal iridium complex is used as a hole injection material for the hole injection layer.

The material of the present invention has the advantages of low sublimation temperature, high optical and electrochemical stability, high color saturation, high luminescence efficiency, and long device service life. As a phosphorescent material, the material of the present invention can convert a triplet state into light, so that the luminescence efficiency of the organic electroluminescent device can be improved, and the energy consumption can be reduced.

DETAILED DESCRIPTION OF EMBODIMENTS

Figure 1:
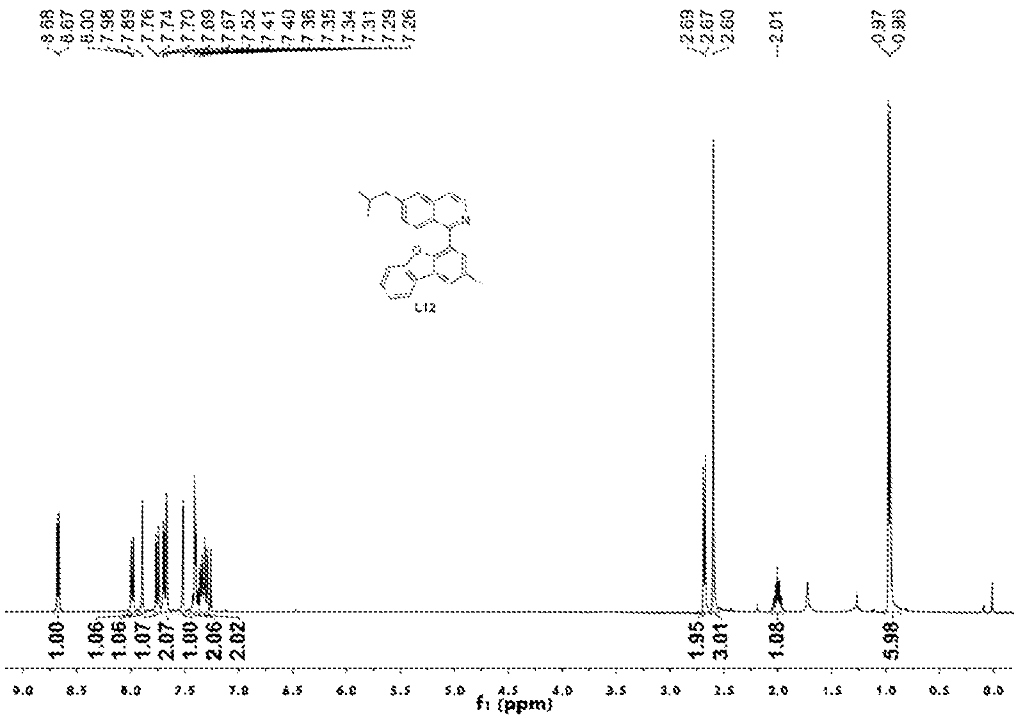
FIG. 1 is a diagram showing the 1HNMR spectrum of a compound L12 of the present invention in a deuterated chloroform solution.

The compound of the present invention is as shown in the following formula (I):

(I)

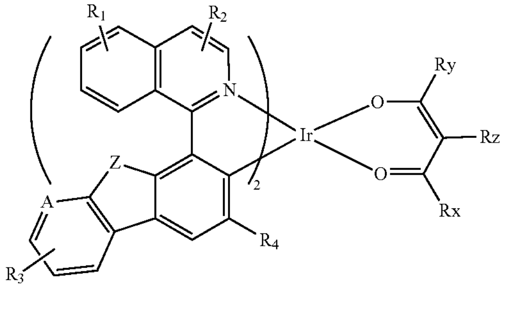

where

A is $CR_0$ or N;

the number of $R_1$, $R_2$, and $R_3$ ranges from a single substitution number to a maximum possible substitution number;

$R_1$ and $R_4$ are independently selected from substituted or unsubstituted $C_1$-$C_{10}$ alkyl, substituted or unsubstituted $C_3$-$C_{20}$ cycloalkyl, substituted or unsubstituted $C_2$-$C_{10}$ alkenyl, substituted or unsubstituted $C_1$-$C_{10}$ heteroalkyl, substituted or unsubstituted $C_6$-$C_{30}$ aralkyl, substituted or unsubstituted $C_6$-$C_{30}$ aryl, or substituted or unsubstituted $C_1$-$C_8$ heteroaryl;

$R_0$, $R_2$, and $R_3$ are independently selected from hydrogen, deuterium, halogen, substituted or unsubstituted $C_1$-$C_{10}$ alkyl, substituted or unsubstituted $C_3$-$C_{20}$ cycloalkyl, substituted or unsubstituted $C_2$-$C_{10}$ alkenyl, substituted or unsubstituted $C_1$-$C_{10}$ heteroalkyl, substituted or unsubstituted $C_6$-$C_{30}$ aralkyl, substituted or unsubstituted $C_6$-$C_{30}$ aryl, or substituted or unsubstituted $C_1$-$C_8$ heteroaryl;

or any two adjacent groups of the $R_0$, the $R_1$, the $R_2$, and the $R_3$ are capable of being connected to each other to form a ring structure or a fused ring structure;

when the $R_3$ exists and is located adjacent to the A, the $R_3$ is not F; Rx-Rz are independently selected from hydrogen, deuterium, substituted or unsubstituted $C_1$-$C_{10}$ alkyl, substituted or unsubstituted $C_3$-$C_{20}$ cycloalkyl, substituted or unsubstituted $C_2$-$C_{10}$ alkenyl, or substituted or unsubstituted $C_1$-$C_{10}$ heteroalkyl;

the Z is independently selected from O, S, $C(R)_2$, or NR; the R is independently selected from substituted or unsubstituted $C_1$-$C_{10}$ alkyl or alkoxy, substituted or unsubstituted $C_2$-$C_{30}$ cycloalkyl, substituted or unsubstituted $C_6$-$C_{30}$ aryl, or substituted or unsubstituted $C_1$-$C_{18}$ heteroaryl;

the "substituted" refers to substitution with deuterium, F, Cl, Br, $C_1$-$C_5$ alkyl, or $C_3$-$C_6$ cycloalkyl;

and a heteroatom in the heteroalkyl or heteroaryl includes one or more of N, S, and O.

In the formula (I), when more than two $R_3$ exist, a plurality of the $R_3$ may be separately identical or different.

In the formula (I), when more than two substituents exist, a plurality of the substituents may be separately identical or different.

Preferably, the number of the $R_1$, the $R_2$, and the $R_3$ is a single substitution number.

More preferably, the compound has the following structure:

Formula (II)

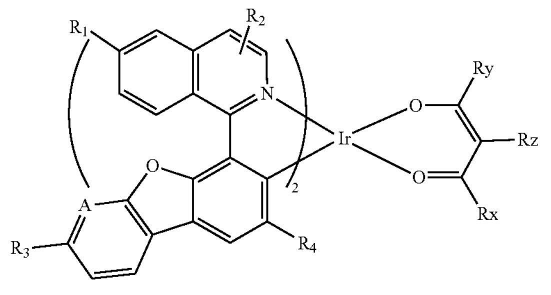

Examples of groups of the compound as shown in the formula (I) are described below.

It should be noted that in the specification, "$C_a$-$C_b$" in the term "substituted or unsubstituted $C_a$-$C_b$ X group" refers to the number of carbons when the X group is unsubstituted, excluding the number of carbons of a substituent when the X group is substituted.

As a linear or branched alkyl, the $C_1$-$C_{10}$ alkyl specifically includes methyl, ethyl, propyl, isopropyl, n-butyl, isobutyl, sec-butyl, tert-butyl, n-pentyl and isomers thereof, n-hexyl and isomers thereof, n-heptyl and isomers thereof, n-octyl and isomers thereof, n-nonyl and isomers thereof, and n-decyl and isomers thereof, preferably methyl, ethyl, propyl, isopropyl, n-butyl, isobutyl, sec-butyl, and tert-butyl, and more preferably propyl, isopropyl, isobutyl, sec-butyl, and tert-butyl.

The $C_3$-$C_{20}$ cycloalkyl may include cyclopropyl, cyclobutyl, cyclopentyl, cyclohexyl, 1-adamantyl, 2-adamantyl, 1-norbornyl, and 2-norbornyl, preferably cyclopentyl and cyclohexyl.

The $C_2$-$C_{10}$ alkenyl may include vinyl, propenyl, allyl, 1-butadienyl, 2-butadienyl, 1-hexatrienyl, 2-hexatrienyl, and 3-hexatrienyl, preferably propenyl and allyl.

As a linear or branched alkyl consisting of atoms other than carbon and hydrogen, the $C_1$-$C_{10}$ heteroalkyl may include mercaptomethyl methyl, methoxymethyl, ethoxymethyl, tert-butoxyl methyl, N,N-dimethyl methyl, epoxy butyl, epoxy pentyl, and epoxy hexyl, preferably methoxymethyl and epoxy pentyl.

Specific examples of the aryl include phenyl, naphthyl, anthracyl, phenanthryl, tetracenyl, pyrenyl, chrysenyl, benzo[c]phenanthryl, benzo[g]chrysenyl, fluorenyl, benzofluorenyl, dibenzofluorenyl, biphenyl, triphenyl, tetraphenyl, and fluoranthracyl, preferably phenyl and naphthyl.

Specific examples of the heteroaryl may include pyrrolyl, pyrazinyl, pyridyl, pyrimidinyl, triazinyl, indolyl, isoindolyl, imidazolyl, furyl, benzofuryl, isobenzofuryl, dibenzofuryl, dibenzothienyl, azodibenzofuryl, azodibenzothienyl, diazodibenzofuryl, diazodibenzothienyl, quinolyl, isoquinolyl, quinoxalinyl, carbazolyl, phenanthridinyl, acridinyl, phenanthrolinyl, phenazinyl, phenothiazinyl, phenoxazinyl, oxazolinyl, oxadiazolyl, furzanyl, thienyl, benzothienyl, dihydroacridinyl, azocarbazolyl, diazocarbazolyl, and quinazolinyl, preferably pyridyl, pyrimidinyl, triazinyl, dibenzofuryl, dibenzothienyl, azodibenzofuryl, azodibenzothienyl, diazodibenzofuryl, diazodibenzothienyl, carbazolyl, azocarbazolyl, and diazocarbazolyl.

The following embodiments are merely described to facilitate the understanding of the technical invention, and should not be considered as specific limitations of the present invention.

All raw materials, solvents and the like involved in the synthesis of compounds in the present invention were purchased from Alfa, Acros, and other suppliers known to persons skilled in the art.

Example 1 Synthesis of a Compound CPD 1

Synthesis of a Common Intermediate Compound B1:

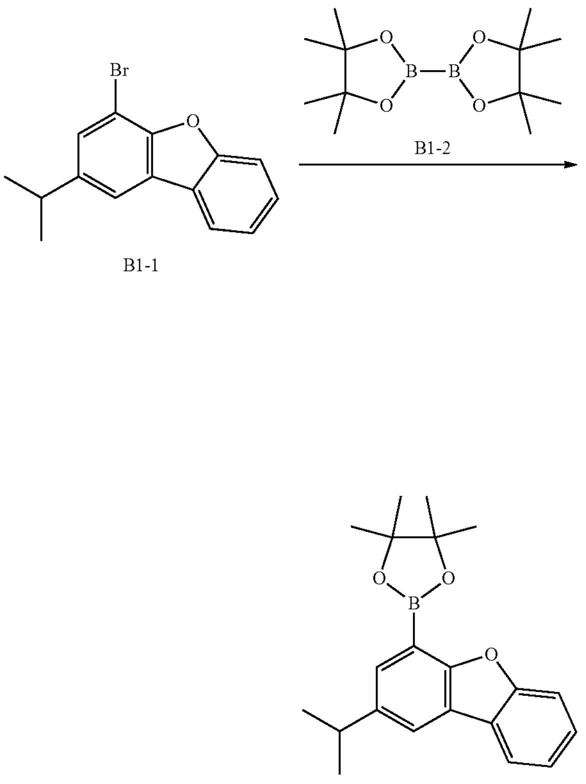

B1-1

B1

A compound B1-1 (49.0 g, 169.4 mmol, 1.0 eq), bis(pinacolato)diboron (51.6 g, 203.3 mmol, 1.2 eq), [1,1'-bis(diphenylphosphino)ferrocene]dichloropalladium (2.48 g, 3.39 mmol, 0.02 eq), potassium acetate (33.2 g, 338.9 mmol, 2.0 eq), and dioxane (500 ml) were sequentially added into a 1 L three-mouth flask under vacuumization and the replacement of nitrogen for 3 times. A mixture obtained was heated to about 100° C. in an oil bath, stirred for 16 hours, and then sampled. According to monitoring by TLC, the raw material B1-1 was reacted completely. The mixture was cooled to room temperature, transferred into a 1 L one-mouth flask in batches, and subjected to rotary evaporation to remove most of the dioxane. Then, toluene (300 ml) was added, and heated for dissolution, and deionized water was added for water washing for 3 times (100 ml/time). After liquid separation, an organic phase was filtered with silica gel (200-300 mesh, 30 g), and washed with toluene (100 ml). The organic phase was concentrated to about 80 ml, and n-hexane (160 ml) was added, and stirred at room temperature for crystallization for 4 hours. After filtration was conducted, a filter cake was rinsed with n-hexane (40 ml) to obtain a product. The product obtained was dried to obtain 44.7 g of a white-like solid compound B1 with a yield of 78.5%. Mass spectrometry was as follows: 337.2 (M+H).

Synthesis of a Common Ligand Compound L1:

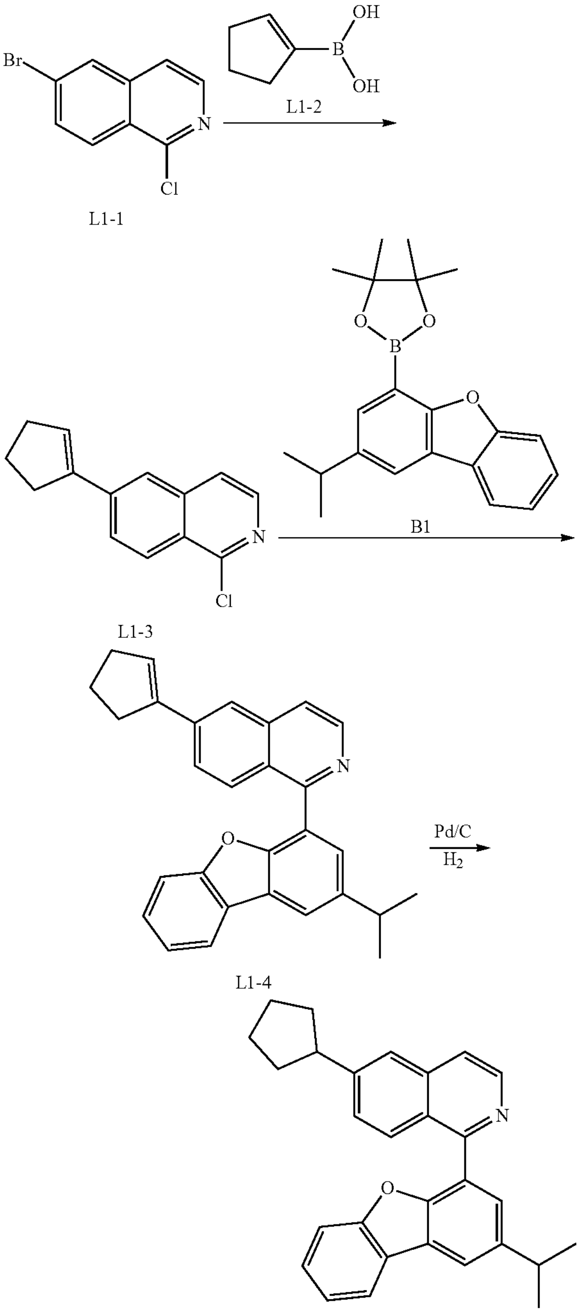

L1-1

L1-3

L1-4

L1

Synthesis of a Compound L1-3:

A compound L1-1 (42.1 g, 173.61 mmol, 1.0 eq), a compound L1-2 (27.21 g, 243.05 mmol, 1.4 eq), dichlorobis[di-tert-butyl(4-dimethylaminophenyl)phosphino]palladium (II) (1.23 g, 1.74 mmol, 0.01 eq), anhydrous $K_3PO_4$ (73.7 g, 347.22 mmol, 2.0 eq), and toluene (505 ml) were sequentially added into a 1 L three-mouth flask under vacuumization and the replacement of nitrogen for 3 times. A mixture obtained was heated to about 80° C. in an oil bath, stirred for 16 hours, and then sampled. According to monitoring by TLC, the raw material L1-1 was basically reacted completely. The mixture was cooled to room temperature. Ethyl acetate (250 ml) was added into the reaction flask, and deionized water was added for water washing for 3 times (150 ml/time). After liquid separation, an organic phase was concentrated under reduced pressure to obtain a solid. A crude product was separated by column chromatography (with a mixture of EA and Hex at a ratio of 1:10) to obtain a product. The product obtained was dried to obtain 27.4 g of a white-like solid compound L1-3 with a yield of 68.71%. Mass spectrometry was as follows: 230.7 (M+H)

Synthesis of a Compound L1-4:

The compound L1-3 (25.5 g, 111.01 mmol, 1.0 eq), the compound B1 (41.06 g, 122.11 mmol, 1.1 eq), dichlorobis [di-tert-butyl(4-dimethylaminophenyl)phosphino]palladium (II) (0.78 g, 1.11 mmol, 0.01 eq), sodium carbonate (23.53 g, 222.02 mmol, 2.0 eq), tetrahydrofuran (250 ml), and deionized water (62 ml) were sequentially added into a 500 ml three-mouth flask under vacuumization and the replacement of nitrogen for 3 times. A mixture obtained was heated to about 60° C. in an oil bath, stirred for 2 hours, and then sampled. According to monitoring by TLC, the raw material L1-3 was basically reacted completely. The mixture was cooled to room temperature. A reaction solution was transferred into a 1 L one-mouth flask. Ethyl acetate (300 ml) was added, and deionized water was added for water washing for 3 times (150 ml/time). After liquid separation, an organic phase was concentrated under reduced pressure to obtain a solid. A crude product was recrystallized with toluene and methanol (a ratio of the crude product to the toluene to the methanol was 1:5:20) to obtain a product. The product obtained was dried to obtain 35.97 g of a white solid compound L1-4 with a yield of 80.3%. Mass spectrometry was as follows: 404.5 (M+H)

Synthesis of a Compound L1:

The compound L1-4 (32.0 g, 79.3 mmol, 1.0 eq), 10% palladium carbon (8.44 g, 7.93 mmol, 0.1 eq), and a mixed solvent of tetrahydrofuran (64 ml) and ethanol (96 ml) were sequentially added into a 250 ml one-mouth flask. $H_2$ was introduced into the reaction flask. A mixture obtained was heated to about 40° C. in an oil bath, stirred for 24 hours, and then sampled. According to monitoring by TLC, the raw material L1-4 was basically reacted completely. The mixture was cooled to room temperature. After a reaction solution was directly filtered, a filtrate was collected, concentrated, and dried. A crude product was separated by column chromatography (with a mixture of EA and Hex at a ratio of 1:8) to obtain a product. The product obtained was dried to obtain 25.47 g of a white-like solid compound L1 with a yield of 79.2%. Mass spectrometry was as follows: 406.5 (M+H). $^1$HNMR (400 MHz, $CDCl_3$) δ8.64 (d, J=5.7 Hz, 1H), 7.93 (d, J=7.4 Hz, 1H), 7.85 (s, 1H), 7.70 (d, J=7.9 Hz, 2H), 7.68-7.55 (m, 2H), 7.51 (s, 1H), 7.43-7.24 (m, 3H), 2.94 (s, 1H), δ2.87 (s, 1H), 2.00 (m, 2H), 1.71 (m, J=25.0 Hz, 6H), 1.20 (d, 6H).

Synthesis of a Compound CPD 1:

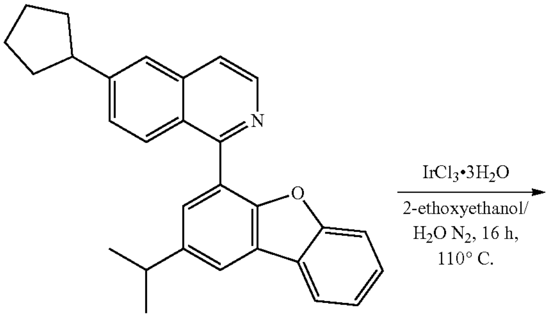

L1

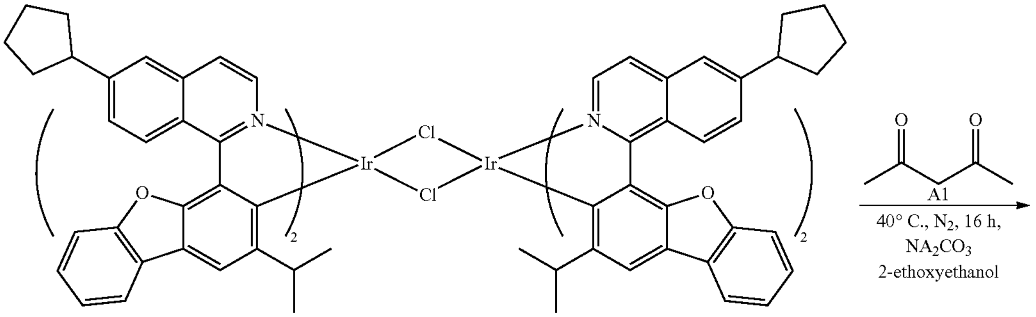

CPD 1-1

-continued

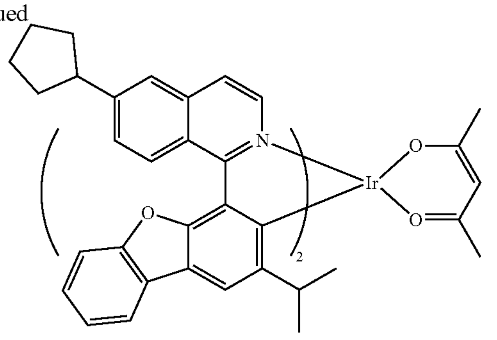

CPD 1

Synthesis of a Common Intermediate Compound CPD1-1:

The compound L1 (24.7 g, 60.91 mmol, 3.0 eq) and $IrCl_3 \cdot 3H_2O$ (6.83 g, 20.3 mmol, 1.0 eq) were put into a 500 ml three-mouth flask, and then 2-ethoxyethanol (247 ml) and deionized water (82.3 ml) were added. A mixture obtained was stirred for reflux at 110° C. for 16 hours under the protection of Na. The mixture was cooled to room temperature, and filtered. A filter residue was sequentially washed with methanol (100 ml*3) and n-hexane (100 ml*3), and then dried to obtain 22.03 g of a compound CPD1-1 with a yield of 88.3%. The obtained compound was directly used in the next step without purification.

Synthesis of a Compound CPD 1:

The compound CPD1-1 (8.75 g, 7.12 mmol, 1.0 eq) was dissolved in 2-ethoxyethanol (87.5 ml), and then anhydrous sodium carbonate (7.55 g, 71.2 mmol, 10.0 eq) and a compound A1 (3.65 g, 35.6 mmol, 5.0 eq) were sequentially added. After the addition was completed, a mixture obtained was stirred at 40° C. for 16 hours under the protection of $N_2$, and then cooled to room temperature. Sampling was conducted. According to monitoring by TLC, a red product point was produced. Methanol (87.5 ml) was added into a reaction solution, and stirred to precipitate out a red solid. After filtration was conducted, a solid was collected. The solid was dissolved in dichloromethane (150 ml) for clarification, and filtered with silica gel. A filter cake was rinsed with a small amount of dichloromethane. A filtrate was collected. Deionized water was added for water washing for 3 times (60 ml/time). After liquid separation, an organic phase was concentrated under reduced pressure to obtain a solid. The solid was recrystallized with tetrahydrofuran and methanol (a ratio of the crude product to the tetrahydrofuran to the methanol was 1:5:7) for 3 times to obtain a product. The product obtained was dried to obtain 4.83 g of a target compound CPD 1 with a yield of 61.7%. 4.83 g of the crude product CPD 1 was sublimated and purified to obtain 3.32 g of a sublimated pure product CPD 1 with a yield of 68.73%. Mass spectrometry was as follows: 1101.37 (M+H).

Example 2 Synthesis of a Compound CPD 3

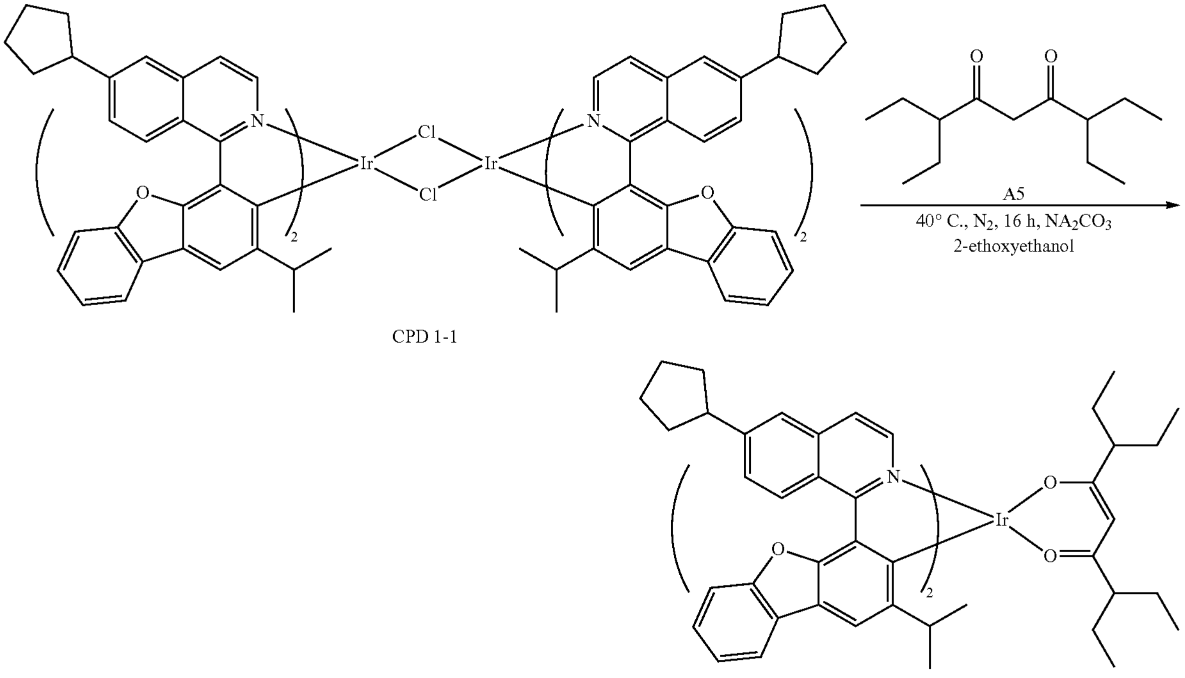

CPD 1-1

CPD 3

With reference to the synthesis process and post-treatment and purification methods of the compound CPD 1, only the corresponding raw materials were required to be changed, and 4.64 g of a target compound CPD 3 with a yield of 58.81% was obtained. 4.64 g of the crude product CPD 3 was sublimated and purified to obtain 3.26 g of a sublimated pure product CPD 3 with a yield of 70.25%. Mass spectrometry was as follows: 1213.5 (M+H).

Example 3 Synthesis of a Compound CPD 8

Synthesis of a Common Ligand Compound L4:

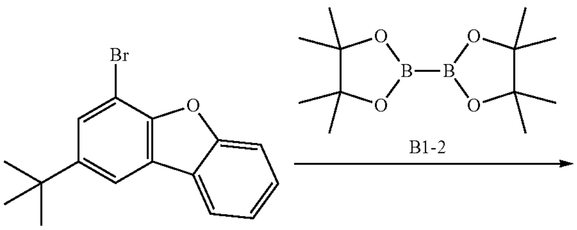
B1-2

B2-1

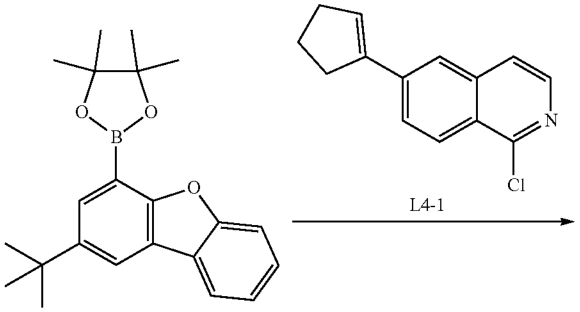
L4-1

B2

-continued

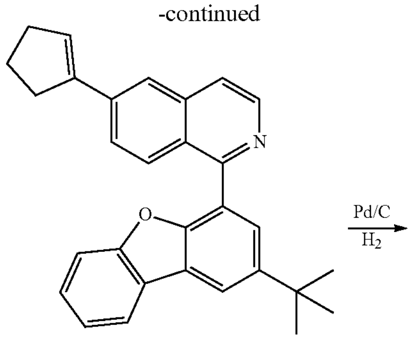

L4-2

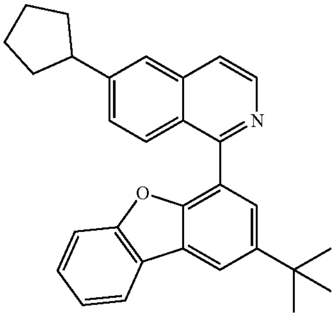

L4

Synthesis of a Compound B2:

With reference to the synthesis process and post-treatment and purification methods of the compound B1, only the corresponding raw materials were required to be changed. Mass spectrometry was as follows: 351.3 (M+H).

Synthesis of a Compound L4-2:

With reference to the synthesis process and post-treatment and purification methods of the compound L1-4, only the corresponding raw materials were required to be changed. Mass spectrometry was as follows: 418.5 (M+H).

Synthesis of a Compound L4:

With reference to the synthesis process and post-treatment and purification methods of the compound L1, only the corresponding raw materials were required to be changed. Mass spectrometry was as follows: 420.6 (M+H). $^1$HNMR (400 MHz, $CDCl_3$) δ8.64 (d, J=5.7 Hz, 1H), 7.94 (d, J=7.4 Hz, 1H), 7.86 (s, 1H), 7.70 (d, J=7.9 Hz, 2H), 7.68-7.55 (m, 2H), 7.51 (s, 1H), 7.43-7.24 (m, 3H), 2.92 (s, 1H), 1.98 (d, J=7.0 Hz, 2H), 1.72 (dd, J=28.5, 21.5 Hz, 6H), 1.32 (s, 9H).

Synthesis of a Compound CPD 8:

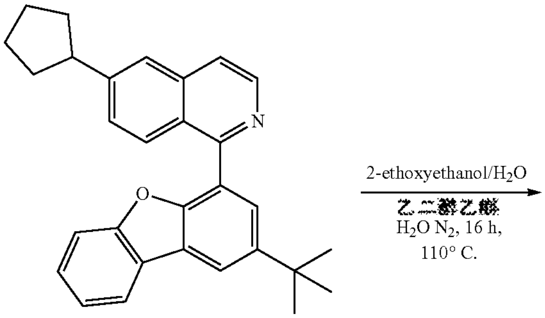

L4

-continued

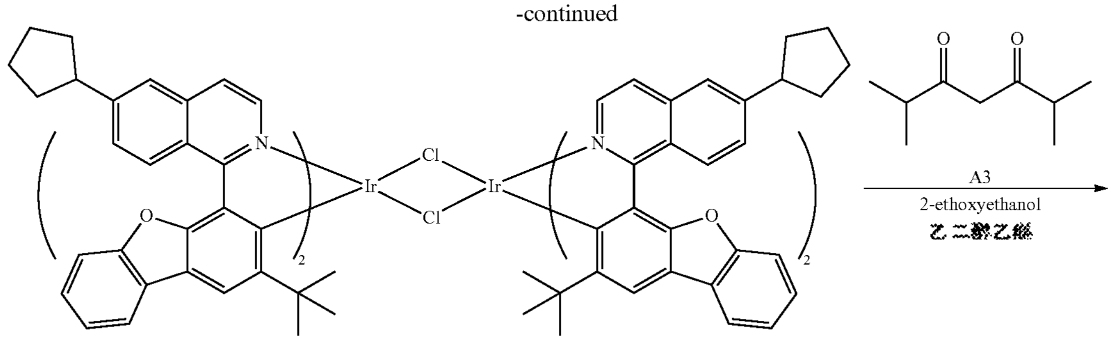

CPD 8-1

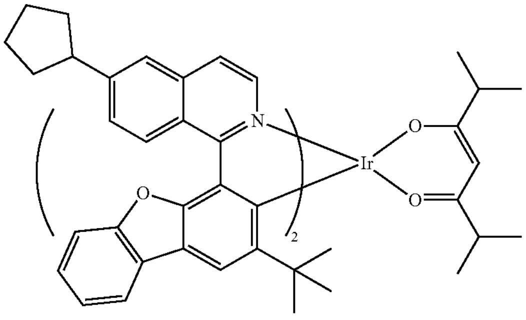

CPD 8

Synthesis of a Compound CPD8-1:

With reference to the synthesis process and post-treatment and purification methods of the compound CPD1-1, only the corresponding raw materials were required to be changed. The obtained compound was directly used in the next step without purification.

Synthesis of a Compound CPD 8:

With reference to the synthesis process and post-treatment and purification methods of the compound CPD 1, only the corresponding raw materials were required to be changed, and 3.77 g of a target compound CPD 8 with a yield of 60.3% was obtained. 3.77 g of the crude product CPD 8 was sublimated and purified to obtain 2.87 g of a sublimated pure product CPD 8 with a yield of 76.12%. Mass spectrometry was as follows: 1185.5 (M+H).

Example 4 Synthesis of a Compound CPD 21

Synthesis of a Common Ligand Compound L6:

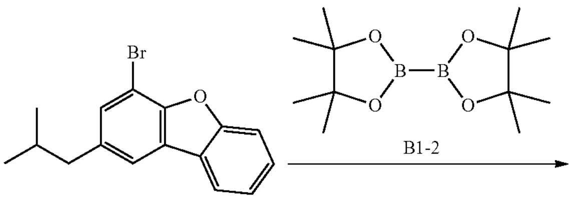

B3-1

-continued

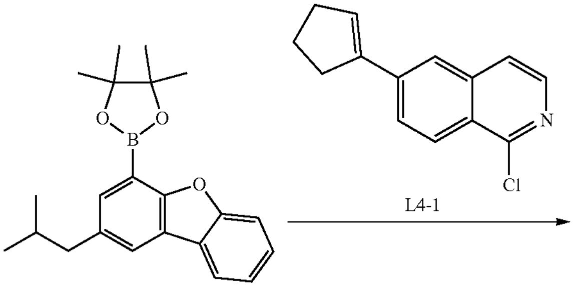

B3

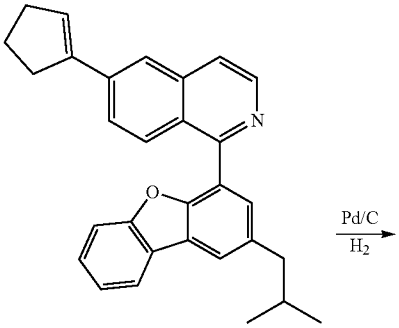

L6-1

-continued

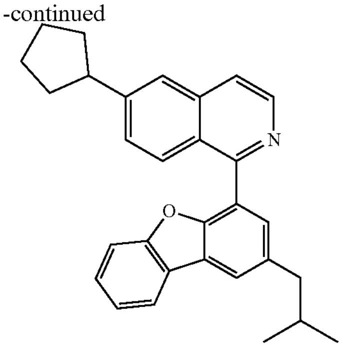

L6

Synthesis of a Compound B3:

With reference to the synthesis process and post-treatment and purification methods of the compound B1, only the corresponding raw materials were required to be changed. Mass spectrometry was as follows: 351.3 (M+H).

Synthesis of a Compound L6-1:

With reference to the synthesis process and post-treatment and purification methods of the compound L1-4, only the corresponding raw materials were required to be changed. Mass spectrometry was as follows: 418.5 (M+H).

Synthesis of a Compound L6:

With reference to the synthesis process and post-treatment and purification methods of the compound L1, only the corresponding raw materials were required to be changed. Mass spectrometry was as follows: 420.6 (M+H). $^1$HNMR (400 MHz, $CDCl_3$) δ8.65 (d, J=5.7 Hz, 1H), 7.95 (d, J=7.4 Hz, 1H), 7.86 (s, 1H), 7.70 (d, J=7.9 Hz, 2H), 7.68-7.55 (m, 2H), 7.51 (s, 1H), 7.43-7.24 (m, 3H), 2.85 (dt, 1H), 2.43 (d, 2H), 2.00 (m, 2H), 1.82 (dq, 1H), 1.79-1.60 (m, 6H), 0.87 (d, 6H).

Synthesis of a Compound CPD 21:

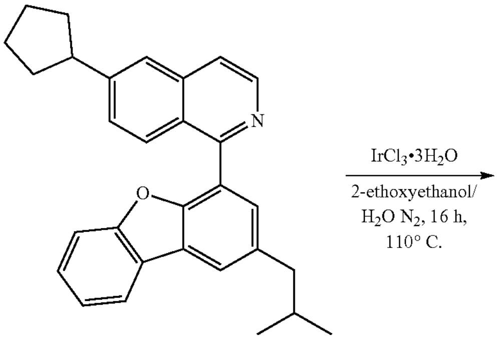

L6

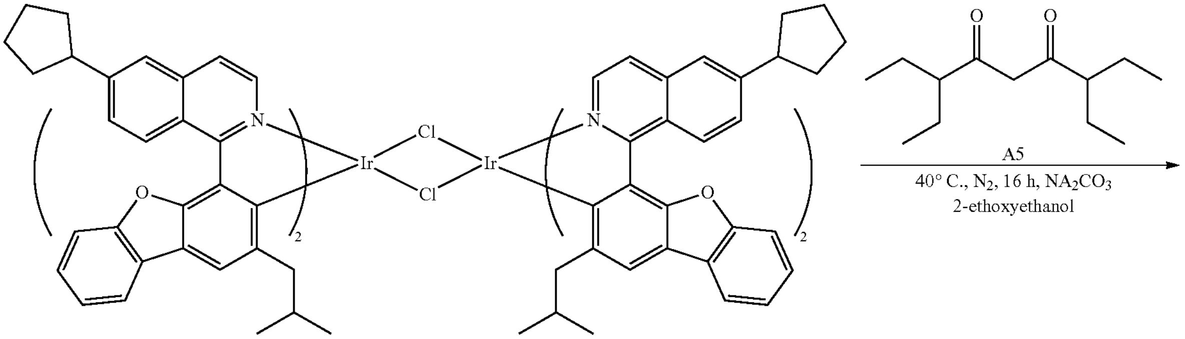

CPD 21-1

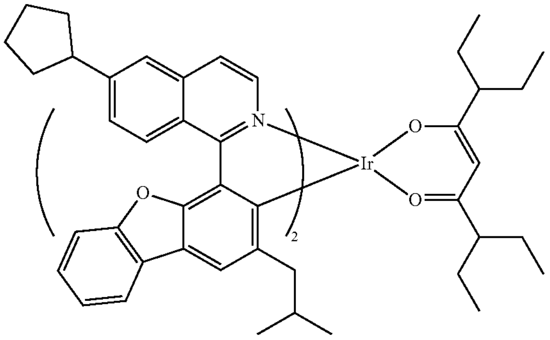

CPD 21

Synthesis of a Compound CPD21-1:

With reference to the synthesis process and post-treatment and purification methods of the compound CPD1-1, only the corresponding raw materials were required to be changed. The obtained compound was directly used in the next step without purification.

Synthesis of a Compound CPD 21:

With reference to the synthesis process and post-treatment and purification methods of the compound CPD 1, only the corresponding raw materials were required to be changed, and 4.11 g of a target compound CPD 21 with a yield of 62.3% was obtained. 4.11 g of the crude product CPD 21 was sublimated and purified to obtain 2.94 g of a sublimated pure product CPD 21 with a yield of 71.53%. Mass spectrometry was as follows: 1241.6 (M+H).

Example 5 Synthesis of a Compound CPD 27

Synthesis of a Common Intermediate Compound B4:

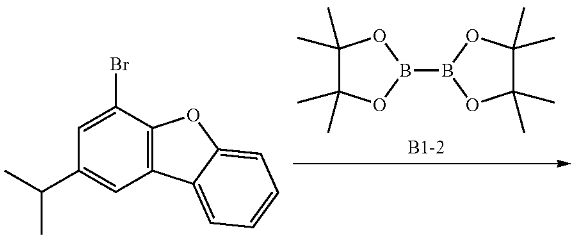

B4-1

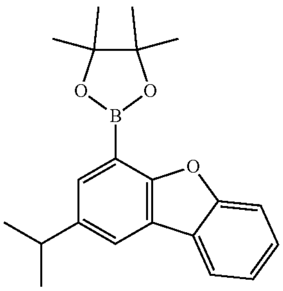

B4

With reference to the synthesis process and post-treatment and purification methods of the compound B1, only the corresponding raw materials were required to be changed. Mass spectrometry was as follows: 337.2 (M+H).

Synthesis of a Common Intermediate Compound L4:

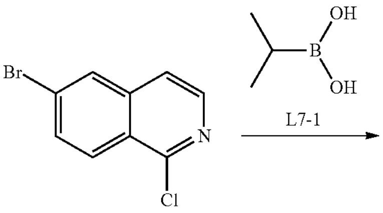

L1-1

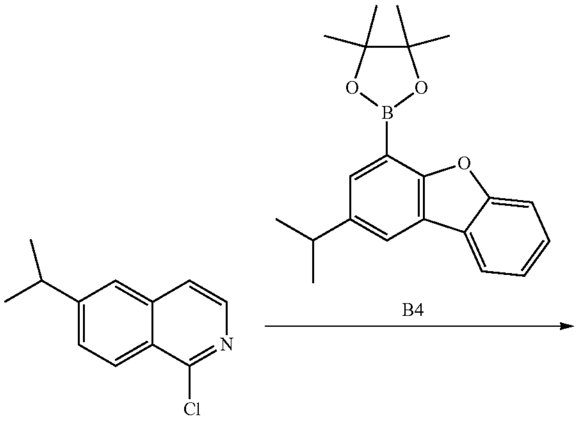

L7-2

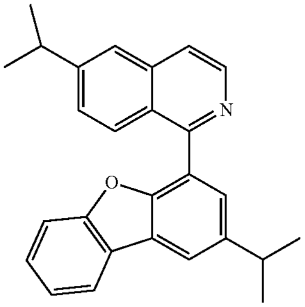

L7

Synthesis of a Compound L7-2:

With reference to the synthesis process and post-treatment and purification methods of the compound L1-3, only the corresponding raw materials were required to be changed. Mass spectrometry was as follows: 206.7 (M+H).

Synthesis of a Compound L7:

With reference to the synthesis process and post-treatment and purification methods of the compound L1-4, only the corresponding raw materials were required to be changed. Mass spectrometry was as follows: 380.5 (M+H). $^1$HNMR (400 MHz, CDCl3) δ8.66 (d, J=5.7 Hz, 1H), 7.98 (d, J=7.4 Hz, 1H), 7.89 (s, 1H), 7.80-7.67 (m, 3H), 7.50 (s, 1H), 7.37 (dq, J=13.9, 6.2 Hz, 4H), 3.11 (dt, J=13.7, 6.8 Hz, 1H), 2.87 (dt, 1H), 2.60 (s, 3H), 1.36 (d, J=6.9 Hz, 6H), 1.20 (d, 6H).

Synthesis of a Compound CPD 27:

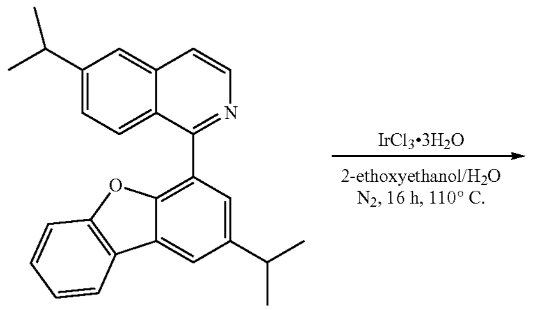

L8

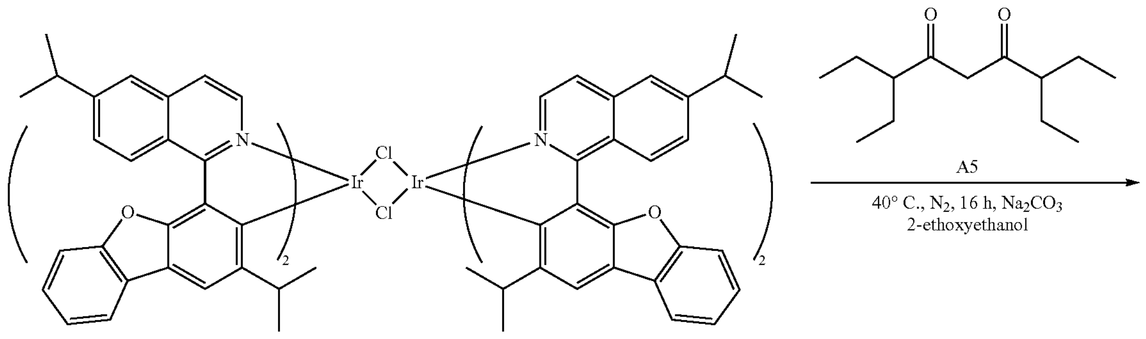

CPD 27-1

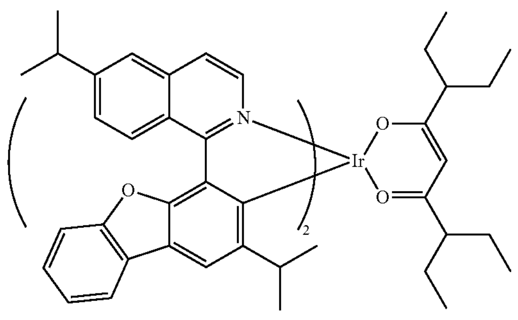

CPD 27

Synthesis of a Compound CPD27-1:

With reference to the synthesis process and post-treatment and purification methods of the compound CPD1-1, only the corresponding raw materials were required to be changed. The obtained compound was directly used in the next step without purification.

Synthesis of a Compound CPD 27:

With reference to the synthesis process and post-treatment and purification methods of the compound CPD 1, only the corresponding raw materials were required to be changed, and 4.35 g of a target compound CPD 27 with a yield of 57.6% was obtained. 4.35 g of the crude product CPD 27 was sublimated and purified to obtain 3.01 g of a sublimated pure product CPD 27 with a yield of 69.19%. Mass spectrometry was as follows: 1161.5 (M+H).

Example 6 Synthesis of a Compound CPD 28

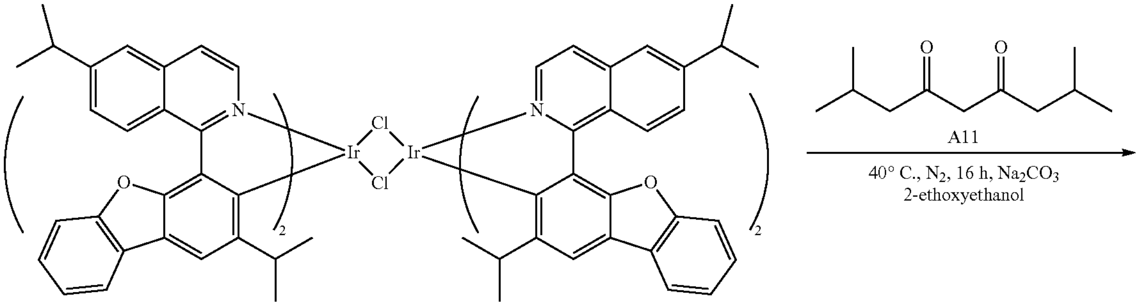

CPD 27-1

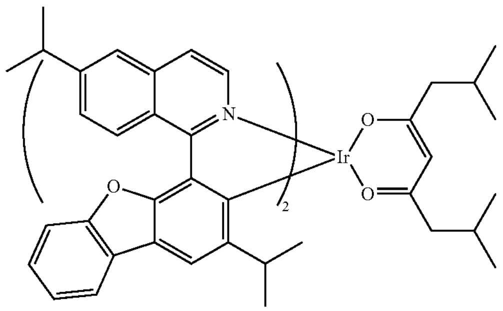

CPD 28

With reference to the synthesis process and post-treatment and purification methods of the compound CPD 1, only the corresponding raw materials were required to be changed, and 3.52 g of a target compound CPD 28 with a yield of 54.71% was obtained. 3.52 g of the crude product CPD 28 was sublimated and purified to obtain 2.47 g of a sublimated pure product CPD 28 with a yield of 70.17%. Mass spectrometry was as follows: 1133.5 (M+H).

Example 7 Synthesis of a Compound CPD 33

Synthesis of a Common Intermediate Compound L9:

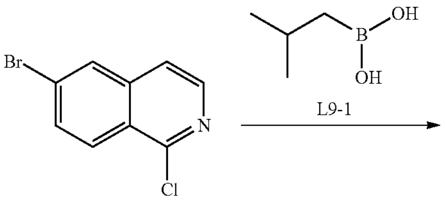

L1-1

-continued

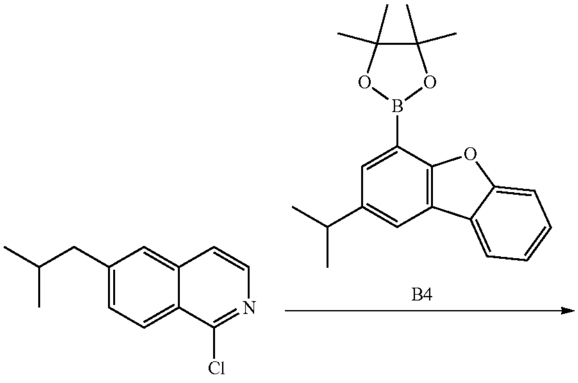

L9-2

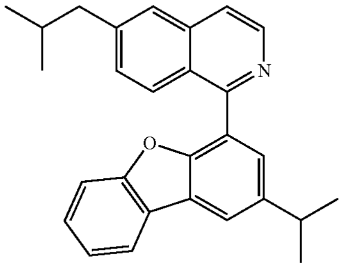

L9

Synthesis of a Compound L9-2:

With reference to the synthesis process and post-treatment and purification methods of the compound L1-3, only the corresponding raw materials were required to be changed. Mass spectrometry was as follows: 220.7 (M+H).

Synthesis of a Compound L9:

With reference to the synthesis process and post-treatment and purification methods of the compound L1-4, only the corresponding raw materials were required to be changed. Mass spectrometry was as follows: 394.5 (M+H). $^1$HNMR (400 MHz, CDCl3) δ8.67 (d, J=5.7 Hz, 1H), 7.99 (d, J=7.4 Hz, 1H), 7.89 (s, 1H), 7.75 (d, J=8.6 Hz, 1H), 7.72-7.63 (m, 2H), 7.52 (s, 1H), 7.40 (d J=5.4 Hz, 2H), 7.36-7.27 (m, 2H), 2.87 (m, 1H), 2.68 (d, J=7.2 Hz, 2H), 2.01 (m, 1H), 1.20 (d, 6H), 0.97 (d, J=6.6 Hz, 6H).

Synthesis of a Compound CPD 33:

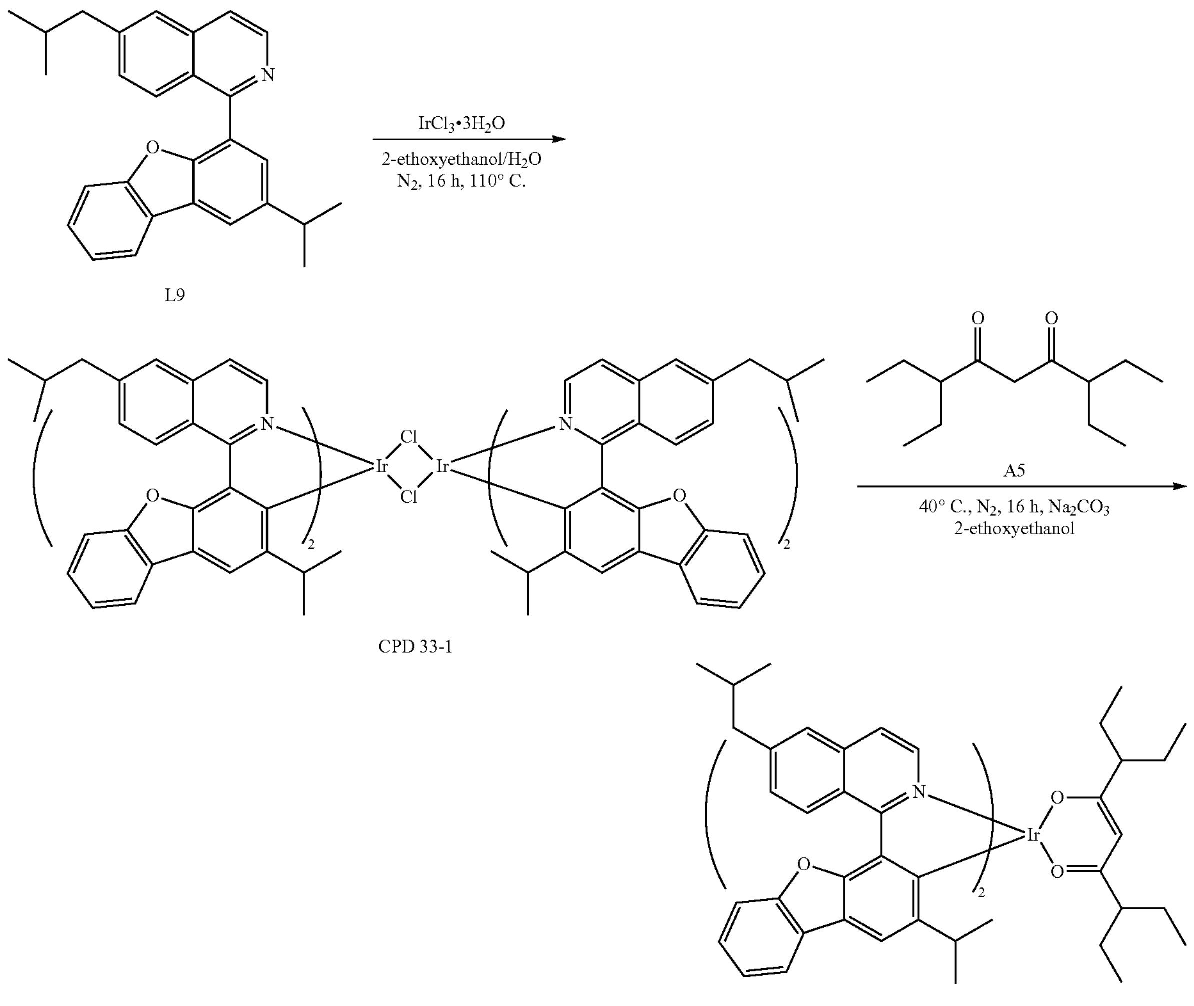

L9

CPD 33-1

CPD 33

Synthesis of a Compound CPD33-1:

With reference to the synthesis process and post-treatment and purification methods of the compound CPD1-1, only the corresponding raw materials were required to be changed. The obtained compound was directly used in the next step without purification.

Synthesis of a Compound CPD 33:

With reference to the synthesis process and post-treatment and purification methods of the compound CPD 1, only the corresponding raw materials were required to be changed, and 3.77 g of a target compound CPD 33 with a yield of 57.6% was obtained. 3.77 g of the crude product CPD 33 was sublimated and purified to obtain 2.69 g of a sublimated pure product CPD 33 with a yield of 71.35%. Mass spectrometry was as follows: 1189.6 (M+H).

Example 8 Synthesis of a Compound CPD 39

Synthesis of a Common Intermediate Compound L10:

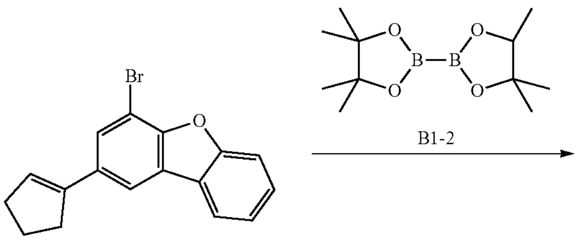

B1-2

B5-1

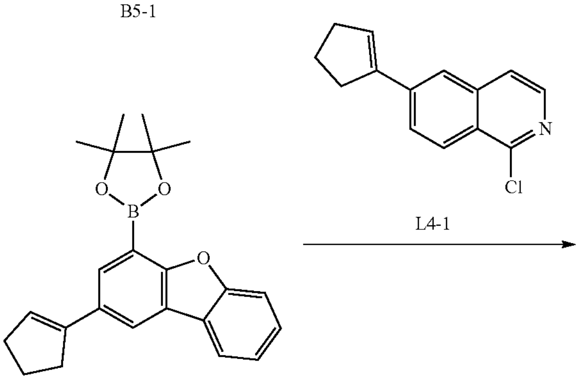

L4-1

B5

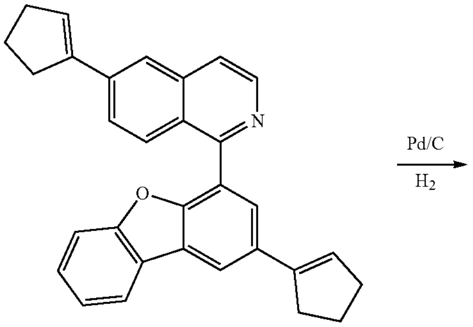

L10-1

-continued

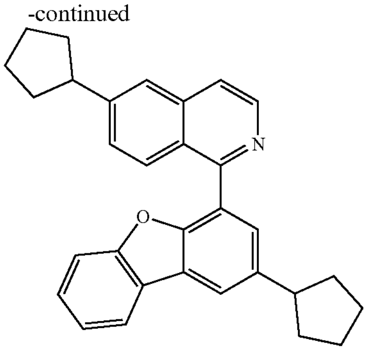

L10

Synthesis of a Compound B5:

With reference to the synthesis process and post-treatment and purification methods of the compound B1, only the corresponding raw materials were required to be changed. Mass spectrometry was as follows: 361.3 (M+H).

Synthesis of a Compound L10-1:

With reference to the synthesis process and post-treatment and purification methods of the compound L1-4, only the corresponding raw materials were required to be changed. Mass spectrometry was as follows: 428.5 (M+H).

Synthesis of a Compound L10:

With reference to the synthesis process and post-treatment and purification methods of the compound L1, only the corresponding raw materials were required to be changed. Mass spectrometry was as follows: 432.6 (M+H). $^1$HNMR (400 MHz, $CDCl_3$) δ8.67 (d, J=5.7 Hz, 1H), 7.99 (d, J=7.4 Hz, 1H), 7.89 (s, 1H), 7.75 (d, J=8.6 Hz, 1H), 7.72-7.63 (m, 2H), 7.52 (s, 1H), 7.40 (d J=5.4 Hz, 2H), 7.36-7.27 (m, 2H), 2.87 (m, 1H), 3.00 (m, 1H), 2.84 (m, 1H), 2.14-1.88 (m, 4H), 1.86-1.56 (m, 12H).

Synthesis of a Compound CPD 39:

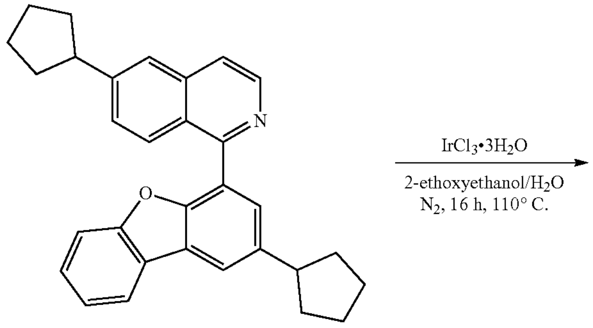

L10

-continued

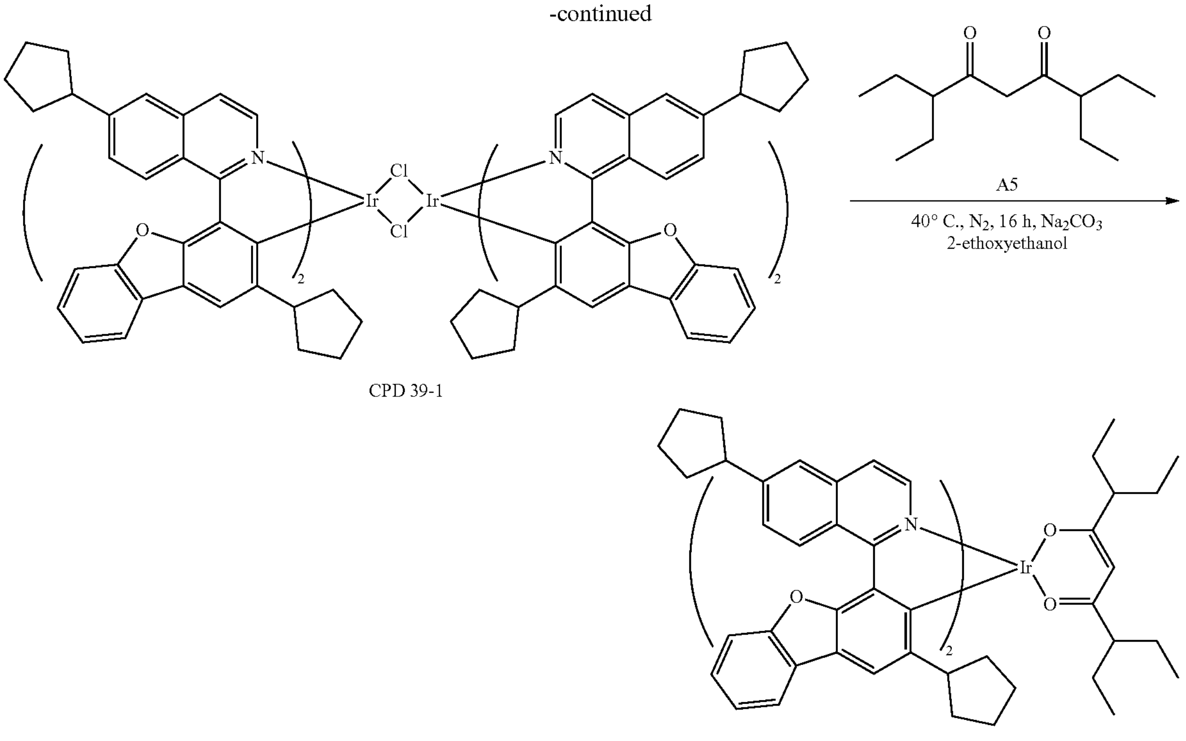

CPD 39-1

CPD 39

Synthesis of a Compound CPD39-1:

With reference to the synthesis process and post-treatment and purification methods of the compound CPD1-1, only the corresponding raw materials were required to be changed. The obtained compound was directly used in the next step without purification.

Synthesis of a Compound CPD 39:

With reference to the synthesis process and post-treatment and purification methods of the compound CPD 1, only the corresponding raw materials were required to be changed, and 3.96 g of a target compound CPD 39 with a yield of 60.71% was obtained. 3.96 g of the crude product CPD 39 was sublimated and purified to obtain 3.74 g of a sublimated pure product CPD 39 with a yield of 69.19%. Mass spectrometry was as follows: 1265.6 (M+H).

Example 9 Synthesis of a Compound CPD 75

Synthesis of a Common Intermediate Compound L11:

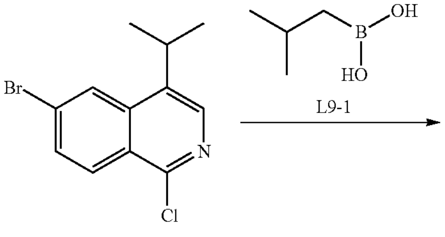

L9-1

L11-1

-continued

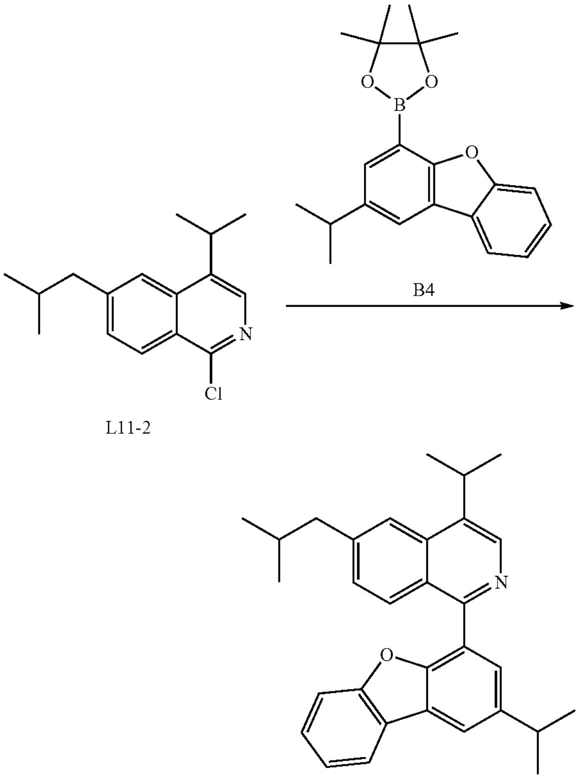

B4

L11-2

L11

Synthesis of a Compound L11-2:

With reference to the synthesis process and post-treatment and purification methods of the compound L1-3, only the corresponding raw materials were required to be changed. Mass spectrometry was as follows: 262.8 (M+H).

Synthesis of a Compound L11:

With reference to the synthesis process and post-treatment and purification methods of the compound L1-4, only the corresponding raw materials were required to be changed. Mass spectrometry was as follows: 436.6 (M+H). $^1$HNMR (400 MHz, CDCl3) δ8.68 (d, J=5.7 Hz, 1H), 7.98 (d, J=7.4 Hz, 1H), 7.89 (s, 1H), 7.76 (d, J=8.6 Hz, 1H), 7.72-7.63 (m, 2H), 7.52 (s, 1H), 7.40 (d J=5.4 Hz, 2H), 7.36-7.27 (m, 2H), 2.97 (m, 1H), 2.87 (m, 1H), 2.68 (d, J=7.2 Hz, 2H), 2.01 (m, 1H), 1.20 (m, 12H), 0.97 (d, J=6.6 Hz, 6H).

Synthesis of a Compound CPD 75:

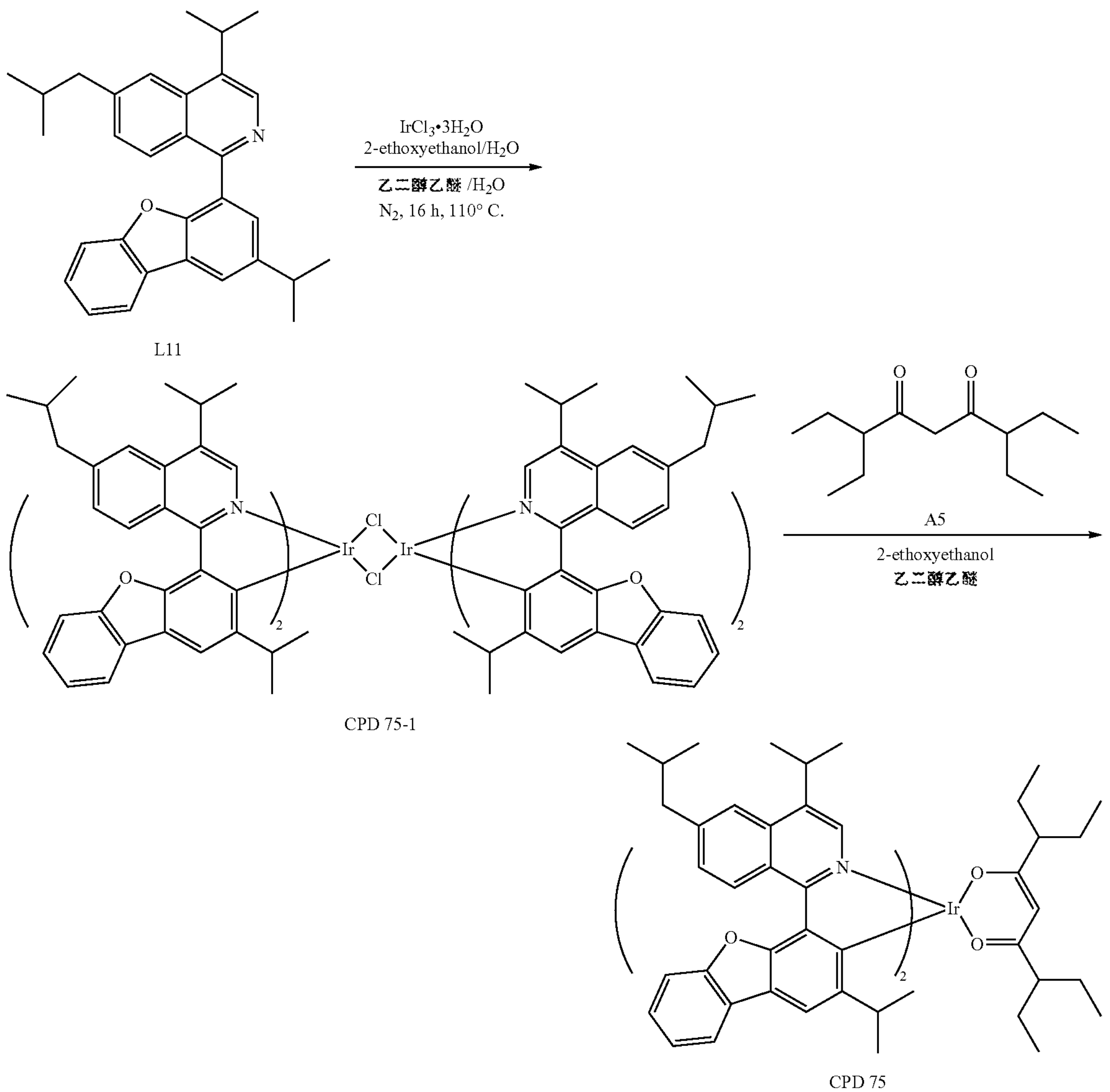

L11

CPD 75-1

CPD 75

Synthesis of a Compound CPD75-1:

With reference to the synthesis process and post-treatment and purification methods of the compound CPD1-1, only the corresponding raw materials were required to be changed. The obtained compound was directly used in the next step without purification.

Synthesis of a Compound CPD 75:

With reference to the synthesis process and post-treatment and purification methods of the compound CPD 1, only the corresponding raw materials were required to be changed, and 4.17 g of a target compound CPD 75 with a yield of 61.81% was obtained. 4.17 g of the crude product CPD 75 was sublimated and purified to obtain 2.94 g of a sublimated pure product CPD 75 with a yield of 70.5%. Mass spectrometry was as follows: 1273.6 (M+H).

Example 10 Synthesis of a Compound CPD 93

Synthesis of a Common Intermediate Compound L12:

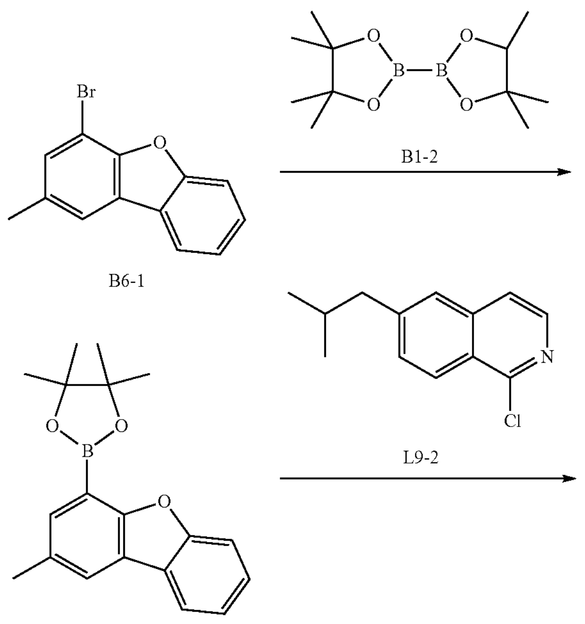

B6-1 B1-2 B6 L9-2

-continued

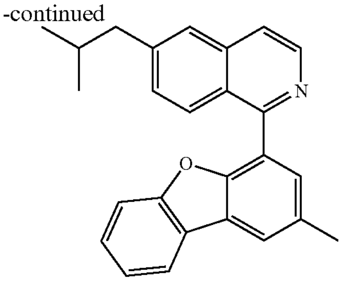

L12

Synthesis of a Compound B6:

With reference to the synthesis process and post-treatment and purification methods of the compound B1, only the corresponding raw materials were required to be changed. Mass spectrometry was as follows: 309.2 (M+H).

Synthesis of a Compound L12:

With reference to the synthesis process and post-treatment and purification methods of the compound L1-4, only the corresponding raw materials were required to be changed. Mass spectrometry was as follows: 366.5 (M+H). $^1$HNMR (400 MHz, $CDCl_3$) δ8.67 (d, J=5.7 Hz, 1H), 7.99 (d, J=7.4 Hz, 1H), 7.89 (s, 1H), 7.75 (d, J=8.6 Hz, 1H), 7.72-7.63 (m, 2H), 7.52 (s, 1H), 7.40 (d J=5.4 Hz, 2H), 7.36-7.27 (m, 2H), 2.68 (d, J=7.2 Hz, 2H), 2.60 (s, 3H), 2.01 (m, 1H), 0.97 (d, J=6.6 Hz, 6H). The compound is as shown in FIG. 1.

Synthesis of a Compound CPD 93:

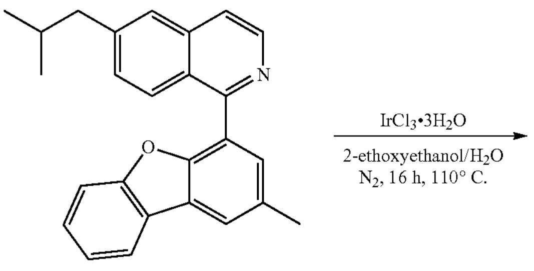

L12

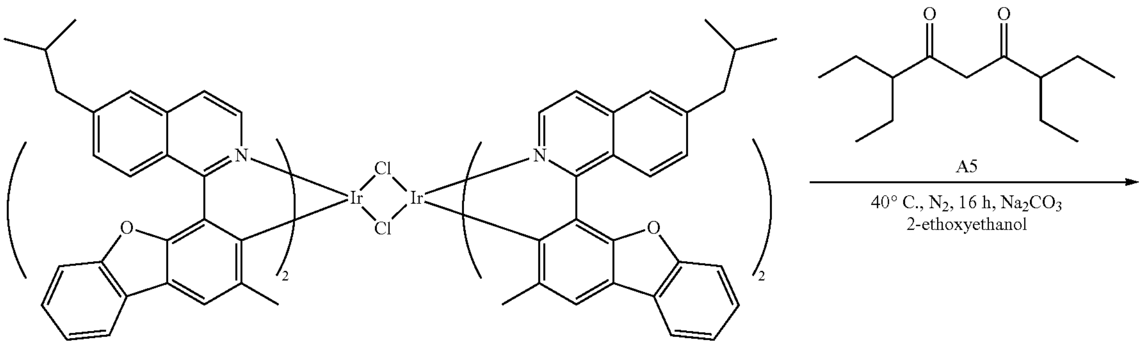

CPD 93-1

-continued

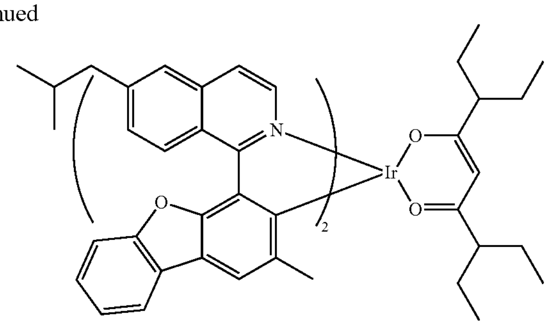

CPD 93

Synthesis of a Compound CPD93-1:

With reference to the synthesis process and post-treatment and purification methods of the compound CPD1-1, only the corresponding raw materials were required to be changed. The obtained compound was directly used in the next step without purification.

Figure 2:
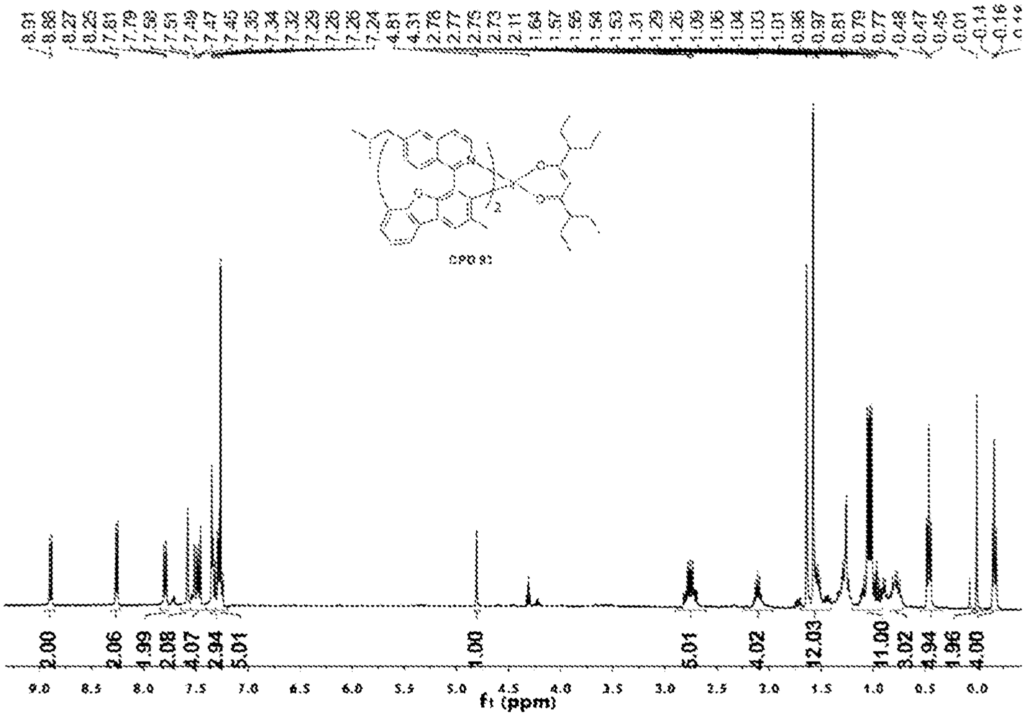
FIG. 2 is a diagram showing the 1HNMR spectrum of a compound CPD 93 of the present invention in a deuterated chloroform solution.

Synthesis of a Compound CPD 93:

With reference to the synthesis process and post-treatment and purification methods of the compound CPD 1, only the corresponding raw materials were required to be changed, and 3.55 g of a target compound CPD 93 with a yield of 54.8% was obtained. 3.55 g of the crude product CPD 93 was sublimated and purified to obtain 2.23 g of a sublimated pure product CPD 93 with a yield of 62.81%. Mass spectrometry was as follows: 1133.5 (M+H). As shown in FIG. 2, $^1$HNMR (400 MHz, $CDCl_3$) δ8.89 (d, J=8.8 Hz, 2H), 8.26 (d, J=6.4 Hz, 2H), 7.80 (d, J=7.5 Hz, 2H), 7.58 (s, 2H), 7.48 (dd, J=15.7, 8.5 Hz, 4H), 7.39-7.31 (m, 3H), 7.31-7.19 (m, 5H), 4.81 (s, 1H), 2.76 (dd, J=14.3, 7.1 Hz, 5H), 2.21-2.01 (m, 4H), 1.76-1.41 (m, 12H), 1.20-0.92 (m, 11H), 0.78 (dd, J=17.0, 9.6 Hz, 3H), 0.47 (t, J=7.4 Hz, 5H), 0.01 (s, 2H), −0.16 (t, J=7.4 Hz, 4H).

Example 11 Synthesis of a Compound CPD 99

Synthesis of a Common Intermediate Compound L13:

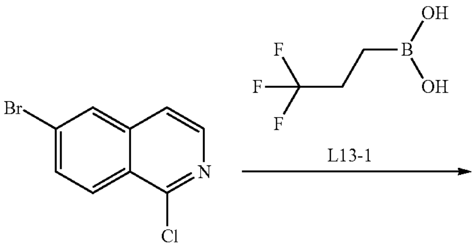

L1-1

L13-1

-continued

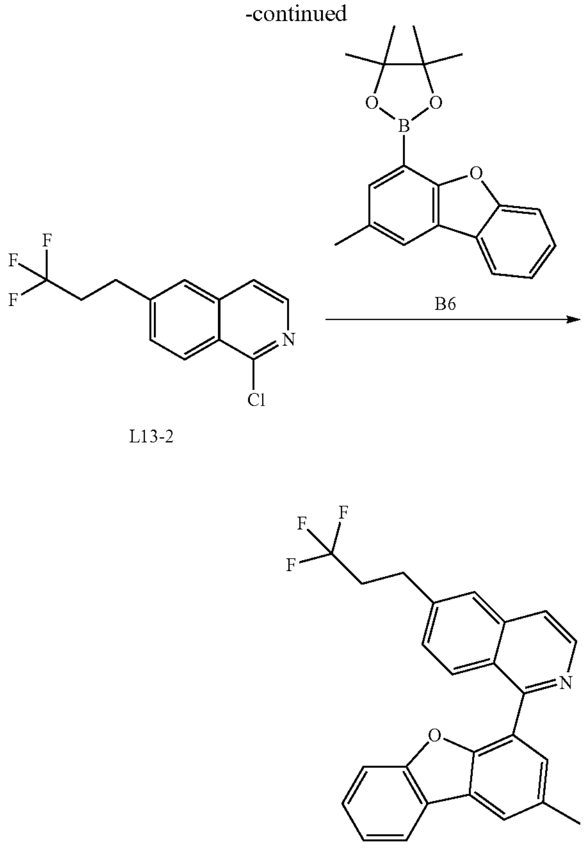

L13-2

B6

L13

Synthesis of a Compound L13-2:

With reference to the synthesis process and post-treatment and purification methods of the compound L1-3, only the corresponding raw materials were required to be changed. Mass spectrometry was as follows: 260.7 (M+H).

Synthesis of a Compound L13:

With reference to the synthesis process and post-treatment and purification methods of the compound L1-4, only the corresponding raw materials were required to be changed. Mass spectrometry was as follows: 406.4 (M+H). $^1$HNMR (400 MHz, CDC13) δ8.69 (d, J=5.7 Hz, 1H), 8.01 (d, J=7.4 Hz, 1H), 7.90 (s, 1H), 7.76 (d, J=8.6 Hz, 1H), 7.73-7.64 (m, 2H), 7.52 (s, 1H), 7.41 (d, J=5.4 Hz, 2H), 7.38-7.28 (m, 2H), 2.93 (t, 3H), 2.46 (t, 3H), 2.31 (s, 3H).

Synthesis of a Compound CPD 99:

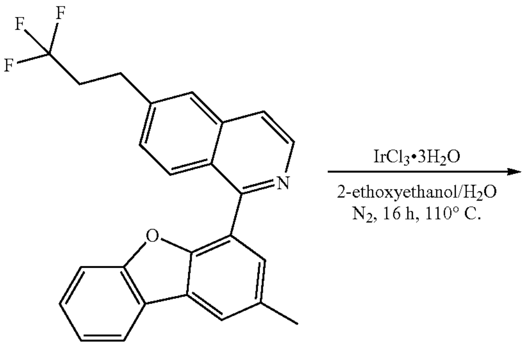

L13

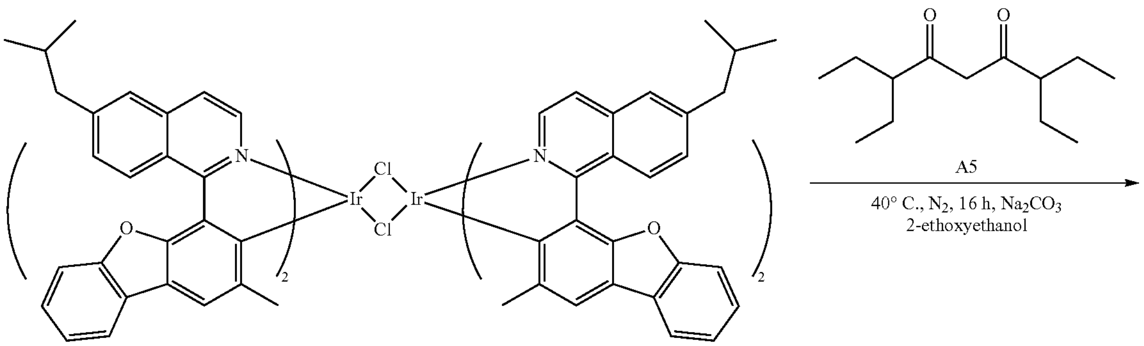

CPD 99-1

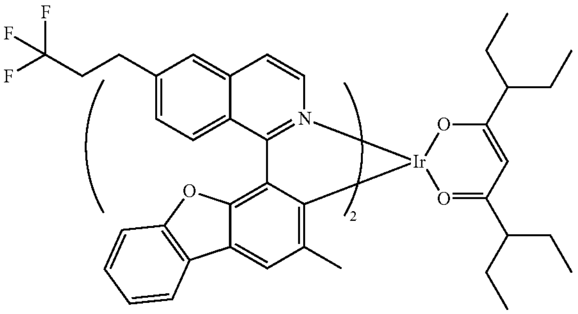

CPD 99

Synthesis of a Compound CPD99-1:

With reference to the synthesis process and post-treatment and purification methods of the compound CPD1-1, only the corresponding raw materials were required to be changed. The obtained compound was directly used in the next step without purification.

Synthesis of a Compound CPD 99:

With reference to the synthesis process and post-treatment and purification methods of the compound CPD 1, only the corresponding raw materials were required to be changed, and 3.79 g of a target compound CPD 99 with a yield of 57.8% was obtained. 3.79 g of the crude product CPD 99 was sublimated and purified to obtain 2.44 g of a sublimated pure product CPD 99 with a yield of 64.37%. Mass spectrometry was as follows: 1213.4 (M+H).

Example 12 Synthesis of a Compound CPD 121

Synthesis of a Common Intermediate Compound L14:

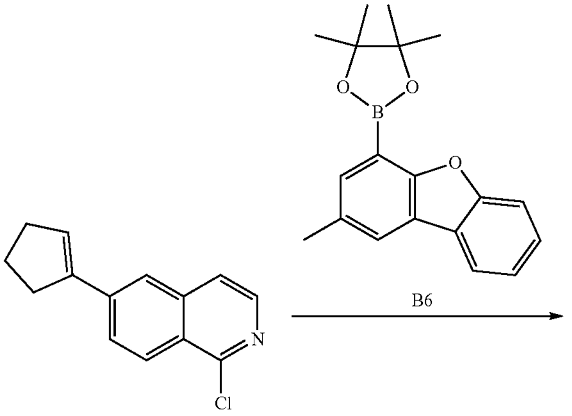

L4-1

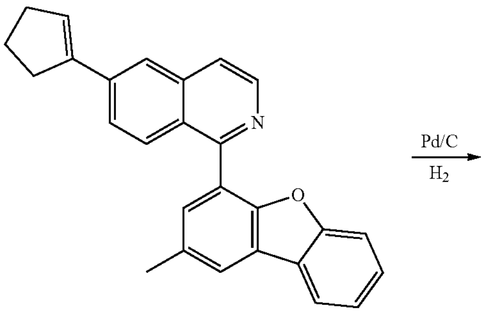

L14-1

-continued

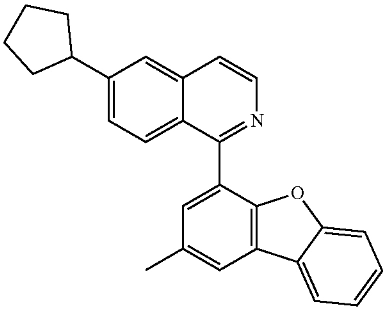

L14

Synthesis of a Compound L14-1:

With reference to the synthesis process and post-treatment and purification methods of the compound L1-4, only the corresponding raw materials were required to be changed. Mass spectrometry was as follows: 376.5 (M+H).

Figure 3:
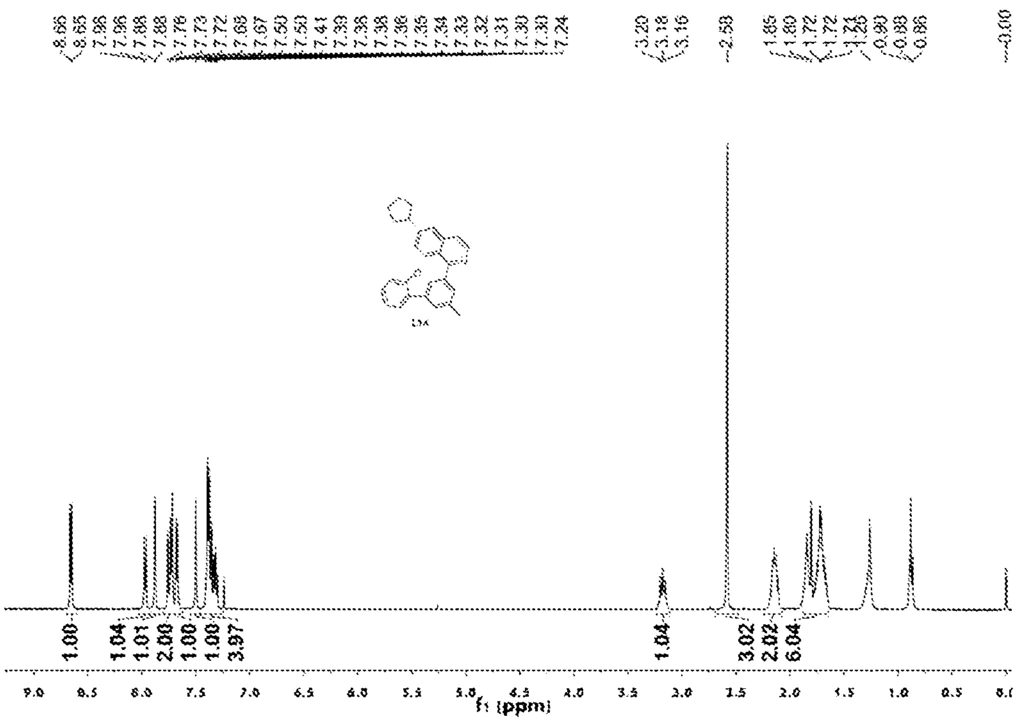
FIG. 3 is a diagram showing the 1HNMR spectrum of a compound L14 of the present invention in a deuterated chloroform solution.

Synthesis of a Compound L14:

With reference to the synthesis process and post-treatment and purification methods of the compound L1, only the corresponding raw materials were required to be changed. Mass spectrometry was as follows: 378.5 (M+H). $^1$HNMR (400 MHz, $CDCl_3$) δ8.65 (d, J=5.7 Hz, 1H), 7.94 (d, J=7.4 Hz, 1H), 7.86 (s, 1H), 7.72 (d, J=7.9 Hz, 2H), 7.69-7.56 (m, 2H), 7.52 (s, 1H), 7.44-7.25 (m, 3H), 2.96 (s, 1H), 2.31 (s, 3H), 1.96 (s, 2H), 1.72 (t, J=25.0 Hz, 6H). The compound is as shown in FIG. 3.

Synthesis of a Compound CPD 121:

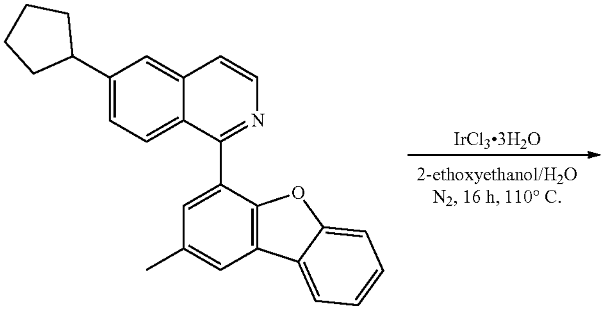

L14

-continued

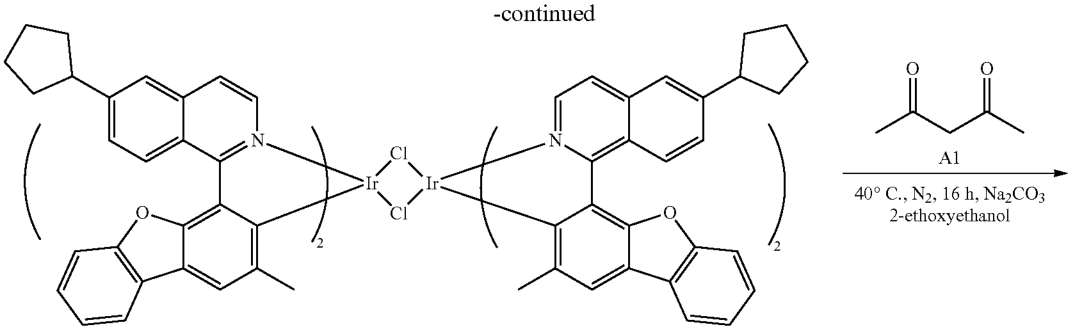

CPD 121-1

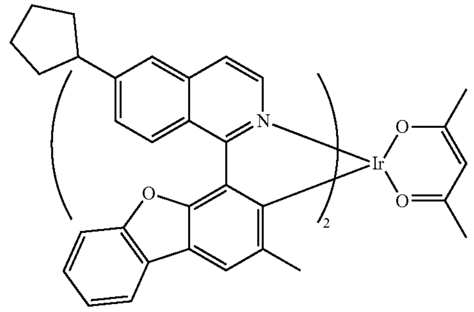

CPD 121

Synthesis of a Compound CPD121-1:

With reference to the synthesis process and post-treatment and purification methods of the compound CPD1-1, only the corresponding raw materials were required to be changed. The obtained compound was directly used in the next step without purification.

Synthesis of a Compound CPD 121:

With reference to the synthesis process and post-treatment and purification methods of the compound CPD 1, only the corresponding raw materials were required to be changed, and 4.05 g of a target compound CPD 121 with a yield of 59.3% was obtained. 4.05 g of the crude product CPD 121 was sublimated and purified to obtain 2.71 g of a sublimated pure product CPD 121 with a yield of 66.91%. Mass spectrometry was as follows: 1045.3 (M+H).

Example 13 Synthesis of a Compound CPD 123

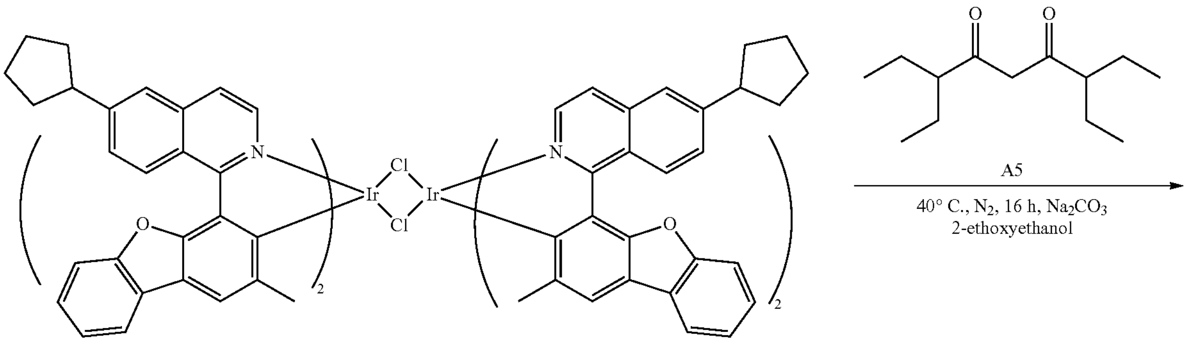

CPD 121-1

-continued

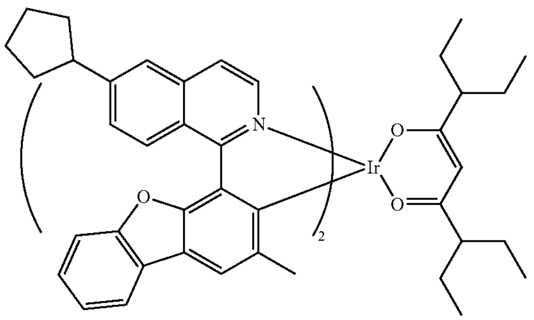

CPD 123

Figure 4:
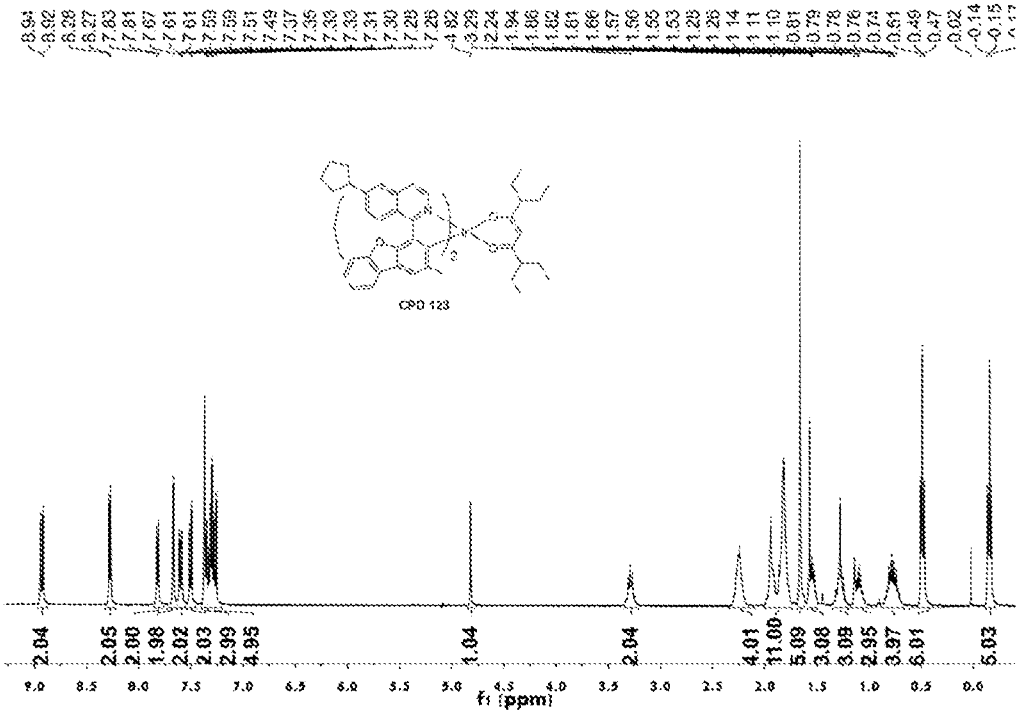
FIG. 4 is a diagram showing the 1HNMR spectrum of a compound CPD 123 of the present invention in a deuterated chloroform solution.

With reference to the synthesis process and post-treatment and purification methods of the compound CPD 1, only the corresponding raw materials were required to be changed, and 3.97 g of a target compound CPD 123 with a yield of 61.1% was obtained. 3.97 g of the crude product CPD 123 was sublimated and purified to obtain 2.66 g of a sublimated pure product CPD 123 with a yield of 67.0%. Mass spectrometry was as follows: 1157.5 (M+H). As shown in FIG. 4, $^{1}$HNMR (400 MHz, $CDCl_3$) δ8.93 (d, J=8.9 Hz, 2H), 8.28 (d, J=6.3 Hz, 2H), 7.82 (d, J=7.5 Hz, 2H), 7.67 (s, 2H), 7.60 (dd, J=8.9, 1.6 Hz, 2H), 7.50 (d, J=8.0 Hz, 2H), 7.36 (d, J=7.5 Hz, 3H), 7.34-7.22 (m, 5H), 4.82 (s, 1H), 3.4-3.18 (m, 2H), 2.24 (s, 4H), 1.86 (dd, J=34.0, 16.9 Hz, 11H), 1.66 (s, 5H), 1.61-1.46 (m, 3H), 1.36-1.19 (m, 3H), 1.11 (dd, J=15.2, 9.7 Hz, 3H), 0.91-0.65 (m, 4H), 0.49 (t, J=7.4 Hz, 6H), −0.15 (t, J=7.4 Hz, 5H).

Example 14 Synthesis of a Compound CPD 145

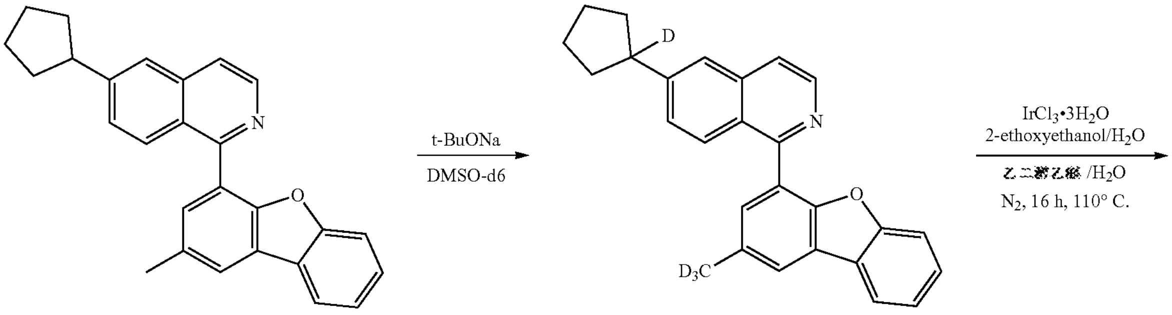

L14 L15

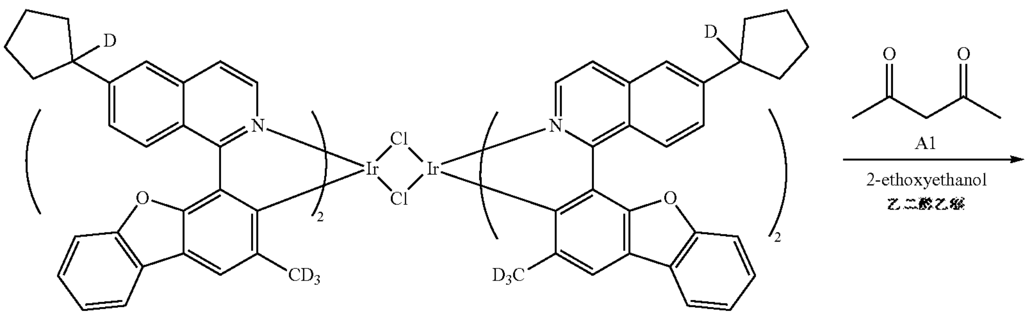

CPD 145-1

-continued

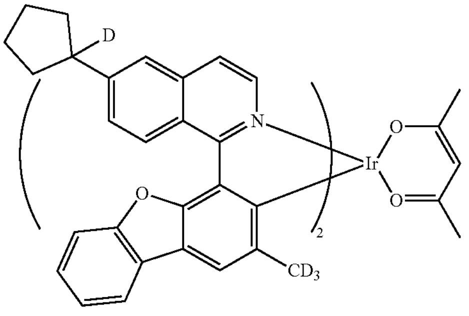

CPD 145

Synthesis of a Compound L15:

The compound L14 (14.3 g, 37.88 mmol, 1.0 eq), sodium tert-butoxide (10.92 g, 113.65 mmol, 3 eq), and DMSO-$d_6$ (172 ml) were sequentially added into a 250 ml one-mouth flask under vacuumization and the replacement of nitrogen for 3 times. A mixture obtained was heated to 75° C. in an oil bath, and stirred for 24 hours. The mixture was cooled to room temperature. Heavy water (35 ml) was added, and stirred for 10 minutes until a yellow solid was precipitated out, and then deionized water (350 ml) was added, and stirred for 10 minutes. After suction filtration was conducted, a yellow solid was collected. The solid was dissolved in ethyl acetate (450 ml), and deionized water was added for water washing for 3 times (200 ml/time). After liquid separation, aqueous phases were combined, and extracted with a small amount of ethyl acetate for one time. Organic phases were combined, concentrated, and dried. A crude product was separated by column chromatography (with a mixture of EA and Hex at a ratio of 1:8) to obtain a product. The product obtained was dried to obtain 12.8 g of a white solid compound L15 with a yield of 88.6%. Mass spectrometry was as follows: 382.5 (M+H). $^1$HNMR (400 MHz, $CDCl_3$) δ8.65 (d, J=5.7 Hz, 1H), 7.94 (d, J=7.4 Hz, 1H), 7.86 (s, 1H), 7.72 (d, J=7.9 Hz, 2H), 7.69-7.56 (m, 2H), 7.52 (s, 1H), 7.44-7.25 (m, 3H), 1.99 (m, 2H), 1.89-1.58 (m, 6H).

Synthesis of a Compound CPD145-1:

With reference to the synthesis process and post-treatment and purification methods of the compound CPD1-1, only the corresponding raw materials were required to be changed. The obtained compound was directly used in the next step without purification.

Synthesis of a Compound CPD 145:

With reference to the synthesis process and post-treatment and purification methods of the compound CPD 1, only the corresponding raw materials were required to be changed, and 3.62 g of a target compound CPD 145 with a yield of 53.7% was obtained. 3.62 g of the crude product CPD 145 was sublimated and purified to obtain 2.25 g of a sublimated pure product CPD 145 with a yield of 62.15%. Mass spectrometry was as follows: 1053.3 (M+H).

Example 15 Synthesis of a Compound CPD 147

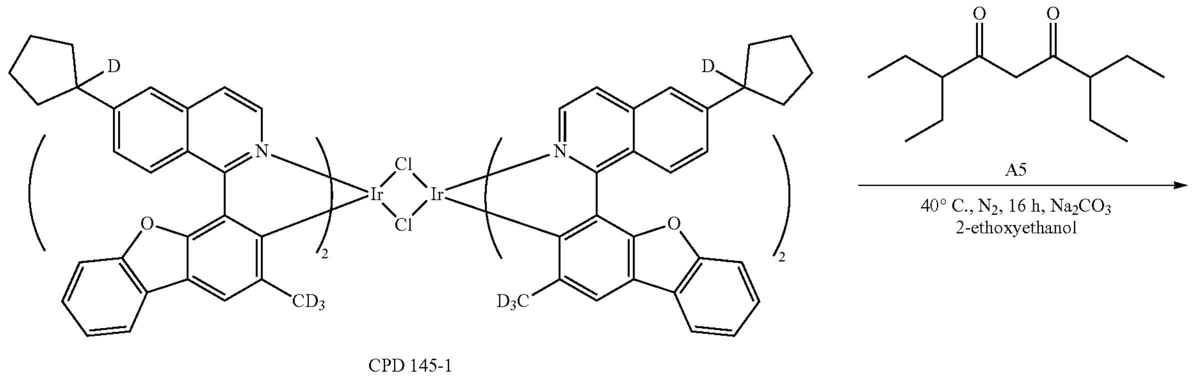

CPD 145-1

-continued

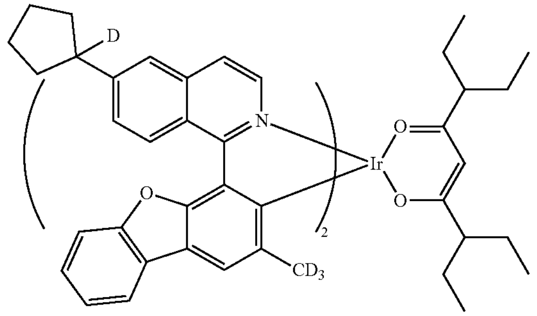

CPD 147

With reference to the synthesis process and post-treatment and purification methods of the compound CPD 1, only the corresponding raw materials were required to be changed, and 3.55 g of a target compound CPD 147 with a yield of 54.4% was obtained. 3.55 g of the crude product CPD 147 was sublimated and purified to obtain 2.12 g of a sublimated pure product CPD 147 with a yield of 59.71%. Mass spectrometry was as follows: 1165.5 (M+H).

Synthesis of a Common Intermediate Compound L16:

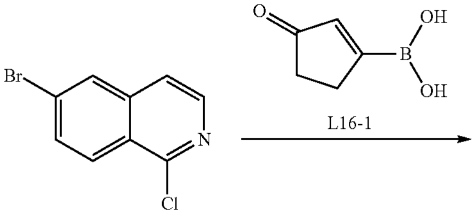

L1-1

L16-1

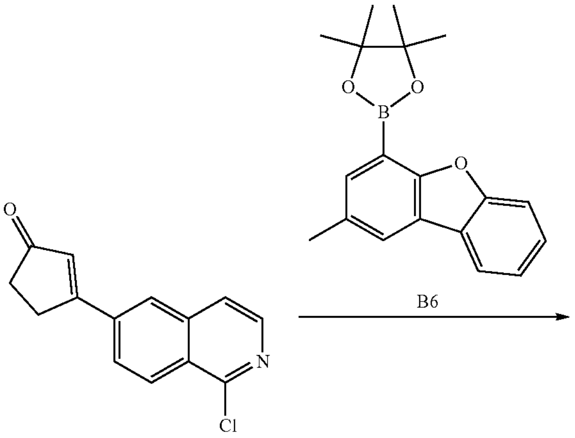

B6

L16-2

-continued

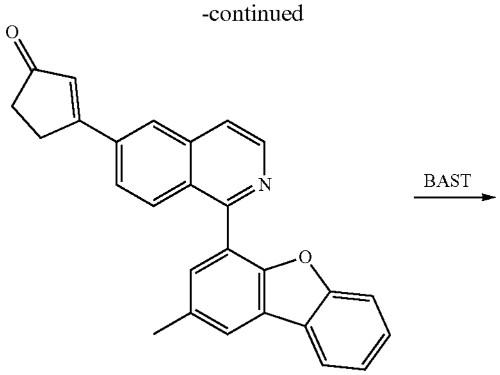

L16-3

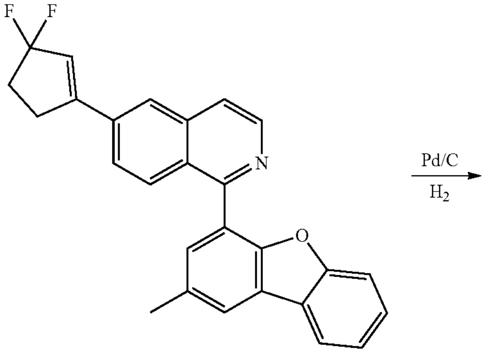

L16-4

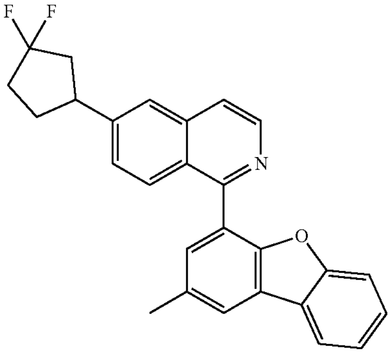

L16

Synthesis of a Compound L16-2:

With reference to the synthesis process and post-treatment and purification methods of the compound L1-3, only the corresponding raw materials were required to be changed. Mass spectrometry was as follows: 244.7 (M+H).

Synthesis of a Compound L16-3:

With reference to the synthesis process and post-treatment and purification methods of the compound L1-4, only the corresponding raw materials were required to be changed. Mass spectrometry was as follows: 390.4 (M+H).

Synthesis of a Compound L16-4:

The compound L16-3 (25 g, 64.19 mmol, 1.0 eq) and dichloromethane (150 ml) were sequentially added into a 500 ml one-mouth flask. The reaction system was cooled to about 0° C., and [bis(2-methoxyethyl)amino]sulfur trifluoride (BAST, 35.51 ml, 192.58 mmol, 3.0 eq) was slowly dropped. After the dropping was completed, a mixture obtained was stirred at room temperature for 16 hours, and then sampled. According to monitoring by TLC, the raw material L16-3 was basically reacted completely. A reaction solution was added into a saturated sodium carbonate solution (450 ml), stirred for 0.5 hour, and subjected to standing for liquid separation. Dichloromethane (150 ml) was added into an aqueous layer for extraction for 1 time, and organic phases were combined. Deionized water was added for water washing for 3 times (100 ml/time). After liquid separation, an organic phase was concentrated, and dried. A crude product was separated by column chromatography (with a mixture of EA and Hex at a ratio of 1:10) to obtain a product. The product obtained was dried to obtain 19.28 g of a white solid compound L16-4 with a yield of 73%. Mass spectrometry was as follows: 412.4 (M+H).

Synthesis of a Compound L16:

With reference to the synthesis process and post-treatment and purification methods of the compound L1, only the corresponding raw materials were required to be changed. Mass spectrometry was as follows: 414.5 (M+H). $^1$HNMR (400 MHz, CDCl3) δ8.65 (d, J=5.7 Hz, 1H), 7.94 (d, J=7.4 Hz, 1H), 7.86 (s, 1H), 7.72 (d, J=7.9 Hz, 2H), 7.69-7.56 (m, 2H), 7.52 (s, 1H), 7.44-7.25 (m, 3H), 3.26 (d, 1H), 2.44 (m, 1H), 2.32 (s, 3H), 2.03 (m, J=28.1, 24.1 Hz, 4H), 1.76 (m, 1H).

Example 16 Synthesis of a Compound CPD 175

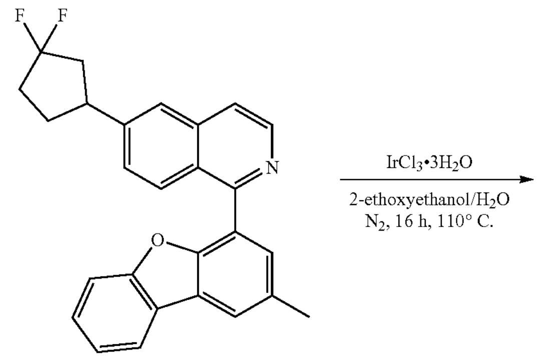

L16

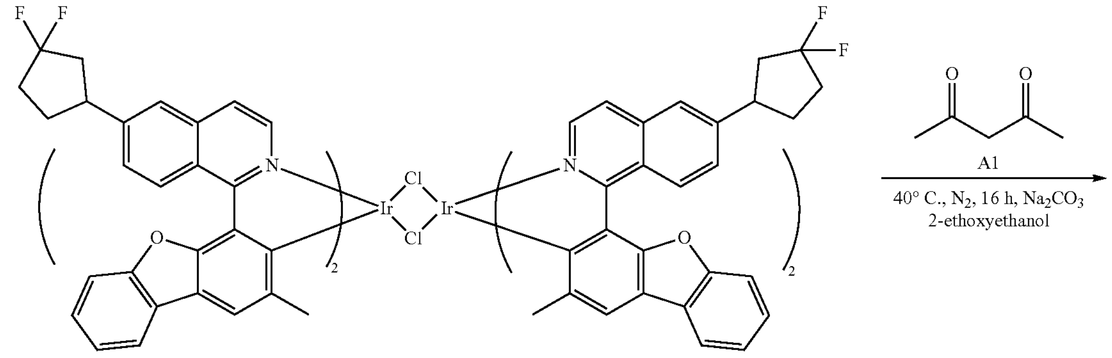

CPD 175-1

-continued

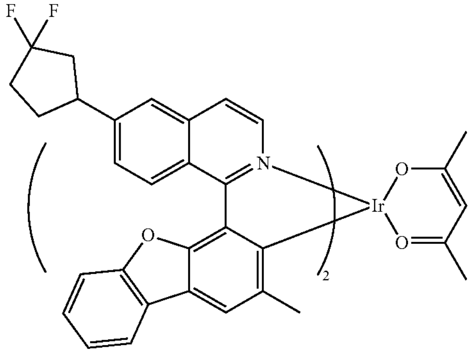

CPD 175

Synthesis of a Compound CPD175-1:

With reference to the synthesis process and post-treatment and purification methods of the compound CPD1-1, only the corresponding raw materials were required to be changed. The obtained compound was directly used in the next step without purification.

Synthesis of a Compound CPD 175:

With reference to the synthesis process and post-treatment and purification methods of the compound CPD 1, only the corresponding raw materials were required to be changed, and 3.77 g of a target compound CPD 175 with a yield of 51.5% was obtained. 3.77 g of the crude product CPD 175 was sublimated and purified to obtain 2.44 g of a sublimated pure product CPD 175 with a yield of 64.72%. Mass spectrometry was as follows: 1117.3 (M+H).

Example 17 Synthesis of a Compound CPD 177

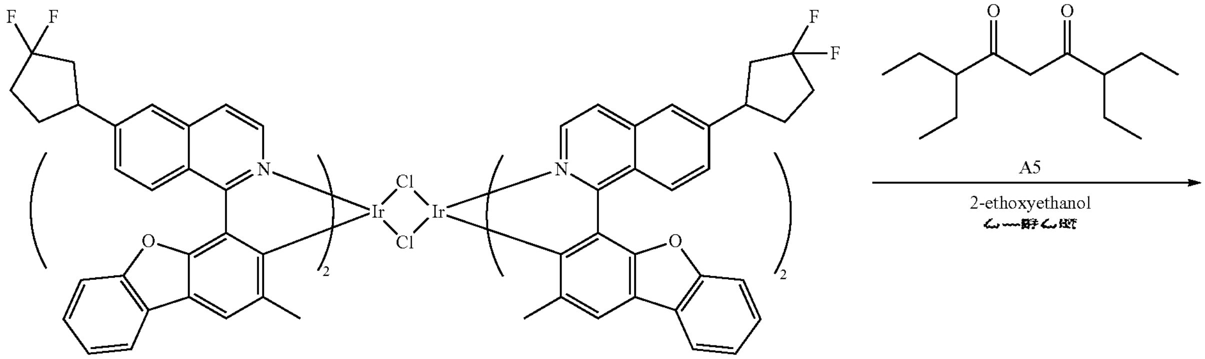

CPD 175-1

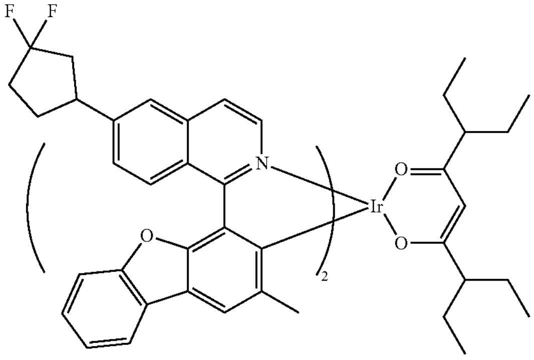

CPD 177

With reference to the synthesis process and post-treatment and purification methods of the compound CPD 1, only the corresponding raw materials were required to be changed, and 3.61 g of a target compound CPD 177 with a yield of 52.7% was obtained. 3.61 g of the crude product CPD 177 was sublimated and purified to obtain 2.37 g of a sublimated pure product CPD 177 with a yield of 65.65%. Mass spectrometry was as follows: 1229.4 (M+H).

Example 18 Synthesis of a Compound CPD 247

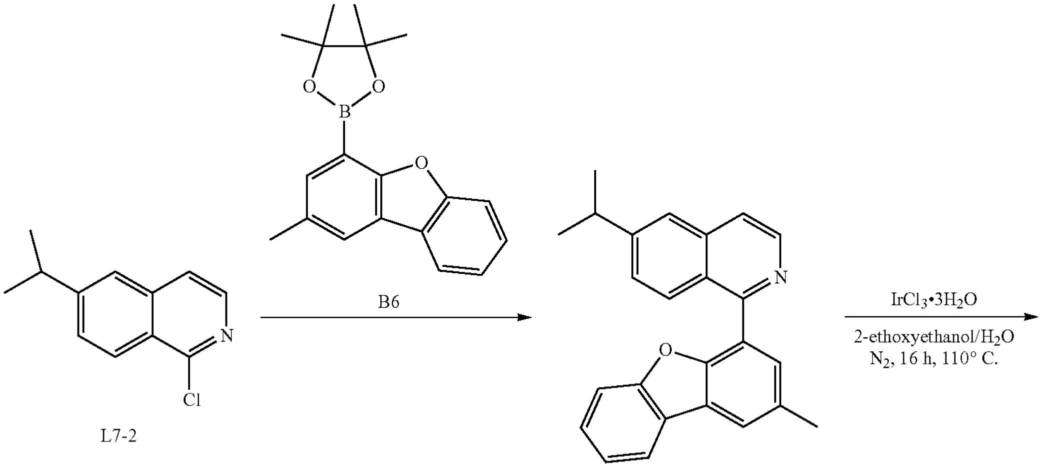

L7-2

L17

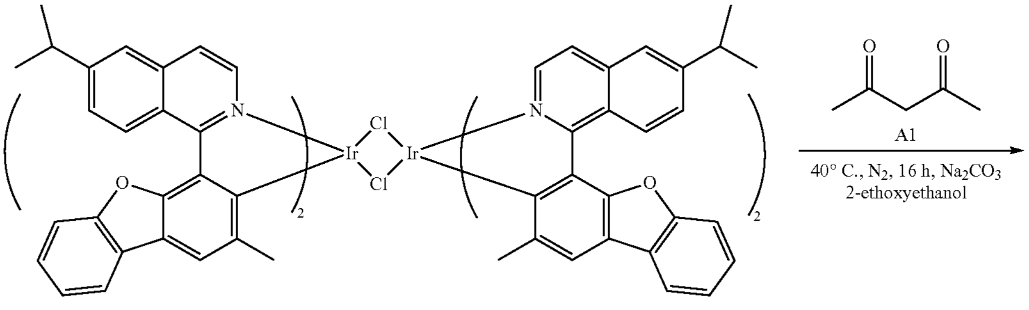

CPD 247-1

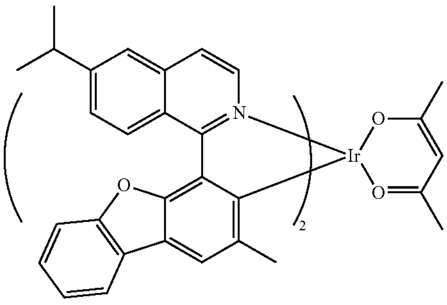

CPD 247

Figure 5:
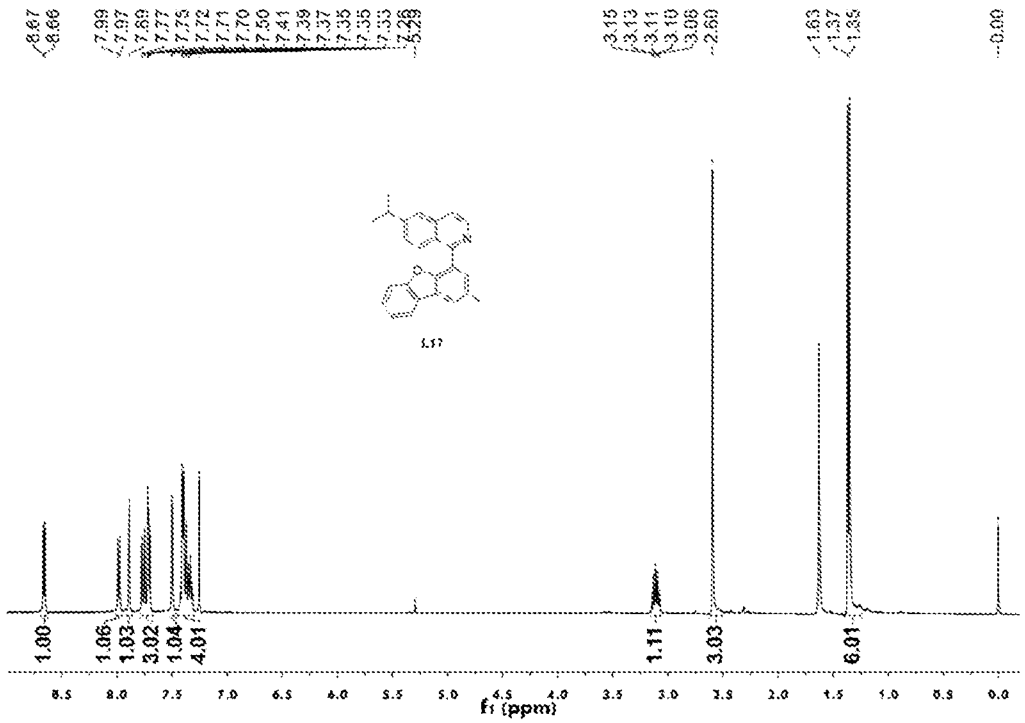
FIG. 5 is a diagram showing the 1HNMR spectrum of a compound L17 of the present invention in a deuterated chloroform solution.

Synthesis of a Compound L17:

With reference to the synthesis process and post-treatment and purification methods of the compound L1-4, only the corresponding raw materials were required to be changed. Mass spectrometry was as follows: 352.4 (M+H). $^1$HNMR (400 MHz, CDCl3) δ8.66 (d, J=5.7 Hz, 1H), 7.98 (d, J=7.4 Hz, 1H), 7.89 (s, 1H), 7.80-7.67 (m, 3H), 7.50 (s, 1H), 7.37 (dq, J=13.9, 6.2 Hz, 4H), 3.11 (dt, J=13.7, 6.8 Hz, 1H), 2.60 (s, 3H), 1.36 (d, J=6.9 Hz, 6H). The compound is as shown in FIG. 5.

Synthesis of a Compound CPD247-1:

With reference to the synthesis process and post-treatment and purification methods of the compound CPD1-1, only the corresponding raw materials were required to be changed. The obtained compound was directly used in the next step without purification.

Synthesis of a Compound CPD 247:

With reference to the synthesis process and post-treatment and purification methods of the compound CPD 1, only the corresponding raw materials were required to be changed, and 3.23 g of a target compound CPD 247 with a yield of 48.9% was obtained. 3.23 g of the crude product CPD 247 was sublimated and purified to obtain 2.03 g of a sublimated pure product CPD 247 with a yield of 62.84%. Mass spectrometry was as follows: 993.2 (M+H).

Example 19 Synthesis of a Compound CPD 249

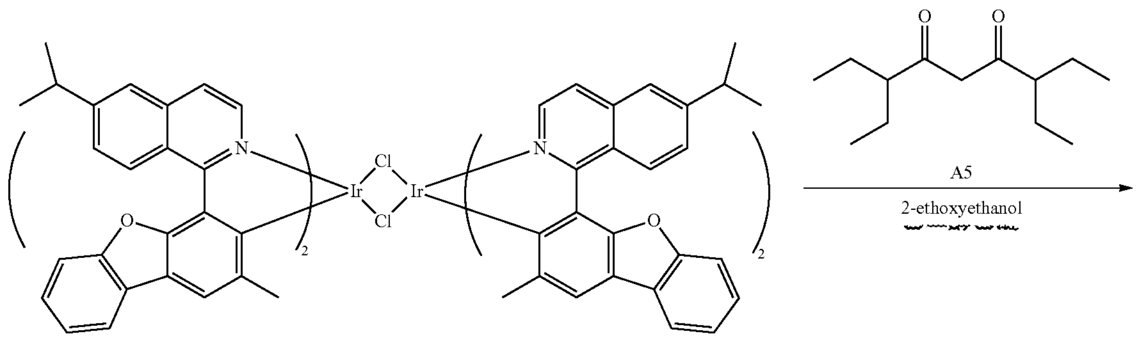

CPD 247-1

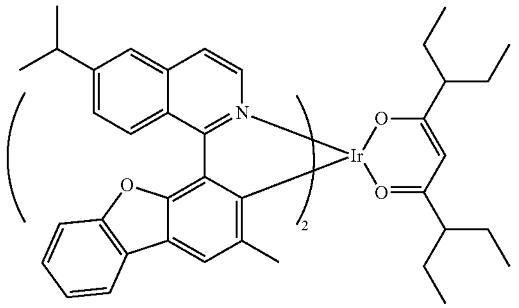

CPD 249

Figure 6:
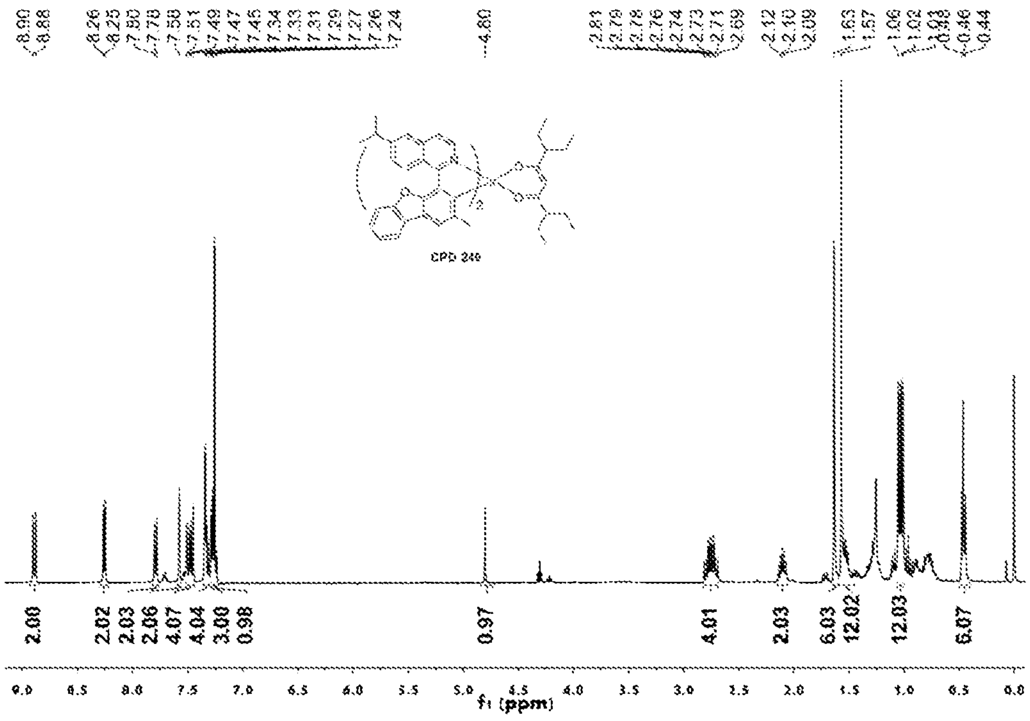
FIG. 6 is a diagram showing the 1HNMR spectrum of a compound CPD 249 of the present invention in a deuterated chloroform solution.

With reference to the synthesis process and post-treatment and purification methods of the compound CPD 1, only the corresponding raw materials were required to be changed, and 3.51 g of a target compound CPD 249 with a yield of 50.7% was obtained. 3.51 g of the crude product CPD 249 was sublimated and purified to obtain 2.17 g of a sublimated pure product CPD 249 with a yield of 61.82%. Mass spectrometry was as follows: 1105.4 (M+H). As shown in FIG. 6, $^1$HNMR (400 MHz, CDCl3) δ8.89 (d, J=8.8 Hz, 2H), 8.26 (d, J=6.4 Hz, 2H), 7.79 (d, J=7.5 Hz, 2H), 7.58 (s, 2H), 7.48 (dd, J=15.7, 8.5 Hz, 5H), 7.37-7.30 (m, 4H), 7.28 (d, J=5.8 Hz, 2H), 4.80 (s, 1H), 2.75 (qd, J=13.2, 7.2 Hz, 4H), 2.10 (dt, J=13.5, 6.7 Hz, 2H), 1.63 (s, 6H), 1.61-1.48 (m, 12H), 1.09-0.98 (m, 12H), 0.46 (t, J=7.4 Hz, 6H).

Synthesis of a Common Intermediate Compound L18:

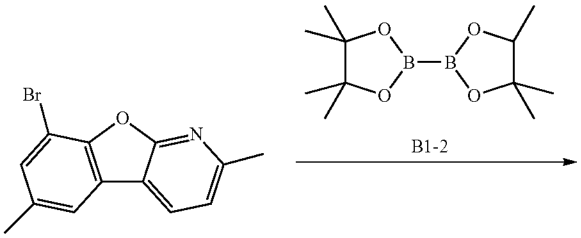

B7-1

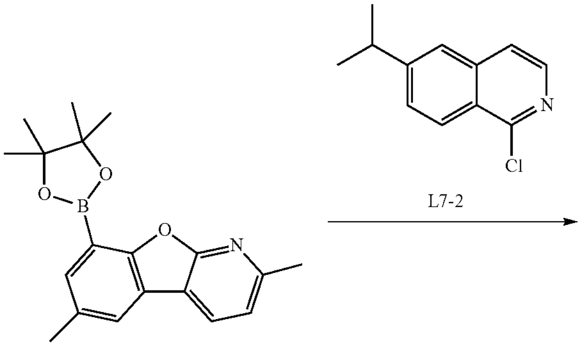

B7

-continued

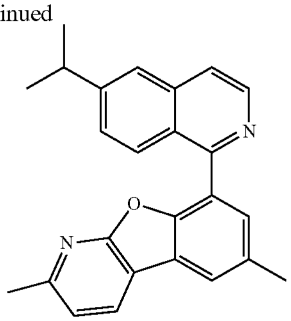

L18

Synthesis of a Compound B7:

With reference to the synthesis process and post-treatment and purification methods of the compound B1, only the corresponding raw materials were required to be changed. Mass spectrometry was as follows: 324.2 (M+H).

Synthesis of a Compound L18:

With reference to the synthesis process and post-treatment and purification methods of the compound L1-4, only the corresponding raw materials were required to be changed. Mass spectrometry was as follows: 367.5 (M+H). $^{1}$HNMR (400 MHz, CDCl3) δ8.4 (d, 1H), 7.81 (dd, 1H), 7.74 (dd, 1H), 7.71 (s, 1H), 7.50 (s, 1H), 7.27-7.36 (m, 3H), 7.1 (d, 1H), 3.12 (q, 1H), 2.55 (s, 3H), 2.35 (s, 3H), 1.29 (d, 6H).

Example 20 Synthesis of a Compound CPD 253

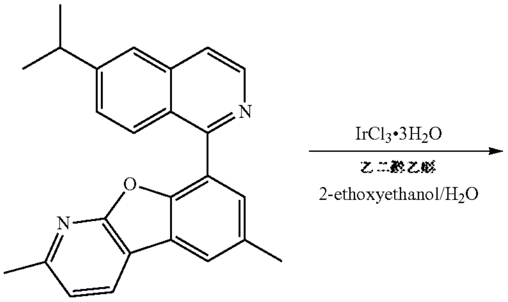

L18

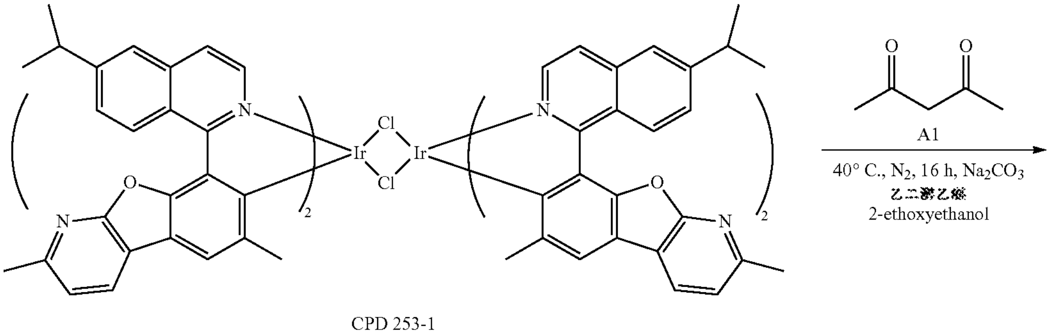

CPD 253-1

-continued

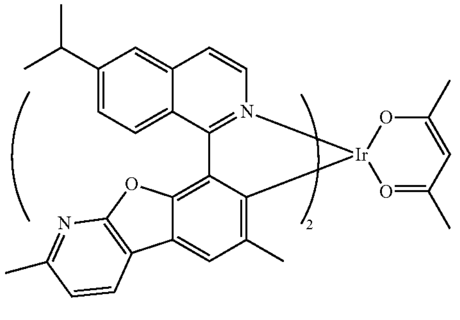

CPD 253

Synthesis of a Compound CPD253-1:

With reference to the synthesis process and post-treatment and purification methods of the compound CPD1-1, only the corresponding raw materials were required to be changed. The obtained compound was directly used in the next step without purification.

Synthesis of a Compound CPD 253:

With reference to the synthesis process and post-treatment and purification methods of the compound CPD 1, only the corresponding raw materials were required to be changed, and 4.13 g of a target compound CPD 253 with a yield of 56.3% was obtained. 4.13 g of the crude product CPD 253 was sublimated and purified to obtain 2.78 g of a sublimated pure product CPD 253 with a yield of 67.3%. Mass spectrometry was as follows: 1023.3 (M+H).

Example 21 Synthesis of a Compound CPD 256

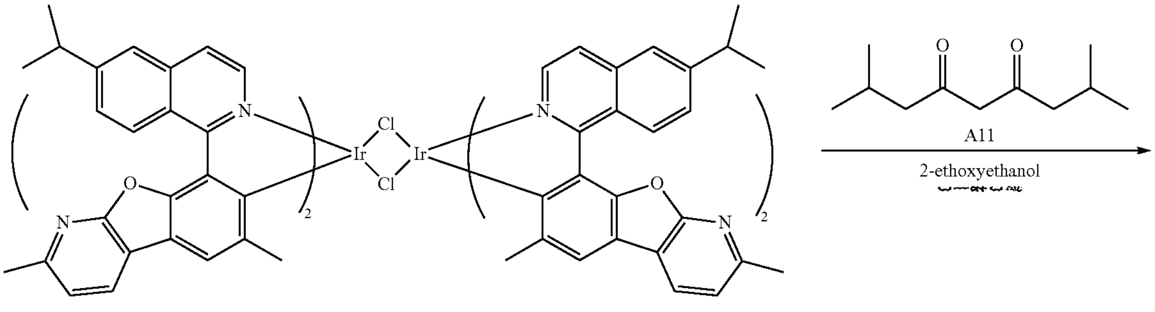

CPD 253-1

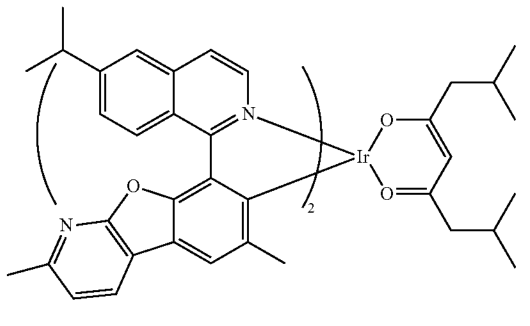

CPD 256

With reference to the synthesis process and post-treatment and purification methods of the compound CPD 1, only the corresponding raw materials were required to be changed, and 4.02 g of a target compound CPD 256 with a yield of 58.1% was obtained. 4.02 g of the crude product CPD 256 was sublimated and purified to obtain 2.67 g of a sublimated pure product CPD 256 with a yield of 66.41%. Mass spectrometry was as follows: 1107.4 (M+H).

Example 22 Synthesis of a Compound CPD 309

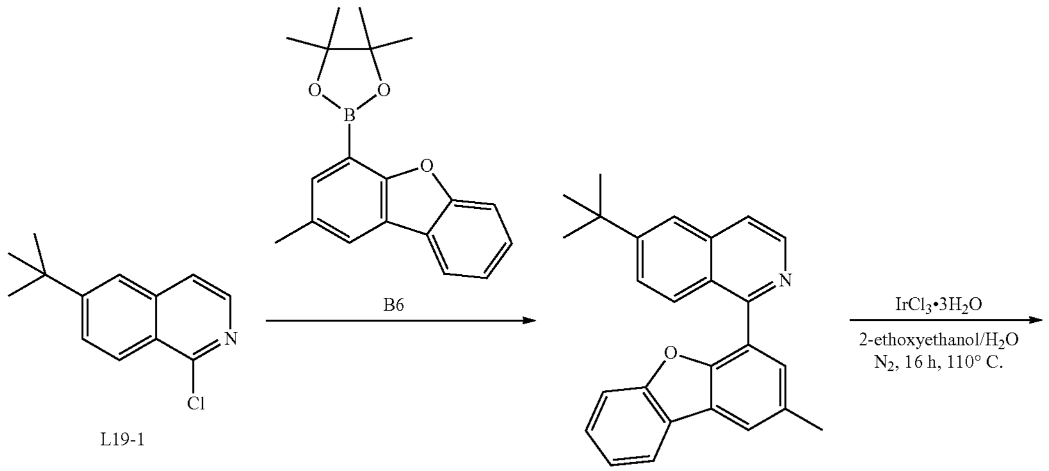

L19-1

L19

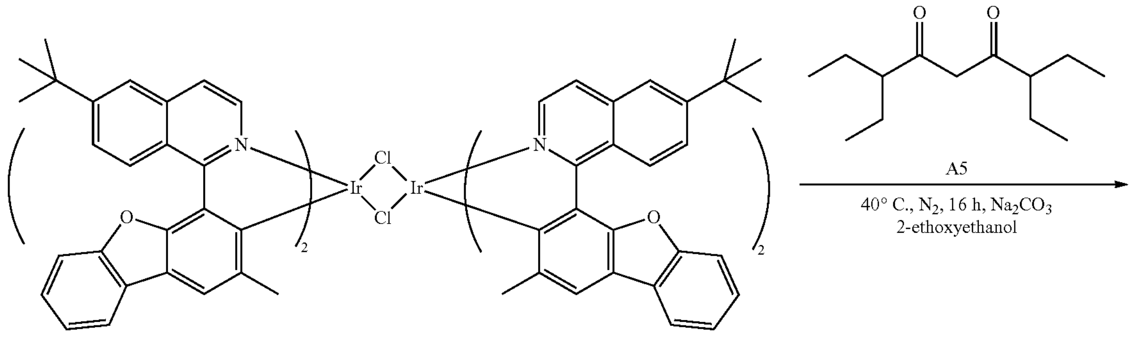

CPD 309-1

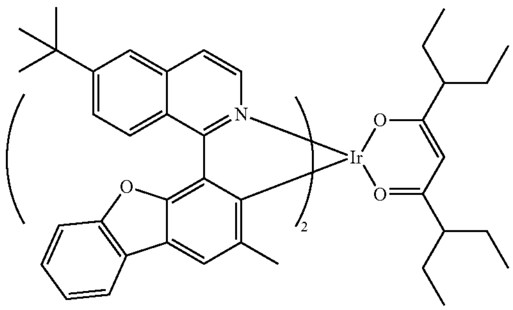

CPD 309

Synthesis of a Compound L19:

With reference to the synthesis process and post-treatment and purification methods of the compound L1-4, only the corresponding raw materials were required to be changed. Mass spectrometry was as follows: 366.5 (M+H). $^1$HNMR (400 MHz, CDCl3) δ8.65 (d, J=5.7 Hz, 1H), 7.97 (d, J=7.4 Hz, 1H), 7.88 (s, 1H), 7.80-7.67 (m, 3H), 7.50 (s, 1H), 7.37 (dq, J=13.9, 6.2 Hz, 4H), 2.60 (s, 3H), 1.43 (s, 9H).

Synthesis of a Compound CPD309-1:

With reference to the synthesis process and post-treatment and purification methods of the compound CPD1-1, only the corresponding raw materials were required to be changed. The obtained compound was directly used in the next step without purification.

Synthesis of a Compound CPD 309:

With reference to the synthesis process and post-treatment and purification methods of the compound CPD 1, only the corresponding raw materials were required to be changed, and 3.08 g of a target compound CPD 309 with a yield of 47.8% was obtained. 3.08 g of the crude product CPD 309 was sublimated and purified to obtain 1.89 g of a sublimated pure product CPD 309 with a yield of 61.36%. Mass spectrometry was as follows: 1133.5 (M+H).

Example 23 Synthesis of a Compound CPD 315

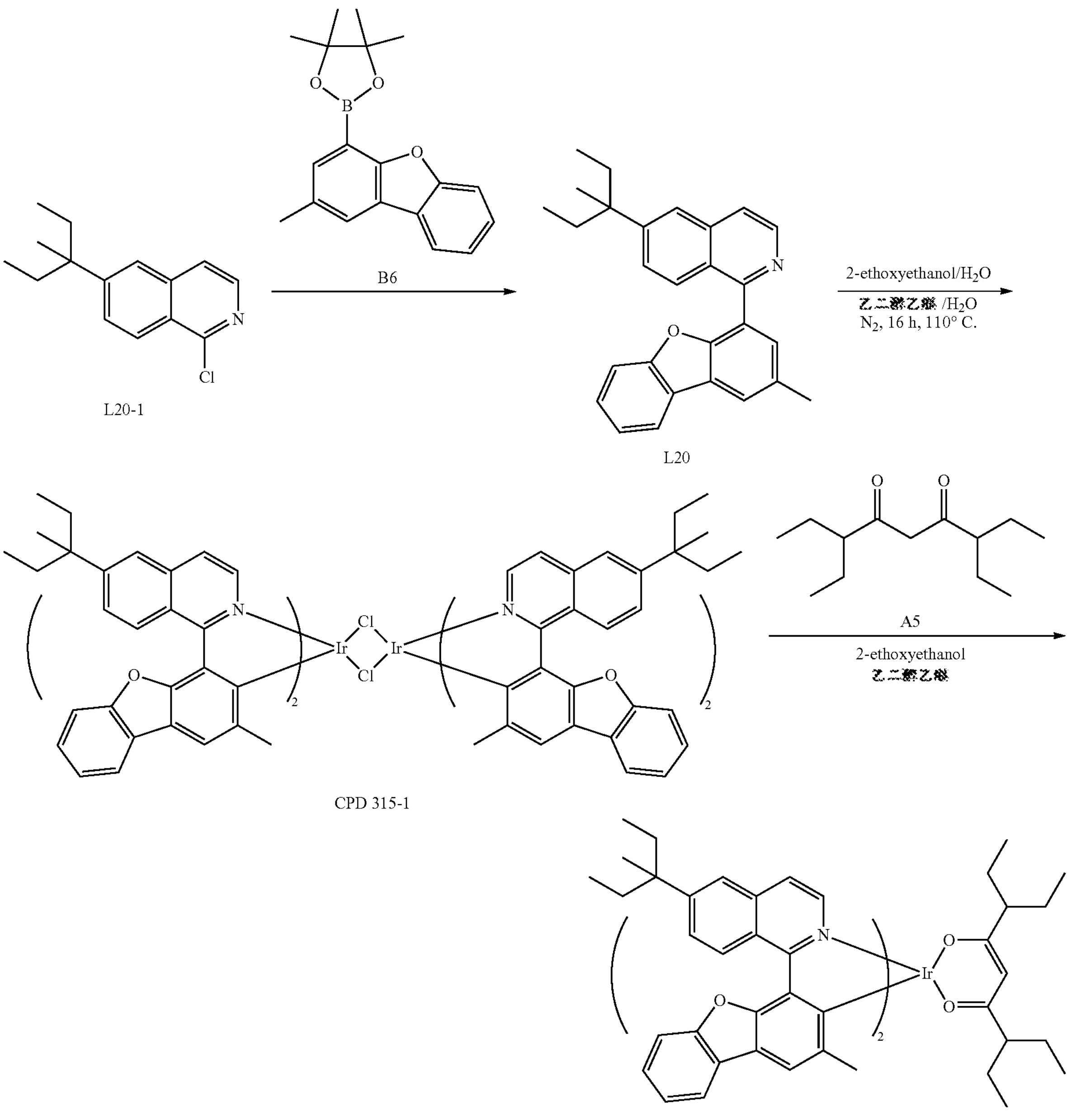

L20-1

L20

CPD 315-1

CPD 315

Synthesis of a Compound L20:

With reference to the synthesis process and post-treatment and purification methods of the compound L1-4, only the corresponding raw materials were required to be changed. Mass spectrometry was as follows: 394.5 (M+H). $^1$HNMR (400 MHz, CDCl3) δ8.65 (d, J=5.7 Hz, 1H), 7.99 (d, J=7.4 Hz, 1H), 7.88 (s, 1H), 7.80-7.67 (m, 3H), 7.50 (s, 1H), 7.37 (dq, J=13.9, 6.2 Hz, 4H), 2.60 (s, 3H), 1.78 (m, J=4.6 Hz, 4H), 1.35 (s, 3H), 0.89 (t, 6H).

Synthesis of a Compound CPD315-1:

With reference to the synthesis process and post-treatment and purification methods of the compound CPD1-1, only the corresponding raw materials were required to be changed. The obtained compound was directly used in the next step without purification.

Synthesis of a Compound CPD 315:

With reference to the synthesis process and post-treatment and purification methods of the compound CPD 1, only the corresponding raw materials were required to be changed, and 3.44 g of a target compound CPD 315 with a yield of 52.2% was obtained. 3.44 g of the crude product CPD 315 was sublimated and purified to obtain 2.24 g of a sublimated pure product CPD 315 with a yield of 65.11%. Mass spectrometry was as follows: 1189.5 (M+H).

Example 24 Synthesis of a Compound CPD 321

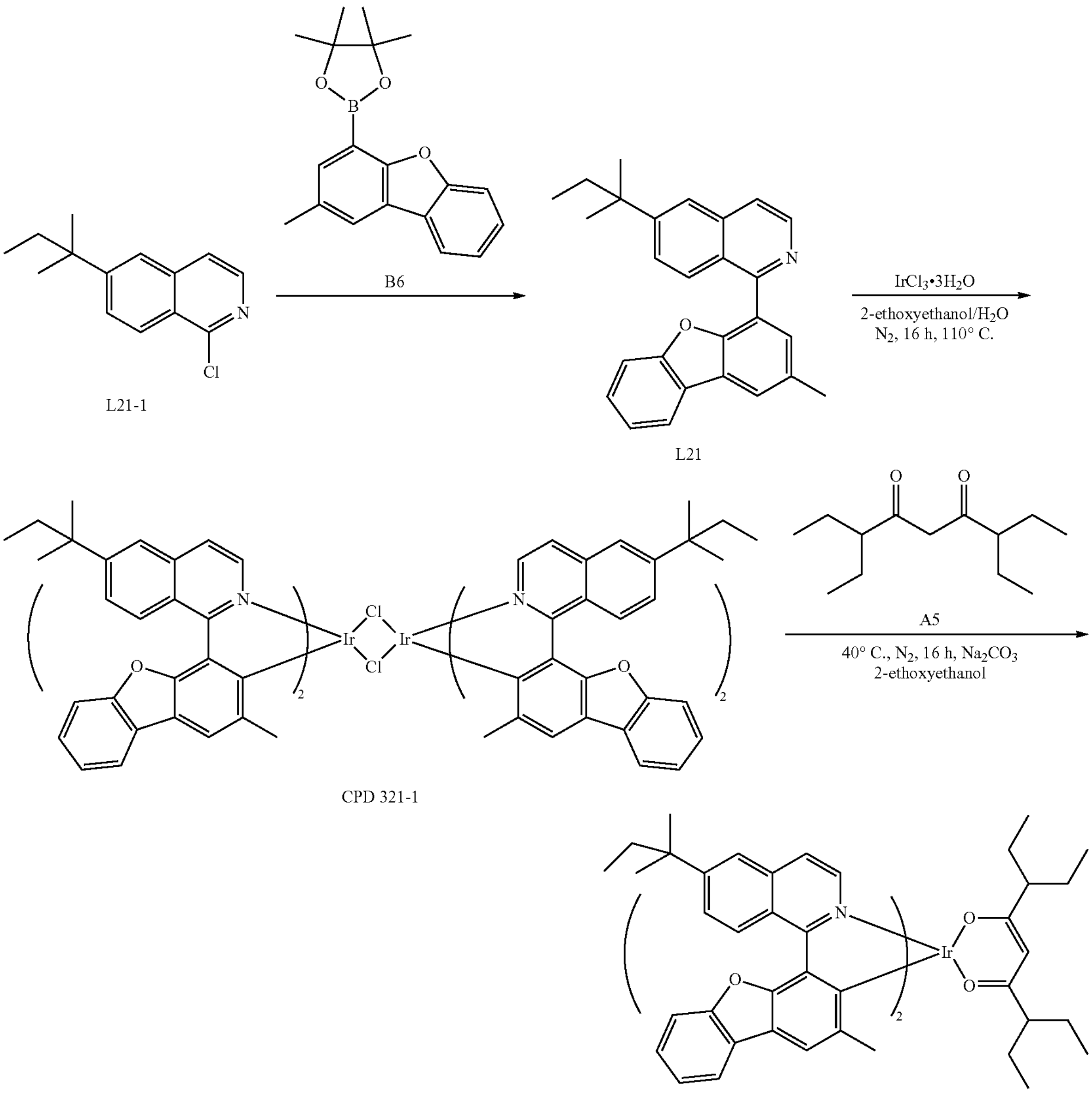

L21-1

L21

CPD 321-1

CPD 321

Synthesis of a Compound L21:

With reference to the synthesis process and post-treatment and purification methods of the compound L1-4, only the corresponding raw materials were required to be changed. Mass spectrometry was as follows: 380.5 (M+H). $^1$HNMR (400 MHz, CDCl3) δ8.66 (d, J=5.7 Hz, 1H), 7.98 (d, J=7.4 Hz, 1H), 7.89 (s, 1H), 7.80-7.67 (m, 3H), 7.50 (s, 1H), 7.37 (dq, J=13.9, 6.2 Hz, 4H), 2.60 (s, 3H), 1.78 (t, 2H), 0.90 (d, J=10.0 Hz, 9H).

Synthesis of a Compound CPD321-1:

With reference to the synthesis process and post-treatment and purification methods of the compound CPD1-1, only the corresponding raw materials were required to be changed. The obtained compound was directly used in the next step without purification.

Synthesis of a Compound CPD 321:

With reference to the synthesis process and post-treatment and purification methods of the compound CPD 1, only the corresponding raw materials were required to be changed, and 3.21 g of a target compound CPD 321 with a yield of 51.1% was obtained. 3.21 g of the crude product CPD 321 was sublimated and purified to obtain 2.16 g of a sublimated pure product CPD 321 with a yield of 67.28%. Mass spectrometry was as follows: 1161.5 (M+H).

Other compounds can be synthesized and sublimated by using corresponding materials according to same or similar methods.

Figure 7:
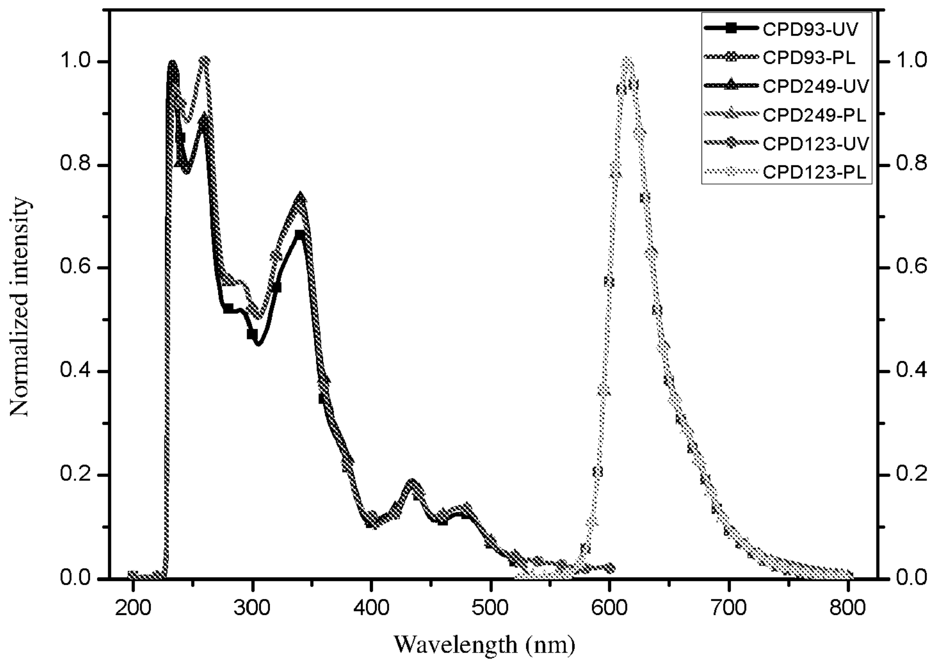
FIG. 7 shows the ultraviolet absorption spectrum and emission spectrum of the compounds CPD 93/CPD 123/CPD 249 of the present invention in a dichloromethane solution.

The ultraviolet absorption spectrum and emission spectrum of the compounds CPD 93/CPD 123/CPD 249 of the present invention in a dichloromethane solution are as shown in FIG. 7. All the compounds of the present invention have more saturated red luminescence and narrow half-peak width, so that the realization of high luminescence efficiency is facilitated.

Application Example: Manufacture of an Organic Electroluminescent Device

A glass substrate with a size of 50 mm*50 mm*1.0 mm including an ITO (100 nm) transparent electrode was ultrasonically cleaned in ethanol for 10 minutes, dried at 150° C., and then treated with $N_2$ plasma for 30 minutes. The washed glass substrate was installed on a substrate support of a vacuum evaporation device. At first, a compound HATCN for covering the transparent electrode was evaporated on the surface of the side having a transparent electrode line to form a thin film with a thickness of 5 nm. Next, a layer of HTM1 was evaporated to form a thin film with a thickness of 60 nm. Then, a layer of HTM2 was evaporated on the HTM1 thin film to form a thin film with a thickness of 10 nm. After that, a main material CBP and a doping compound (including reference compounds X and CPD X) were co-evaporated on the HTM2 film layer to obtain a film with a thickness of 30 nm, where a ratio of the main material to the doping material was 90%:10%. An $AlQ_3$ film layer (25 nm) and a LiF film layer (1 nm) were evaporated on a light-emitting layer in sequence. At last, a layer of metal A1 (100 nm) was evaporated to serve as an electrode.

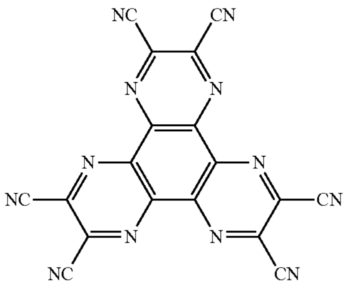

HATCN

HTM 1

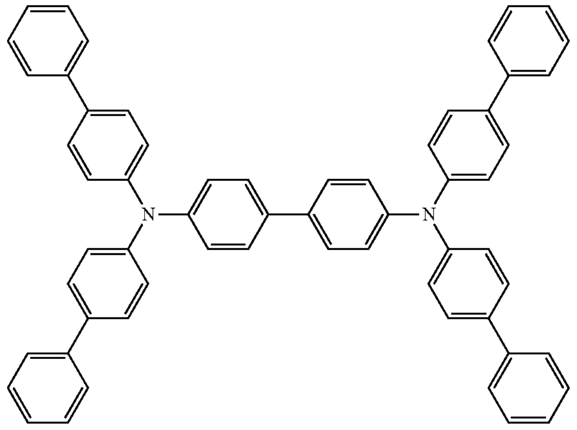

-continued

HTM 2

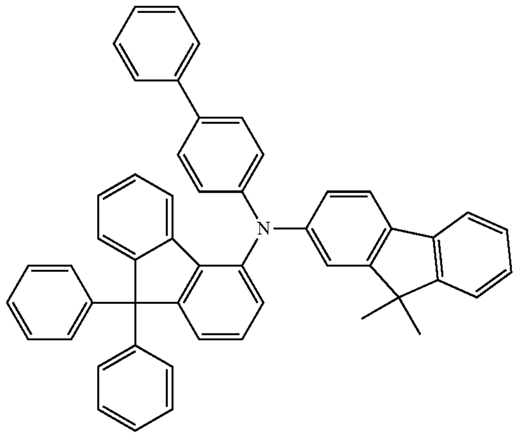

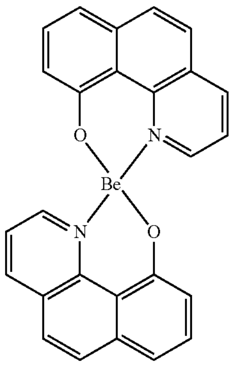

Main material

AlQ3

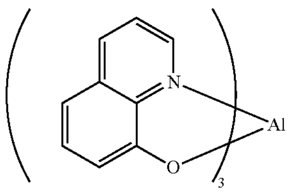

-continued

Reference compound 1

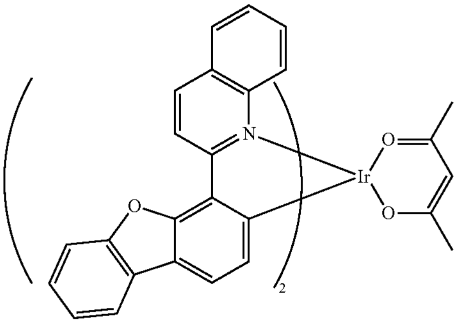

Reference compound 2

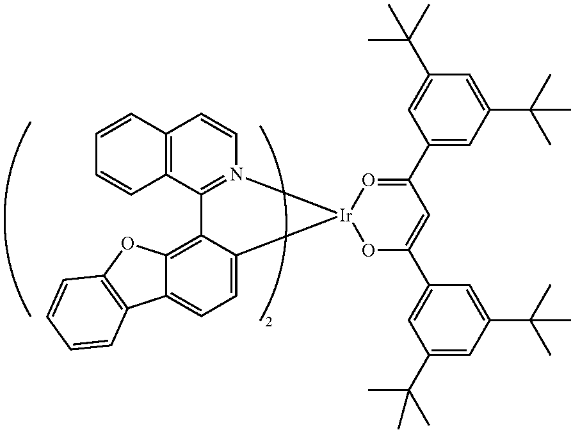

-continued

Reference compound 3

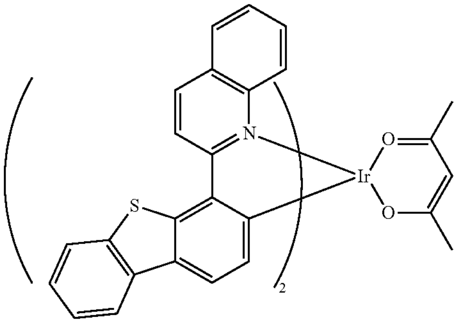

Reference compound 4

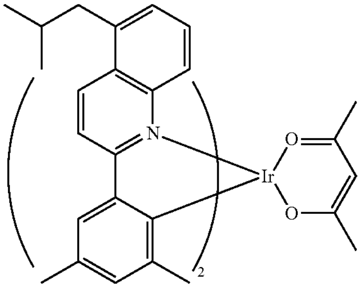

Evaluation: Properties of a device obtained above were tested. In various examples and comparative examples, a constant-current power supply (Keithley 2400) was used, a current at a fixed density was used for flowing through light-emitting elements, and a spectroradiometer (CS 2000) was used for testing the light-emitting spectrum. Meanwhile, the voltage value was measured, and the time (LT90) when the brightness was reduced to 90% of an initial brightness was tested. Results are shown as follows.

| | Doping material | Starting voltage V | Current efficiency Cd/A | Power efficiency lm/W | Peak wavelength nm | LT90 @ 3000 nits |
|---|---|---|---|---|---|---|
| Example 1 | CPD 1 | 4.21 | 30.3 | 22.0 | 616 | 192 |
| Example 2 | CPD 3 | 4.18 | 32.9 | 24.6 | 616 | 233 |
| Example 3 | CPD 8 | 4.17 | 29.9 | 22.5 | 615 | 212 |
| Example 4 | CPD 21 | 4.18 | 33.1 | 24.6 | 617 | 225 |
| Example 5 | CPD 27 | 4.16 | 30.6 | 22.9 | 616 | 218 |
| Example 6 | CPD 28 | 4.17 | 29.3 | 22.1 | 615 | 201 |
| Example 7 | CPD 33 | 4.15 | 31.2 | 23.6 | 616 | 219 |
| Example 8 | CPD 39 | 4.20 | 32.6 | 24.4 | 617 | 239 |
| Example 9 | CPD 75 | 4.19 | 31.6 | 23.7 | 618 | 218 |
| Example 10 | CPD 93 | 4.16 | 31.3 | 23.6 | 616 | 232 |
| Example 11 | CPD 99 | 4.13 | 30.9 | 23.5 | 615 | 189 |
| Example 12 | CPD 121 | 4.18 | 29.3 | 22.0 | 616 | 186 |
| Example 13 | CPD 123 | 4.15 | 32.5 | 24.6 | 617 | 225 |
| Example 14 | CPD 145 | 4.16 | 29.6 | 22.4 | 616 | 203 |
| Example 15 | CPD 147 | 4.16 | 33.2 | 25.1 | 618 | 229 |
| Example 16 | CPD 175 | 4.25 | 30.2 | 22.3 | 620 | 178 |
| Example 17 | CPD 177 | 4.26 | 29.9 | 22.1 | 620 | 192 |
| Example 18 | CPD 247 | 4.18 | 29.1 | 21.8 | 615 | 201 |
| Example 19 | CPD 249 | 4.16 | 30.3 | 22.9 | 616 | 222 |
| Example 20 | CPD 253 | 4.05 | 31.0 | 24.03 | 620 | 211 |
| Example 21 | CPD 256 | 3.99 | 33.1 | 25.97 | 626 | 232 |
| Example 22 | CPD 309 | 4.14 | 30.9 | 23.4 | 616 | 229 |
| Example 23 | CPD 315 | 4.15 | 31.6 | 23.9 | 617 | 220 |
| Example 24 | CPD 321 | 4.15 | 31.3 | 23.7 | 617 | 219 |
| Comparative Example 1 | Reference compound 1 | 4.56 | 21 | 14.46 | 610 | 102 |
| Comparative Example 2 | Reference compound 2 | 4.41 | 20 | 14.24 | 612 | 116 |
| Comparative Example 3 | Reference compound 3 | 4.64 | 21 | 14.21 | 611 | 94 |
| Comparative Example 4 | Reference compound 4 | 4.88 | 18 | 11.58 | 608 | 82 |

Through comparison of the data in the above table, it can be seen that compared with reference compounds, the compound of the present invention used as a dopant in an organic electroluminescent device has the advantages that more excellent properties, such as driving voltage, luminescence efficiency, and device service life, are achieved.

Comparison of the sublimation temperature is as follows. The sublimation temperature is defined as the temperature corresponding to an evaporation rate of 1 AA at a vacuum degree of $10^{-7}$ Torr. Test results are shown as follows.

| Doping material | Sublimation temperature |
|---|---|
| CPD 1 | 263 |
| CPD 75 | 262 |
| CPD 93 | 265 |
| CPD 99 | 258 |
| CPD 123 | 269 |
| CPD 249 | 268 |
| Reference compound 1 | 280 |
| Reference compound 2 | 288 |
| Reference compound 3 | 286 |
| Reference compound 4 | 276 |

Through comparison of the data in the above table, it can be seen that the metal iridium complex of the present invention has low sublimation temperature, and industrial application is facilitated.

According to the present invention, through special combinations of substituents, better device luminescence efficiency and improved service life are achieved unexpectedly. Meanwhile, compared with the prior art, low sublimation temperature is achieved unexpectedly. According to the above results, it is indicated that the compound of the present invention has the advantages of low sublimation temperature, high optical and electrochemical stability, high color saturation, high luminescence efficiency, and long device service life, and can be used in organic electroluminescent devices. In particular, the complex has the potential for application in the OLED industry as a red light-emitting dopant.

The invention claimed is:

1. A metal iridium complex, having a structure formula as shown in the following formula (I):

(I)

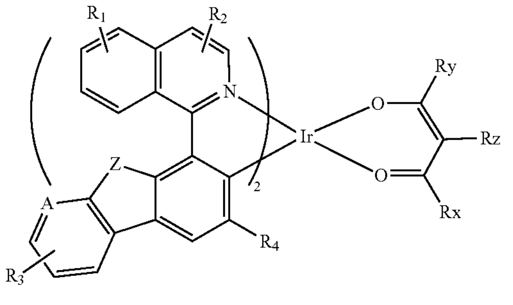

wherein:

A is $CR_0$;

the number of $R_1$, $R_2$, and $R_3$ ranges from a single substitution number to a maximum possible substitution number;

$R_1$ is independently selected from substituted or unsubstituted $C_1$-$C_{10}$ alkyl, substituted or unsubstituted $C_3$-$C_{20}$ cycloalkyl, substituted or unsubstituted $C_1$-$C_{10}$ heteroalkyl, substituted or unsubstituted $C_6$-$C_{30}$ aralkyl, substituted or unsubstituted $C_6$-$C_{30}$ aryl, or substituted or unsubstituted $C_1$-$C_8$ heteroaryl;

$R_4$ is substituted or unsubstituted $C_3$-$C_6$ branched alkyl, substituted $C_3$-$C_6$ linear alkyl, or substituted or unsubstituted $C_3$-$C_6$ cycloalkyl; substituted or unsubstituted $C_1$-$C_{10}$ heteroalkyl, substituted or unsubstituted $C_6$-$C_{30}$ aralkyl, substituted or unsubstituted $C_6$-$C_{30}$ aryl, or substituted or unsubstituted $C_1$-$C_8$ heteroaryl;

$R_0$, $R_2$, and $R_3$ are independently selected from hydrogen, deuterium, halogen, substituted or unsubstituted $C_1$-$C_{10}$ alkyl, substituted or unsubstituted $C_3$-$C_{20}$ cycloalkyl, substituted or unsubstituted $C_2$-$C_{10}$-alkenyl, substituted or unsubstituted $C_1$-$C_{10}$ heteroalkyl, substituted or unsubstituted $C_6$-$C_{30}$ aralkyl, substituted or unsubstituted $C_6$-$C_{30}$ aryl, or substituted or unsubstituted $C_1$-$C_8$ heteroaryl;

when the $R_3$ exists and is located adjacent to the A, the $R_3$ is not F;

Rx-Rz are independently selected from hydrogen, deuterium, substituted or unsubstituted $C_1$-$C_{10}$ alkyl, substituted or unsubstituted $C_3$-$C_{20}$ cycloalkyl, or substituted or unsubstituted $C_1$-$C_{10}$ heteroalkyl;

the Z is independently selected from O, S, $C(R)_2$, or NR;

the R is independently selected from substituted or unsubstituted $C_1$-$C_{10}$ alkyl or alkoxy, substituted or unsubstituted $C_2$-$C_{30}$ cycloalkyl, substituted or unsubstituted $C_6$-$C_{30}$ aryl, or substituted or unsubstituted $C_1$-$C_{18}$ heteroaryl;

the "substituted" refers to substitution with deuterium, F, Cl, Br, $C_1$-$C_5$ alkyl, or $C_3$-$C_6$ cycloalkyl; and a heteroatom in the heteroalkyl or heteroaryl comprises one or more of N, S, and O.

2. The metal iridium complex according to claim 1, wherein:

the number of the $R_1$, the $R_2$, and the $R_3$ is a single substitution number;

the $R_1$ is substituted or unsubstituted $C_1$-$C_6$ alkyl or substituted or unsubstituted $C_3$-$C_6$ cycloalkyl;

$R_4$ is substituted or unsubstituted $C_3$-$C_6$ branched alkyl, substituted $C_3$-$C_6$ linear alkyl, or substituted or unsubstituted $C_3$-$C_6$ cycloalkyl, and the $R_0$, the $R_2$, and the $R_3$ are independently selected from hydrogen, deuterium, halogen, substituted or unsubstituted $C_1$-$C_6$ alkyl, or substituted or unsubstituted $C_3$-$C_6$ cycloalkyl.

3. The metal iridium complex according to claim 2, having a structural formula as shown in the following formula (II):

Formula (II)

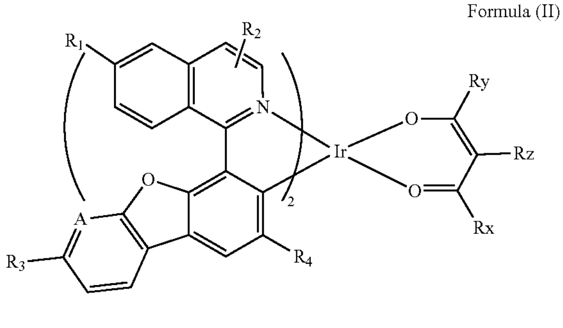

wherein:

$R_1$ is substituted or unsubstituted $C_3$-$C_6$ branched alkyl, substituted $C_3$-$C_6$ linear alkyl, or substituted or unsubstituted $C_3$-$C_6$ cycloalkyl;

$R_0$, $R_2$, and $R_3$ are independently selected from hydrogen, deuterium, substituted or unsubstituted $C_1$-$C_6$ alkyl, or substituted or unsubstituted $C_3$-$C_6$ cycloalkyl; and the "substituted" refers to substitution with deuterium, F, $C_1$-$C_5$ alkyl, or $C_3$-$C_6$ cycloalkyl.

4. The metal iridium complex according to claim 3, wherein the "substituted" refers to substitution with D, F, $C_1$-$C_5$ alkyl partially or completely substituted with D or F, or $C_3$-$C_6$ cycloalkyl partially or completely substituted with D or F.

5. The metal iridium complex according to claim 4, wherein A is CH.

6. The metal iridium complex according to claim 1, wherein a structure of

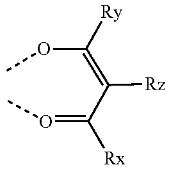

in the right side of the formula I is one of the following structures, or corresponding parts or complete deuterides thereof, or corresponding parts or complete fluorides thereof, and a dotted line refers to a metal connection position,

A1

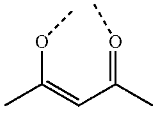

A2

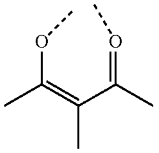

A3

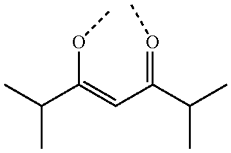

A4

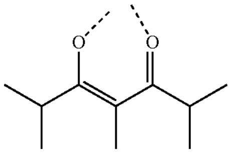

-continued

A5

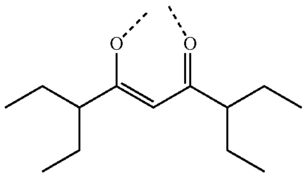

A6

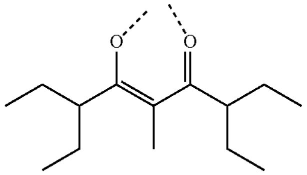

A7

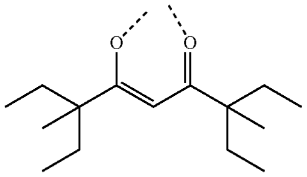

A8

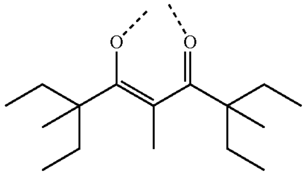

A9

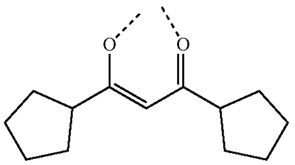

A10

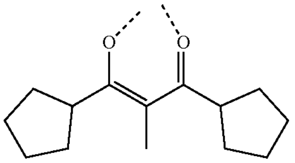

A11

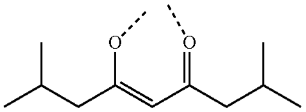

A12

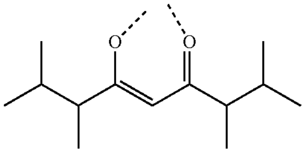

A13

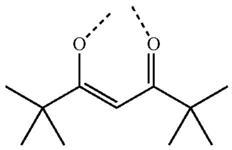

-continued
A14
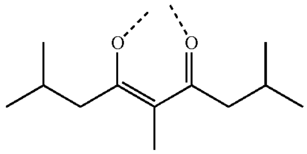
A15
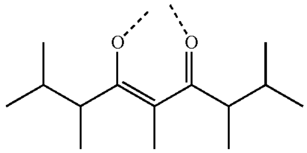
A16
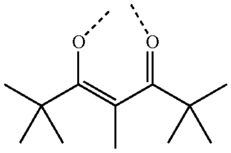
A17
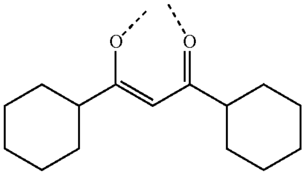
A18
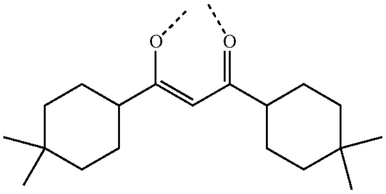
A19
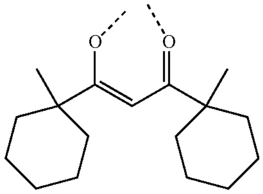
A20
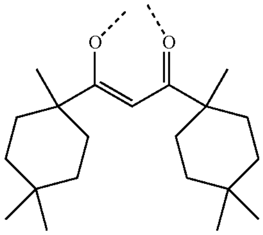
A21
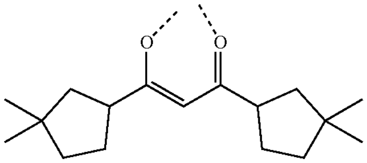
-continued
A22
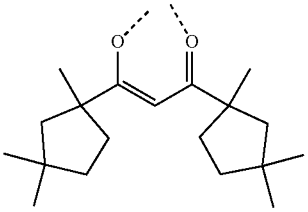
A23
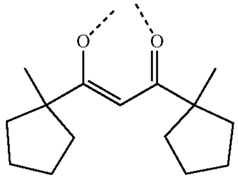
A24
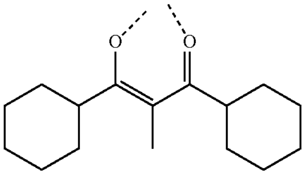
A25
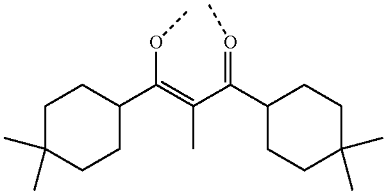
A26
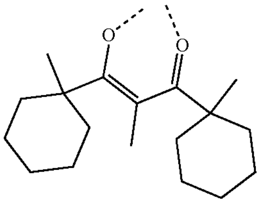
A27
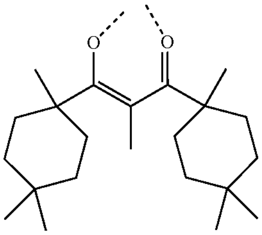
A28
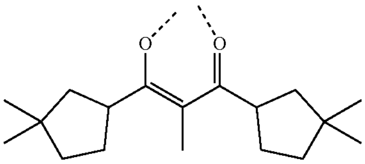

-continued
A29
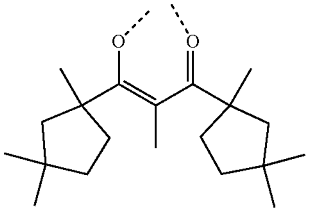
A30
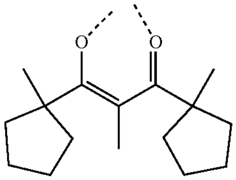
A31
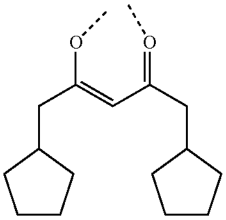
A32
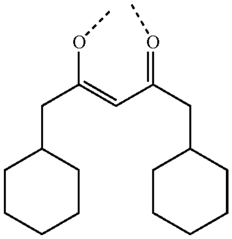
A33
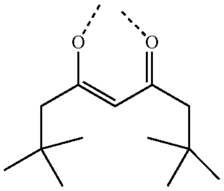
A34
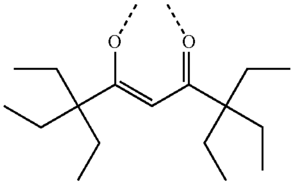
A35
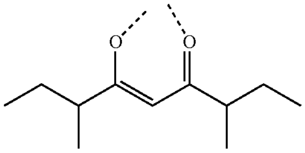
-continued
A38
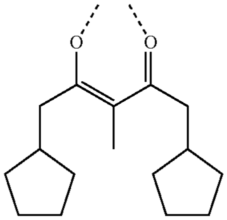
A39
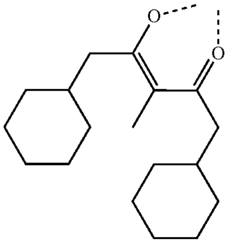
A40
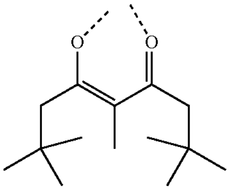
A41
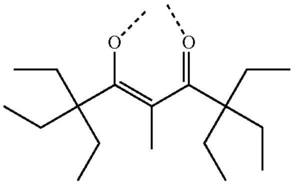
A42
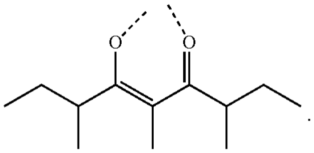
7. A metal iridium complex, having one of the following structural formulas, or corresponding parts or complete deuterides thereof, or corresponding parts or complete fluorides thereof,
CPD 1
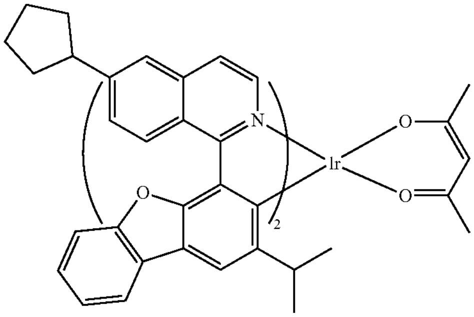

-continued
CPD 2
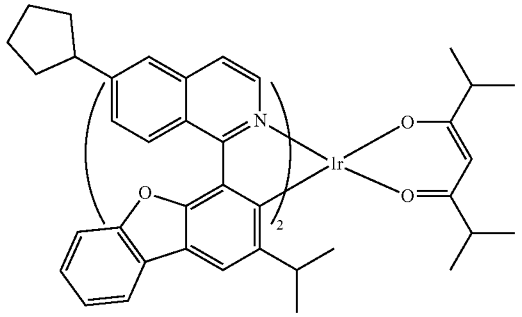
CPD 3
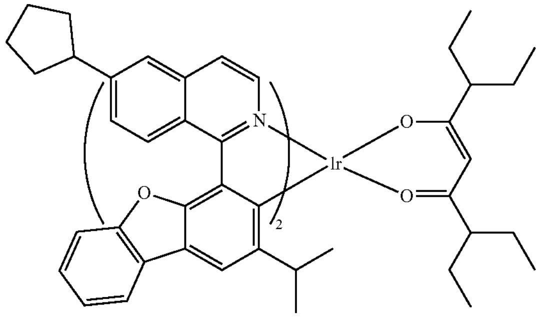
CPD 4
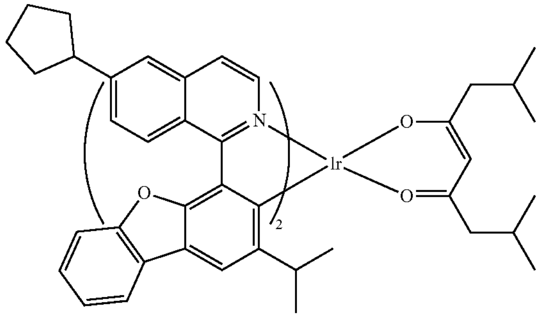
CPD 5
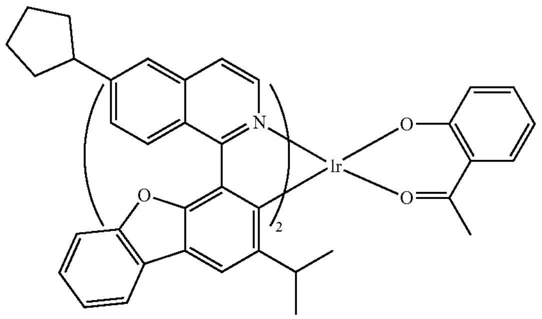
-continued
CPD 6
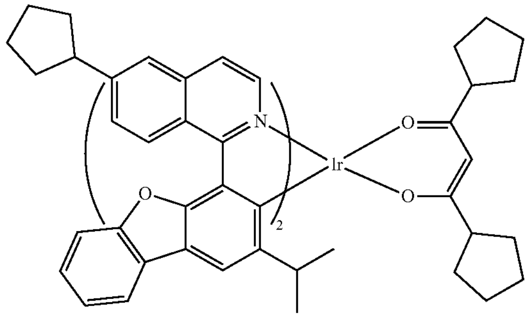
CPD 7
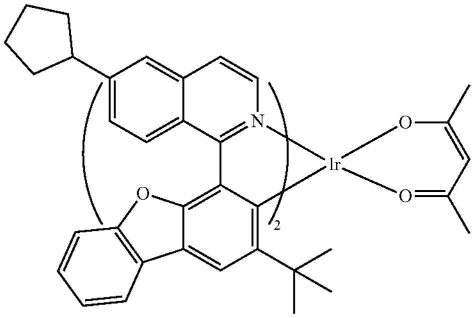
CPD 8
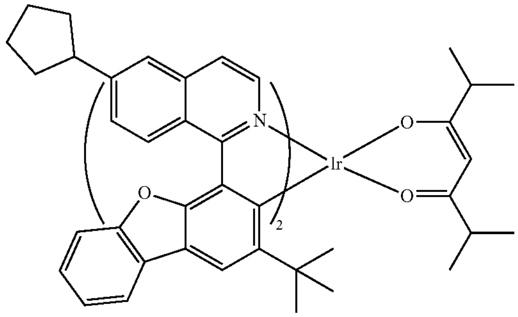
CPD 9
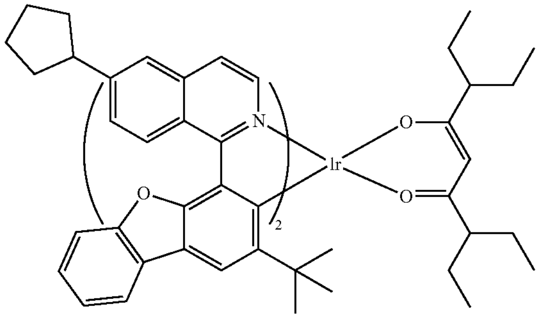

-continued
CPD 10
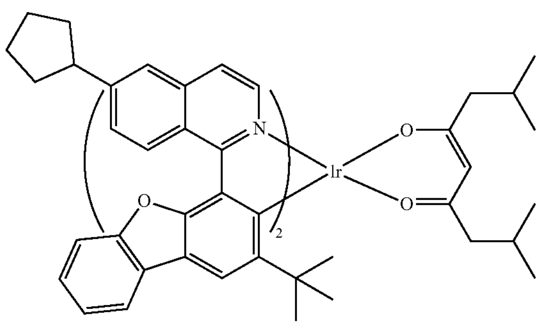
CPD 11
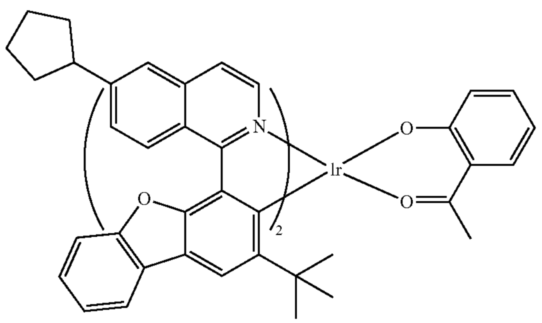
CPD 12
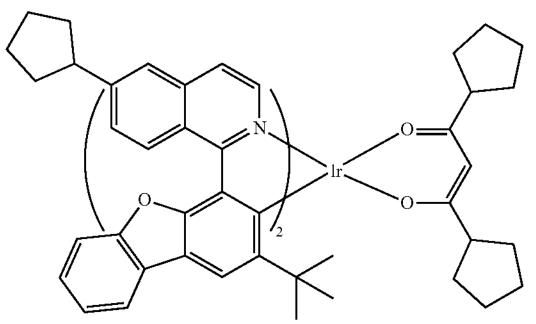
CPD 13
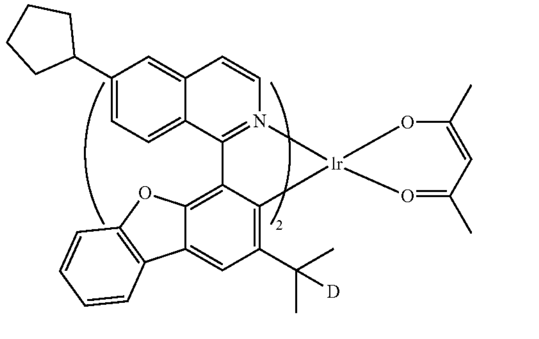
-continued
CPD 14
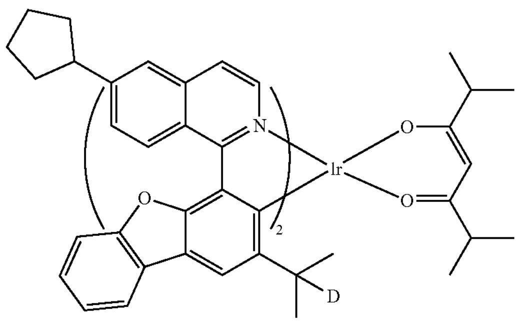
CPD 15
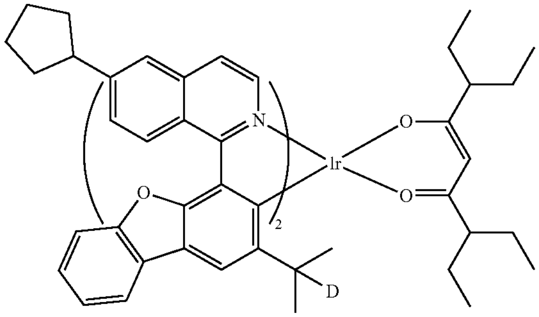
CPD 16
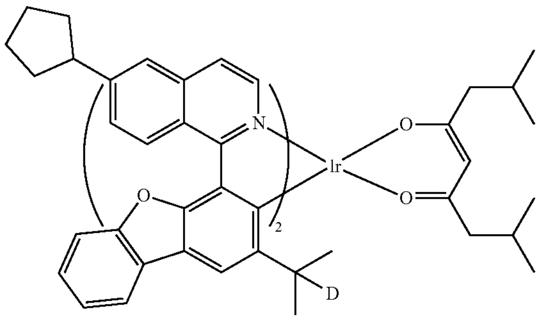
CPD 17
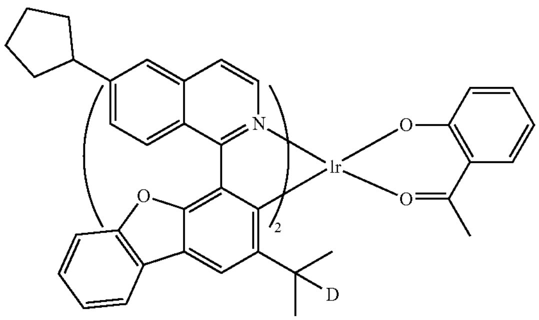

-continued
CDP 18
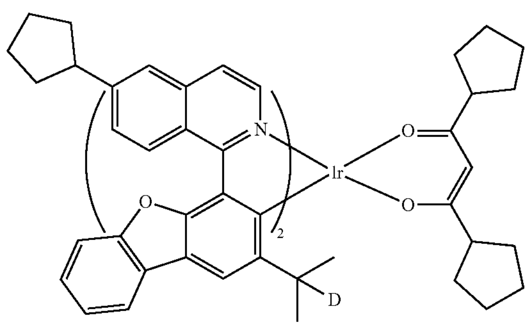
CPD 19
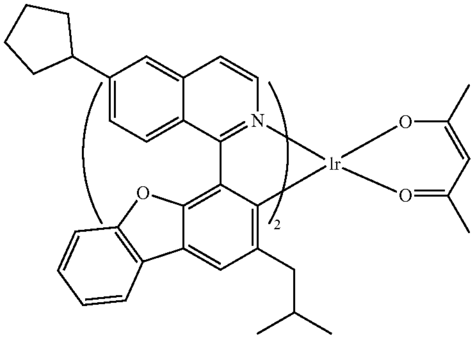
CPD 20
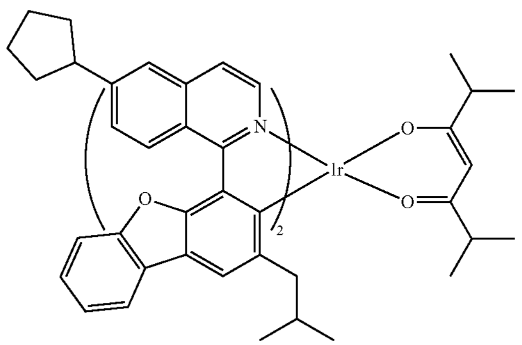
CPD 21
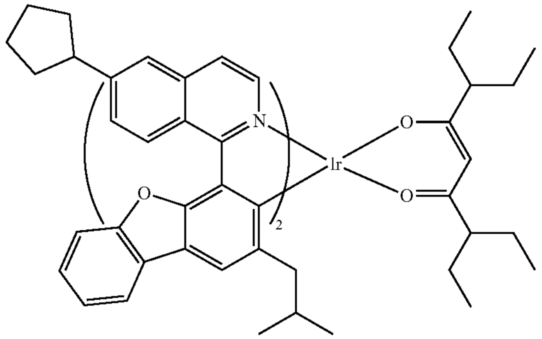
-continued
CPD 22
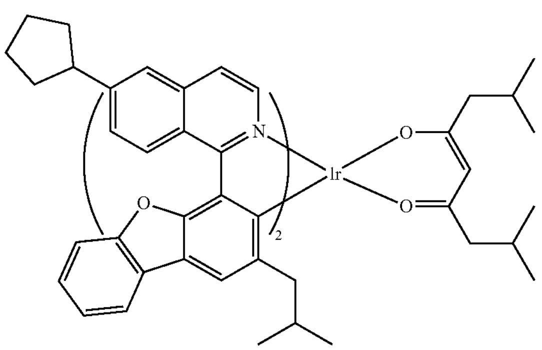
CPD 23
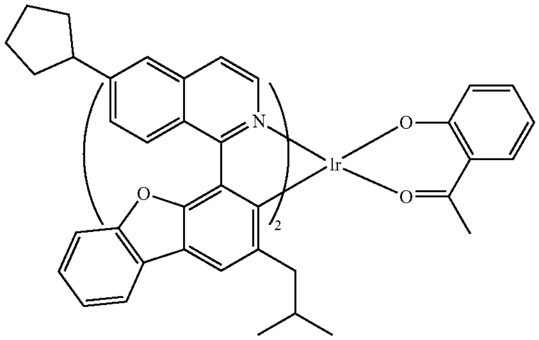
CPD 24
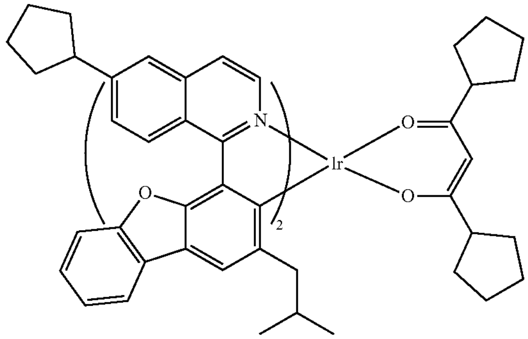
CPD 25
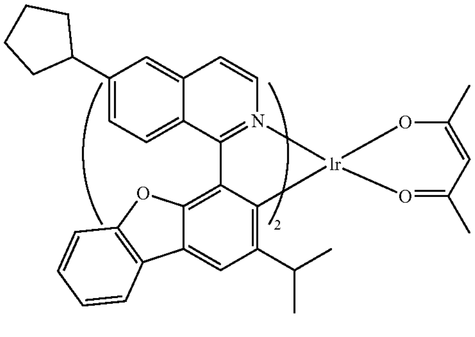

-continued
CPD 26
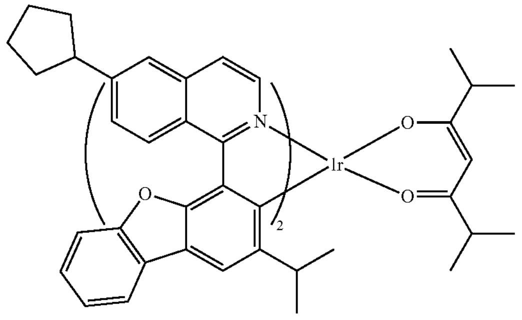
CPD 27
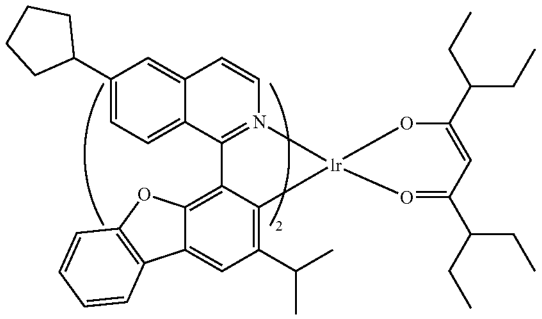
CPD 28
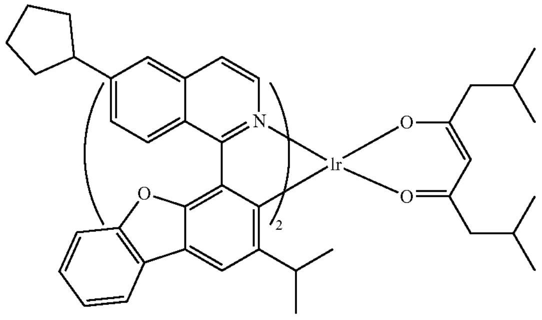
CPD 29
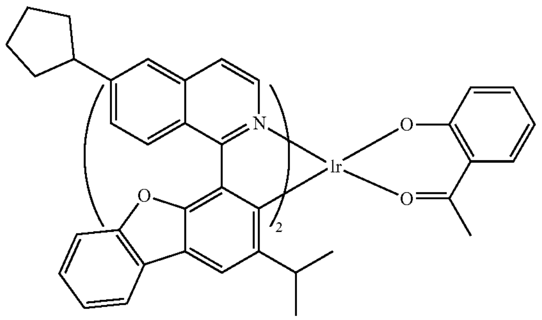
-continued
CPD 30
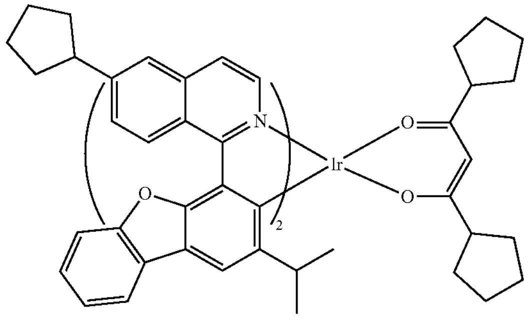
CPD 31
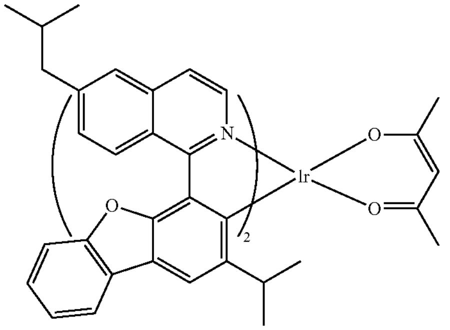
CPD 32
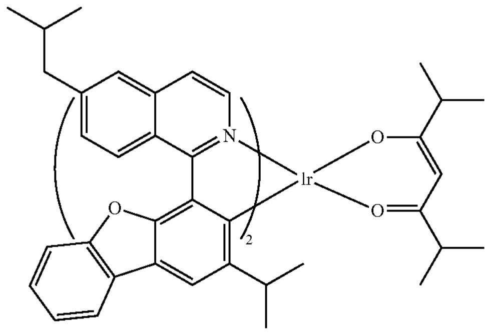
CPD 33
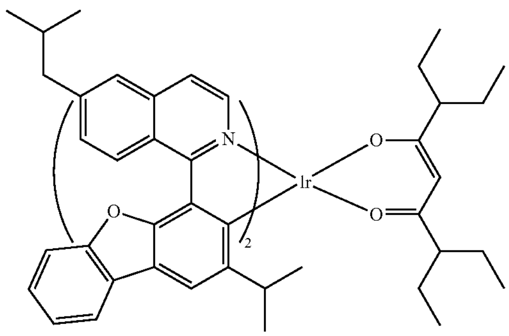

-continued
CPD 34
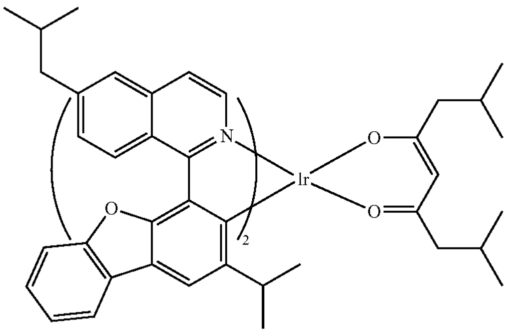
CPD 35
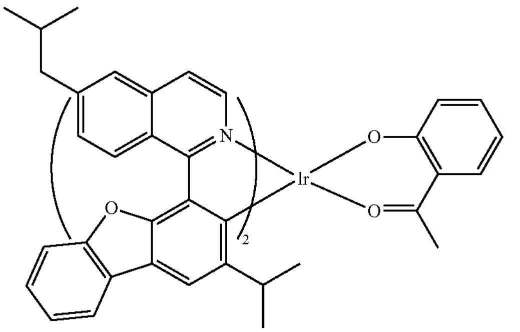
CPD 36
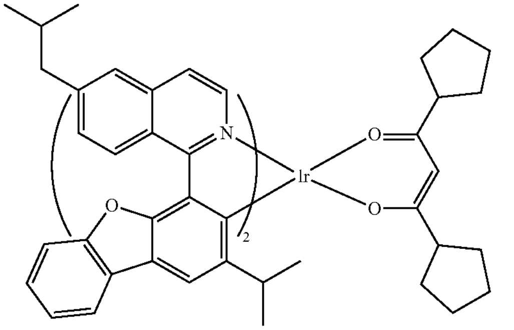
CPD 37
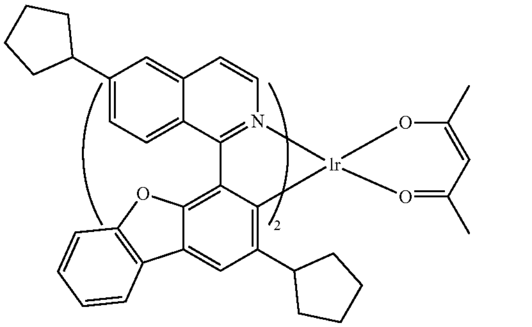
-continued
CPD 38
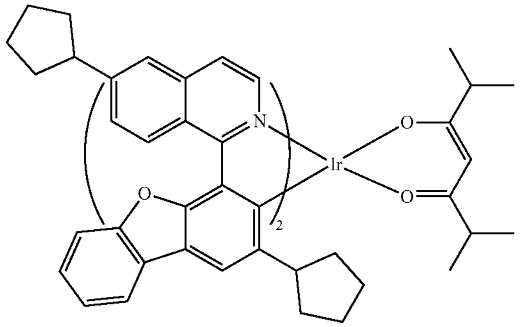
CPD 39
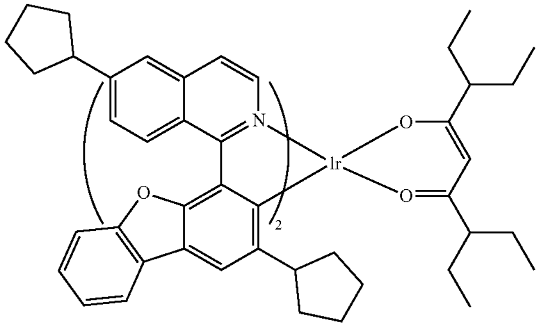
CPD 40
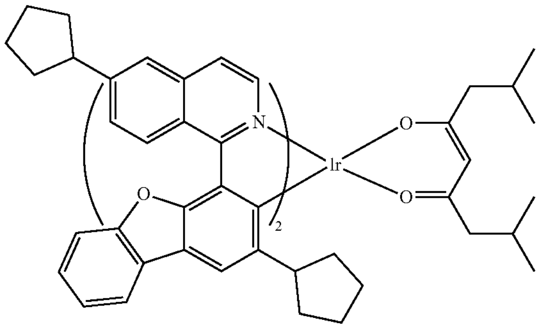
CPD 41
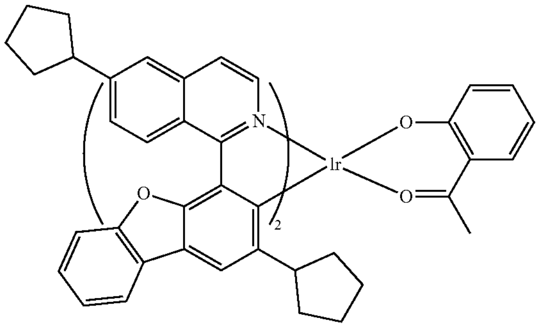

CPD 42
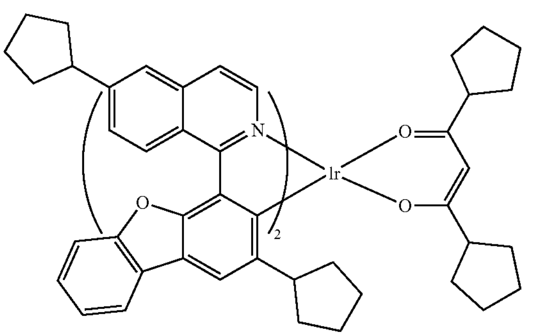
CPD 43
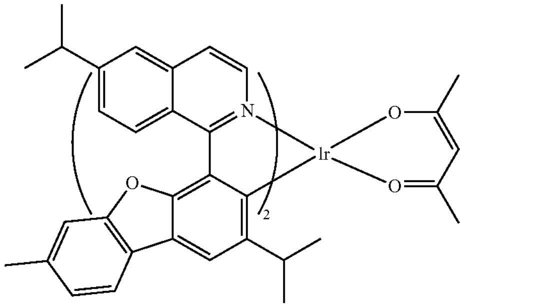
CPD 44
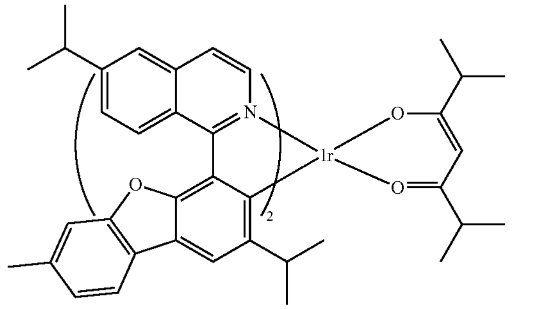
CPD 45
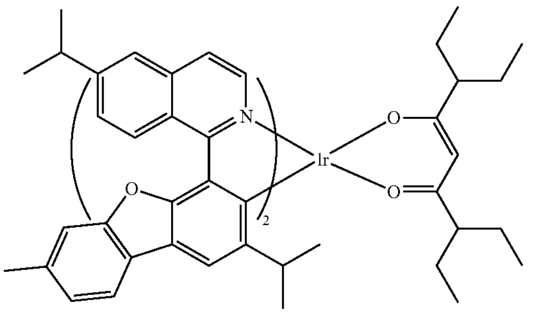
CPD 46
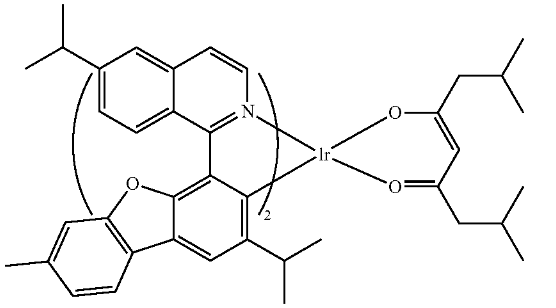
CPD 47
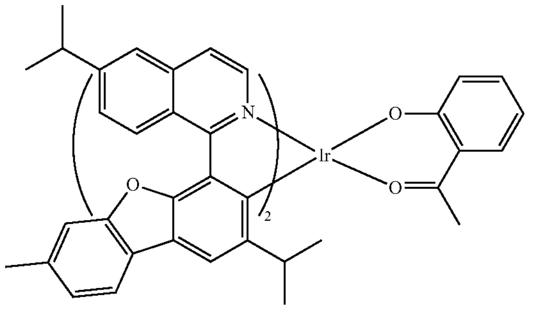
CPD 48
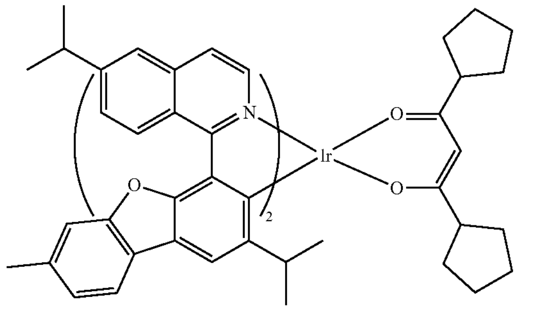
CPD 49
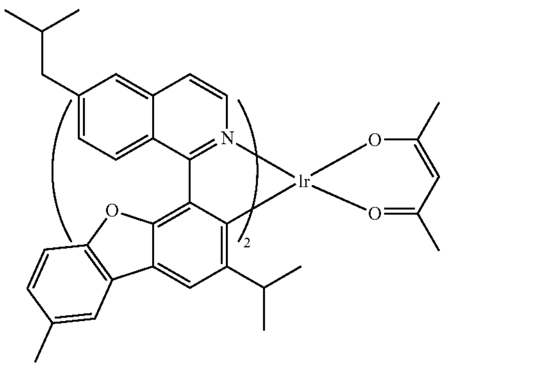

-continued
CPD 50
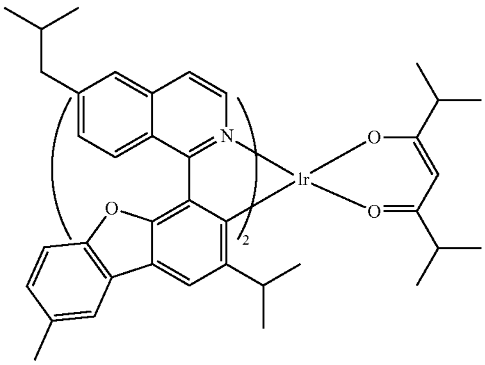
CPD 51
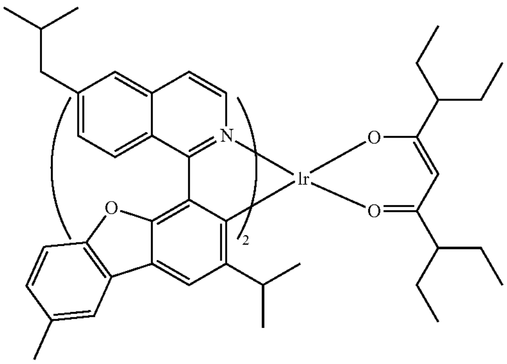
CPD 52
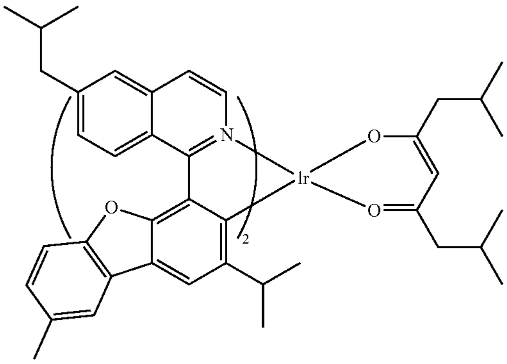
CPD 53
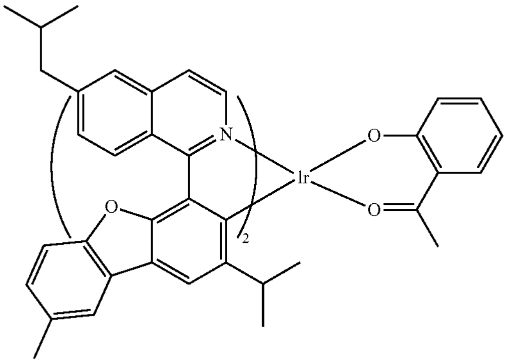
-continued
CPD 54
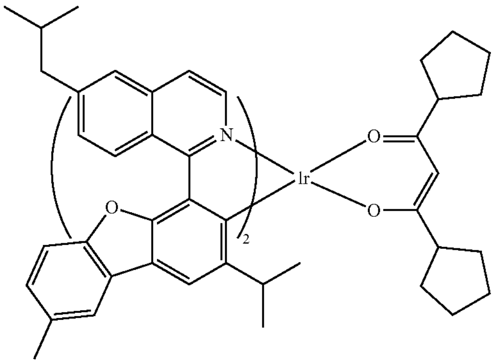
CPD 55
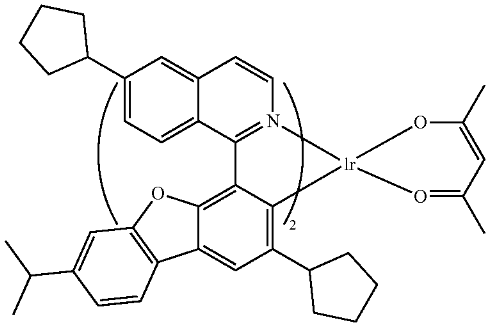
CPD 56
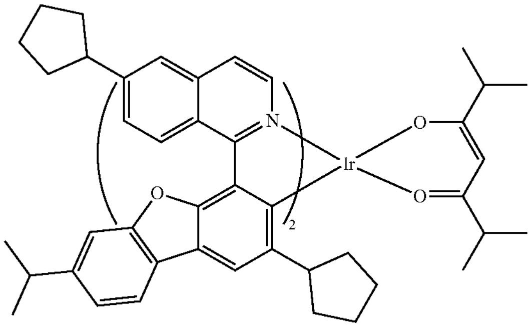
CPD 57
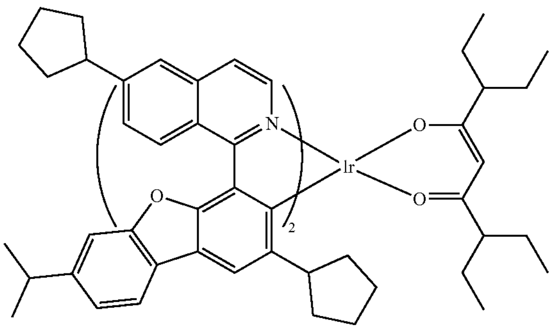

-continued
CPD 58
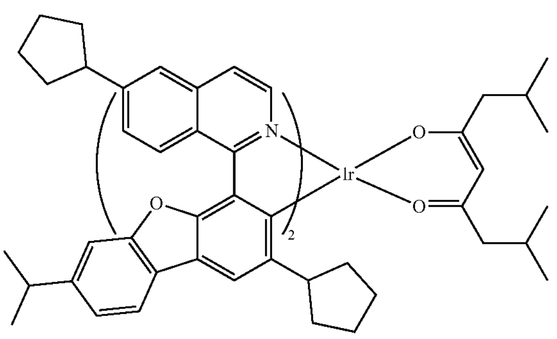
CPD 59
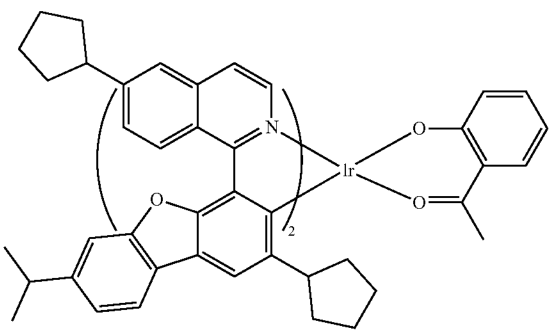
CPD 60
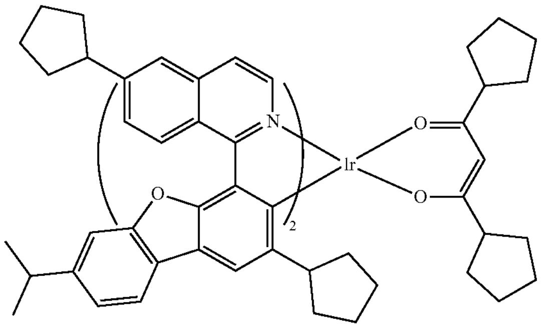
CPD 61
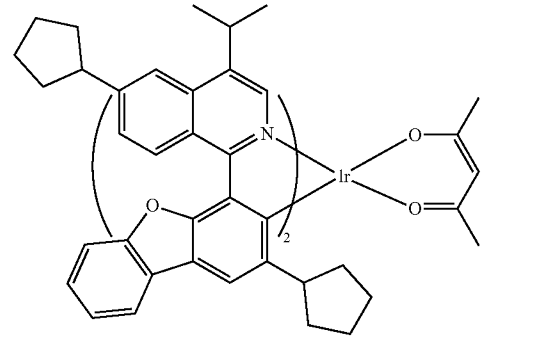
-continued
CPD 62
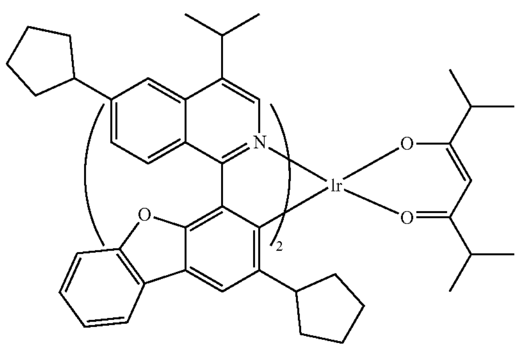
CPD 63
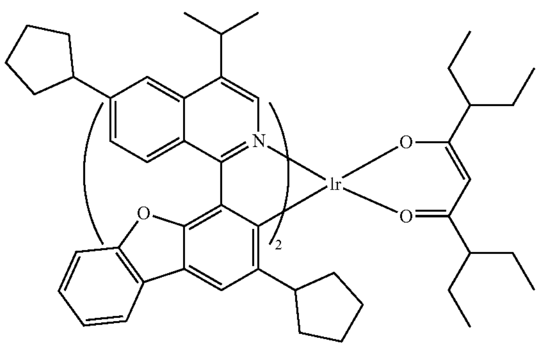
CPD 64
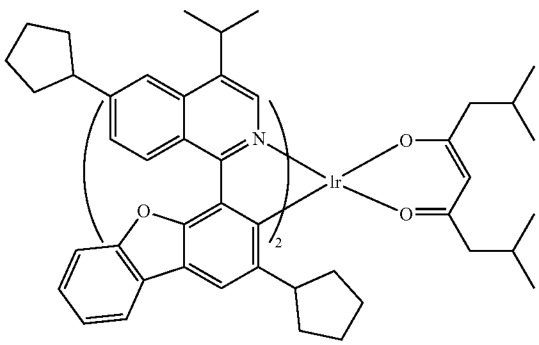
CPD 65
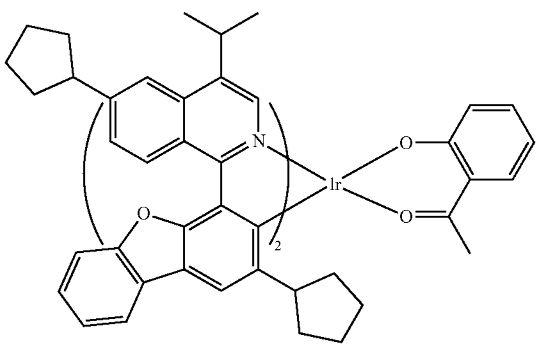

-continued
CPD 66
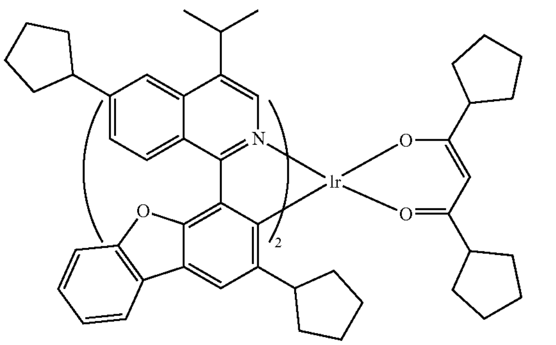
CPD 67
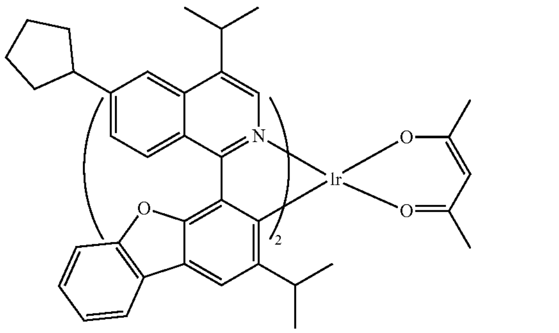
CPD 68
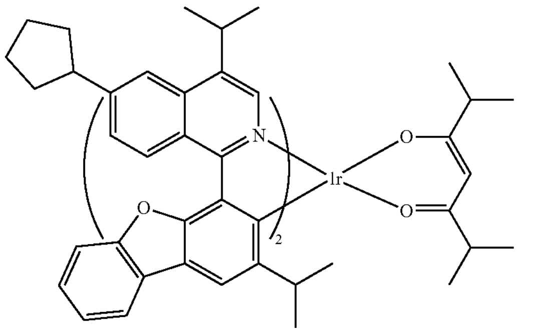
CPD 69
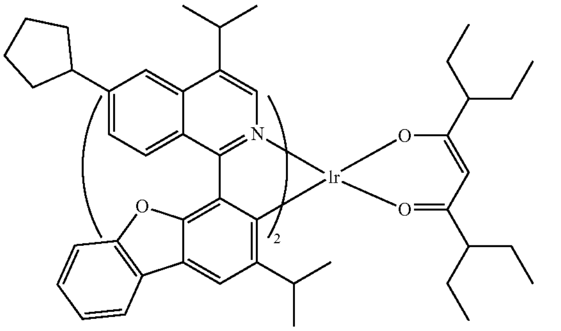
-continued
CPD 70
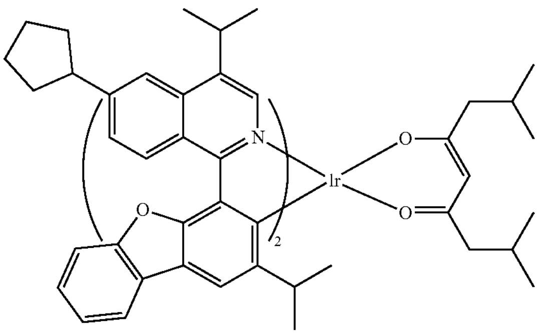
CPD 71
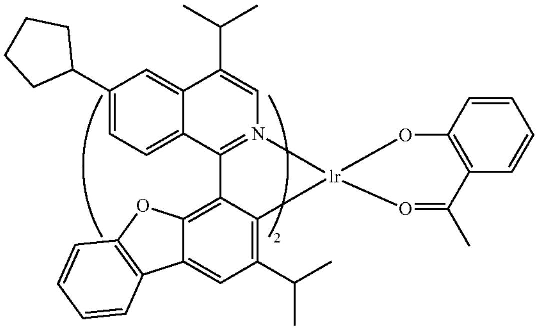
CPD 72
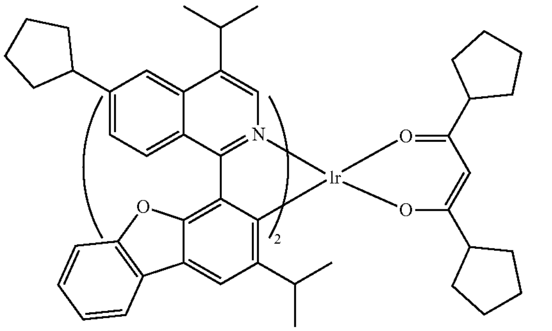
CPD 73
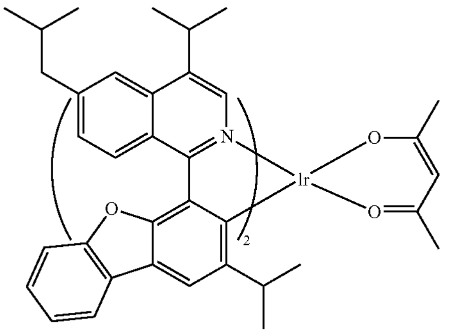

-continued
CPD 74
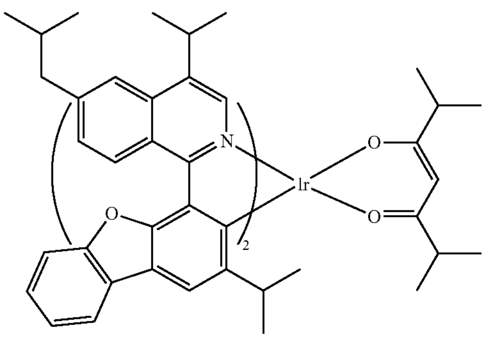
CPD 75
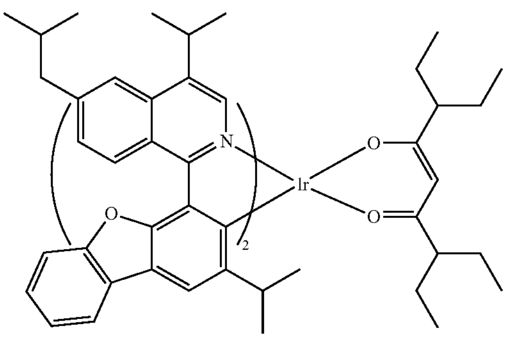
CPD 76
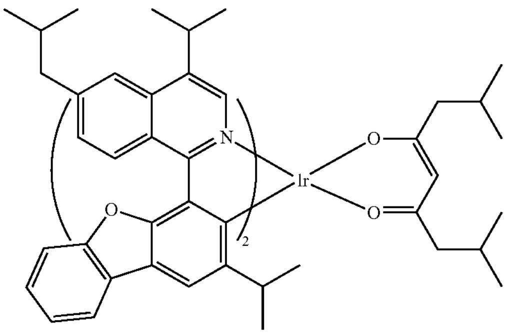
CPD 77
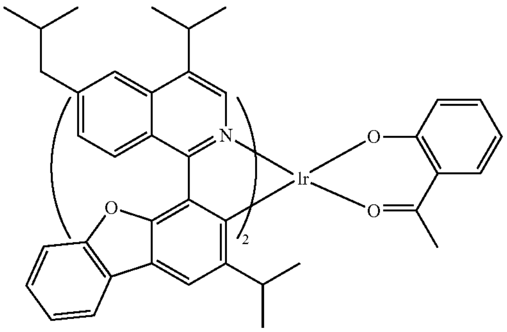
-continued
CPD 78
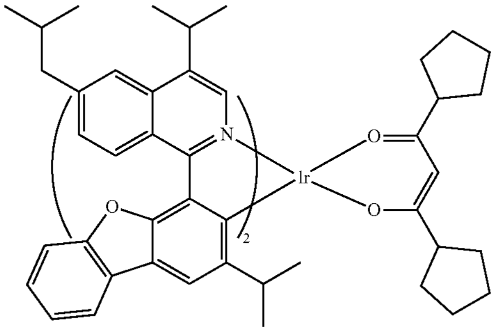
CPD 79
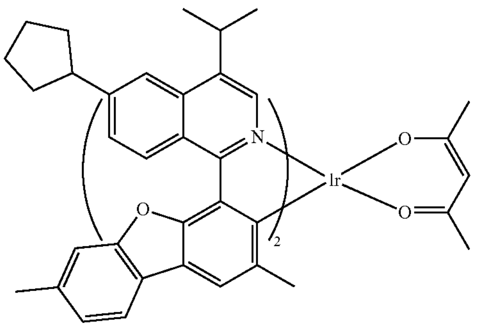
CPD 80
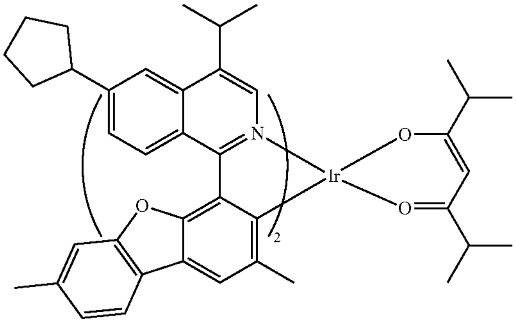
CPD 81
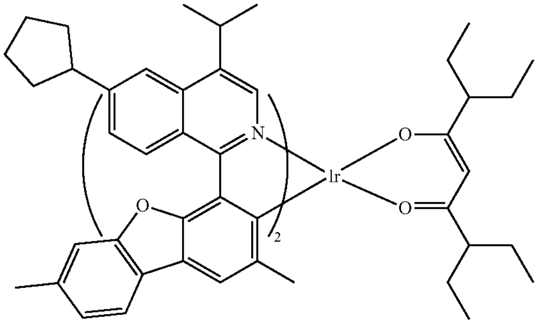

-continued
CPD 82
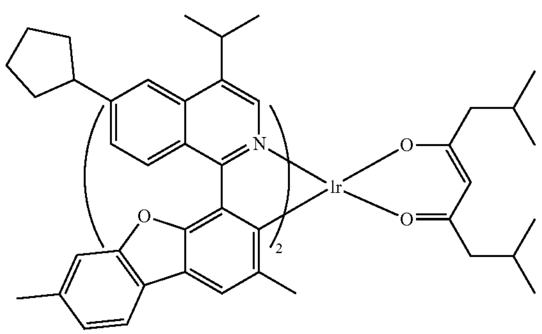
CPD 83
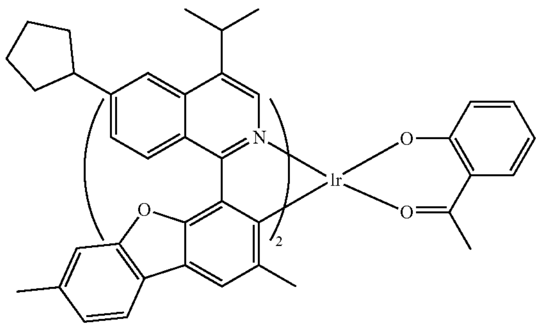
CPD 84
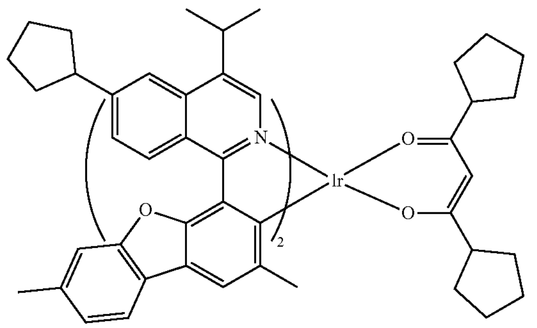
CPD 85
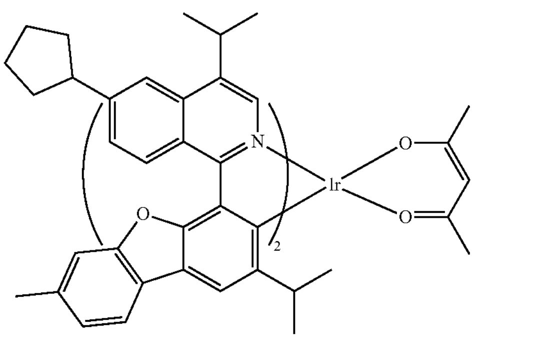
-continued
CPD 86
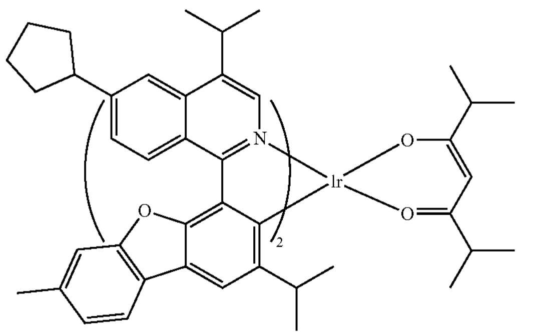
CPD 87
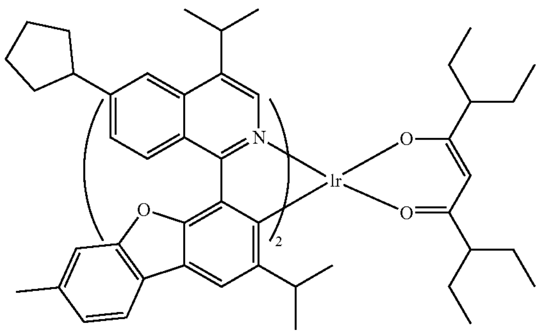
CPD 88
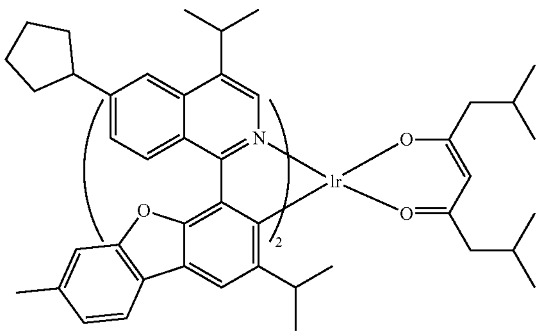
CPD 89
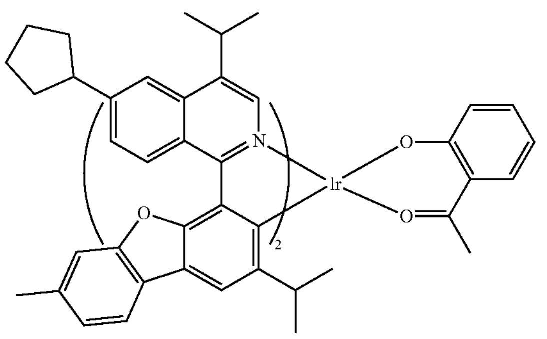

-continued
CPD 90
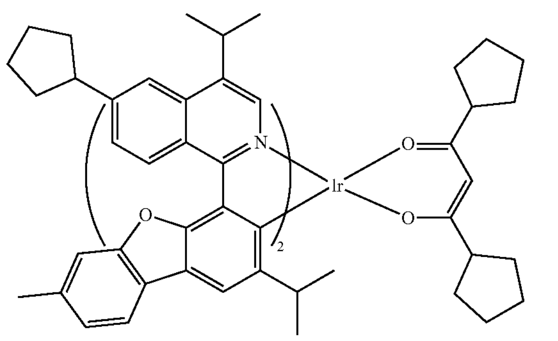
CPD 91
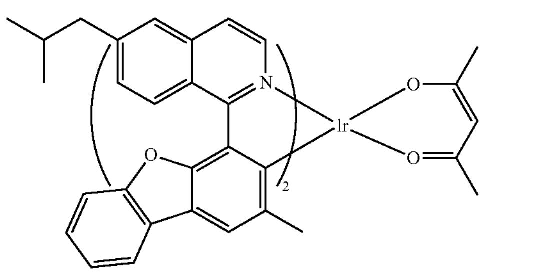
CPD 92
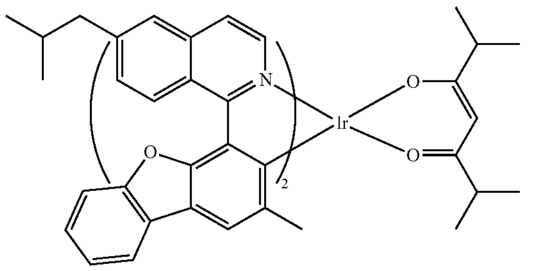
CPD 93
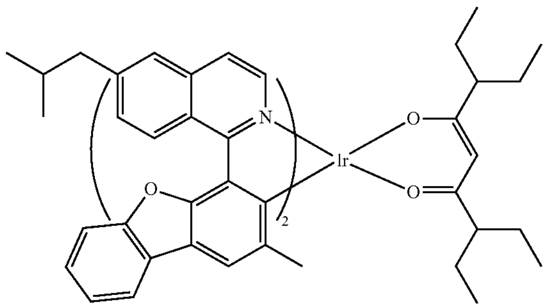
CDP 94
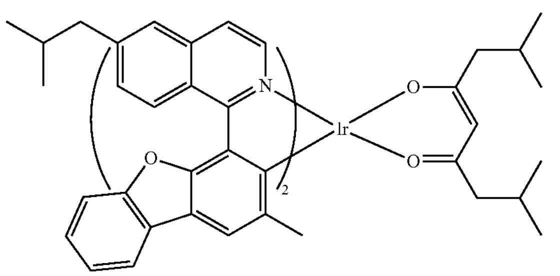
-continued
CPD 95
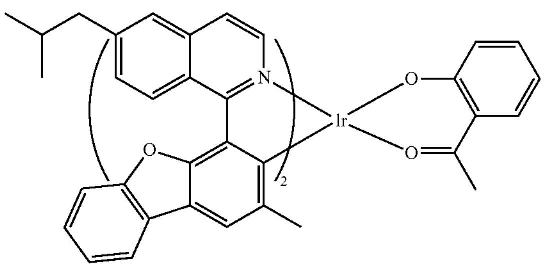
CPD 96
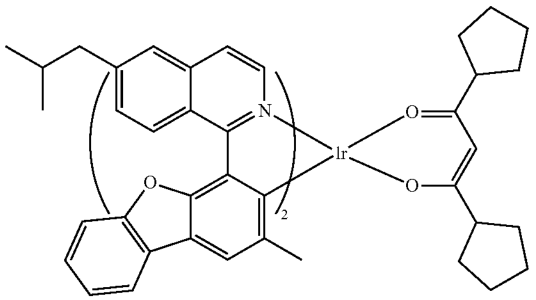
CPD 97
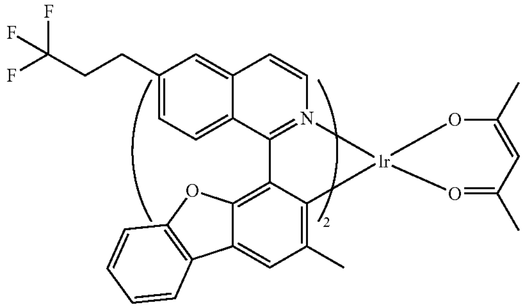
CDP 98
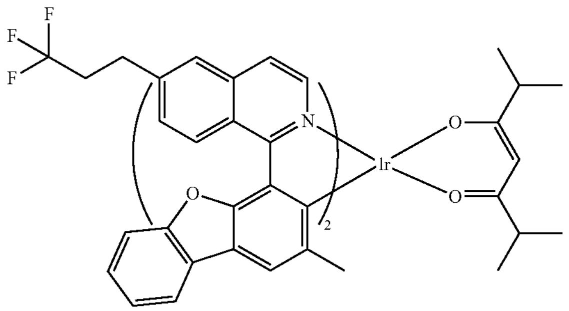
CPD 99
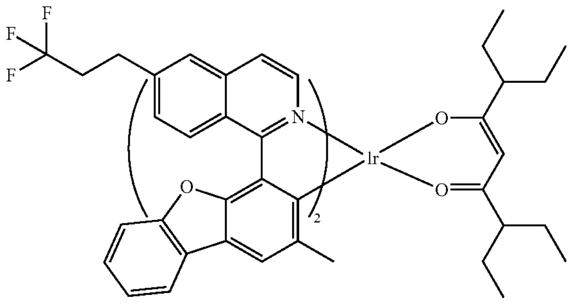

-continued
CPD 100
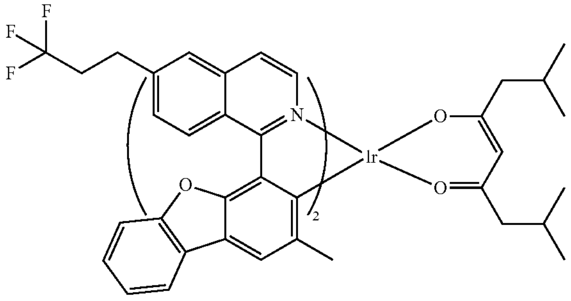
CPD 101
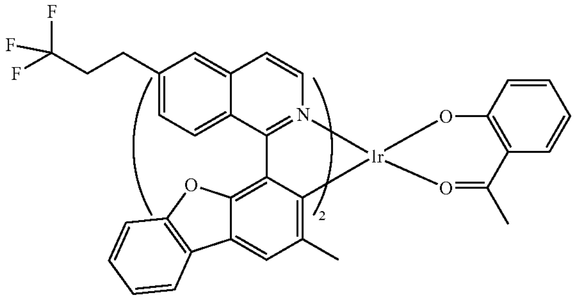
CPD 102
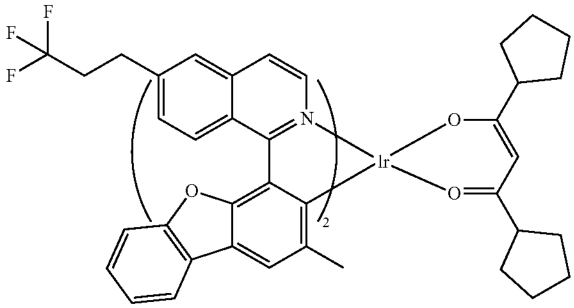
CPD 103
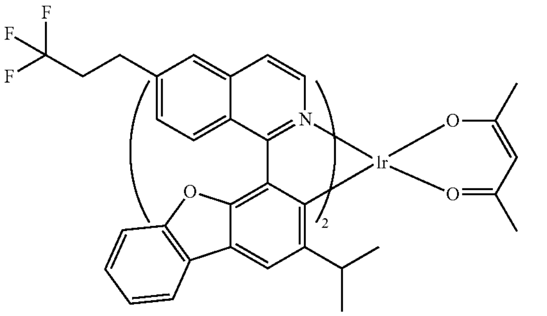
-continued
CDP 104
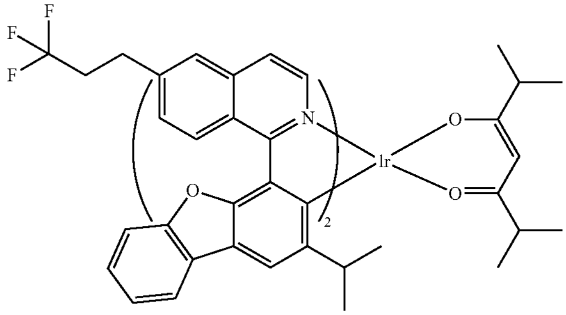
CPD 105
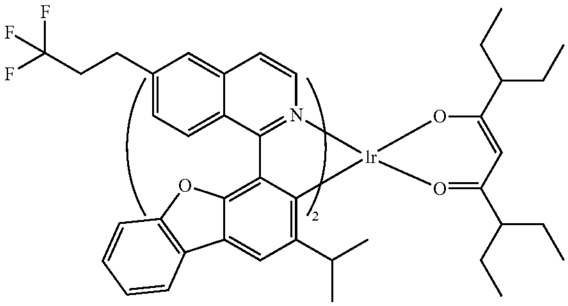
CPD 106
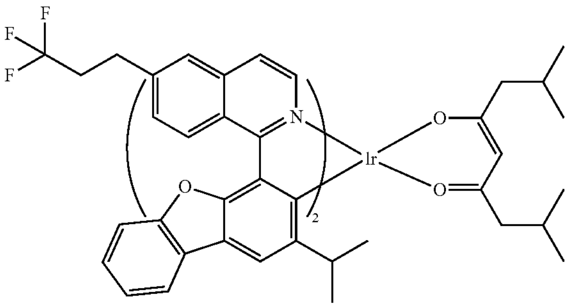
CPD 107
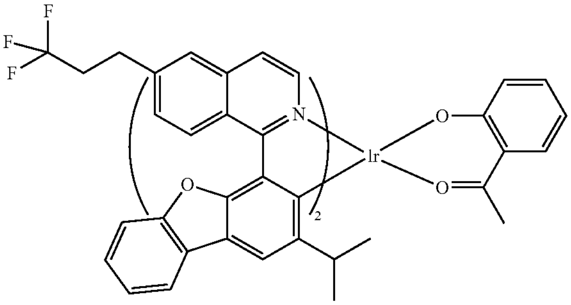

CPD 108
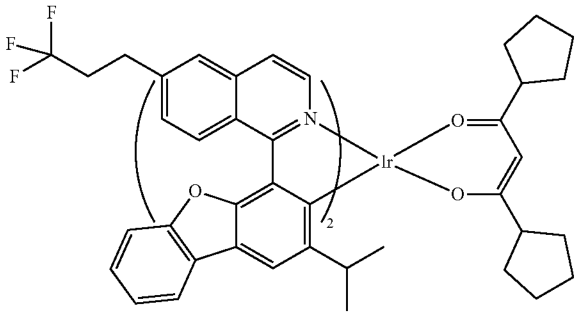
CPD 109
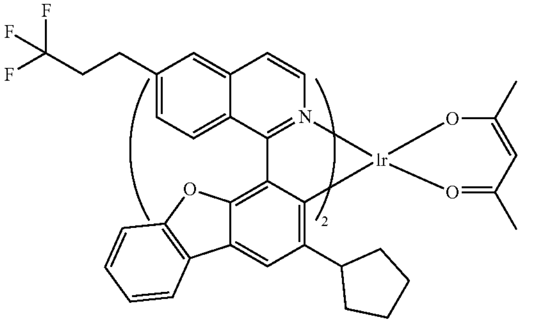
CPD 110
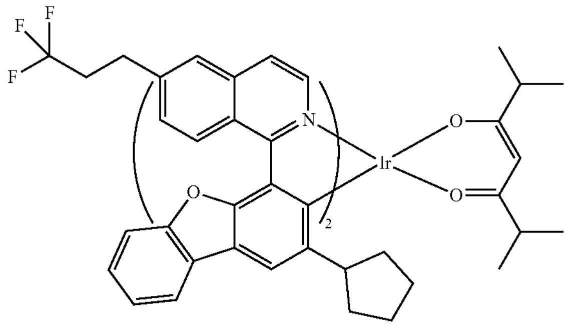
CPD 111
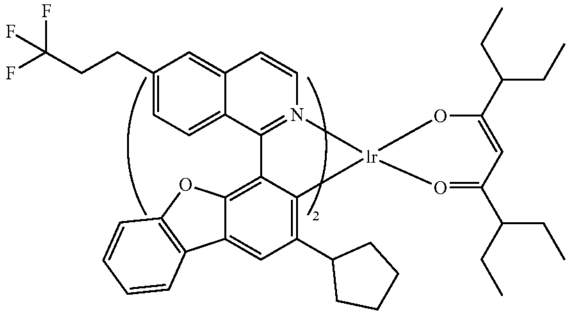
CPD 112
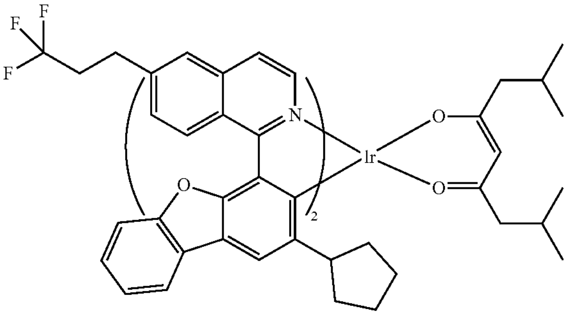
CPD 113
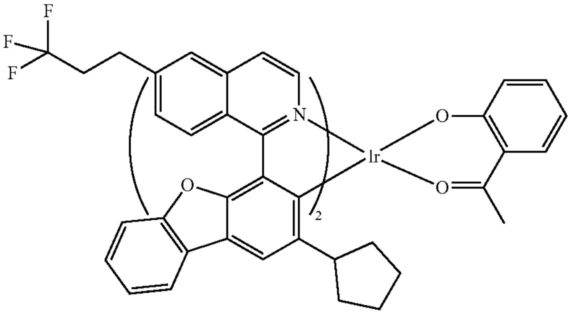
CPD 114
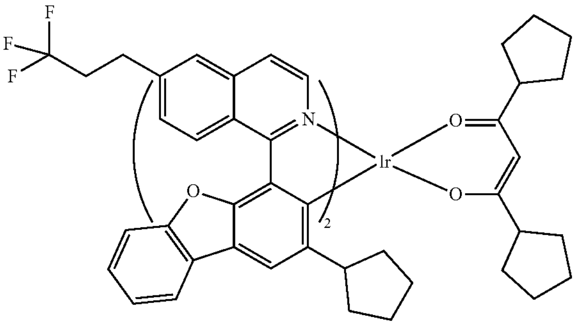
CPD 115
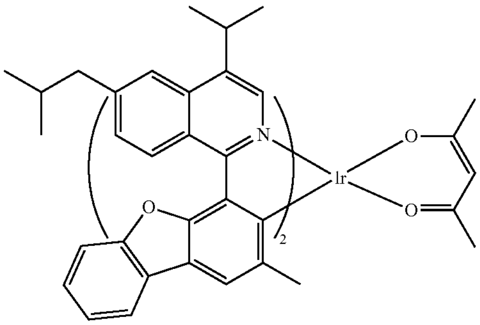

CPD 116
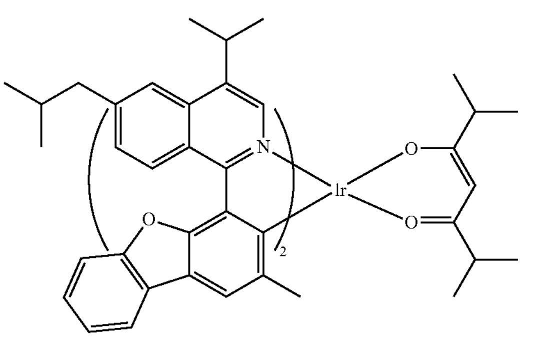
CPD 117
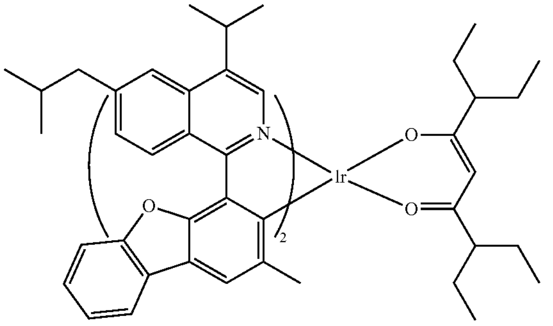
CPD 126
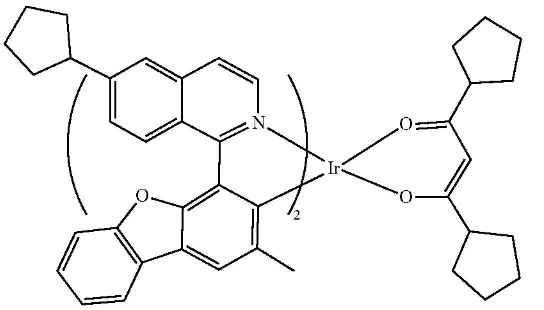
CPD 132
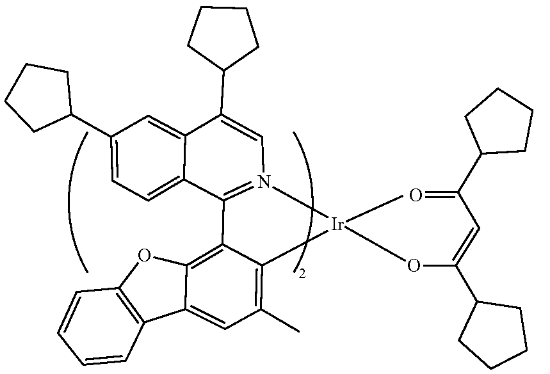
CPD 138
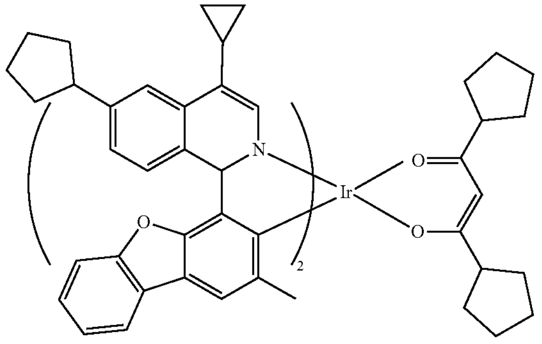
CPD 145
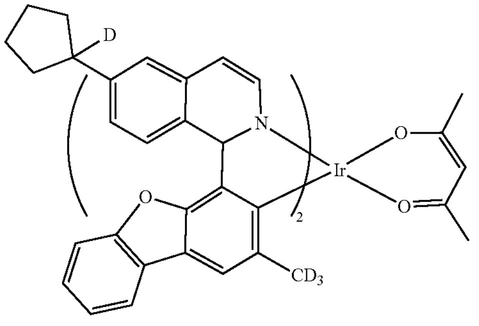
CPD 146
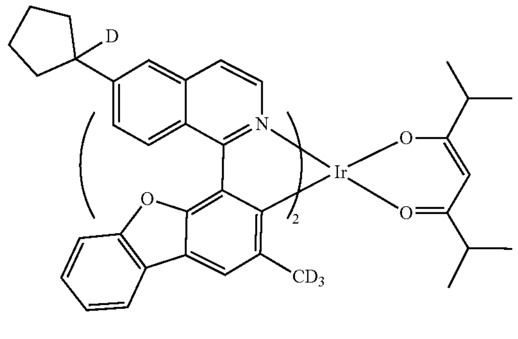
CPD 147
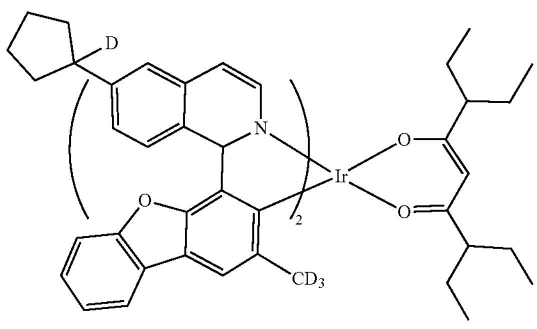

-continued
CPD 148
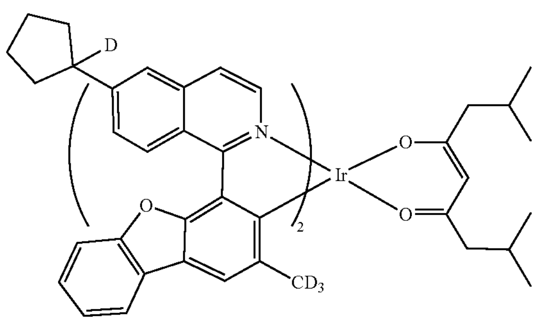
CPD 149
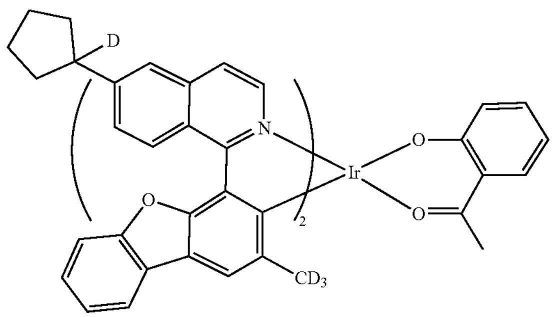
CPD 150
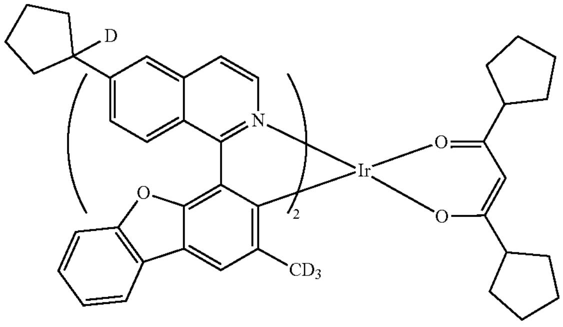
CPD 156
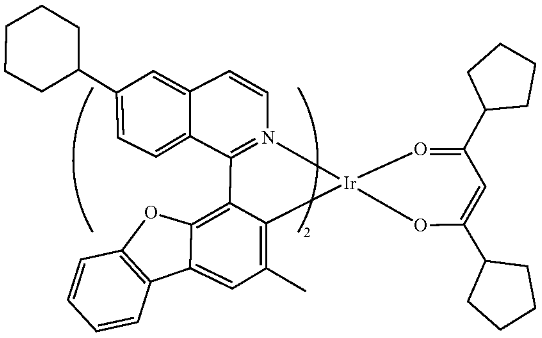
-continued
CPD 162
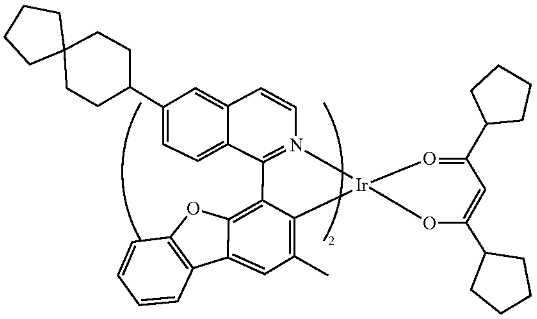
CPD 174
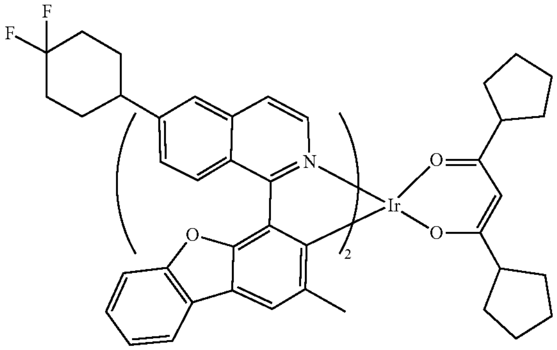
CPD 180
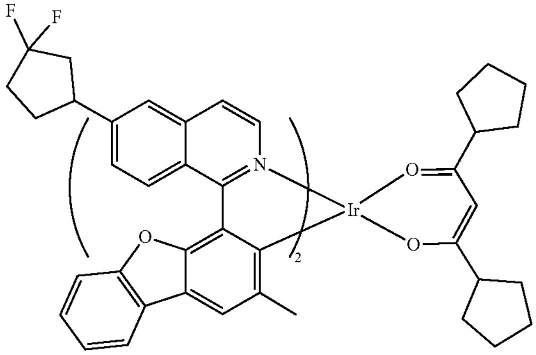
CPD 186
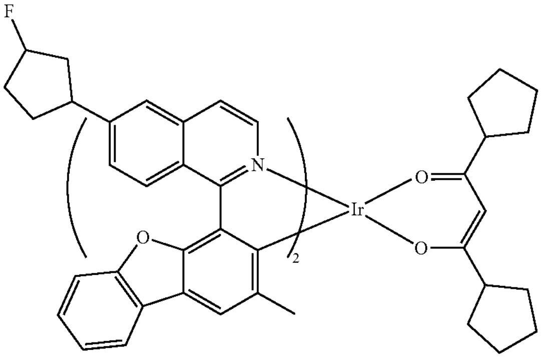

-continued
CPD 192
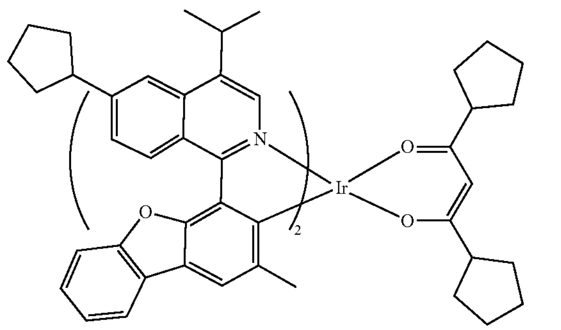
CPD 198
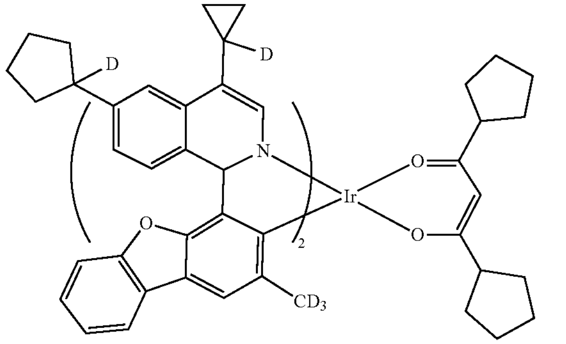
CPD 204
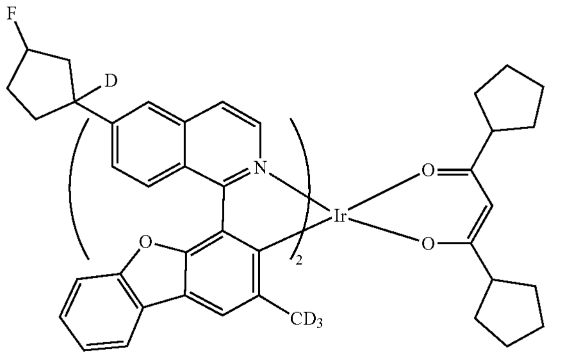
CPD 210
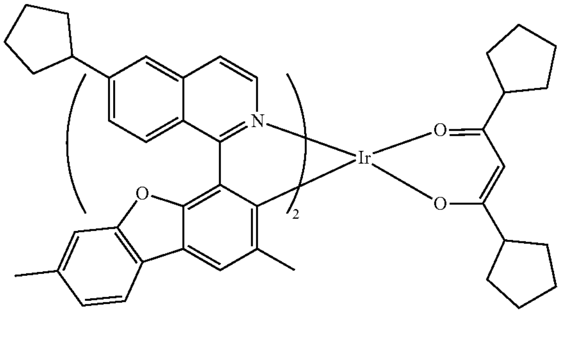
CPD 240
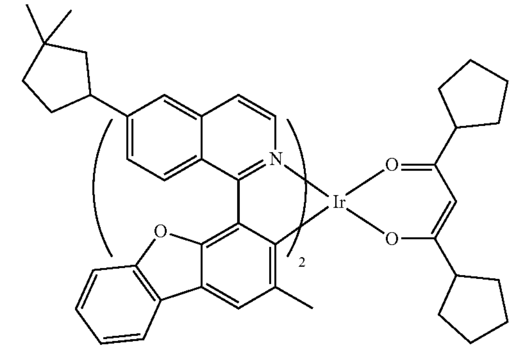
CPD 246
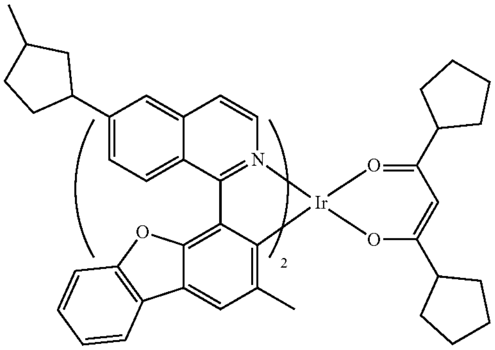
CPD 252
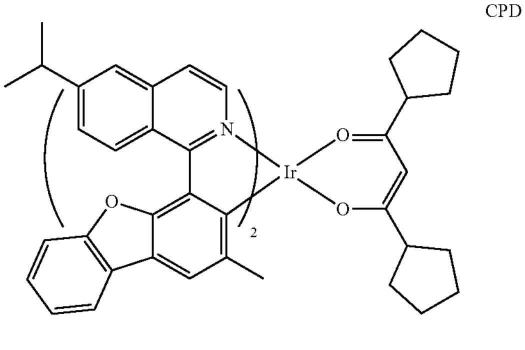
CPD 276
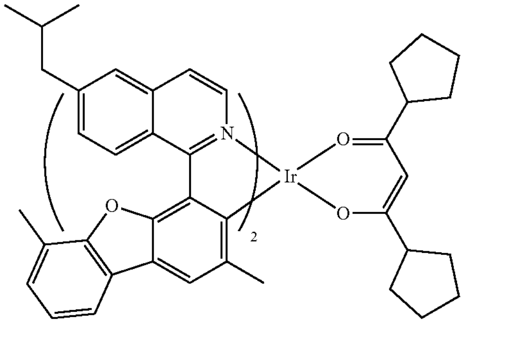

-continued
CPD 307
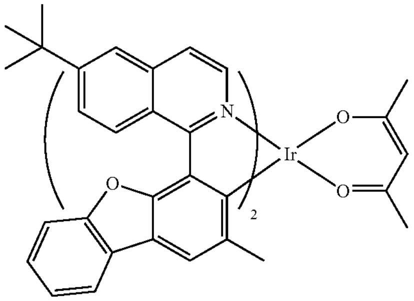
CPD 308
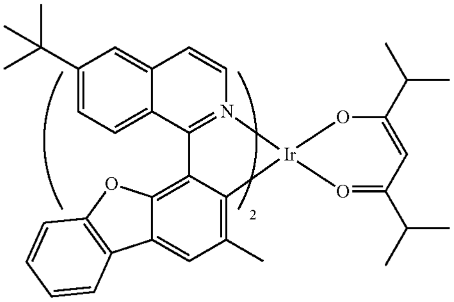
CPD 309
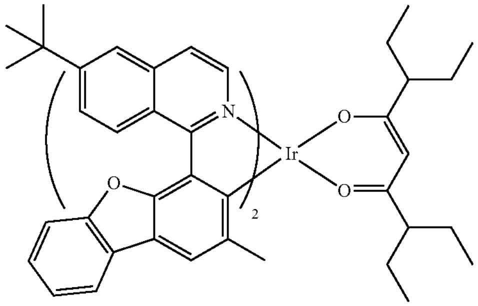
CPD 310
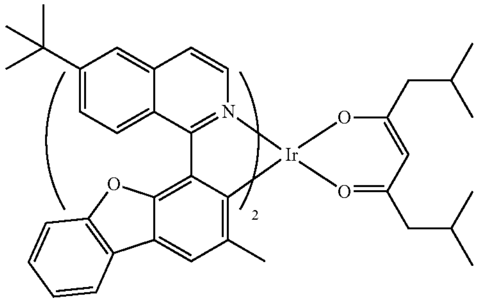
CPD 311
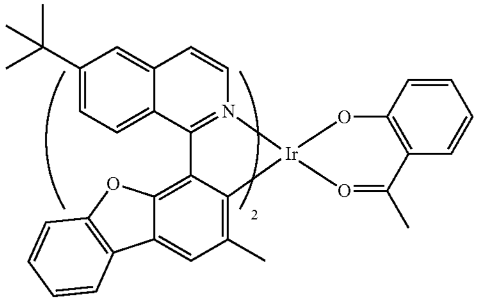
-continued
CPD 312
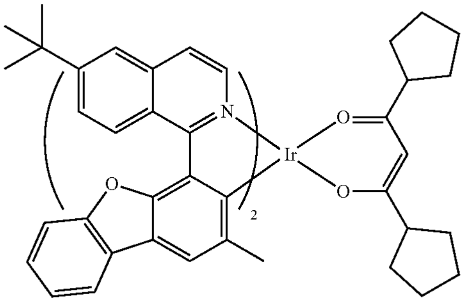
CPD 313
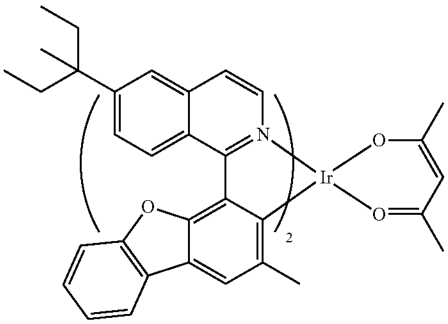
CPD 314
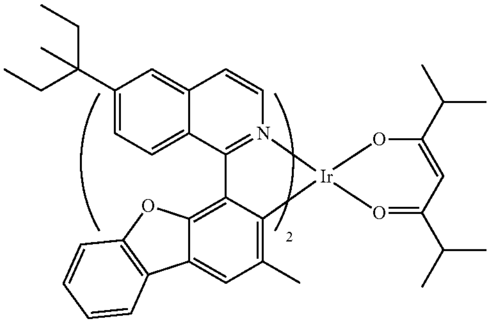
CPD 315
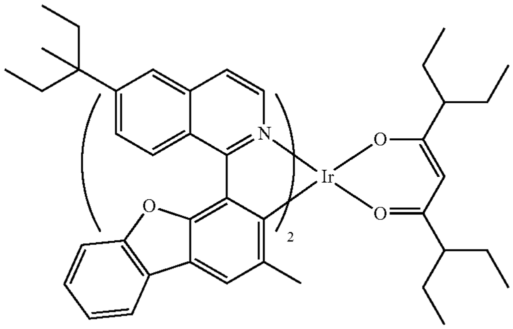

-continued
CPD 316
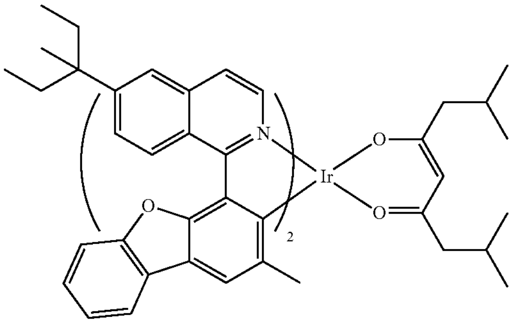
CPD 317
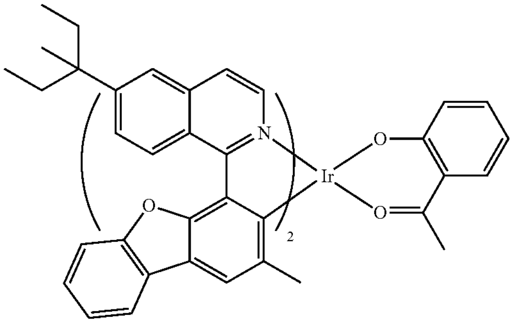
CPD 318
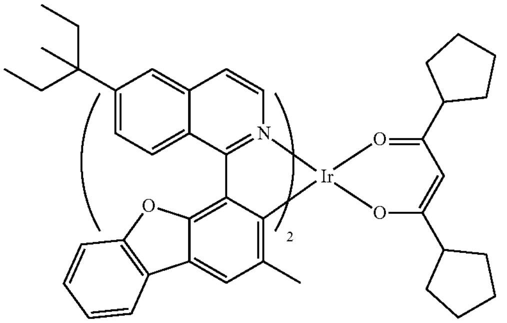
CPD 319
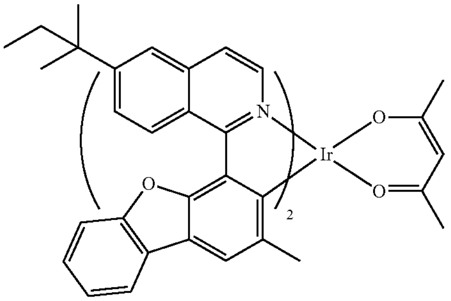
-continued
CPD 320
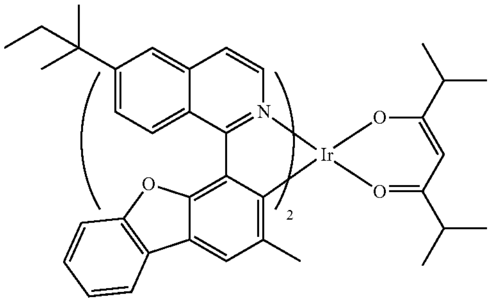
CPD 321
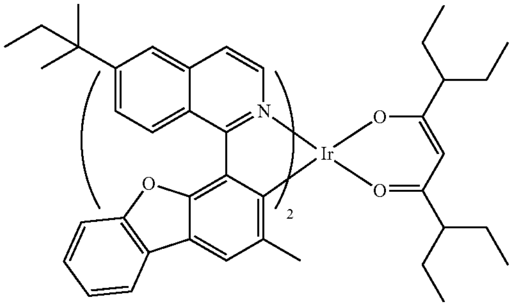
CPD 322
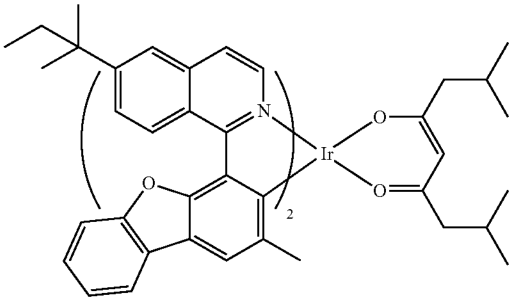
CPD 323
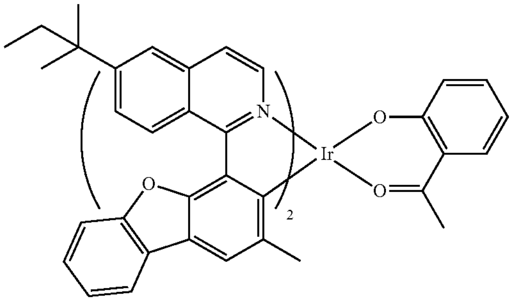

-continued

CPD 324

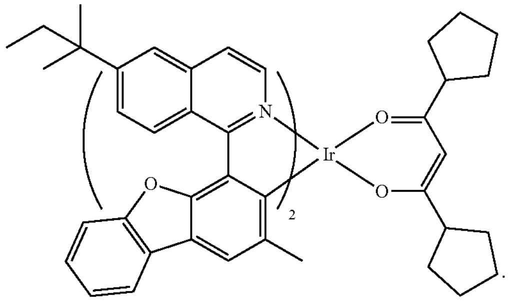

8. An electroluminescent device, comprising a cathode, an anode, and an organic layer arranged between the cathode and the anode, wherein the organic layer comprises the metal iridium complex according to claim 1.

9. The electroluminescent device according to claim 8, wherein:

the organic layer comprises a light-emitting layer, and the metal iridium complex is used as a red light-emitting doping material for the light-emitting layer; or the organic layer comprises a hole injection layer, and the metal iridium complex is used as a hole injection material for the hole injection layer.

10. An electroluminescent device, comprising a cathode, an anode, and an organic layer arranged between the cathode and the anode, wherein the organic layer comprises the metal iridium complex according to claim 2.

11. An electroluminescent device, comprising a cathode, an anode, and an organic layer arranged between the cathode and the anode, wherein the organic layer comprises the metal iridium complex according to claim 3.

12. An electroluminescent device, comprising a cathode, an anode, and an organic layer arranged between the cathode and the anode, wherein the organic layer comprises the metal iridium complex according to claim 4.

13. An electroluminescent device, comprising a cathode, an anode, and an organic layer arranged between the cathode and the anode, wherein the organic layer comprises the metal iridium complex according to claim 5.

14. An electroluminescent device, comprising a cathode, an anode, and an organic layer arranged between the cathode and the anode, wherein the organic layer comprises the metal iridium complex according to claim 6.

15. An electroluminescent device, comprising a cathode, an anode, and an organic layer arranged between the cathode and the anode, wherein the organic layer comprises the metal iridium complex according to claim 7.

* * * * *